(12) United States Patent
Fonseka et al.

(10) Patent No.: US 9,564,927 B2
(45) Date of Patent: Feb. 7, 2017

(54) CONSTRAINED INTERLEAVING FOR 5G WIRELESS AND OPTICAL TRANSPORT NETWORKS

(71) Applicants: John P Fonseka, Plano, TX (US); Eric Morgan Dowling, Escazu (CR)

(72) Inventors: John P Fonseka, Plano, TX (US); Eric Morgan Dowling, Escazu (CR)

( * ) Notice: Subject to any disclaimer, the term of this patent is extended or adjusted under 35 U.S.C. 154(b) by 82 days.

(21) Appl. No.: 14/545,588

(22) Filed: May 27, 2015

(65) Prior Publication Data

US 2016/0352361 A1    Dec. 1, 2016

(51) Int. Cl.
  *H03M 13/00* (2006.01)
  *H03M 13/27* (2006.01)
  *H03M 13/29* (2006.01)

(52) U.S. Cl.
  CPC ..... *H03M 13/2792* (2013.01); *H03M 13/2906* (2013.01)

(58) Field of Classification Search
  CPC .................. H03M 13/2792; H03M 13/2906
  See application file for complete search history.

(56) References Cited

U.S. PATENT DOCUMENTS

| | | |
|---|---|---|
| 4,713,817 A | 12/1987 | Wei |
| 5,258,987 A | 11/1993 | Wei |
| 5,329,551 A | 7/1994 | Wei |
| 5,535,228 A | 7/1996 | Dong et al. |
| 5,548,615 A | 8/1996 | Wei |
| 5,654,986 A | 8/1997 | Lim |
| 6,034,996 A | 3/2000 | Herzberg |
| 6,115,427 A | 9/2000 | Calderbank et al. |
| 6,266,795 B1 | 7/2001 | Wei |
| 6,351,832 B1 | 2/2002 | Wei |
| 6,473,878 B1 | 10/2002 | Wei |
| 6,516,037 B1 | 2/2003 | Wei |
| 6,662,337 B1 | 12/2003 | Brink |
| 6,687,461 B1 | 2/2004 | MacFarlane |
| 6,769,091 B2 | 7/2004 | Classon |
| 6,857,087 B2 | 2/2005 | Crozier et al. |
| 6,889,355 B1 | 5/2005 | Calderbank et al. |
| 7,042,657 B2 | 5/2006 | MacFarlane |
| 7,197,690 B2 | 3/2007 | Shen et al. |

(Continued)

OTHER PUBLICATIONS

JP Fonseka et al, "Constrained Interleaving of Turbo Product Codes," IEEE Comm Letters, vol. 16, No. 9, Sep. 2012, pp. 1365-1368.

(Continued)

*Primary Examiner* — Sam Rizk

(57) ABSTRACT

The present invention provides a design framework that is used to develop new types of constrained turbo block convolutional (CTBC) codes that have higher performance than was previously attainable. The design framework is applied to design both random and deterministic constrained interleavers. Vectorizable deterministic constrained interleavers are developed and used to design parallel architectures for real time SISO decoding of CTBC codes. A new signal mapping technique called constrained interleaved coded modulation (CICM) is also developed. CICM is then used to develop rate matching, spatial modulation, and MIMO modulation subsystems to be used with CTBC codes and other types of codes. By way of example, embodiments are primarily provided for improved 5G LTE and optical transport network (OTN) communication systems.

30 Claims, 27 Drawing Sheets

(56) References Cited

U.S. PATENT DOCUMENTS

| | | | |
|---|---|---|---|
| 7,243,294 | B1 | 7/2007 | Divsalar et al. |
| 7,827,472 | B2 | 11/2010 | Crozier et al. |
| 8,086,943 | B2 | 12/2011 | Divsalar et al. |
| 8,532,209 | B2 | 9/2013 | Fonseka |
| 8,532,229 | B2 | 9/2013 | Dowling et al. |
| 8,537,919 | B2 | 9/2013 | Fonseka |
| 2001/0047502 | A1 | 11/2001 | Hattori et al. |
| 2004/0025102 | A1 | 2/2004 | Yokokawa et al. |
| 2004/0246888 | A1 | 12/2004 | Peron et al. |
| 2005/0010848 | A1 | 1/2005 | Yokokawa |
| 2005/0166132 | A1 | 7/2005 | Shen et al. |
| 2005/0216819 | A1 | 9/2005 | Chugg et al. |
| 2006/0031737 | A1 | 2/2006 | Chugg et al. |
| 2007/0130494 | A1 | 6/2007 | Divsalar et al. |
| 2007/0288834 | A1 | 12/2007 | Crozier et al. |
| 2015/0039965 | A1 | 2/2015 | Fonseka |
| 2015/0143195 | A9 | 5/2015 | Fonseka |

OTHER PUBLICATIONS

JP Fonseka et al, "Constrained Interleaving of Serially Concatenated Codes with Inner Recursive Codes," IEEE Comm Letters, vol. 17, No. 7, Jul. 2013, pp. 1431-1434.

S. Ik, JP Fonseka et al, "Constrained Turbo Block Convolutional Codes for 100G and Beyond Optical Transmissions," IEEE Photonics Technology Letters, pp. 995-998.

A. Nimbalker et al. "ARP and QPP Interleavers for LTE Turbo Coding," WCNC 2008 proceedings, pp. 1032-1037.

Y. Sun and J. Cavallaro, "Efficient hardware implementation of a highly-parallel 3GPP LTE/LTE-advance turbo decoder," Integration, the VLSI Journal, vol. 44 (2011), pp. 305-313.

C. Studer et al., "Design Design and Implementation of a Parallel Turbo-Decoder ASIC for 3GPP-LTE," IEEE J. Solid State Circuits, vol. 46, No, 1, Jan. 2011, pp. 8-17.

R.G. Maunder and L. Hanzo, "Evolutionary Algorithm Aided Interleaver Design for Serially Concatenated Codes," IEEE Trans. Comm vol. 59 No. 7, Jul. 2011.

R.G. Maunder and L. Hanzo, "Iterative Decoding Convergence and Termination of Serially Concatenated Codes," IEEE Trans Vehicular Tech, vol. 59, No. 1, Jan. 2010, pp. 216-224.

M. Isaka, "On the iterative decoding of multilevel codes," IEEE JSAC, Vo. 19, No. 5, May 2001, pp. 935-943.

L. Yu and J. Liu, "An improved rate matching algorithm for 3GPP LTE Turbo code," 2011 Int. Conf. Comm and Mobile Comp, pp. 345-348.

Y. Xiao et al, "Spatial modulaiton for 5G MIMO communications," Proc. ICDSP, 2014, pp. 847-851.

R. Masleh et al., Spatial Modulation, IEEE Trans Vehic tech, V57, No. 4,. Jul. 2008, pp. 2228-2241.

P. Yang et al., "Star-QAM signaling constellations for Spatial Modulaiton," IEEE Transd Vehic Tech V63, No. 8, Oct. 2014, pp. 3741-3749.

J. Li et al., "Product-accumulate codes: a class of codes with near-capacity performance and low decoding complexity," IEEE Trans. Info theory, V50, No. 1, Jan. 2004, pp. 31-46.

D.L. Macfarlane et al., "Experiment and Theory of an active optical lattice filter," IEEE J. Quantum Elect., vol. 48, No. 3, Mar. 2012, pp. 307-317.

G. Raleigh and JM Cioffi, "Spatio-Temporal coding for wireless communication," IEEE TR Com. V 46, No. 3, Mar. 1998, pp. 357-366.

R. Melseh et al, "Spatial Modulaiton—OFDM," Proceedings of the 2006 OFDM Workshop.

CONSTRAINED INTERLEAVING FOR 5G WIRELESS AND OPTICAL TRANSPORT NETWORKS

BACKGROUND OF THE INVENTION

Field of the Invention

The present invention relates generally to methods, apparatus and systems for communication encoders, decoders, transmitters, receivers and infrastructure and/or user devices. More particularly, aspects of the invention relate to constrained turbo block convolutional codes, constrained interleaving, and related methods, apparatus, and systems for improved constrained interleaving, encoding, decoding, signal mapping, MIMO applications, spatial modulation, and rate matching. The present invention also relates to efficient parallel ASICs and VLSI architectures and optical integrated circuit architectures to implement these methods, apparatus, and systems.

Description of the Related Art

A large body prior art includes of technical publications, patents, and standards that relate to 4G LTE (fourth generation long term evolution) wireless systems. In particular, the relevant prior art relates to encoding and decoding architectures and algorithms for use with the CTC (convolutional turbo code) specified for use with 4G LTE. Specifically, important prior art relates to algorithms and high performance ASIC architectures for CTC encoding/decoding, deterministic contention-free interleavers such as the QPP (quadratic polynomial permutation) based interleavers, and rate matching/puncturing architectures.

A parallel decoding ASIC for the CTCs used in 4G LTE can be found in C. Studer, C. Benkeser, S. Belfanti, and Q. Huang, "Design and Implementation of a Parallel Turbo-Decoder ASIC for 3GPP-LTE," IEEE J. Solid State Circuits, Vol. 46, No, 1, January 2011 (referred to as the "Studer" reference" herein). A follow on paper explains more improvements and details about efficient parallel decoding of the CTC used in 4G LTE. This second technical publication is: C Roth, S. Belfanti, C. Benkeser, and Q. Huang, "Efficient parallel turbo-decoding for high throughput wireless systems," IEEE Transactions on Circuits and Systems, 2012 (referred to as the "Roth reference" herein).

One of ordinary skill in the art would be familiar with the Studer reference which explains how to design a highly optimized parallel real time ASIC designed to implement the CTC specified for use in 4G LTE. The Roth reference provides further details and optimizations to the same architecture as described in the Studer reference. One of ordinary skill in the art would also be familiar with the following prior art reference as well: A. Nimbalker, Y. Blankenship, B. Classon, T. K Blankenship, "ARP and QPP Interleavers for LTE Turbo Coding," WCNC 2008 proceedings, (referred to as the "Nimbalker reference" herein). The architecture in the Studer reference uses the QPP interleaver as described in the Nimbalker reference. The QPP interleaver is important because it is used in the 4G LTE standard and because it can be described as a "contention free" "vectorizable" and "deterministic" interleaver.

As is well known "contention free"/"vectorizable" means that the permutation function has a particular property that aids in parallel processing implementations. Consider a case where there are N=8 parallel processors. Then, as long as N divides the frame size, K, the contention free interleaver places on a given row in memory all of the N elements to be processed by the N processors in a given clock cycle. The QPP only supports up to N=8 level vectorization.

The Studer reference also points out a very efficient way to compute the QPP address sequence. As per the Nimbalker reference, the QPP interleaved address sequence can be written as $$\pi_{QPP}(i)=(f_1 i + f_2 i^2) \mod K \quad (1)$$

where $f_1$ and $f_2$ are suitably chosen interleaver parameters that depend on the code-block size K. Note that in this notation the sequentially incremented symbol i is used to denote a coded bit position in the transmitted frame, and the permuted version of the indexing sequence, $\pi_{QPP}(i)$, is used to look up a bit position in the non-permuted sequence of input bits. The Studer reference explains a very efficient way to compute equation (1) is to use the following set of recursions which can be easily implemented in hardware. The recursions below only use additions and modulo operations which can be very efficiently implemented in hardware. Hence at runtime, in hardware, equation (1) is computed as $$\pi_{QPP}(i+1)=(\pi_{QPP}(i)+\delta(i)) \mod K \quad (2)$$

and $$\delta(i+1)=(\delta(i)+b) \mod K \quad (3)$$

where $\pi_{QPP}(0)=0$, $\delta(0)=f_1+f_2$, and $b=2f_2$.

Another prior art reference that is known to those of skill in the art and that goes into further detail about QPP recursions is: Y. Sun and J. Cavallaro, "Efficient hardware implementation of a highly-parallel 3GPP LTE/LTE-advanced turbo decoder," Integration, the VLSI Journal, No. 44, 2011, pp 305-315, (referred to as the "Sun reference" herein). This reference provides additional recursions that allow QPP addresses to be incremented by an integer, $d=\Delta i$, that can be any positive integer. This allows forward and backward sequences of QPP addresses to be generated for forward and backward recursions used in decoding. Also, this allows recursions similar to equations (2)-(3) to increment by more than one element, for example, $\Delta i=K/M$, where K is the frame size and M is the number of processors in a system. The Sun reference also explains the prior art knowledge that a set of M different QPP address generators can be run in parallel with relative offsets of one and with $\Delta i=K/M$ to generate a set of M consecutive QPP addresses in parallel. The Sun reference also provides efficient hardware circuits to implement such an addressing scheme.

Another relevant field of art is called rate matching. Rate matching is also known as "puncturing." The CTC mother code defined in the LTE standards is a rate ⅓ parallel concatenated turbo code. This CTC leads to very complicated rate matching circuits at both the encoder and the decoder, thus increasing over all hardware complexity of the 4G LTE CTC encoding and decoding. A reference that discusses rate matching for LTE turbo codes is C. Ma and P. Lin, "Efficient implementation of rate matching for LTE codes," IEEE ICFCC 2010 international conference proceedings, pp. V1-704-708 (referred to as the "Ma reference" herein). FIG. 1 of the Ma reference shows the basic configuration of 4G LTE rate matching at the transmitter side. The data stream plus two streams of parity bits from the rate ⅓ parallel concatenated CTC pass through three parallel blocks labeled "sub-block interleaver." That is, three interleavers are used, one each to process the total number of bits in a non-punctured frame. Another reference that explains the rate matching used in 4G LTE is L. Yu et al., "An improved rate matching algorithm for 3GPP LTE Turbo code," Conference on Communications and Mobile Computing (CMC), pp. 345-348, April 2011. FIG. 2 of this article and the discussion thereof is very helpful in understanding the 4G LTE rate matching algorithm.

There also exists a vast body of literature related to OTN (optical transport network) applications. OTN applications are demanding because they require very high data rates and powerful codes and the frame size used in coding/decoding is long, (122,368 message bits plus coding overhead bits). OTN systems are either already available or still being researched and developed to support data rates of 100GBPS (usually referred to as 100G), 400GBPS and even up to 1000GBPS (1 Terabit per second, 1 T). These very high speed systems demand very powerful codes to achieve specified high NCGs (net coding gains) at very low BERs (bit error rates) below $10^{-15}$. High speed digital hardware that employs extensive parallel processing is needed to decode these powerful codes in real time.

It can be noted that in OTN applications, the codes being used/considered now correspond to LDPC (low density parity check) codes, concatenations of LDPC codes with one or more long block codes, or TPCs (turbo product codes). OTN applications cannot use CTCs like LTE does because the error floors required by OTN applications are far below those afforded by CTCs. Hence it would be desirable to have a much lower complexity parallel coding/decoding technique and parallel architecture than those that are currently proposed for use in or used in the OTN field. It would be desirable if this low complexity coding/decoding technique could meet the stringent NCGs requirements at BERs of $10^{-15}$ and outperform all known coding/decoding techniques that are currently proposed for use in or used in the OTN field.

The prior art also includes U.S. Pat. No. 8,537,919 "Encoding and decoding using constrained interleaving," and its continuation-in-part, U.S. Pat. No. 8,532,209, "Methods, apparatus and systems for coding with constrained interleaving, and both of these U.S. Patents are incorporated herein by reference in order to provide the reader with written description level details of known constrained interleaver design techniques, and known encoder/decoder structures that use constrained interleaving. These patents are incorporated by references, but it is to be understood that for claim construction purposes, the instant written description should be used, and not any of the written description in the incorporated-by reference patents. In this patent application, some terms are defined differently than the U.S. patents incorporated by reference herein. Therefore, it is to be understood that the interpretation of terms and phrases used in the claims herein should be taken in the context of the present application and not the references incorporated herein. The prior art also includes J. Fonseka, E. Dowling, S. I. Han and Y. Hu, "Constrained interleaving of serially concatenated codes with inner recursive codes," IEEE Communications Letters, Vol. 17, No. 7, July 2013, referred to herein as "the Fonseka [1] reference." The prior art also includes J. Fonseka, E. Dowling, T. Brown and S. I. Han, "Constrained interleaving of turbo product codes," IEEE Communications Letters, vol. 16, 2012, pp. 1365-1368, September 2012, referred to herein as "the Fonseka [2] reference." The prior art also includes S. I. Han, J. P. Fonseka and E. M. Dowling, "Constrained Turbo Block Convolutional Codes for 100G and Beyond Optical Transmissions," IEEE Photonics Technology Letters, Vol. 26, No. 10, May 2014, referred to herein as "the Fonseka [3] reference." The above-listed patents and technical publications also cite to related articles in the technical literature and to other U.S. patent references, which are also part of the prior art. It can be noted that the above referenced patents and technical papers constitute at least a portion of what would be known to one of skill in the art of CTBC (constrained turbo block convolutional) codes.

Consider FIG. 1, which corresponds to FIG. 4 in U.S. Pat. Nos. 8,537,919 and 8,532,209. FIG. 1 shows an encoder structure that can represent a method and/or an apparatus for encoding in accordance with CTBC code. The CTBC encoder embodiment of FIG. 1 makes use of an outer block code (OBC) encoder 405, that encodes in accordance with a selected OBC. For example the OBC can be a (n,k) block code, B, where n>k and n,k are positive integers. The message bit stream at the input can be considered to be a sequence of k-bit blocks consisting of message bits. Each k-bit message block is first processed by the OBC encoder 405 which, in the exemplary embodiment of FIG. 1, encodes according to an (n,k) outer code with minimum Hamming distance (MHD) given by MHD=$d_0$. In some embodiments the outer code 405 can perform outer encoding in accordance other types of fixed-length codes, such as a finite-length convolutional code or an LDPC code, for example. A characterizing feature of the embodiment of FIG. 1 is that it also makes use of an inner recursive convolutional code (IRCC) encoder 415 that encodes its input bit stream in accordance with an inner recursive convolutional code (the selected IRCC). An appropriate IRCC is chosen to have an MHD given by MHD=$d_i$. For example, the IRCC, could be selected to be the rate-1 accumulator given by G(D)=1/(1+D). Another specific example of an IRCC is to use the rate-1 accumulator followed by a $(\lambda,\lambda-1)$ SPC encoder (or any other block code), a finite-length (finite impulse response) convolutional code, or any other recursive convolutional code (RCC). The value of $\lambda$ can be chosen to provide design flexibility to chose the IRCC to fine tune the rate and/or the $d_i$ value to design a CTBC code to meet a particular set of design specifications. In some embodiments, the CTBC code is designed using the rate-1 accumulator as the IRCC, but this CTBC code is then followed by another block code like the $(\lambda,\lambda-1)$ SPC encoder mentioned above.

Another characterizing feature of the CTBC encoder 400 is that it makes use of a constrained interleaver 410. Any specific CTBC code is defined in terms of the specifically selected outer block code B used in the OBC encoder 405, the specifically selected recursive convolutional code (RCC) used in the IRCC encoder 415, and a specifically selected constrained interleaver having a specified size and permutation function used in block 410. The constrained interleaver 410, and various forms of its interleaver constraints are described in the above-cited prior art references. The constrained interleaver 410 can be designed to provide an interleaver gain, $G_I$, similar to uniform interleaving, but also can be designed to ensure that the net MHD of the entire CTBC code satisfies some target MHD, $d_t \geq d_0 d_i$. It can be noted that if the constrained interleaver used in the CTBC were to be replaced by a uniform interleaver of the same length, a "Uniform-interleaved Turbo Block Convolutional" (UTBC) code would result, and the MHD of this corresponding UTBC code would typically be close to MHD, $d_t = d_i$.

Various forms of constrained interleavers are defined in the above-referenced U.S. patents and the three above-cited references related to constrained interleaving. A constrained interleaver type 2, i.e., the "CI-2" is introduced and used in the block 401 of FIG. 1. The above-referenced U.S. patents teach how CI-2 interleaver constraints can be defined to design the constrained interleaver 410 to enforce the property MHD, $d_t \geq d_0 d_i$. In U.S. Pat. No. 8,532,209, the term and notation "Constrained interleaver type 2" and its abbreviation "CI-2" are introduced. In the Fonseka [2] reference, it is shown that CI-2s can be designed to achieve a specified target MHD that satisfies $d_0 d_i \leq MHD \leq d_0^2 d_i$. CI-2s use inter-row constraints in order to achieve this. Note that the constrained interleaver block 410 in FIG. 1 is labeled "r×ρn constrained interleaver." This is because, as discussed in the above-referenced U.S. patents, the constrained interleaver's permutation function is designed using a r×ρn row-column matrix structure. That is, the prior art relies upon the CI-2 design matrix, $[A]_{r \times \rho n}$, and requires certain relations to hold for coded bit positions from different codewords of the OBC that are loaded into $[A]_{r \times \rho n}$. In the Fonseka [1] reference, the symbol for the number of rows of the CI-2 design matrix was changed to the symbol, "L," and the CI-2 design matrix is thus written as of $[A]_{L \times \rho n}$. In the rest of this patent application, from here forward, the symbol L will be used to refer to the number of rows in the CI-2 design matrix.

An objective of the CI-2 interleaver is to create CTBC codes that simultaneously provide a specified high MHD while achieving as high of an interleaver gain as possible. The high MHD provides a lower error floor and has other desirable effects in various types of channels, and the high interleaver gain ensures a high coding gain for the CTBC code. However, the interleaver gain attainable by the CI-2 is limited to a large extent by the number of rows, L in the CI-2 design matrix. The lower the number L, for a fixed frame size K, the higher the CI-2 interleaver gain. However, when CI-2 interleavers are used, lowering L will eventually limit the achievable MHD.

It would be desirable to have improved constrained interleavers that do not require a CI-2 design matrix, but instead use L=1, and can thus lead to improved CTBC codes that have higher interleaver gains as compared to a CI-2 interleaver of the same length. It would be desirable to further include improved signal mapping methods, apparatus and systems to map a CTBC code onto a target signal constellation in such a way as to provide a constellation mapping gain, similar to the kinds of gains provided by trellis coded modulation (TCM) and bit interleaved coded modulation (BICM). It would also be desirable to have new rate matching algorithms that could efficiently interoperate with these new and improved CTBC codes and signal mapping subsystems. It would also be desirable to have algorithms developed for applications in multiple input multiple output (MIMO) systems and spatial modulation and subsystem for use communications devices that include in multi-antenna subsystem.

Next consider FIG. 2, which corresponds to FIG. 5 in U.S. Pat. Nos. 8,537,919 and 8,532,209. FIG. 2 shows a prior art receiver method and apparatus for a receiver 500 used to receive and decode a signal r(t) which was generated in accordance with FIG. 1 or a version of a serial concatenated code whose inner coded is a block code that is also discussed in U.S. Pat. Nos. 8,537,919 and 8,532,209. It is important to note that when CTBC codes as generated using an IRCC as shown in FIG. 1 herein, block 510 and the connection between block 510 and 525 will be missing. The block 510 is only used to decode coded signals generated by an alternative embodiment shown in FIG. 2 of the above two referenced patents. So herein, block 510 and should be ignored.

Block 1105 processes or otherwise demodulates a received signal r(t) to generate an initial vector $r_s$, which preferably corresponds to a vector of bit metrics. The bit metrics are preferably used in decoding of the component codes using an α-posteriori probability (APP) decoding technique.

The IRCC soft in soft out (SISO) decoder 515 can implement a well known soft decoding algorithm such as the BCJR algorithm, or a soft output Viterbi algorithm (SOVA), the min sum algorithm. Such algorithms are known to generate extrinsic information indicative of the reliability of the soft decoded results. The BCJR algorithm can be embodied using any of the MAP, Log-MAP, or the Max-Log-Map algorithms. For example, if the IRCC SISO decoder 515 involves the BCJR algorithm, then the IRCC SISO decoder 515 will need to compute a sequence of branch transition probabilities, γ's, that each are a function of a respective element of the received signal metrics, $r_s$, and a corresponding respective element of updated or initial extrinsic information, the $L_e$'s. The IRCC SISO decoder 515 will use this sequence of branch transition probabilities, γ's, while making one forward recursion pass to update a set of state metrics, α's, and one backward recursion pass algorithm to update a set of state metrics, β's. Such concepts are well known in the art in the context of decoding convolutional turbo codes (CTCs). Using the calculated α's, β's and γ's values, the BCJR decoding of the IRCC decoder calculates the extrinsic information of all its input bits. For example, see P. Robertson, et al., "A comparison of optimal and sub-optimal MAP decoding algorithms operating in the log domain," IEEE ICC 1995, pp. 1009-1013.

The IRCC SISO decoder 515 couples its extrinsic information output to a constrained deinterleaver 520 which deinterleaves the extrinsic information received from the IRCC SISO decoder 515, for example, in accordance with the inverse CI-2 permutation function. The OBC SISO decoder 525 is coupled to receive the deinterleaved extrinsic information from the constrained deinterleaver 520. The OBC SISO decoder 525 also preferably implements a known soft decoding algorithm such as the well known Chase-Pyndiah algorithm (also referred to as the Pyndiah algorithm), low complexity Chase-Pyndiah algorithm, the OSD algorithm and its low complexity variations, or any similar soft decoding algorithm for decoding of block codes, for example. In general, different well known (or proprietary) soft decoding algorithms can be used in the blocks 515 and 525. All such algorithms are well known to those of skill in the art, for example, see J. Cho and W. Sung, "Reduced complexity Chase-Pyndiah decoding for turbo product codes," pp. 210-215, IEEE workshop on signal processing systems, October, 2011.

It would be desirable to have a decoding architectures that could be used to efficiently decode the new improved CTBC codes. It would be desirable to have additional efficient algorithms and parallel architectures to decode the improved CTBC codes that have undergone additional constrained interleaving based signal mapping and/or rate matching and/or constrained interleaving based spatial modulation.

While the above mentioned prior art relating to constrained interleaving for use with an OBC and an IRCC provide very powerful CTBC codes, the CI-2 is based on the CI-2 design matrix, $[A]_{L \times \rho n}$, and the concept of a random interleaver. The construction of the CI-2 requires many randomization operations performed in the CI-2 design matrix and a complicated process of ensuring that randomizations do to not violate any constraints in the CI-2 design matrix. As discussed below, this CI-2 design matrix and design process actually limits BER performance. Also, the CI-2 is not a vectorizable/contention free interleaver. Herein a "random interleaver" is also defined in opposition to a "deterministic interleaver" that uses a mathematical formula to generate the deterministic interleaver permutation. A random interleaver is thus often implemented as a table look up or with a state-machine logic circuit whose sequencing logic does not use a fixed mathematical equation but whose state transition logic needs to be specifically designed for each is frame size.

It would be desirable to have a family of a contention free, vectorizable constrained interleavers, both deterministic and semi-random. It would be desirable to have an SCC that is constructed by coupling the output of the OBC to the IRCC via a contention free, vectorizable and deterministic version of a constrained interleaver. It would further be desirable to be able to design a system that could achieve the memory efficient benefits of the Studer reference, and to also greatly simplify the rate matching requirements of the system. It would be desirable to have a parallel architecture that could meet the encoding and decoding performance requirements of the 4G LTE CTC encoders and decoders, but with simpler computational functional units, less overall computational complexity, and thus lower power consumption. It would be desirable to have a CTBC encoder/decoder architecture that could eliminate the complicated and hardware intensive rate matching and inverse rate matching subsystems required by 4G LTE encoders and decoders. It would also be desirable if the parameters of this same CTBC encoder/decoder architecture could be scaled to higher values of N levels of parallelism and designed to provide the NCGs need at BERs of $10^{-15}$ for 400 GHz and beyond OTN applications. It would be desirable to also have a new coded modulation techniques that could be used to map codes onto higher order constellations and to implement advanced functions such as rate matching, spatial modulation, and MIMO systems. It would be desirable if the advanced modulation technique could be used along with optical integrated circuits and similar technology to implement higher capacity optical communication channels, for example 400 GHz and beyond, and 1 Tera Hz and beyond. It would be desirable to have a constrained interleaver design process that did not rely on the CI-2 design matrix and was able to provide higher BER performance for random and deterministic constrained interleavers.

SUMMARY OF THE INVENTION

Using the abbreviations CI="constrained interleaver" and CICM=constrained interleaved coded modulation," and other more common abbreviations that are all defined herein, the present patent application is organized and the present invention can be summarized into sub-invention categories as follows:
i) CI-(L=1) (single row) constrained interleaver, encoder, decoder.
ii) CI-3 constraints and design approach.
iii) CI-4 constraints and design approach.
iv) CI-3 and CI-4 design approach using one or more target MHDs.
v) Vectorizable, deterministic CI, encoder, decoder.
vi) Parallel decoder chip architectures.
vii) CICM Signal Mapper subsystem
viii) CICM Rate Matching subsystem/Variable Redundancy and Vectorizable embodiments.
ix) CICM embodiments with unequal error protection.
x) CICM MIMO Spatial Modulation subsystem and processing algorithms.
xi) Optical subsystem and optical IC with signature filters for use in WDM SM and MIMO OTN, 100G, 400+G, 1 Tera bit, and beyond; and non-optical embodiments using analog, discrete-time or purely digital signature filter banks.

xii) OFDM Related Embodiments.
xiii) System level aspects: handhelds, headends, systems.

In accordance with a first aspect of the present invention, constrained interleavers are designed that only use a single row vector as opposed to CI-1 or a CI-2 design matrix which always needs more than one row to meet non-trivial MHD design objectives. For example, CI-3 and CI-4 constrained interleavers are designed by identifying restricted zones of numbers where a pseudo-random number generator cannot generate an output. These restricted zones correspond to sets of adjacent integers within the integer domain [0,K-1]. The length of the constrained interleaver is K, and is used to permute the integer ring [0,K-1]=[0, . . . ,K-1] to a permuted version of this integer ring, which can be denoted as $\pi[0,K-1]$. An unconstrained pseudo-random permutation can map [0,K-1] to any reordering of [0,K-1]. In contrast, a constrained interleaver in accordance with the present invention imposes constraints that eliminate any possible reordering that would cause a particular index of [0,K-1] to be mapped to a position (index) in $\pi[0,K-1]$ that would violate a constraint. The constraints are implemented by sequentially pseudo-randomly permuting (placing) indices (positions) in the integer ring [0,K-1] to new positions (indices) in $\pi[0,K-1]$ subject to the constraint of not permuting any index of [0,K-1] into any restricted zone in $\pi[0,K-1]$. The restricted zones are used to identify ranges of indices in $\pi[0,K-1]$ where, if a particular index from [0,K-1] were to be placed, a low weight a CTBC codeword would be/could be generated. Herein, the phrases "low weight codeword," "low weight error sequence," and "low distance error sequence" generally correspond to any possible low weight encoded bit sequences, $i_P$, of weights $d_t \le d \le d_f$ where none of the possible low weight encoded bit sequences, $i_P$, can have a weight less than $d_t$. Here the weights $d_t \le d \le d_f$ correspond to Hamming distances, and the coded sequence can be a CTBC coded sequence or some other kind of encoded sequence encoded in accordance with a code for which the low weight error sequences can be identified and enumerated. The interleaver constraints are used to eliminate the possibility of the generation/existence of any low weight CTBC codewords that have weight below a target MHD value denoted as $d_t$.

It should be noted that while U.S. Pat. Nos. 8,537,919 and 8,532,209 disclose the general genus of constrained interleavers and certain species such as CI-1 and CI-2 species of constrained interleavers, the an aspect of the present invention discloses additional specific novel species that members of the genus of constrained interleaver inventions. That is, the present invention specifically discloses the two new species of constrained interleavers, CI-3 and CI-4. Both CI-3 and CI-4 are members of the newly disclosed sub-genus class SRCI (single row constrained interleaving).

SRCI as performed in accordance with the present invention provides several advantages. First, the interleaver gain can be improved in comparison to the prior art CI-2 because the number of restricted-out permutation possibilities decreases with respect to the CI-2 design method. Second, it is possible to design CTBC codes that allow different target MHD values to be used for different categories of low weight error sequences. This is important because certain categories of low distance error sequences can be identified that are relatively much less likely. These categories of low distance error sequences have low associated error coefficients. Therefore, the overall probability of error can be reduced by allowing lower MHD to these less likely categories of low distance error sequences. This allows the overall probability of error to be reduced by balancing MHD and error coefficient products in the error probability expression as a function of distance spectra. A third advantage to the SRCI approach is that it provides additional flexibility that allows vectorizable (contention free) deterministic constrained interleavers to be designed using the single row type interleaver constraints.

Another aspect of the present invention focuses on parallel processing architectures that can be used to implement chips, systems of chips or chip subsystems for encoding and decoding of CTBC codes. These parallel architectures make use of the contention free deterministic constrained interleaver along with a parallel-access memory architecture as well as parallel processing units that perform SISO decoding in parallel.

Another aspect of the present invention centers around CICM (constrained interleaved coded modulation). CICM signal mapping is used to map coded sequences such as CTBC coded sequences and other coded sequences for which the low distance error sequences (lowest weight codewords) can be identified and tabulated. CICM signal mappers uses a permutation, $\Gamma$, to permute the coded bit positions of a coded bit stream of frame of frame size K, onto a sequence of K/m groups of m bits, each of which will be mapped to an $2^m$-ary symbol in accordance with a selected constellation mapping rule. The constellation mapping rule is preferably uses RGC (reverse Gray coding) to map groups of m bits at a time onto the $2^m$-ary signal constellation points. The combination of the CICM permutation $\Gamma$ and the constellation mapping rule is preferably designed to ensure that at least one of a symbol Hamming distance and a MSED (minimum squared Euclidian distance) is achieved. This is achieved by keeping track of a set of low distance error sequences that can be generated at weights d, where $d_l \leq d \leq d_f$. Similar to the CI permutation $\pi[0,K-1]$, $\Gamma$ is constrained to ensure that low distance error sequences are avoided, but now in terms of symbol Hamming distance and MSED on the transmitted sequence as opposed to the encoded bit stream itself. In preferred embodiments both the symbol Hamming distance and the MSED are jointly achieved. In unequal error protection embodiments, the symbol Hamming distance and a plurality of different MSEDs for different subsets of message bits are jointly achieved. In all such systems mentioned above, when AWGN (additive white Gaussian noise) channels are in use, it may not be needed to maintain a given symbol Hamming distance, so that the maintaining/achieving a given symbol Hamming distance portion becomes optional. In general, the CICM permutation and mapping is selected to improve or optimize the net probability of error on the channel.

CICM can be used to aid in a variety of areas. For example, CICM is used herein to implement rate matching/puncturing/variable redundancy. Also, CICM is used to implement improved SM (spatial modulation) and MIMO (multiple input multiple output) systems such as multiple-antenna wireless systems for potential use, for example, in 5G and beyond wireless systems.

Another aspect of the present invention involves the design of OTN (optical transport network) systems for 100G and beyond fiber optic or free space laser communication systems. The present invention shows how to design and implement optical subsystems using filter banks constructed using a plurality of known optical discrete-time filters that can be implemented in coupled fiber subsystems and/or optical integrated circuits. The optical discrete time filter banks are used to implement a transmit portion of a MIMO type channel matrix, H. The output of the optical discrete time filter banks is coupled onto a single fiber or free space optical laser channel for transmission. At the receiver, another optical filter bank is used to implement a receive portion of the MIMO type channel matrix, H. Both SM and MIMO type modulation formats are disclosed. The SM and MIMO type systems can be used to increase the performance and data rate of the optical communication system at a given noise level.

BRIEF DESCRIPTION OF THE DRAWINGS

The various novel features of the present invention are illustrated in the figures listed below and described in the detailed description that follows.

DETAILED DESCRIPTION OF THE PREFERRED EMBODIMENTS

Figure 1:
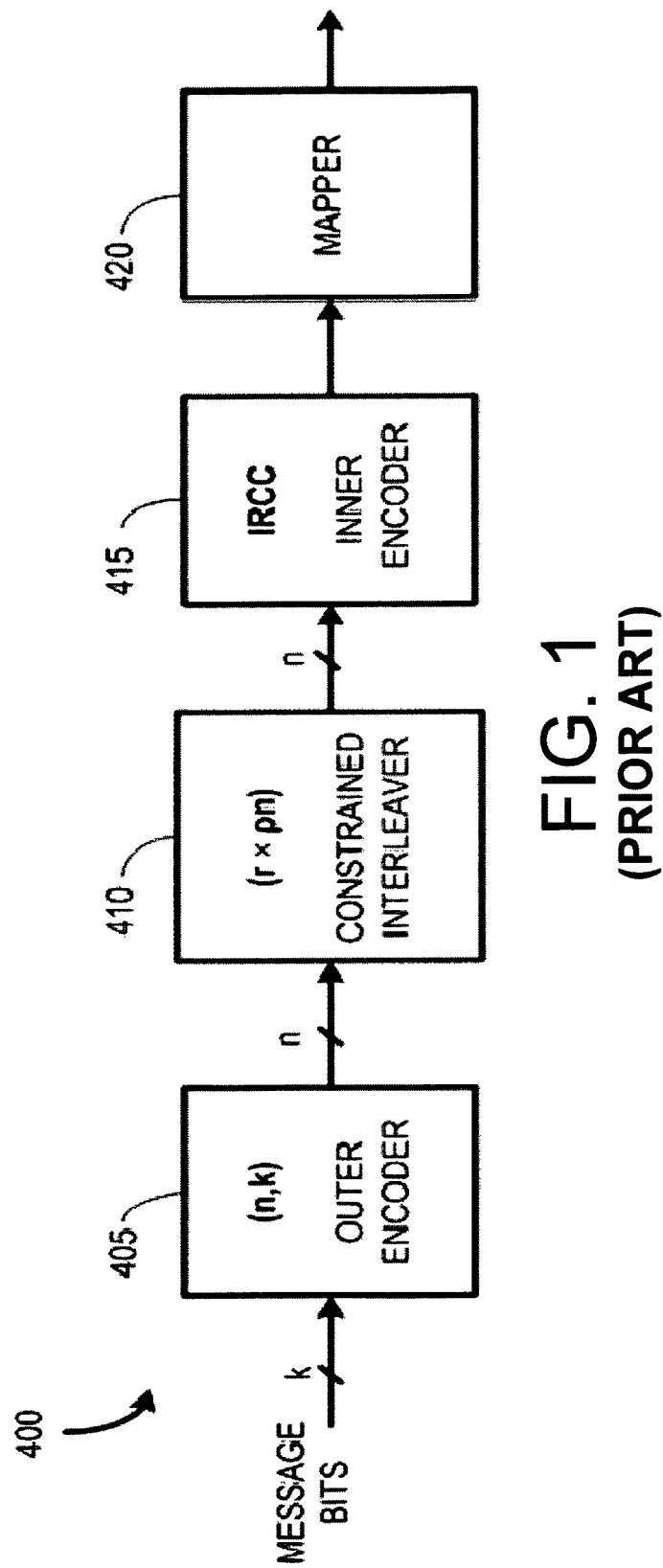
FIG. 1 is a block diagram of an embodiment of a prior art encoder that encodes data bits in accordance a constrained turbo block convolutional (CTBC) code and maps the CTBC encoded sequence to a channel for transmission.
Figure 2:
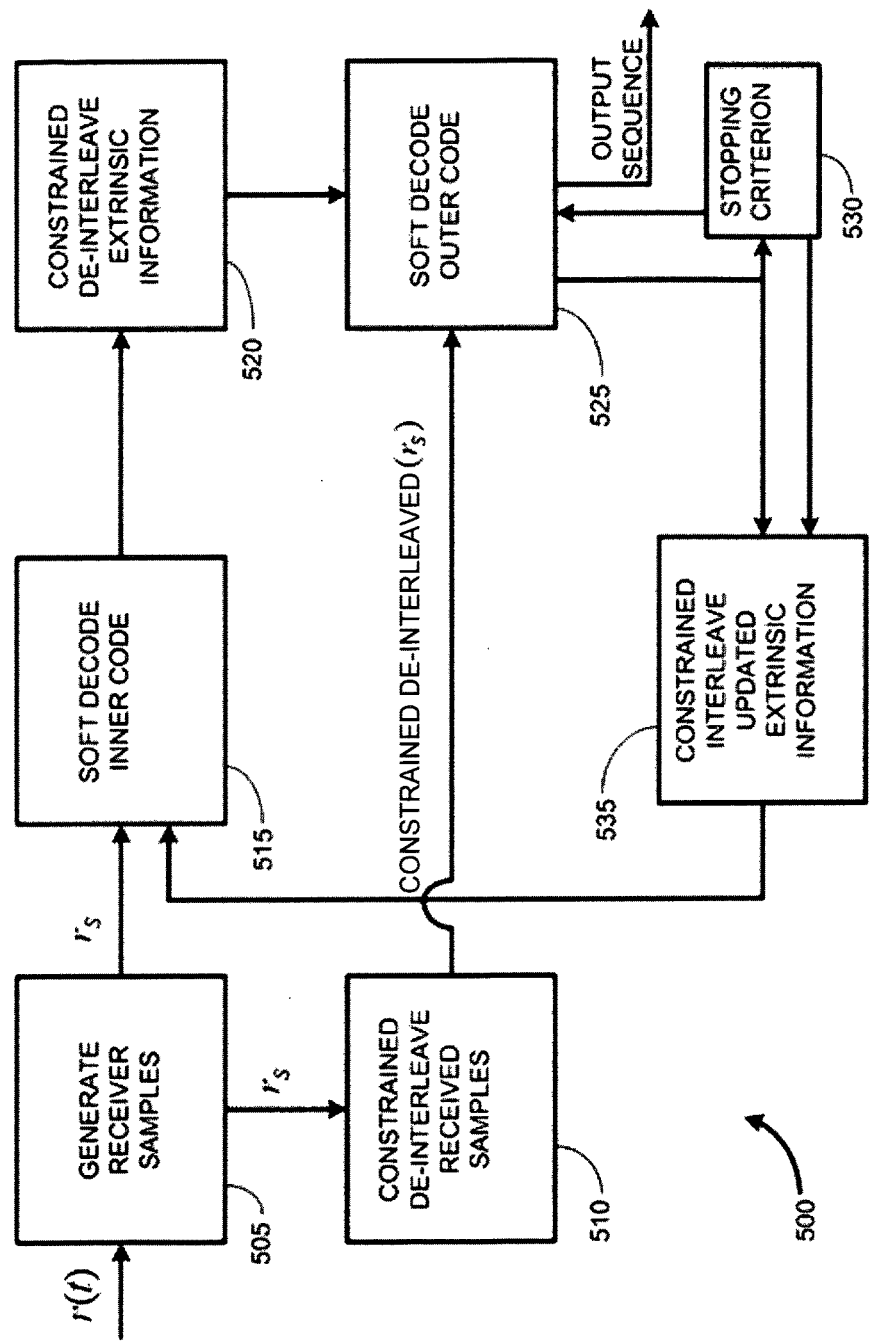
FIG. 2 is a block diagram of an embodiment of a prior art receiver method and apparatus that makes use of an iterative soft input soft output (SISO) decoder to decode a received version of a CTBC code such as generated by FIG. 1.

Throughout this written description various mathematical algorithms will be presented in the form of block diagrams. It is to be understood that in any such cases, the block diagrams can be viewed as hardware blocks or logic blocks that could be carried out in software. Likewise, especially in hardware implementations, a given block in the any block diagram herein could be embodied using two or more separate hardware sub- blocks. Hence all such modifications are contemplated as ways to implement various aspects and embodiments of the present invention. Also, it should be recognized that any block diagram whose operation is described herein can be viewed as a flow chart, thereby describing a method in addition to a system or an apparatus.

Constrained Interleaver Mathematical Notation

A single frame of a CTBC code can be modeled starting from a set of $\rho$ independent message blocks, each of length k, $m_j=(m_{j1}, m_{j2}, \ldots m_{jk})$, $j=0,2,\ldots,\rho-1$, where $\rho$ is the integer number of message blocks in a frame. These message blocks are first individually encoded by an (n,k) outer block code (OBC) with minimum Hamming distance (MHD) $d_0$ to form a sequence of codewords of the OBC. This sequence of codewords of the OBC will be placed into a vector, $[c]_{\rho n}=[c]_K$, where K=$\rho$n is the frame size. The elements of $[c]_{\rho n}$ can be written in terms of the codeword positions, $c_j=(c_{j1},c_{j2},\ldots c_{jn})$, for $j=0,1,2,\ldots,\rho-1$, and or in terms of the individual coded bit positions, c(i), for $i=0,\ldots,K-1$, where $i=nj+t$, for $j=0,1,2,\ldots,\rho-1$ and $t=0,\ldots,n-1$. In this document, the term "codeword" specifically refers to a set of coded bits generated by applying the OBC to a message block, $\{m_j\}$, while the term "codeword position" refers to physical memory locations where the coded bits of a corresponding codeword reside. The vector, $[c]_{\rho n}$, can be viewed as a memory array whose contents are the naturally ordered set of codewords, $\{c_j\}$, or can be viewed as a bit-oriented memory array containing "coded bit positions" where the corresponding coded bits $\{(c_{j0},c_{j1},\ldots c_{jn-1})\}$, $j=0,1,2,\ldots,\rho-1$, physically reside. Also, the term "coded bit position" can refer to a permuted location or address where the corresponding coded bit will reside after an interleaving operation has occurred as described below.

The contents of the vector, $[c]_{\rho n}$, can be permuted to form a constrained interleaved sequence, $\pi:c\to u$ denoted as, $u=\pi[c]$. In terms of a physical interleaver structure, the vector u can also be viewed as a vector of coded bit positions, where the coded bit positions (and/or their addresses) are in a permuted order with respect to the coded bit positions in the vector c. The sequence u is then encoded according to an inner recursive convolutional code (IRCC) to form the final coded sequence $v=(v_1,v_2,\ldots v_{L\rho n+v})$ of the CTBC code, where v is the number of additional terminating bits added by the IRCC. In terms of the generator function G(D) of the IRCC, this conversion from u to v can also be described as v(D)=G(D)u(D), or, in vector notation, $v=G[u]=G[\pi[c]]$.

In the analysis herein, the IRCC is assumed to be the modulo-2 accumulator, i.e., G(D)=1/(1+D), where then v=1. However, in case of an accumulator this single termination bit can be eliminated as it contributes the same bit metric resulting from the same coded bit for the two paths terminating at state zero. Using this modulo-2 accumulator, when the Hamming weight of u, W[u], is an even value d, the CTBC coded sequence v consists of d/2 number of disjoint segments of all ones. Similarly, when W[u] is an odd value d, v consists of $\lceil d/2\rceil=(d+1)/2$ number of disjoint segments of all ones including one segment that ends at the last bit of the sequence v. The interleaver constraints developed herein put restrictions on the permutation $\pi:c\to u$ so as to selected categories of the low distance error sequences of the final CTBC codeword, $v=G[u]=G[\pi[c]]$. That is, constraints are placed on the permutation $\pi:c\to u$ to ensure that the minimum weight of v generated by any vector c is at least $d_t$, where $d_t$ is a target MHD of the CTBC code. As discussed later, the constraints developed herein can be applied to any general IRCC with any arbitrary G(D).

CTBC Code Encoder/Transmitter Using a CI With a Single Row

The present invention introduces a new family of L=1 constrained interleavers (Single Row Constrained Interleavers—SRCI) that are based on a new type of constraint that directly restricts (i.e., constrains out) a particular subset of zero or more indices in the vector u to which a given coded bit of an associated OBC codeword cannot be placed, given the previous placement coded bits of the current codeword into u and possibly coded bits of other codewords of the OBC that have already been placed into the vector u. As stated above, the prior art CI-2 constrained interleaver required the use of $[A]_{L \times \rho n}$ that necessarily required L>1 in order to meet a specified target MHD requirement. Hence using the prior art techniques, it would be impossible to set L=1 in order to meet a set of interleaver constraints that would enforce a specified target MHD $d_t > d_0 d_i$ because both intra-codeword bit separations and the inter-row constraints would be needed, thus forcing L>1. Also, using prior art constrained interleaving techniques it would not be possible to design a deterministic constrained interleaver as defined below which has contention free properties and is compatible and used along with a pre-defined deterministic contention free permutation such as the QPP permutation.

Figure 3:
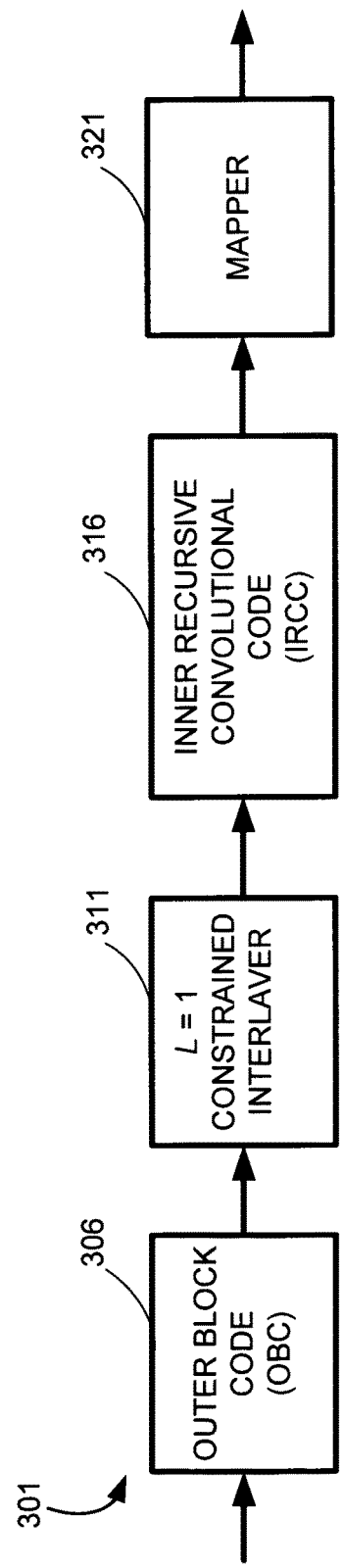
FIG. 3 is a block diagram of a CTBC code encoder that uses an L=1 constrained interleaver designed to provide higher interleaver gain and/or higher MHD and/or improved BER performance as compared to prior art CTBC codes that relied on a CI-2 interleaver with L>1.

FIG. 3 shows a CTBC encoder 301 in accordance with an aspect of the present invention. FIG. 3 will be described assuming the OBC is a (n,k) block code. In general, any other type of finite length codes, for example, a tail biting convolutional code or an LDPC code could be used for the OBC as well. An outer block code (OBC) encoder 306 receives a sequence of independent message blocks, each of length k, $m_j=(m_{j1}, m_{j2}, \ldots, m_{jk})$, j=0,1, . . . , $\rho$–1. The OBC encoder 306 encodes these independent message blocks to produce an OBC-encoded sequence, $c_j=(c_{j1}, c_{j2}, \ldots c_{jn})$, j=0,1, . . . , $\rho$–1, which corresponds to a length-K vector, c. Next, OBC-encoded sequence, $c_j=(c_{j1}, c_{j2}, \ldots c_{jn})$, j=0, 1, . . . , $\rho$–1, is passed to a pre-determined L=1 constrained interleaver block 311 (herein also called an SRCI—single row constrained interleaver) which permutes the vector c according to $\pi_{CI-L=1}$:c→u. The permutation $\pi_{CI-L=1}$ can be implemented as an L=1 pseudorandom constrained interleaver (e.g., CI-3 or CI-4 interleavers as discussed below). The vector u is then passed to an IRCC encoder 316 which produces at its output the vector, v, of the CTBC code as previously described. The vector v is then passed to a constellation mapper 321. The constellation mapper 321 can be any form of modulator, for example, the exact type of modulator specified for use in 4G LTE, OTN, or any other type of modulator. In some embodiments, the constellation mapper 321 uses a constrained interleaved coded modulation (CICM) constellation mapper as discussed in more detail below and as shown in FIGS. 15-20.

In a specific example, an L=1 constrained interleaver (also called a SRCI) is used to construct a transmitter to generate and transmit CTBC codes. In such a transmitter, an outer encoder is configured to transform a sequence of input bits to a sequence of outer encoded bits. The sequence of outer-encoded bits is encoded in accordance with an outer code that can be block code (which would include an LDPC code) or a non-recursive convolutional code, for example. A constrained interleaver would be configured to implement a permutation function to permute the order of the outer-encoded bits to produce a constrained-interleaved sequence of outer-encoded bits. The constrained interleaver implements at least one SRCI (single row constrained interleaver) constraint that prevents one or more low-distance error sequences from occurring. The permutation function also implements a pseudo-random reordering of the outer-encoded bits subject to the at least one SRCI constraint. An inner encoder is configured to encode the constrained-interleaved sequence of outer-encoded bits into a sequence of inner-encoded bits. A constellation mapper is used to map the sequence of inner-encoded bits to a transmission signal such as a BPSK signal, a QPSK signal, a 16-QAM signal, or a 16-PSK signal, for example. In this example, the sequence of inner-encoded bits constitutes a serially-concatenated sequence of bits that incorporates coding from both the inner code and the outer code in accordance with a serially-concatenated code that achieves a target minimum distance of $d_t$. The outer code has a minimum distance of $d_0$ and the inner code has a minimum distance of $d_i$. In this example, the permutation function implemented by the SRCI constrained interleaver is configured to implement the SRCI constraint in order to enforce $d_t > d_0 d_i$. The SRCI constraint ensures that the permutation function does not place any respective index from the integer ring [0,K-1] into any position in a permuted integer ring $\pi$[0,K-1] that corresponds to any identified respective restricted zone. Each identified respective restricted zone corresponds to a subset of one or more adjacent positions in $\pi$[0,K-1] that, if the respective index were to be placed into any one of the identified respective restricted zones, at least one error sequence of weight less than $d_t$ would become possible in the serially-concatenated code.

Observations Regarding the CI-2 Interleaver

The design of the specific classes of permutation functions implemented by the L=1 constrained interleavers of FIG. 3, is based upon some observations regarding the bit error rate performance of CTBC codes constructed using the CI-2 interleaver. These observations will be used below to develop the CI-3 and CI-4 interleavers. The CI-3 and CI-4 interleavers developed below are used to construct CTBC codes with improved BER performance as compared to CTBC codes constructed using a CI-2 interleaver.

1. The MHD of a CTBC codeword, W[v] is a sum of the distances between non-zero coded bits in u. Starting the count with zero, a string of ones in v begins at the position of each even numbered non-zero coded bit in u and ends at the position immediately before each odd numbered non-zero coded bit in u.

2. The effect of the parameter L on certain key error coefficients of CTBC codes constructed using a CI-2 can be seen directly in equations (2) and (6) of the Fonseka reference [1]. These error coefficients are minimized with respect to L when L=1. When the CI-2 interleaver is used to construct a CTBC code, increasing L leads to higher values of MHD, but also lower values of the interleaver gain. This is because when the CI-2 design matrix, $[A]_{L \times \rho n}$, is read in column-major order to create the sequence u, any two coded bits of any given codeword of the OBC will have a separation of at least L bits in u. However, note that the frame size is K=L$\rho$n, and for fixed values of K, and n, the value of $\rho$ is maximized when L=1. Therefore, decreasing L increases the number of codewords of the OBC, $\rho$, that can be placed on any single row. The interleaver gain, which increases with the number of possible permutations of coded bits in u, thus increases as L is lowered and is maximized when L=1.

3. The inter-row constraints in CI-2 were introduced to ensure that two non-zero codewords of the OBC placed on two different rows of $[A]_{L \times \rho n}$ will cause to be generated a CTBC codeword, v, that has a weight, W[v], that is greater to or equal to the target MHD. With the CI-2 inter-row constraints, when coded bits of a codeword $c_1$ on row i and a codeword $c_2$ on row (i-l) are observed in pairs (with one coded bit from $c_1$ and the other from $c_2$) in the sequence u, the inter-row constraints ensure that only up to K(l) such pairs are allowed have a separation of l in u, for a set of considered/constrained row separations l=1, . . . ,$l_{max}$. Further, the inter-row constraints and the reading of $[A]_{L \times \rho n}$ in column-major order ensure that all remaining pairs have at least a separation of (L-l) in u, up to a maximum $l_{max}$. For example, consider the placement of coded bits of a codeword $c_2$ in u when K(l)=1, for l=1,2, . . . ,$l_{max}$. Then if codeword $c_1$ has a coded bit with a $l \leq l_{max}$ bit separation from a coded bit of $c_2$ in u, the inter-row constraints ensure that the separation between every other coded bit of $c_1$ and every other coded bit of $c_2$ has to be at least (L-l).

4. Additionally, the act of reading the CI-2 design matrix, $[A]_{L \times \rho n}$, in column-major order introduces an inherent constraint. This inherent constraint deals with codewords separated by $l_{max}+1$ rows. In order to understand the inherent constraint, consider a typical example as provided in the Fonseka reference [1] where L is selected as L=2($l_{max}+1$) and ($l_{max}+1$)=$d_t/d_0$ in order to achieve a target MHD of $d_t=d_0^2$. In particular, consider the specific case where $d_0=4$, $d_t=d_0^2=16$, $l_{max}=3$, and L=8.

Given the above example, consider the case where three codewords $c_1$, $c_2$ and $c_3$ of the OBC that have placed into consecutive rows of $[A]_{L \times \rho n}$. When $[A]_{L \times \rho n}$ is read in column major order, if the separation between a coded bit of $c_1$ and a coded bit of $c_2$ on u is one, and the separation between a coded bit of $c_2$ and $c_3$ is also one, then the row-column structure of $[A]_{L \times \rho n}$ ensures that the separation between any coded bit of $c_1$ and a coded bit of $c_3$ has to be at least 2. Similarly, when L=8 and $l_{max}+1=4$, if $c_1$, $c_2$, $c_3$ and $c_4$ are codewords of the OBC are placed on consecutive rows of $[A]_{L \times \rho n}$, then the minimum possible separation between each $\{c_i, c_{(i+1)}\}$, i=1 . . . ,3 is one, and the minimum possible separation between $c_1$ and $c_3$ and $c_2$ and $c_4$ is at least two.

If it happens to be that the actual minimum separation between coded bit pairs in codewords $c_1$ and $c_3$, and the actual minimum separation between coded bit pairs in $c_2$ and $c_4$ are both 2, then the minimum separation between coded bit pairs in $c_1$ and $c_4$ will have to be at least 3. Due to the row-column structure of a CI-2, when K(l)=1 for l =1, 2, . . . ,$l_{max}$, this inherent constraint prevents the generation of coded sequences v with weight less than $d_t$ from three through $l_{max}$ number of codewords of the OBC. This inherent constraint ensures the minimum weight of coded sequences v generated by three through $l_{max}$ codewords of the OBC is dependent on L since all remaining n-1 pairs of coded bits have at least a separation of (L-l) in u. However, the minimum weight of sequences of v generated by ($l_{max}+1$) codewords of the OBC is independent of L. The act of (implicitly) reading of the row-column matrix structure of $[A]_{L \times \rho n}$, in column major order adds in this inherent constraint that is not explicitly called out as a separate constraint in the Fonseka reference [1], or in U.S. Pat. Nos. 8,537,919 and 8,532,209.

5. CI-2 is structured to maintain the same MHD for all codewords of the concatenation regardless of whether they are generated by one non-zero codeword of the OBC or whether they are generated by combinations of two or more non-zero codewords of the OBC. Observe that different categories (subsets) of CTBC codewords, {v} can be defined in terms of the number of codewords of the OBC that combine to form a potentially low weight CTBC codeword, v, at a given distance, d. Further, observe that the interleaver gain of CTBC codewords in each different category of codewords has a corresponding different category-level error coefficient.

To understand this further, note that the asymptotic bit error rate (BER) of any CTBC code is determined by the error contributions of the codewords according to $$P_e \approx \sum_d A_d \times P(d, \gamma_b) \qquad (4)$$

where $A_d$ is the error coefficient of the corresponding weight d codewords, and $P(d,\gamma_b)$ is the probability of decoding in favor of a CTBC codeword with a weight d error sequence at a bit signal to noise ratio of $\gamma_b=E_b/N_0$. As per Lemma 1 of the Fonseka reference [1], CTBC codes can be designed with a CI-2 to eliminate the error contributions in equation (4) associated with all CTBC codewords having weights d which are below a selected target MHD, $d_t$. At the same time, the $A_d$ values of the remaining terms in equation (4) can be reduced to be close to the $A_d$ values associated with uniform interleaving. This simultaneous elimination of the lower weight error terms in equation (4) and the reduction of the remaining $A_d$ values allows powerful CTBC codes to be constructed starting from simple component codes. However, it is further observed here that the individual $A_d$ values at each given distance, d, can also be sub-divided down to a finer granularity by considering different categories of codewords that have the same distance, d, but different error coefficients.

6. CI-2 is structured to maintain the same MHD for all codewords of the concatenation regardless of their category, i.e., whether they are generated by one or two or more non-zero codewords of the OBC. Observe that the final bit error probability of (1) can be lowered by using different values of $d_t$ for different categories of codewords. For example, if the error coefficient for a certain category of codewords is much less than the error coefficient for another category of codewords, the error probability of equation (4) can be lowered by using a higher $d_t$ value for the category of codewords with the much lower error coefficient. This is because the number of possible error sequences in the category of codewords with the much lower error coefficient is much fewer.

7. The standard CI-2 construction treats any combination of $d_0$ non-zero coded bits of a codeword of the (n,k) OBC as a codeword whether or not that combination is actually a codeword. Observe that the actual number of codewords of the OBC with weight $d_0$ is usually lower than the total possible number of permutations of the $d_0$ non-zero coded bit positions of each codeword position, cj. Hence, many combinations of one or more codewords, each containing $d_0$ non-zero coded bits, will not actually correspond to valid combinations of one or more codewords of the OBC. Such invalid combinations should be ignored to increase interleaver gain whenever possible.

CI-3 Interleaver Constraints to Meet a Target MHD

A CI-3 interleaver is defined in accordance with a set of Constraints 1-4 as defined in this section. Constraints 1-4 provide similar restrictions as the CI-2 constraints, but do so in a manner so as to avoid the use of the CI-2 design matrix, $[A]_{L \times \rho n}$. This allows the use of L=1 and thus allows CTBC codes to be constructed with higher interleaver gains than can be achieved with a CI-2 interleaver. Just like the CI-2, constraints 1-4 can be used to achieve a target MHD, $d_t$, as high as $d_t = d_0^2$. In the next section, an additional constraint, Constraint 5, is defined that also allows even higher target MHDs to be reached than is possible with CI-2 interleavers.

To start, a parameter $s_1$ is defined to identify a spacing requirement between coded bits of a single non-zero codeword of the OBC. All of Constraints 1-5 put constraints directly in the sequence u without the use of $[A]_{L \times \rho n}$. The parameter $s_1$ performs a similar function as L in the CI-2 interleaver, but defines a separation requirement directly applied to the coded bit positions of codewords as opposed to defining the number of rows of the CI-2 design matrix.

Constraint 1: Constraint 1 is used to prevent low distance error events/sequences from occurring among a first category of CTBC codewords, denoted $\phi_1$, generated as $v = G[u] = G[\pi[c]] \epsilon \phi_1$, where c consists of a single non-zero codeword of the OBC having the minimum weight $d_0$. Constraint 1 ensures that any two coded bits of every codeword of the OBC must have at least a separation of $s_1$ positions between them on u, where $s_1$ is chosen to satisfy:

$$s_1 \geq \begin{cases} \frac{2d_t}{d_0}, & d_0 \text{ is even} \\ \frac{2d_t}{d_0 - 1}, & d_0 \text{ is odd} \end{cases} \quad (5)$$

With this constraint, the resulting sequence $v \epsilon \phi_1$ will contain $\lceil d_0/2 \rceil$ segments of all ones, and each such segment will have at least weight $s_1$. Therefore, $W[v] \geq \lceil s_1 * d_0/2 \rceil \geq d_t$.

Constraint 1 can be easily handled using the pre-selected value of $s_1$. For example, when finding a position for a coded bit (nj+t) of a codeword of any codeword position, $c_j$, all positions within $s_1$ locations in u away from any already positioned coded bits, $\pi(nj+t)$ for $t \in \{0, \ldots n-1\}$, of that codeword correspond to restricted locations in the vector u where the bit (nj+t) cannot be placed. The term "restricted zone" is used herein to denote the set of restricted locations in the vector u where the bit (nj+t) cannot be placed. The interleaver gain associated with codewords in category 1 is the lowest relative to all the other categories of codewords discussed in this section. This is because there are more ways to generate codewords in category 1 than any other category identified herein.

Constraint 2: Constraint 2 is used to prevent low distance error events/sequences from occurring among a second category of CTBC codewords, denoted $\phi_2$, generated as $v = G[u] = G[\pi[c]] \epsilon \phi_2$, where c consists of two non-zero codewords of the OBC, each having the minimum weight $d_0$. Constraint 2 ensures that, if a coded bit of any codeword position $c_j$ and a coded bit of any other codeword position $c_{j1}$ have a spacing of exactly $(l_{max}+1)$, then all other coded bits of $c_j$ must have a separation of at least $(l_{max}+1)$ positions from every other coded bit of each codeword position $c_{j1}$ on u. The parameter, $l_{max}$, is chosen to satisfy $(l_{max}+1) = \lceil d_t/d_0 \rceil$. With this constraint, the resulting sequence $v \epsilon \phi_2$ will have $d_0$ segments of ones, each with weight of at least $(l_{max}+1) = \lceil d_t/d_0 \rceil$. This ensures that $W[v] \geq (l_{max}+1)d_0 \geq d_t$.

Constraint 2 can be handled by storing a list of pairs of codewords positions $(c_j, c_{j1})$ that have a coded bit of $c_j$ and a coded bit of $c_{j1}$ separated by exactly $(l_{max}+1)$ positions. When finding a position for a coded bit of of $c_j$, if $c_j$ happens to be on that list coupled with $c_{j1}$, all positions within $(l_{max}+1)$ from the remaining coded bit positions of $c_{j1}$, need to be added to the restricted zone. Note that if they are all bigger, then there is no constraint.

The impact of the inter-row constraints related to rows i and (i-1) which is defined using k(l) in traditional CI-2 is to ensure that (a) coded bits of a codeword $c_1$ can pair up with only up to k(l) number of pairs with coded bits of a codeword $c_2$ on u, where a pair is formed by a coded bit of $c_1$ and a coded bit of $c_2$ at a separation of l, and (b) while all remaining pairs of coded bits of $c_1$ and $c_2$ maintain at least a separation of (L-1), for $l=1,2,\ldots l_{max}$, where, $l_{max}$ is found according to $d_0(l_{max}+1) \geq d_t$. In SRCI constraint 2, the same $l_{max}$ value as in traditional CI-2 is used. Preserving the same impact, inter-row constraints of SRCI can be enforced as: (a) no more than k(l) number of pairs of coded bits from any two codewords $c_1$ and $c_2$ are allowed to have a separation of l or less on u, and (b) if $l_\alpha (\leq k(l))$ number of pairs have separations, $l_1, l_2, \ldots, l_{l\alpha}$, (where each $l_x \leq l$, $x=1,2, \ldots, l_\alpha$, then all remaining pairs need to have a separation of more than $$\left\lceil \left( d_t - \sum_{p=1}^{l_\alpha} l_p \right) / (d_0 - l_\alpha) \right\rceil,$$

for all $l=1,2,\ldots l_{max}$.

Constraint 3: Constraint 3 is used to prevent low distance error events/sequences from occurring among a third category of CTBC codewords, denoted $\phi_3$, generated as $v = G[u] = G[\pi[c]] \epsilon \phi_3$, where, similar to Constraint 2, c consists of two non-zero codewords of the OBC, each having the minimum weight $d_0$. Constraint 3 ensures that, if the two nearest coded bits of a codeword position $c_j$ and a coded bit of a codeword position $c_{j1}$ have a separation of $l < (l_{max}+1)$, then only up to a total of K(l) (<d0) such pairs of coded bits of $c_j$ and $c_{j1}$ may have the separation of less than $(l_{max}+1)$, and all the rest of the (n-K(l)) coded bits of $c_j$ must have a separation of at least $s_2(l) = (s_1-l)$ positions from every other coded bit of $c_{j1}$. In the selection of K(l) values, $l=1, 2, \ldots, l_{max}$, note that the lowest weight category 3 CTBC codewords will consist of (a) K(l) number of segments each with weight between l and $l_{max}$ and (b) $(d_0-K(l))$ number of additional segments, each with weight of at least $s_2(l) = (s_1-l)$. Hence, to assure $W[v] \geq d_t$, K(l) is selected to ensure that $lK(l) + (d_0-K(l))s_2(l) \geq d_t$. Equivalently, K(l) is selected as $$K(l) < \frac{d_0(s_1 - l) - d_t}{s_1 - 2l}, l = 1, 2, \ldots, l_{max}. \quad (6)$$

In the case K(l)=1 for $l=1,2,\ldots,l_{max}$, when a coded bit of a codeword position $c_j$ is l $(\leq l_{max})$ positions away from a coded bit of $c_{j1}$, every remaining coded bit of $c_j$ has to be positioned at least $(s_1-l)$ positions away from every other coded bit of $c_{j1}$. The case K(l)=1 for $l=1,2\ldots,l_{max}$, with the introduction of constraint 4 below, can generate powerful concatenations with MHD values of $d_t = d_0^2$ as discussed in the Fonseka reference [1].

Constraint 3 can be implemented by checking to see that if a coded bit of codeword position $c_j$ and a coded bit of codeword position $c_{j1}$ have a separation of l, then when finding a position for a coded bit of $c_j$, all positions within $(s_1-l)$ away from already placed other coded bits of $c_{j1}$ should be designated as restricted zones.

Constraint 4: Constraint 4 is used to prevent low distance error events/sequences from occurring among a fourth category of CTBC codewords, denoted $\phi_4$, generated as $v=G[u]=G[\pi[c]]\epsilon\phi_4$, where c consists of 3, ..., $(l_{max}+1)$ non-zero codewords of the OBC. Constraint 4 ensures that, if a set of codewords $c_{j\_h}$, h=1,2, ..., p for each $p \leq (l_{max}+1)$ are placed on u in such a way that the minimum separation between two coded bits of $c_{j\_h}$ and $c_{j\_h+1}$ is one for h=1,2, ..., (p-1), then the minimum separation between every coded bit of $c_{j\_h}$ and every coded bit of $c_{j\_h+2}$ has to be at least 2 for h=1,2, ... (p-2). In addition, once the coded bits are randomly placed, if they are placed in such a way that the actual minimum separation of coded bits of codewords $c_{j\_x}$ and $c_{j\_x+y}$ is y for y=2,3, ... s, x=1,2, ...,$(l_{max}+1-y)$, $s+x<(l_{max}+1)$, then the minimum spacing between every coded bit of $c_{j\_x}$ and $c_{j\_(x+y+1)}$ has to be at least (y+1).

Constraint 4 is designed to implement the inherent constraint discussed above in connection with CI-2, but can be used when L=1, i.e., there is no CI-2 design matrix, $[A]_{L \times \rho n}$, that is read in column-major order. With Constraint 4 as stated above, if the minimum separation of coded bits of codewords 1 and 2, codewords 2 and 3, and codewords 3 and 4 are all one, and the minimum separation of coded bits of codewords 1 and 3, and codewords 2 and 4 (each of which should be at least 2) happens to be actually 2, then the minimum separation of coded bits of codewords 1 and 4 has to be at least 3. Constraint 4 thus makes the L=1 implementation function like a standard CI-2 where the reading of $[A]_{L \times \rho n}$ in column major order automatically/inherently adds in the above-mentioned inherent constraint.

Constraint 4 can be efficiently implemented by monitoring neighboring codewords of every coded bit on u. Let us identify the n-bit codewords by their identification numbers, $c_j$, for j=0, ..., $\rho-1$. For each codeword $c_j$, for j=0, 1, ..., $\rho-1$, and for each s=1,2, ...,$(l_{max}+1)$, prepare a respective list of neighboring codewords, $Ln_j(s)$ whose list entries identify all of the neighboring codewords of $c_j$ in u that have a coded bit at a minimum separation of s relative to any of the n coded bits of the codeword $c_j$. Note that each of these lists is an array with at most 2n entries. Once the sequence u starts to fill up, these lists of neighbors begin to fill up to their maximum value of at most 2n entries. When selecting a position for a coded bit position (nj+t) of codeword position, $c_j$, the lists $Ln_j(s)$ are consulted. Suppose that $c_{jx}$ is an entry of $Ln_j(1)$, and $c_{jy}$ is an entry of $Ln_{jx}(1)$. Then mark as a restricted zone one position around each coded bit of codeword $c_{jy}$ when placing coded bit position (nj+t).

When K(l)=1 for l=1,2, ...,$l_{max}$, Constraint 4 prevents the generation of coded sequences v with weight less than $d_t$ from three through $(l_{max}+1)$ number of codewords of the OBC. Together, Constraints 1-4 ensure the minimum weight of coded sequences v generated by three through $l_{max}$ codewords of the OBC is dependent on $s_1$. However, the minimum weight of sequences of v generated by $(l_{max}+1)$ or more codewords of the OBC is independent of $s_1$. The minimum weight generated by a combination of $(l_{max}+1)$ codewords of the OBC can be found by considering the worst case placement of coded bits of $(l_{max}+1)$ codewords when placed in accordance with Constraints 1-4. As discussed in Lemma 1 of the Fonseka reference [1], the minimum weight of sequences of v generated by $(l_{max}+1)$ or more codewords of the OBC limits the MHD that is achievable by CTBC code constructed with a CI-2 to be $d_t=d_0^2$. Constraints 1-4 can be used to generate concatenations with MHD $d_t \leq d_0^2$ but now with a higher interleaver gain since L=1.

Furthermore, note that when L=1 and Constraints 1-4 are applied as described above, the worst case placement of $(l_{max}+1)$ weight $d_0$ codewords of the OBC creates the following sequences of ones in v: one sequence with weight $d_0$, two sequences with weight $(d_0-1)$ and so on up to $d_0$ sequences of ones with weight 1. Therefore, the worst case weight generated by $(l_{max}+1)$ codewords is, $$\sum_{i=1}^{d_0}[i(d_0-i+1)] = d_0(d_0+1)(d_0+2)/6. \quad (7)$$

Note that the resulting MHD is thus $d_t=d_0(d_0+1)(d_0+2)/6$, and this is greater than $d_0^2$ for $d_0>2$. However, to reach this target MHD greater than $d_0^2$ it is necessary to also satisfy Constraint 5 as provided in the next section to prevent the generation of any additional low weight error sequences that can give rise to a coded sequence v with weight less than $d_t=d_0(d_0+1)(d_0+2)/6$ that can arise from combinations of $2d_0$, $(2d_0+1)$, ..., $\lfloor 2d_t-1)/d_0 \rfloor$ codewords of the OBC.

That is, if only Constraints 1-4 are applied, the resulting CI-3 interleaver can be designed to achieve the MHD that is achievable by CTBC code constructed with a CI-2, i.e., $d_t=d_0^2$. Constraint 5 can additionally be enforced in order to reach $d_t=d_0(d_0+1)(d_0+2)/6>d_0^2$. This causes the relatively few additional possible error sequences due to combinations of up to $\lfloor 2d_t-1)/d_0 \rfloor$ codewords to be eliminated by preventing the generation sequences with weight between $d_0^2$ and $d_t=d_0(d_0+1)(d_0+2)/6$.

A CI-3 interleaver can also make use of Constraint 5 be to provide still higher MHDs, i.e., with $d_t>d_0(d_0+1)(d_0+2)/6$. To do this, the Constraints 1-4 are applied as outlined above, and Constraint 5 is applied using the CI-4 design approach of the next section, using a selected target MHD, $d_t>d_0(d_0+1)(d_0+2)/6$. This mixed CI-3/CI-4 interleaver can reduce the size of the restricted zones as compared to the straight CI-4 interleaver design approach described below that can reach the same target MHD. This can provide increased interleaver gain and make it easier to find CI-3 interleavers as compared to a CI-4 interleaver designed at a selected target MHD. Hence it is to be understood that CI-3 interleavers with $d_t>d_0^2$ and even $d_t>d_0(d_0+1)(d_0+2)/6$ can be constructed by additionally applying the CI-4 design approach of the next section, but also enforcing any restricted zones from Constraints 1-4 at the same time. Once Constraints 1-4 are enforced, the restricted zones that arise due to Constraint 5 will be greatly reduced, thereby shifting a large load of restricted zones from the Constraint 5 to Constraints 1-4. Since Constraints 1-4 are more restrictive than Constraint 5, when applied along with Constraint 5, they will tend to make it easier to find CI-4 solutions and to potentially lower increase interleaver gain due to a smaller number of restricted zones when compared to applying CI-4 on its own.

As mentioned in observation 6 of the CI-2 as discussed above, it is possible to use different values for the target MHD, $d_t$, for different categories of codewords. The categories of codewords whose category-level error coefficient is lowest, for example, can use a lower MHD value to cause the overall probability of error in (1) to be lowered. This use of multiple target MHD's is applied similarly in both of the CI-3 and CI-4 interleaver designs, so the multiple target MHD versions of the CI-3 and CI-4 interleavers will be described after the CI-4 interleaver is developed.

CI-4 Interleaver Design Approach to Meet a Target MHD

In the CI-4 interleaver design approach, the coded bits of codewords of the OBC are pseudo-randomly placed directly into the sequence u in such a way as to maintain a target MHD, $d_t$ of a concatenation of non-zero codewords. The CI-4 interleaver is designed to be as close to a uniform interleaver as possible while simultaneously maintaining the MHD at $d_t$. In the raw CI-4 approach, there is only one constraint, namely constraint 5. Interleavers that only use Constraint 5 are called CI-4 interleavers. Interleavers that use one or more of Constraints 1-4 and additionally enforce Constraint 5, are called mixed CI-3/CI-4 interleavers.

Constraint 5: Constraint 5 requires that the coded bits of combinations of an integer number, $N_c$, of nonzero codewords of the OBC are positioned in u such that $W[v] \geq d_t$, for some specified target MHD, $d_t$, where $v=G[u]=G[\pi[c]]$ is the CTBC codeword generated from the combination of codewords of the OBC in c.

In CI-4 interleavers, different categories of CTBC codewords that correspond to different types of error sequences are denoted, $\phi_m^{(CI-4)}$, m=1, ... ,$N_c$. The category $\phi_m^{(CI-4)}$ includes all weight d CTBC codewords formed by a combination of m>$N_c$ non-zero codewords of the OBC with the minimum weight $d_0$. In mixed CI-3/CI-4 interleavers, all of the categories of codewords discussed in connection with the CI-3 interleaver can exist, and additionally, the categories $\phi_m^{(CI-4)}$, m=1, ... ,$N_c$ are defined. If there is any overlap between the CI-3 categories and the CI-4 categories, the CI-3 categories take precedence and any remaining combinations of codewords that are not already accounted for by a CI-3 category are accounted for in the CI-4 categories. With this definition, no single CTBC codeword can fall into more than one category.

To understand how Constraint 5 can be implemented, consider the example where the OBC is an (8,4) Hamming code and the IRCC is an accumulator. Table 1 enumerates the 16 different codewords of the (8,4) extended Hamming code. Note that 14 of these codewords have weight $d_0$=4, one has weight 8, and one has weight zero. Next recall that the vector c contains codeword positions $c_j=(c_{j1},c_{j2}, \ldots c_{jn})$, for j=0,2, ..., ρ−1. To start, consider the case where Nc=1, so that only one non-zero codeword need be considered. Let $\alpha_1 < \alpha_2 < \alpha_3 < \alpha_4$ be the ordered set of indices of where the four ones of a corresponding weight $d_0$=4 codeword are placed into u by the permutation, π. Then v=G[u] will have all zeros, except for a string of ones starting at $\alpha_1$ and terminating at $\alpha_2$, and another string of ones starting at $\alpha_3$ and terminating at $a_4$. Hence for this codeword, Constraint 5 will require that all 14 of the weight $d_0$=4 codewords in Table 1 satisfy $W[v]=(\alpha_2-\alpha_1)+(\alpha_4-\alpha_3) \geq d_t$. Constraint 5 will require also that $W[v]=(\alpha_2-\alpha_1)+(\alpha_4-\alpha_3)+(\alpha_5-\alpha_6)+(\alpha_7-\alpha_8) \geq d_t$ is satisfied by codeword #16 in Table 1 and whose eight ones are placed on the ordered set of indices in u, $\alpha_1 < \alpha_2 < \alpha_3 < \alpha_4 < \alpha_5 < \alpha_6 < \alpha_7 < \alpha_8$.

TABLE 1

| (8,4) Hamming Codewords | |
|---|---|
| 1) | [00000000] |
| 2) | [10001011] |
| 3) | [01001101] |
| 4) | [00100111] |
| 5) | [00011110] |
| 6) | [11000110] |
| 7) | [10101100] |
| 8) | [10010101] |
| 9) | [01101010] |
| 10) | [01010011] |
| 11) | [00111001] |
| 12) | [11100001] |
| 13) | [11011000] |

TABLE 1-continued

| (8,4) Hamming Codewords | |
|---|---|
| 14) | [10110010] |
| 15) | [01110100] |
| 16) | [11111111] |

The above expressions for W[v] form sums based upon "pairs" of indices of where the ones of a corresponding codeword of the OBC are located in the vector u. The locations of the ones that make up the pairs are identified starting from left to right in u. These pairs are important, because they each give rise to a respective string of ones in the vector v. Each string of ones in v begins at the location of the first one in each pair and ends at the location right before the second one in each pair of ones in u. In the above expressions for W[v], the weight $d_0$=4 codeword has pairs given by $(\alpha_1,\alpha_2)$ and $(\alpha_3,\alpha_4)$, and the weight 8 codeword has pairs given by $(\alpha_1,\alpha_2)$, $(\alpha_3,\alpha_4)$, $(\alpha_5,\alpha_6)$, and $(\alpha_7,\alpha_8)$. A "doublet" is defined as a pair that generates weight one in v, e.g., the ordered indices $\alpha_1$, and $\alpha_2$ form a doublet if $(\alpha_2-\alpha_1)=1$. The condition that Constraint 5 avoids, i.e., $W[v] < d_t$, can generally occur due to formation of low weight pairs, and in the worst case, doublets.

Note that when bit (nj+t) of the vector c is placed into a location π(nj+t) on u to maintain $W[v] \geq d_t$ for all combinations of i=1,2, ... , $$N_c = \left\lfloor \frac{2d_t}{d_0} \right\rfloor,$$

(i.e., 2dt/$d_0$ for the case where $d_0$ is odd, and 2dt/$d_0$ rounded down to the nearest integer for the case where $d_0$ is odd) number of the codewords, then additionally, all combinations of a total of Nx>Nc number of codewords of the OBC with $c_j$ will also satisfy $W[v] \geq d_t$. This is the case because when there are total of $$N_c = \left\lfloor \frac{2d_t}{d_0} \right\rfloor$$

codewords, each with the minimum weight $d_0$, this combination of codewords generates at least a total of $d_0 Nc = d_0 \lfloor 2d_t/d_0 \rfloor = 2dt$ ones in u. In the worst case, each of these ones will pair up to form $2d_t/2 = d_t$ doublets u, each generating a weight of 1 in v, therefore $W[v] > d_t$. Increasing Nx beyond Nc can only increase W[v] beyond this worst case value. Also, if higher weight codewords are involved, this also will only increase W[v] beyond the worst case value.

The paragraph above shows that when Constraint 5 is implemented by checking all combinations of only up to Nc=$\lfloor 2dt/d_0 \rfloor$ number of non-zero codewords of the OBC, that $W[v] \geq d_t$ will satisfied for all possible combinations of nonzero codewords in c. Additionally, note that if the target MHD of the CTBC codeword, v, is $d_t$=20 and the MHD of the OBC is $d_0$=4, then Nc=$\lfloor 40/4 \rfloor$=10, while if $d_t$=16, then Nc=$\lfloor 32/4 \rfloor$=8. That is, the higher the target minimum distance, $d_t$, of the CTBC codeword v relative to the MHD of the OBC, $d_0$, the more combinations of codewords, Nc, need to be considered to maintain $W[v] \geq d_t$.

The permutation π can be built up sequentially. For example, each bit for t=0,2, ... 7 of any coded bit position within the codeword position, $c_j$, in c, can be "placed" one bit at a time. The term "placed" is action of identifying that a bit location nj+t in c will be permuted to a location $\pi$(nj+t) in u. A codeword such as codeword #13 in Table 1 is said to have been "completed" once enough coded bits of $c_j$, have been placed into u to allow all of the ones of the completed codeword to appear on u. For example, coded bit positions 0, . . . ,3 of the codeword position, $c_j$, can be mapped to any set of permutated locations, $\pi$(nj+0), . . . ,$\pi$(nj+3) without the possibility of having any weight $d_0$=4 codeword of the OBC of Table 1 complete. This is because [1 1 1 1 0 0 0 0] or any other 8 bit sequence with fewer than 4 ones in the first four positions is not a codeword of the (8,4) OBC as can be seen from Table 1. However, when the fifth bit of the codeword position, $c_j$, is mapped to $\pi$(nj+4), then all of the ones needed to complete codeword #13, i.e., [1 1 0 1 1 0 0 0] will have been mapped from codeword position, $c_j$, to u. In general a maximum of, $\mu$ number of bits can be placed from a given codeword position, $c_j$, without completing any codeword of the OBC. Checks to ensure that Constraint 5 is satisfied must be made when placing the remaining n-$\mu$ coded bits of $c_j$.

For the (8,4) OBC of Table 1, $\mu$=4. Hence, a suitable ordering of t$\in$\{0, . . . 7\} can be selected to allow a maximum of $\mu$=4 coded bit positions to be placed into u freely and without restriction. The remaining n-$\mu$=4 coded bit positions from each codeword position need to be checked to ensure Constraint 5 is satisfied. Note that the process of "placing" coded bits involves finding, one by one, a permuted ordering of the coded-bit locations in c to define the corresponding permuted ordering of coded bit positions in the vector u.

The CI-4 interleaver design process can be started off by pseudo-randomly selecting and placing $\mu$*$\rho$ coded bits that can be placed in u without any restriction. Next, the CI-4 process can proceed by randomly selecting a remaining coded bit in c, one at a time to be placed into the sequence u. At this point codewords will start to complete and care should be taken to ensure that Constraint 5 is satisfied. Note that in a brute force approach, there would be a large number of combinations of the OBC to consider to ensure that Constraint 5 is satisfied. This number of combinations $\sum_{n_j=1}^{N_c} \binom{P}{n_j}$ is very large, especially at higher values of $\rho$. The CI-4 interleaver design algorithm presented below reduces the complexity greatly by only evaluating the relatively few codeword combinations that can potentially give rise to low weight CTBC codewords, v. In the process of sequentially placing the coded bits of codeword positions $c_j$=($c_{j1}$, $c_{j2}$, . . . $c_{jn}$), for j=0,1,2, . . . , $\rho$-1, consider the placement of a coded bit of codeword position $c_j$ on u that will end up completing one or more valid codewords in Table 1. At the point in time of placing each coded bit, it is assumed that any and all of the previously placed coded bits were placed into u in such a way as to meet Constraint 5. This condition is clearly met after placing the first $\mu$*$\rho$ coded bits as described above, but from then forward, additional care needs to be taken to avoid placing any bit in a "restricted zone," i.e., into any range of one or more locations that would cause Constraint 5 to be violated. As u fills up beyond the first $\mu$*$\rho$ coded bits, a list L of already completed codewords is preferably maintained which includes the identification numbers in Table 1 of each completed codeword along with the positions of their respective coded bits in u. By the end of the CI-4 interleaver design process, the list L will have grown to include $\rho$*$2^k$ entries, containing all codewords of the OBC mapped from all of the codeword positions, $c_j$=($c_{j1}$,$c_{j2}$, . . . $c_{jn}$), for j=0,1,2, . . . , $\rho$-1.

Once $\mu$ bits from codeword position $c_j$, have already been placed, when placing a "current coded bit" position (nj+t) of the "codeword position $c_j$, t$\in$\{0, . . . 7\}, care needs to be taken to assure that Constraint 5 is met for each codeword in Table 1 that completes upon this bit's placement. That is, for each of the codewords that complete, in accordance with Constraint 5, identify any restricted zones in u where coded bit (nj+t) cannot be placed due to the codewords that currently complete due to the placement of bit (nj+t). In addition, combinations of other already completed codewords from other codeword positions other than $c_j$ need to be considered to determine if additional restricted zones in u exist due to combinations of the currently completing codeword(s) with other already completed codewords from different codeword positions, e.g., $c_{j2}$.

Figure 4A:
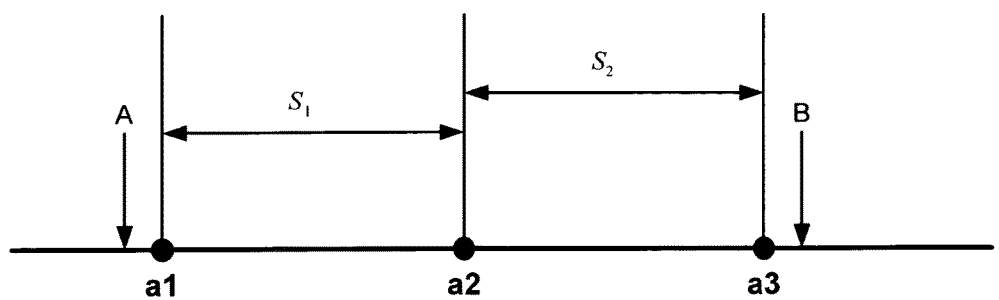
FIG. 4A illustrates how the act of placing a next bit of a single codeword can give rise to a restricted zone.

Consider the example of FIG. 4A where placing a new bit of a single non-zero codeword into u is considered. Define the set $S_1$ to be the set containing the already placed bits of each codeword on the list L that will complete when the currently being placed bit, (nj+t), is placed. As shown in FIG. 4A, for the (8,4) OBC as enumerated in Table 1, there will be $d_0$−1=3 ones of any such a codeword that will be completed, are already placed for any given weight $d_0$ codeword in the set S1. The indices of the already placed ones of the completing codeword can be reordered as $\alpha_1$ <$\alpha_2$ . . . <$\alpha_{d0-1}$. In the $d_0$=4 example of FIG. 1, this is $\alpha_1$<$\alpha_2$<$\alpha_3$. Also shown in FIG. 1 are the "separations," $S_1$ and $S_2$, that exist between the already placed ones of the weight $d_0$ codeword in Table 1 that will complete once bit (nj+t) is placed into u. A worst case condition occurs when the currently being placed bit is mapped to location "A" in FIG. 4A, forming a doublet with $\alpha_1$, leading to W[v]=1+$S_2$. Similarly if the currently being placed bit is mapped to location "B" in FIG. 4A, forming a doublet with $\alpha_3$, then W[v]=1+$S_1$. If the currently being placed bit is mapped to form a doublet on either side of $\alpha_2$, then W[v]=$S_1$+$S_2$−1. In general the odd numbered indices give rise to the worst case conditions and the even numbered indices need not be evaluated separately to identify the restricted zones. Algorithm 1 as described below can be used to find any restricted zones for placing the bit (nj+t) at a location $\pi$(nj+t) in u. When it is desired to identify restricted zones based on a currently completing weight $d_0$ codeword by itself, Algorithm 1 below is called with a "positions vector," given by p=[$\alpha_1$, . . . $\alpha_{d0-1}$]. The positions vector, p, is an ordered set of indices where the streams of ones in v will potentially begin and terminate. In the example of FIG. 4A, p=[$\alpha_1$, . . . $\alpha_3$]. Because the number of elements in p is odd, no adjustment (as discussed below) is needed, so set p_adj=p and call Algorithm 1 with p_adj and LengthP$_{\_adj}$=3.

Algorithm 1 Given that $d_r$, p_adj and LengthP_adj have been specified:

1. Set local variables, p=p_adj and LengthP=LengthP_adj.
2. For i=1, . . . , LengthP, compute $S_i$=[p(i+1)−p(i)].
3. Initialize $$S_0 = 0,\ X(1) = 0,\ Y(1) = \sum_{i=2, (even\ i)}^{LengthP} S_i.$$

4. For i=1,3,. . . LengthP, (odd i):
   a. X(i+1)=X(i)+$S_{i-1}$
   b. Y(i+1)=Y(i)−$S_{i+1}$.

5. Compute $w(i)=d_r-X(i)-Y(i)-1$ for $i=1,3,\ldots$ LengthP, (odd i).

6. If $w(i)\leq 0$, there are no restrictions on either side of $p(2i-1)$.

7. If $w(i)>0$, restrictions are needed around $p(2i-1)$. If $w(i)$ extends up to or beyond the next or previous element of q, then the restricted zone is the entire region between $p(2i-1)$ and the near-by element. If $w(i)>0$ and $w(i)$ does not extend up to a near-by element of p on one or both sides, a window of width $w_{RZ}=w(i)$ of $p(2i-1)$ identifies a restricted zone in the direction(s) where there is no near-by element.

Figure 4B:
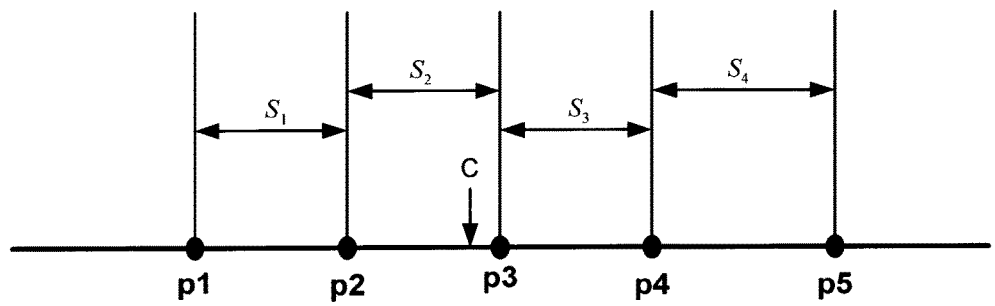
FIG. 4B illustrates how the act of placing a next bit of a codeword can give rise to a restricted zone in a combination of one or more codewords.

To better understand Algorithm 1, consider FIG. 4B. Note that when the new bit is placed at $C=\pi(nj+t)$, forming a doublet with $p(3)$, that $W[v]=S_1+1+S_4$. In Algorithm 1, the $X(i)$ terms account for the preceding odd numbered distances and the $Y(i)$ terms account for the succeeding even numbered distances when considering the placement of the new bit near an interior odd-numbered point like $p(3)$. Only the odd-indexed values in $p(i)$, e.g., $p(2i-1)$ need to be checked for troublesome areas to place the new bit on u. The even numbered p-indices are less important because a stream of ones in v ends there as opposed to beginning there when $\pi(nj+t)$ is selected to be near an even-numbered p -index.

An adjustment will be needed prior to calling Algorithm 1 for cases when the length of the position vector, p, is even. For example, consider FIG. 4A and 4B, where $p=[\alpha_1, \ldots \alpha_{d0-1}]$, but when $d_0$ is odd. Specifically, suppose that $d_0=3$, in which case, $d_0-1=2$, and LengthP=$d_0-1=2$, and $p=[\alpha_1, \alpha_2]$. To make the adjustment create an "imaginary partner," which, in this example is, $\alpha_{d0}=\alpha_3=\rho n-1$. This imaginary partner is used because a stream of ones in v will start at the location of the $d_0^{th}$ one placed in u and this stream of ones will terminate at the end of vector v, i.e., at the end location, $\rho n-1$. Because of this additional element in p, append this element to p to form p_adj=[p, $\rho n-1$], and LengthP_adj=$d_0=3$. This way, when Algorithm 1 below is called, the adjusted position vector, p_adj, will have an odd number of elements as required by Algorithm 1. This type of adjustment is also made for any combination of codewords that causes the positions vector, p, to have an even number of elements.

Figure 5A:
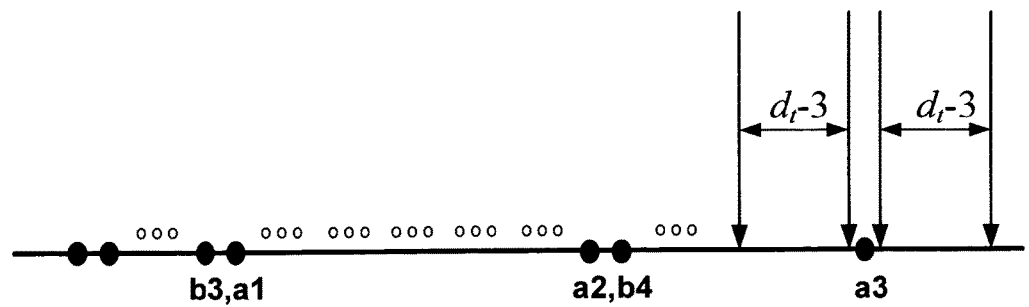
FIG. 5A illustrates an example of how the act of placing a next bit of a codeword can give rise to a restricted zone in a combination of two codewords.

To identify combinations of two codewords that potentially can give rise to low weight vectors, v, again consider the limiting worst case conditions. Assume that an already placed codeword exists whose ordered indices can be written as $\{b_1, b_2, b_3, b_4\}$ as illustrated in FIG. 5A. The information about this already completed codeword will already have been added to the list L at the time this codeword had completed. Similar to FIG. 4A, assume that the currently being placed bit, (nj+t), is to be placed in such a way so as to complete a weight $d_0=4$ codeword of Table 1. Again, the three already placed ones of this codeword have ordered indices, $\{\alpha_1,\alpha_2,\alpha_3\}$. In this example, worst case conditions occur when one or more bits of $\{\alpha_1, \ldots a_3\}$ form doublets with each other and/or with the already placed bits, $\{b_1, b_2, b_3, b_4\}$. As illustrated in FIG. 5A, in the worst case condition, the $2d_0-1$ already placed bits from the two codewords form $d_0-1$ doublets and leave one odd bit out that is not paired up. In this case, a window can be formed around the remaining unpaired bit, e.g., $\alpha_3$, and this window is $w_2=[(d_r-(d_0-1)]$. In the example of FIG. 5A, this window separation between $\alpha_3$ and $\alpha_4$ will ensure that $W[v]=(3+(|\alpha_4-\alpha_3|)\geq d_r$.

In the construction of sets as described in the various paragraphs below, the actions are to be carried out separately and as many times as is needed to account for each codeword that will be completed by placing the coded bit (nj+t). Also, the elements of each set, $S_i$, will generally contain the identities from the list L of each codeword that has already completed and that will be used in a combination with the codeword currently under consideration that will complete due to the placement of coded bit (nj+t). Subsets of such elements are added separately for each codeword that completes due to the placement of coded bit (nj+t). The elements of each set, $S_i$, can be considered to be vectors of (i-1)-tuples of previously completed codewords, where each element of the tuple corresponds to a corresponding already completed codeword on the list L. From each set, $S_i$, can be constructed a corresponding set of position vectors, $\{p\}_i$, which will be evaluated by Algorithm 1 to find any restricted zones due to combinations of each currently completing codeword with already completed codewords on the list L that can potentially form the low-weight combinations that need to be avoided by to satisfy Constraint 5.

The above example regarding FIG. 5A illustrates a more general condition of when an already placed codeword from codeword position $c_{j0}$ needs to be evaluated when placing a bit of a current codeword position $c_j$. A set, $S_2$, is defined to contain all of the completed codewords from other codeword positions, $c_{j0}$, that need to be evaluated when placing a coded bit from current codeword position $c_j$, that causes one or more current codewords to complete. To identify codewords for inclusion in the set $S_2$, check to see if at least one of the already placed ones of an already placed codeword from the list, L, falls within a window of $w_2=[d_r-(d_0-1)]$ bit locations on either side of any of the already placed ones from each codeword to be completed due to the placement of bit (nj+t). Once the set of codewords in the set $S_2$ has been identified, Algorithm 1 can be called to identify all of the restricted zones, if any, for all the identified combinations of codewords in the set $S_2$ with the current codeword being completed by the placement bit (nj+t) into u. If no already completed codewords from the list L were found within the specified windows, $w_2$, around the already placed bits of a selected currently completing codeword, then the $S_2$ will be empty.

In the context of FIG. 5A, a positions vector, p, for the case of two codeword combinations can be formed. Recall that the positions vector is an ordered set of indices where the already placed ones occur. In the example of FIG. 5A, reading the indices in order from left to right, $p=[b_1,b_2,b_3,\alpha_1,\alpha_2,b_4,\alpha_3]=[p_1, \ldots p_{2d0-1}]$. Typically, the worst case condition will not occur, and many of the doublets shown in FIG. 5A will not be doublets but will have separations such as $s_1, s_2, \ldots, s_m$ between them, where in the example of FIG. 5A, $m=2d_0-2$ (the length of the positions vector minus 1, see FIG. 4B). To find the set of restricted locations for the example of FIG. 5A, call Algorithm using the above indicated positions vector, p.

Figure 5B:
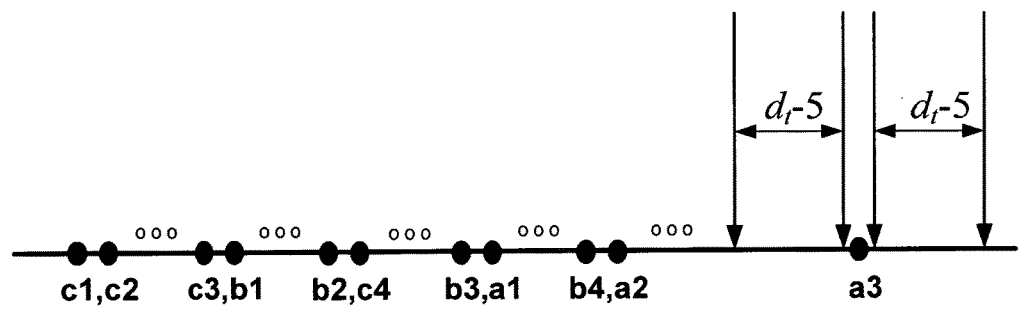
FIG. 5B illustrates an example of how the act of placing a next bit of a codeword can give rise to a restricted zone in a combination of three codewords.

Similarly, FIG. 5B illustrates how windows can be used to capture the potentially problematic combinations of three codewords and identify the restricted zones on u that cannot be used to place the current bit, (nj+t). In the example of FIG. 5B assume that the bits of two already placed codewords are given by $b_1<\ldots<b_4$, and $c_1<\ldots<c_4$, and note that none of the already placed bits $\alpha_1<\alpha_2<\alpha_3$ of the current codeword paired up with any of the ones of the second already placed codeword, i.e., the already placed bits $c_1<\ldots<c_4$. By counting the number of doublets that formed in the worst case type situation for the three codeword case as illustrated in FIG. 5B, the window width when checking for combinations of three codewords the maximum widow size can be lowered to $w_3=[d_r-(3d_0/2)-1)]=[d_r-6-1]=[d_r-5]$ on either side of $\alpha_3$.

In the context of placing a $t^{th}$ bit of a current codeword to satisfy Constraint 5 for combinations of three codewords, define the set, $S_3$, as containing the indices of all the already placed bits of each 2-tuple of two codewords that can potentially form low weight vectors, v, when combined with each codeword that completes when the current bit, (nj+t), is placed. The definition of the set S3 can be considered a next action of an iterative set construction where each element of each set contains the combinations of other already placed codewords that need to be checked in combination with the currently being placed bit of a current codeword. That is, the elements of the set $S_3$ contain the indices of the $2d_0$ already placed ones of the two codewords that need to be checked along with the $d_0-1$ already placed bits of the current codeword. The $d_0-1$ already placed bits of the current codeword can then be appended to each codeword 2-tuple contained in the set S3, and these indices can be sorted to form a set of positions vectors, $\{p\}_3$. The position vectors in $\{p\}_3$ can each be sent to Algorithm 1 with ni=3 to find any restricted zones that come up due to all possible combinations of three codewords. To identify each 2-tuple of codewords to be included in $S_3$, first look for codewords on the list L of completed codewords that fall within the window $w_3$ around already placed bits of each codeword of Table 1 that completes due to the placement of bit (nj+t). Call this set $S_2'$ because it looks like the set $S_2$ but uses the smaller window, $w_3$. For example, in FIG. 5B, bits $b_3$, and $b_4$ are in $S_2'$ because they fall within the window $w_3$ around $\alpha_1$, and $\alpha_2$. Now identify all possible distinct combinations of two codewords in $S_2'$ and include them as 2-tuple elements in the set $S_3$. If there is only one codeword in S2' then do not add any 2-tuples to $S_3$ at this time. If there are no codewords in $S_2'$ stop, because the set $S_3$ (and all higher order sets $S_i$, for i=3, . . . ,Nc) will be empty. Because the 2-tuples will later be sorted along with the already placed bits from the currently being completed codeword, the ordering of the codewords in the 2-tuples does not add new combinations to the set S3. That is, a "distinct tuple" is defined that must differ by at least one codeword on the list L to be considered distinct. Also, a distinct tuple will never include the any given completed codeword from the list L more than once. While the above process identified a subset of the set S3, there are still more elements that need to be looked for possible inclusion in the set $S_3$.

Next consider an additional type of element for possible inclusion in the set S3, called a "chained tuple" of codewords. To understand the concept of chained tuples of codewords, consider the low weight example of FIG. 5B and note that none of $c_1, \ldots, c_4$, fall into the window $w_3$ around any of the already placed bits $\alpha_1, \alpha_2, \alpha_3$. However, $b_3$, and $b_4$ do, and $c_3$ and $c_4$ fall within $w_3$ of $b_1$ and $b_2$. Hence the chained tuple $[(b_1, \ldots, b_4,), (c_1, \ldots, c_4,)]$ needs to be considered when placing the final bit of the currently being completed codeword whose already placed bits are at $\alpha_1, \alpha_2, \alpha_3$.

To identify the chained tuples for possible inclusion into the set S3, perform the following steps for each codeword in the set $S_2'$: 1) Select a current codeword under consideration from the set $S_2'$. 2) Create a new set of windows around each of the coded bit positions in u of the current codeword in $S_2'$ under consideration. 3) For this current codeword under consideration, identify all of the other already completed codewords from the list L that have at least one coded bit positioned within the window, $w_3$. 4) For each such identified codeword from the list L, identify a 2-tuple of codewords consisting of the current codeword under consideration and the newly identified codeword from the list L with at least one bit within the window, $w_3$. For each such tuple found that is not already in the set S3, add it to the set S3. At the end of this process the set S3 will be complete. If no chained tuples were found, no new elements will be added to the set S3. If $S_2'$ only had one element and no chained tuples were found, then the set S3 is empty.

In the context of placing a $t^{th}$ bit of a current codeword to satisfy Constraint 5 for combinations of i>3 codewords, define the set, $S_i$, as containing the indices of all the already placed bits of the (i-1)-tuples of codewords to be considered in combination with a current codeword when placing bit (nj+t) of the current codeword. If the set $S_{i-1}$ is empty, then the set $S_i$ and all subsequent sets will also be empty. In combinations of i codewords, $(i*d_0/2)-1$ doublets can be formed so the worst case window is thus $w_i=[d_r-(i*d_0/2)-1)]$. To identify each (i-1)-tuple of codewords to be included in $S_i$, an iterative process is used that begins by first looking for codewords on the list L of completed codewords that fall within the window $w_{ni}$ around coded bits of the current codeword. Also call this set $S_2'$ because it looks like the set $S_2$ but uses the smaller window, $w_{ni}$. Start by including any and all distinct (i-1)-tuples of codewords in $S_2'$ into $S_i$. If the set $S_2'$ is empty, stop, because the set $S_i$, will also be empty. If the set $S_2'$ contains less than i-1 elements, no (i-1)-tuples of codewords will be formed or added to the set $S_i$ at this time.

Next construct a set $S_3'$. Start by including all of the distinct 2-tuples, if any, of codewords in the set $S_2'$ into the set S3'. As in the construction of the set $S_3$ as previously discussed, next identify chained 2-tuples of codewords using the codeword(s) in $S_2'$ to identify the other potentially existing codewords from the list L within the newly introduced windows of size $w_i$. Add any distinct chained 2-tuples found to the set of $S_3'$. If the set $S_3'$ is empty, stop, because $S_i$, will also be empty. Next form the set $S_4'$ by including any and all distinct 3-tuples formed as combinations of a codeword in $S_2'$ with a 2-tuple in $S_3'$. Next the chaining is applied as discussed in the context of S3 to form chained 3-tuples for further inclusion into $S_4'$. This process of forming tuples and chaining is iteratively continued until the set $S_i$ is reached or until the set $S_i$ is found to be empty. The elements of the set $S_i$ will be (i-1)-tuples of the indices of the locations of the ones of i-1 other completed codewords to be considered in combination along with the indices of the $d_0-1$ already placed ones of the currently being placed codeword.

That is, the elements of the set $S_i$ are used to construct a set of vectors, $\{p\}_i$, where each vector p in this set contains an ordered list of the indices of all of the already placed ones from the current codeword along with the indices of all of the already placed ones from i-1 additional completed codewords that need to be considered in combinations of i codewords to ensure Constraint 5 is satisfied.

Figure 5C:
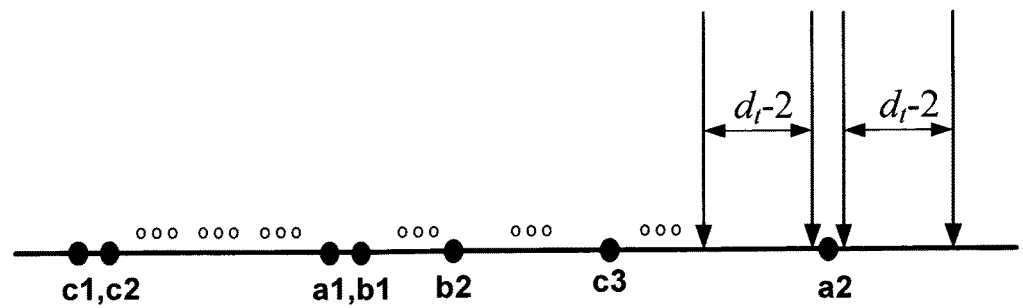
FIG. 5C illustrates an example of how the act of placing a next bit of a codeword can give rise to a restricted zone when the Hamming weight of each of three codeword is an odd number.

As illustrated in FIG. 5C, in the case where $d_0$ is odd, there is another type of condition that can give rise to low weight combinations of codewords. Note that while $\alpha_1$ and $b_1$ form pairs, there are no elements of $\{c_1,c_2,c_3\}$ in the vicinity of the currently being placed codeword, whose already placed ones are located at $\{\alpha_1,\alpha_2\}$. Hence it is possible to randomly place a bit at $\pi(nj+t)$ to avoid the window shown around $\alpha_2$ which was placed in light of $b_1$ and $b_2$, but to place $\pi(nj+t)$ near $c_3$ without restriction. However, a low weight pair $\{a_3, c_3\}$ would cause causes a problem due to the existence of the doublet $\{c_1,c_2\}$. More generally, even when $d_0$ is even, there is a possibility that new low weight combinations can be formed due to chaining from as yet non-analyzed already placed bits located near to the chosen placement point, π(nj+t).

In order to ensure that a situation like that shown in FIG. 5C or the more general case does not happen, the concept of a tentative placement is introduced. That is, in the case where $d_0$ is odd, when a bit is finally randomly placed in accordance with all of the above mentioned checks in order to meet Constraint 5, an additional set of windows, $w_2$, $w_3$, ... $w_{ni}$ whose widths are described above, need to be additionally checked on either side of where π(nj+t) is tentatively placed. Then during these additional checks, any newly identified completed codewords from L should be added to sets S2, S3, etc. Note that if no such codewords are added to S2, then no codewords will be added to any other set as the window widths gradually decrease from $w_2$. If no such codewords are added, accept the tentative position, π($nj_c$+t). If one or more such codewords are found within the newly introduced windows, without placing the coded bit at π(nj+t), repeat the above described process with the newly found combinations that include at least one or more newly added codewords along with the already placed coded bits of the codeword currently being placed. This process can find additional positions to be restricted due to the newly added codewords to the sets $S_2, \ldots S_{ni}$. If the π(nj+t) is not one of the newly restricted positions, accept π(nj+t) and place that coded bit of the currently being placed codeword at π(nj+t). However, if the π(nj+t) happens to be one of the newly restricted positions, then π(nj+t) should be discarded and a new tentative position needs to be randomly identified among the non-restricted and available remaining locations on u. In order to find a new tentative position, add these newly found positions to be restricted to the set of restricted positions and randomly select a new position among the available remaining positions. Once such a new tentative position is identified, repeat the process until an acceptable position for the coded bit of the current codeword has been found.

It follows from the above discussion that in order to find a position in u, π(nj+t), where a currently being placed coded bit, (nj+t), in c can be placed in accordance with Constraint 5, perform the following actions:

1. For i=1, ... ,Nc,
   a. Identify set $S_i$, and stop early if any $S_i$ is empty.
   b. Construct the corresponding set of position vectors, $\{p\}_i$.
   c. For each p∈$\{p\}_i$ determine LengthP, and:
      i. IF LengthP is even, set p_adj=[p, ρn−1], and LengthP_adj=LengthP+1 ELSE set p_adj=p, and LengthP_adj=LengthP,.
      ii. Call Algorithm 1 p_adj and LengthP_adj.
2. Take the union of all restricted zones found by Algorithm 1 in action 1 above.
3. Randomly select π(nj+t) among the remaining available positions.
4. Open a sequence of windows of widths $w_2, w_3, \ldots w_{Nc}$ around the π(nj+t). Identify any completed codewords on L within this newly introduced set of windows. If no such codewords are found, place bit (nj+t) at π(nj+t). If completed codewords are found within this newly introduced window, do action 5.
5. Without placing the coded bit in question at π(nj+t) do action 1 by augmenting each set $S_i$ for i=2, ... Nc, with any newly identified elements due to the newly opened windows of action 4. Use Algorithm 1 to identify the newly selected positions to be restricted from this run. If π(nj+t) is not in the newly found positions to be restricted, stop. If π(nj+t) is in the set of newly found positions to be restricted, add the newly found positions to be restricted to the set of positions to be restricted and repeat actions 4-5 until a permutation position that can be confirmed is found. Once a position is conformed, place the coded bit at the final π(nj+t).
6. In the event that the algorithm is having difficulty, perform a roll-back and continue. A "roll-back" is defined as undoing (and eventually re-placing) any number of already placed positions. A record is preferably kept as to the most recently placed positions so that the roll-back can remove any desired number of most recently placed positions. When these positions are removed, the restricted zones due to these already placed positions that are being undone will be have been removed when placing subsequent positions and the randomization in the placement process will provide opportunity to bypass the current problem that caused the roll-back to occur. Alternatively, positions that have caused a proportionally large number of restricted zones to appear while placing subsequent positions can be removed. A respective list is preferably kept for each respective placed position. Each respective list identifies all of the restricted zones that had to be removed for subsequent positions being placed due to the respective already-placed position. This allows the most troublesome positions to be intelligently selected for removal/unplacement in the roll-back. Further aspects of intelligent roll-backs are discussed below. Also discussed below is RCID (reverse constrained interleaver design), which is a general method of performing intelligent roll -backs, i.e., ensuring a set of interleaver constraints are met for an interleaver whose positions are already placed, but may not already meet the interleaver constraints.

The above approach selectively considers only the necessary combinations of codewords to place coded bits on u. It is seen that the complexity of this method increases with increasing $d_t$ values. Even though the above approach still considers different combinations of codewords, the complexity of the above outlined algorithm is much lower than searching over all possible codeword combinations of all of the ρ codewords.

Figure 6:
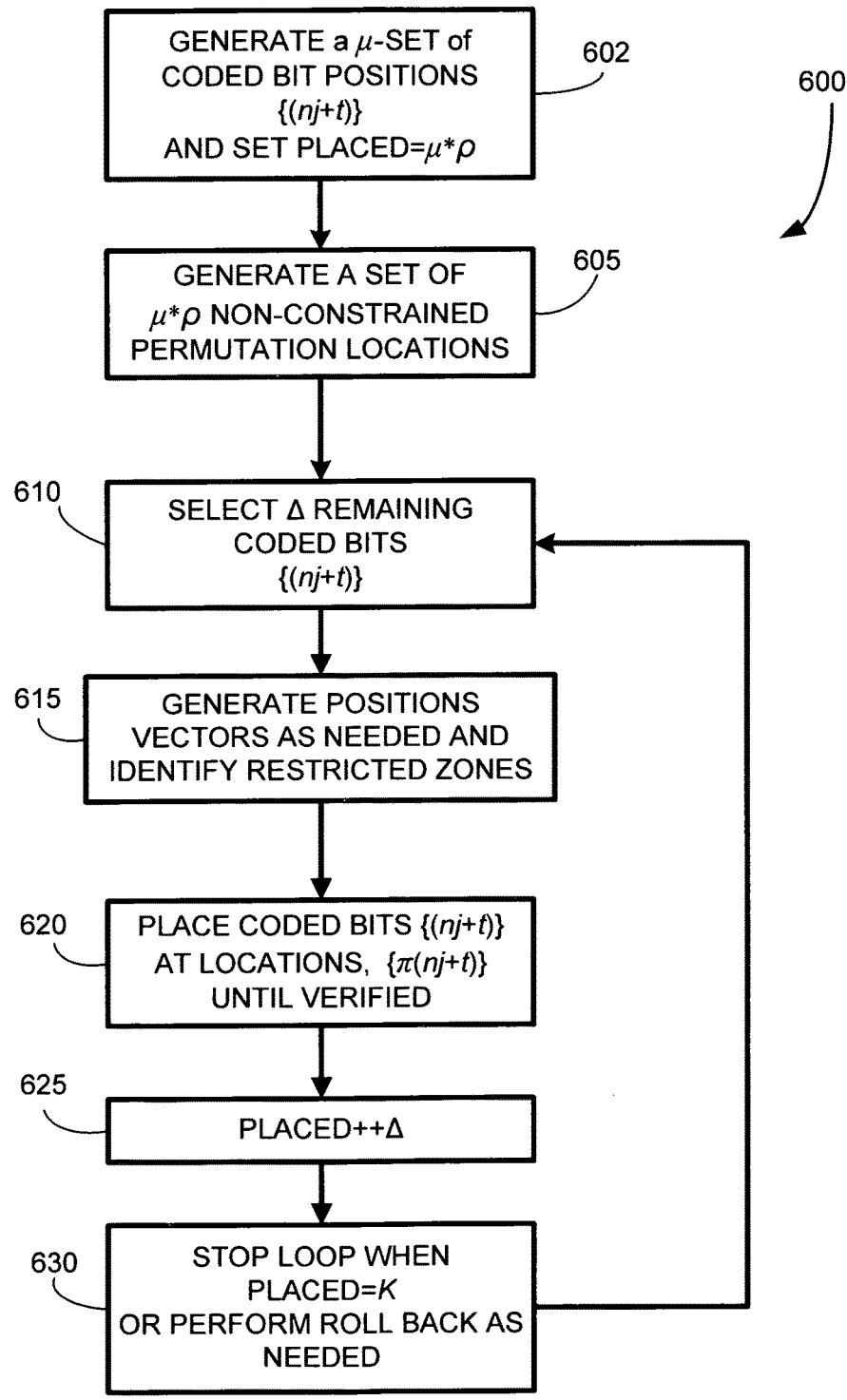
FIG. 6 is a flow chart that illustrates the general concept of how to design certain classes of L=1 Constrained Interleavers, $\pi_{CI-L=1}: c \rightarrow u$, such as the CI-3 and CI-4 interleavers.

Referring now to FIG. 6, a design method 600 is provided to design various types of L=1 constrained interleavers, $\pi_{CI-L=1}$:c→u, such as are used in block 311 of FIG. 3. The design method 600 can be used to design CI-3, CI-4 or mixed CI-3/CI-4 interleavers that implement all of Constraints 1-5. In the context of deterministic interleavers versus random interleavers, the method 600 is primarily used to design random constrained interleaver ("RCI") implementations of constrained interleavers that typically rely upon lookup tables of frame-size-specific state machines and state-transition logic. The method 600 is first described for use in designing a CI-4 interleaver.

To understand the action 602, recall that the number μ represents the maximum number of coded bit positions that can be placed from each codeword position, $c_j$, without completing a codeword. That is, for any fixed j, indicative of the set of coded bit positions (nj+t), the variable t may take on μ different selected values, $\{t\}_\mu = \{0, \ldots, n-1\}$, (called a "μ-subset"), to identify a corresponding subset of μ different coded bit positions, $\{(nj+t)\}_\mu$ that can be placed into any $j^{th}$ codeword position without completing any codeword of the OBC. For example, when the (8,4) Hamming code of Table 1 is used, μ=4, and $\{t\}_\mu = \{0,1,2,3\}$ or $\{t\}_\mu = \{4,5,6,7\}$ represent valid μ-subsets because if four ones were placed into the coded bit positions $\{(nj+t)\}$ using the four t-values from either of these two μ-subset, no codeword in the (8,4) Hamming code of Table 1 would complete. Depending on the code, there will be a fixed number of valid μ-subsets that applies to all codeword positions, $c_j$. The action 602 generates a µ-set by selecting a respective µ-subset to be used in each codeword position. For example, if there are a total of 8 valid µ-subsets in a given code, then the action 602 could use a randomly selected one of these µ-subsets for use in each of the coded bit positions, $c_j$. With L=1 constrained interleavers, a CTBC code is typically constructed using ρ different (n,k) codewords of the OBC, and the frame size is K=ρn coded bits. Therefore, any complete µ-set of coded bit positions will contain up to a total of $\mu^*\rho$ coded bit positions.

When the CI-4 design approach is in use, the action 602 preferably generates a complete µ-set, $\{(nj+t)_\mu: j=0, \ldots, \rho-1\}$, with t taking on the µ different values in each $j^{th}$ selected µ-subset. Once the action 602 identifies a complete µ-set, a variable "PLACED" is set to the number of elements in the µ-set, e.g., PLACED=$\mu^*\rho$. In some embodiments, in order to provide additional flexibility in mapping, the action 602 creates a partial µ-set in order to loosen the requirements later while placing coded bits subject to the constraints. Whether a complete or incomplete µset is selected, the action 605 identifies a corresponding set of permutation locations, $\{\pi(nj+t)_\mu: j=0, \ldots, \rho-1\}$, for the µ-set selected in the action 602. The "non-constrained" portion of action 605 refers to Constraint 5. Constraint 5 need not be evaluated while placing the bits in the action 605 because it is guaranteed that no codewords of the OBC will complete during the placement of these bits.

Control next passes to action 610 where one or more (Δ) remaining coded bit positions (i.e., Δ bit positions that have not yet been placed), $\{(nj+t)\}$, are selected. Often, Δ=1. In preferred embodiments, the selection 610 is generated using a pseudo random number generator that generates an index into a vector that includes all the indices of the bits that have not yet been placed, although other selection criteria can be used. When Δ>1, if a particular selected coded bit position, (nj+t), cannot be placed at a particular location, $\pi_{candidate}$, then a different selected bit position being analyzed at the same time can be checked to see if it can be permuted to the location $\pi_{candidate}$. This way, the action 610 can work to avoid or resolve potential conflicts and provide further flexibility in finding a valid permutation function, $\pi_{CI-L=1}: c \rightarrow u$.

Control next passes to an action 615 which performs an analysis function. Action 615 identifies any and all restricted zones associated with placing the selected bit, (nj+t). If a plurality of coded bit positions, $\{(nj+t)\}$ (a mapping group"), have been selected in the action 610, then all of the restricted zones associated with placing each of the plurality of coded bit positions are preferably identified in the action 615. In a preferred embodiment, the action 615 generates a set of positions vectors for each of the one or more coded bit positions in the mapping group and passes these positions vectors to Algorithm 1 in order to identify their respective restricted zones. As discussed below, different target MHDs may optionally be used in Algorithm 1 depending on LengthP of each positions vector.

Next control passes to an action 620 which starts by identifying one of more candidate permutation locations. In embodiments where the action 615 only selects one coded bit to be placed at a time, i.e., where each mapping group has only one coded bit, the action 620 identifies a candidate permutation position, π(nj+t), in which to place the coded bit position, (nj+t), from c to u. The permutation location, π(nj+t), is selected to be outside of any restricted zones identified for the selected coded bit position, (nj+t). As described above in connection with the CI-4 design algorithm, one or more verification actions are next taken to ensure that, once placed, no new constraint violations occur.

This verification is preferably performed by opening a set of windows around the candidate bit placement location, π(nj+t), and determining whether any already completed codewords on the list L have any bits within these new windows. If not, the bit (nj+t) can be verified to be placeable at the candidate bit placement location, π(nj+t). If one or more coded bit positions from already placed codewords are found to be in the new windows, Algorithm 1 is preferably used to identify any new restricted zones. Next it is determined whether the candidate bit placement location, π(nj+t), is located within any new restricted zones. If not, the action 620 performs the placement (nj+t)→π(nj+t) and declares this placement to be verified. If the placement cannot be verified, then a new candidate placement is selected outside all identified restricted zones and the process is continued until a verified location can be found. If, for example, toward the very end of the method 600, no location π(nj+t) can be found to be verifiable, then a roll-back procedure as described above is invoked and the method 600 is reentered at action 610 using the rolled back state of the method 600. In embodiments where the mapping group consists of a single coded bit position, then Δ=1, and control passes to action 625 where the variable PLACED is incremented by one.

In embodiments where the mapping group has more than one element the actions 610-625 perform additional functions. For example suppose that the action 610 selects a mapping group, $\{(nj+t)\}$, that contains ten different candidate coded bit positions from different codeword positions, $c_j$, to be mapped together as a group. Then the action 610 would identify the ten different coded bit positions in the mapping group. For each coded bit position in the mapping group, the action 615 would identify a respective set of positions vectors and would use Algorithm 1 to identify ten respective sets of restricted zones. Next the action 620 would observe the ten sets of restricted zones and analyze additional information, such as overlapping restricted zones and zones where none of the bits in the mapping group had any restrictions. Such additional information could be used in a mapping group placement strategy to more intelligently place one or more of the coded bits in the mapping group. For example, permutation positions located outside of the union of these restricted zones would likely lead to verifiable placements. Also, for example, if the restricted zones of nine the coded bit positions overlapped in a certain "crowed area(s)," but the tenth coded bit to be placed did not, it may be desirable to place the tenth coded bit position into an identified crowded area in order to fill a difficult position. The mapping group placement strategy is preferably organized to increase a measure of performance such as the probability of finding valid CI-4 interleaver solutions by eventually being able to place all of the K bits in the frame.

In the example where the mapping group has ten coded bit positions, suppose that a candidate target location in u, $\pi_{candidate-1}$, is selected by a random number generator during the action 620. In this example, assume that $\pi_{candidate-1}$ is not in any restricted zone of six of the ten coded bits positions in the mapping group, $\{(nj+t)\}$. Then the verification portion of the action 620 could be carried out for these six coded bits positions. Suppose that three of these six coded bit positions were verified to be placeable at $\pi_{candidate-1}$. This information can be recorded, another candidate permutation location, for example $\pi_{candidate-2}$ could be similarly analyzed. This analysis can be continued up to $\pi_{candidate-10}$. Now, with the knowledge of the verifiable placements and the interactions between the different coded bit position in the mapping group, the action 620 can determine an ordering in which to make the placements and final verifications of the coded bits in the mapping group. For example, the action 620 can recursively perform tentative placements and verifications among the remaining bit positions to be placed based on the first pass analysis above. The action 620 continues analyzing the effects of different placement strategies until all of the bits of the mapping group have been placed, in which case, the parameter $\Delta$ is set as $\Delta=10$. Also, the action 620 preferably maintains data records indicating placements that could have been made but were not selected. This information can later be used if and when a roll-back is needed. When the method 600 is near completion, it is possible that $\Delta<10$ placements can be made for a given mapping group. In such cases the roll-back process discussed above can be invoked and the method 600 reentered at action 610, or $\Delta<10$ placements can be made and the parameter $\Delta$ can be set to the number of coded bit positions that have actually been placed. Control then passes to action 625 where the variable PLACED is incremented by $\Delta$.

In a one type of embodiment, the mapping group can be selected to be all of the remaining bits to be place outside of the originally selected $\mu$-set. In such an embodiment, the action 615 analyzes all possible valid placement positions for each remaining coded bit outside the $\mu$-set. Next computer-chess forward looking trellis logic is used whereby each placement is considered to be a "move." Using the same type of game theory forward looking analysis as is used in computer chess games, the action 620 could analyze all sequences of "moves" and identify a sequence of "moves" that caused the method 600 to "win" the game, i.e., to place all of the coded bits into a proper CI-4 interleaver design. While such an approach requires more computing time, such logic is well known, the method 600 will be carried out off line and the final result potentially used millions and millions of times in the future or published in a standards document. Also, the computer-chess forward looking trellis logic can be applied during roll-backs to just be applied to a smaller portion of the placement problem within which the trouble spots have been identified.

Control next passes from action 625 to action 630 which then passes control back to the action 610 until an error condition arises where certain placements cannot be verified, or until the condition PLACED=K is met, in which case the CI-4 permutation vector, $\pi$, is supplied as output. If control passed to the action 630 because of an error condition (e.g., $\Delta=0$), then a roll-back as discussed above is performed and the process 610-630 is continued until the condition PLACED=K is met. Once this condition is met, the entire permutation vector, $\pi$, is output from the design algorithm 600.

The method 600 can also be configured to perform an "analysis run" that does not place coded bit positions from c to u in actions 605 and 620. In analysis runs, the coded bit positions are assumed to already have been placed by a previous run of the method 600, so the method 600 is configured to only to identify and analyze restricted zones for a specified MHD>$d_r$. Analysis runs are used to identify a set of positions vectors (and their respective lengths) that correspond to low weight CTBC coded sequences whose weights are $d_r<d\le d_f$, for some specified weight, $d_f$. It is assumed that all CTBC coded sequences $d\le d_r$ will already have been eliminated in the previous run of the method 600 that performed the placements subject to $d_r$. If, as discussed below, multiple $d_r$'s are used in the method 600, then the set of weights identified in the analysis run, $d_r<d\le d_f$, holds for the lowest value of $d_r$ used in the run of the method 600 that performed the placements. Analysis runs can be configured to provide additional information such the restricted zones associated with each of the identified positions vectors in the higher weight regions, $d_r<d\le d_f$. While the previous run of the method will have avoided all restricted zones for all weights $d<d_r$, there will be new restricted zones that can be identified for remaining low weight CTBC codes whose weights are in the range $d_r<d\le d_f$.

The method 600 can also be configured to perform a CI-3 interleaver design, or a mixed CI-3/CI-4 interleaver design. First consider configuring the method 600 to perform a CI-3 interleaver design. To start, the action 602 is configured by setting the parameter $\mu$ to $\mu=1$. This causes action 605 to place one bit from each codeword without constraints. For example, action 605 can use a random number generator to place a total of $\rho$ coded bit positions, one from each codeword position, from c onto u. Control next passes to action 610 which is configured to use a mapping group containing one bit, i.e., $\Delta=1$.

In a CI-3 embodiment of the method 600, action 615 is configured to identify the restricted zones due to Constraints 1-4. For Constraint 1, assuming a value has been specified for the restricted zones for a coded bit (nj+t) consist of all positions within $s_1$ locations in u away from any already placed coded bits, $\pi(nj+t)$ for $t \in \{0, \ldots n-1\}$. For Constraint 2, a list of pairs of codewords positions $(c_j, c_{j1})$ that have a coded bit from $c_j$ and a coded bit from $c_{j1}$ separated by exactly $(l_{max}+1)$ positions is maintained. When finding a position for a coded bit of $c_j$, each the list element containing $c_j$, as an element of a pairs of codewords positions $(c_j, c_{j1})$ is identified, and all positions within $(l_{max}+1)$ from the remaining coded bit positions of each $c_{j1}$ on the list are added to the Constraint-2 restricted zone for placing the current bit of $c_j$. For Constraint 3, checks are performed to see that if a coded bit of codeword position $c_j$ and a coded bit of codeword position $c_{j1}$ have a separation of l, then when finding a position for a coded bit of $c_j$, the Constraint 3 restricted zones include all positions within $(s_1-l)$ away from already placed other coded bits of $c_{j1}$. For Constraint 4, neighboring codewords of every coded bit on u are monitored. For each codeword $c_j$, for $j=0,1, \ldots, \rho-1$, and for each $s=1,2, \ldots, (l_{max}+1)$, a respective list of neighboring codewords, $Ln_j(s)$ is maintained whose list entries identify all of the neighboring codewords of $c_j$ in u that have a coded bit at a minimum separation of s relative to any of the n coded bits of the codeword $c_j$. When selecting a position for a coded bit position (nj+t) of codeword position, the $c_j$, the lists $Ln_j(s)$ are consulted. Suppose that $c_{jx}$ is an entry of $Ln_j(1)$, and $c_{jy}$ is an entry of $Ln_{jx}(1)$. Then when placing coded bit position (nj+t), the Constraint 4 restricted zone includes one position around each coded bit of codeword $c_{jy}$.

In the action 620, the coded bit position (nj+t) is placed at a selected permutation position, $\pi(nj+t)$, that is outside of all restricted zones identified in the action 615. For example, a random number generator can select $\pi(nj+t)$ from among the remaining non-restricted positions. In the action 625 the variable PLACED is incremented by $\Delta=1$. In the action 630 the end conditions are checked and control is passed back to action 610 until a CI-3 interleaver is available. If needed, a roll-back can performed as needed prior to returning control to the action 610. Upon completion the method 600 will provide as output a full CI-3 interleaver, $\pi$.

To configure the method 600 to design a mixed CI-3/CI-4 interleaver, the method 600 is instantiated twice, with one instantiation configured to design a CI-3 interleaver as described above ("the CI-3 instantiation,") and the other instantiation configured to design a CI-4 interleaver as also described above ("the CI-4 instantiation.") The two instantiations will work on the same problem together and communicate and synchronize with each other as described in the example embodiment provided immediately below.

To start, the CI-3 instantiation is allowed to execute actions 602-630 as described above until PLACED=$\mu$*$\rho$, where the value of $\mu$ refers to the value of $\mu$ used in the CI-4 instantiation, e.g., $\mu$=4 when the (8,4) Hamming code is used in the OBC. Now that the entire $\mu$-set has been placed in accordance with Constraints 1-4, action 610 of the CI-3 instantiation is allowed to select the next coded bit position, (nj+t) to be placed. Action 615 of the CI-3 next identifies all restricted positions for all of Constraints 1-4 as described above. At this point, the coded bit position to be placed, (nj+t), and all the restricted zones for Constraints 1-4 are passed to the CI-4 instantiation. The CI-4 instantiation then executes action 615 using this selected coded bit position (nj+t) and identifies of its CI-4 restricted zones using Constraint 5. The CI-4 instantiation then takes the union of all CI-3 and CI-4 restricted zones to form the final restricted zone for coded bit position (nj+t). Actions 620-630 are then performed just as in the CI-4 approach, except once control passes back action 610, the CI-3 instantiation is allowed to take over and the cycle repeats this way until the mixed CI-3/CI-4 interleaver, $\pi$, is available at the output.

To understand the concept of running the method 600 using multiple target MHDs, consider an example where the method 600 has already be run to determine a CI-4 interleaver with a target MHD of $d_t$. Next an analysis run of the method 600 is subsequently run using a higher distance value, namely $d_f+1$ where $d_t \leq d_f$, so that the analysis run identifies all low weight CTBC codewords with weights $d_t < d \leq d_f$. In the analysis run, some of the additional information collected can include statistics that tabulate the low weight CTBC coded sequences and monitor the number weight d CTBC codewords there are in each of the above described categories of codewords. Specifically, the specific categories of the CTBC codewords whose weights are in the range $d_t < d \leq d_f$ are evaluated and their positions vectors, p(d), are tabulated in respective tables, P(d). Note that the principal probability of error contributions are thus given by $$P_{e,df} \approx \sum_{d=dt}^{df} A_d \times P(d, \gamma_b) \quad (8)$$

where $P_{e,df}$ denotes the error probability due to low weight CTBC codewords whose weights are in the range $d_t < d \leq d_f$ and $P(d,\gamma_b)$ is the probability of decoding in favor of a CTBC codeword with a weight d error sequence at a bit signal to noise ratio of $\gamma_b=E_b/N_0$. A further granularity in the error coefficients, $A_d$, can be discerned using the statistics provided by the analysis run of the method 600. The analysis run preferably tabulates how many weight d CTBC sequences come from each of the categories of low weight error sequences as defined herein above, i.e., $\phi_1, \ldots, \phi_4$ and $\phi_m^{(CI-4)}$, for m=1, ..., $N_c$, at each weight, $d_t < d \leq d_f$. Define the category-error-coefficient expansion, for each $d_t < d \leq d_f$, as follows:

$$A_d = \sum_{cat=1}^{Nc+4} A_d(cat) \quad (9)$$

where the $A_d(cat)$ values ("category-error-coefficients") equal $A_d$ times the percentage of low weight CTBC codewords at weight d, that come from, respectively, categories $\phi_1, \ldots, \phi_4$ and $\phi_m^{(CI-4)}$, for m=1, ..., $N_c$, and divided by 100. In a CI-3 design only the first four $A_d(cat)$ values can be non-zero, and in a CI-4 design only the $A_d(cat)$ values for cat=5, ..., $N_c$+4 values can be non-zero. In a mixed CI-3/CI-4 design, all the $A_d(cat)$ values in equation (9) can be nonzero. As discussed earlier, in mixed CI-3/CI-4 interleaver designs, if a given positions vector determined in a CI-4 instantiation identifies a low weight error vector that has already been identified as a member of any of categories 1-4, that positions vector would be grouped into its respective category 1-4 and not counted a second time in a category cat≥5. It can be noted that combinatorics could alternatively be used to determine closed form expressions for each of the category-error-coefficients. With these definitions, equation (8) can be modified to take advantage of this additional information as $$P_{e,df} \approx \sum_{d=dt}^{df} \sum_{cat=1}^{Nc+4} A_d(cat) P(d(cat), \gamma_b). \quad (10)$$

where d(cat) is a separate target minimum distance, $d_t < d(cat) \leq d_f$, defined for each category of codewords. The values of d(cat) are used as the multiple target MHDs in the method 600. The values of d(cat) are selected to lower the error probability of equation (10) below that of equation (8) or to preferably minimize error probability of equation (10).

Note that the lengthP parameter sent to Algorithm 1 identifies each positions vectors as belonging to a certain category, $\phi_m^{(CI-4)}$, for m=1, ..., $N_c$. Hence the $d_t$ value used in Algorithm 1 can be changed to $d_t$(LengthP) which correspond to the d(cat) values for cat≥5 in equation (10). Different d(cat) values can be used in each of Constraints 1-5 so that each category of low distance error sequences is made to give rise to a lower overall contribution in (10) from the identified values of $A_d(cat)$ and $d_t(cat)$.

Reverse Constrained Interleaver Design (RCID)

In the CI-3 and CI-4 constrained interleaver design examples presented so far, the constrained interleaver, $\pi:c \rightarrow u$ i.e., $u=\pi[c]$, was created by sequentially placing coded bit positions, one at a time, from the coded sequence c into an initially empty interleaver vector u. The placement of the coded bits into the vector u was performed subject to a set of interleaver constraints that, when satisfied, ensure that a target minimum Hamming distance, $d_t$, will be maintained at the output of the IRCC. This process of sequential placement was continued until the interleaver vector u was completely filled with K=n$\rho$ coded bits. RCID (reverse constrained interleaver design) takes the view that the coded bits from the vector c have initially been placed into the vector u. However, this initial placement may very well violate the interleaver constraints. RCID then applies a systematic approach to rearrange certain selected bits in u in order to arrive at a new vector u that gives rise to a vector v that does satisfy the constraints and thus achieves the target minimum Hamming distance, $d_t$. In the CI-3 and CI-4 constrained interleaver design methods, as the placement of coded bits from the vector c were sequentially placed into the vector u, in some cases it was indicated that roll-backs may have been needed. As explained below, RCID can also be used at the time it is determined that a roll-back will be required. RCID is then used to convert a current interleaver u that requires a roll-back into an interleaver u that meets the interleaver constraints.

The RCID method starts by assuming all of the positions have already been placed into the interleaver u and thus the u vector is initially full. For example, the vector u may be initialized to the natural ordering of coded bits in the vector c by setting u=c. At this time the interleaver, $\pi$, amounts to an identity transformation and the coded bits of the concatenation, $v=G[u]=G[\pi[c]]$, most likely violate the target MHD requirement $d_t$. The RCID approach remedies this situation by removing a predetermined set of coded bits from the initial vector u until all sub-distance error sequences, denoted $i_{P<}$, with weights $d<d_t$ are eliminated. This is preferably performed by removing the minimum possible number from of bits u so as to prevent the sub-distance error sequences, $i_{P<}$, from completing. The act of removing already placed positions from the vector u creates a set of "holes" in the vector u that correspond to the now-vacated positions in u.

RCID next seeks to place the removed positions back in the interleaver in such a way as to achieve the target MHD, $d_t$. An advantage of this approach is that there will be a smaller number of bits that need to be placed thus making the interleaver design simpler. Also, using this approach, shorter interleavers (i.e., with a lower value of $\rho$) can be constructed that meet the MHD requirement, $d_t$. However, when RCID is used to construct minimally short constrained interleavers that meet the MHD requirement, $d_t$, the interleaver $\pi$ will only permute the bits that have been removed be and thus will not be nearly as random as the previously discussed CI-3 and CI-4 designs. Such RCID interleavers will thus sacrifice much of the interleaver gain. However, when RCID is used to resolve roll-back conditions, this disadvantage is not the case. Nor is it the case if the initial u vector is set as $u=\pi_{rand}[c]$, where $\pi_{rand}$ is a random interleaver.

To better understand RCID, consider a simple example. In this example, let the OBC be a (4,1) repetitive code that is formed by repeating each message bit four times, and whose MHD is $d_0=4$. That is, the c vector is equal to a vector of message bits with each message bit repeated four times. Therefore, each codeword involves a repetition of four message bits, and each codeword requires four coded bits in order to complete. In this example, a concatenation $v=G[u]=G[\pi[c]]$ will be formed using the accumulator IRCC for the inner code, and the RCID interleaver will be selected to achieve a target MHD of $d_t=16$. Note that this target MHD corresponds to the maximum that can be achieved using a CI-2 since CI-2 can achieve $d_t=d_0^2d_i$. Using RCID, set the initial condition u=c so that the interleaver $\pi$ is initialized to the identity transformation. In this example, the goal is to modify $\pi$ (i.e., the ordering in u) in a minimalistic way so that the concatenation, $v=G[u]=G[\pi[c]]$, achieves $d_t=16$. To achieve this MHD, the following steps may be used:

1. Start by placing all $4\rho$ coded bits into u by setting u=c. At this time the resulting MHD (from each single OBC codeword) is only 2 because the accumulator IRCC converts each sequence like "1111" into goes "1010". Hence, changes are needed.

2. In order to ensure that none of the $\rho$ codewords can complete, remove one coded bit from each codeword position. For example, remove the last coded bit position from every codeword position. This will result in removing a total of $\rho$ coded bit positions at locations congruent to 3 modulo 4 (u(i), i Mod 4==3). Once these coded bit positions are removed, no codeword of the OBC will be completed in u. Hence, with these removals, there will be no sub-distance error sequences, $i_{P<}$, and thus there will be no violations to the MHD objective, $d_t=16$.

3. Next the RCID approach seeks to place only the $\rho$ number of removed coded bit positions back into the $\rho$ number of holes created in u, but in a different order. The removed positions needed to be placed back into the holes in such a way as to achieve the target MHD, $d_t$. In this example, this involves placing only $\rho$ number of removed coded bit positions as opposed to placing the entire set of $4\rho$ as is needed in the above described CI-3 and CI-4 design methods. When placing this smaller set of $\rho$ number of removed coded bit positions, the CI-3 or CI-4 constraints as described above can be used. For example, if constraint 5 is used, and considering a single codeword, with bit position 4 (i mod 4=3) taken out of codeword position zero, if the coded bit position removed from this first codeword is placed at position u(i) where i≥19, then the concatenation, $v=G[u]=G[\pi[c]]$, will achieve $d_t \geq 16$ for this single codeword error event. Similarly, any one or more of constraints 1-5 can be checked/applied when placing the removed coded bit positions back into u to account for low distance error events involving multiple codewords as well.

In the above example, the parameter $\rho$ need not be known ahead of time. Instead, the method can be carried out and the lowest value of $\rho$ for which the MHD requirement can be met can be determined to be $\rho_{min}$. This allows a minimum frame size, $K_{min}=n\rho_{min}$, to be determined that is needed to meet the target MHD. Also, it should be noted that this simple example was provided to illustrate the main RCID concepts. RCID could be applied to the (8,4) Hamming code as well. In the case of the (8,4) Hamming code, for example, RCID can be applied by starting with u=c and then removing the last four bit positions from of each codeword position u. In this case, the vector u will hold the first four coded bit positions of each codeword position in natural order. The second four bit positions of each codeword position will include bit positions from other codeword positions, and in a more randomized order. However, this approach will lead to a lower interleaver gain due to less randomization as compared to the CI-3 and CI-4 design approaches. The RCID approach may be desirable if it is desired to use as small of a frame size as possible to meet a given MHD requirement.

The RCID technique can be more generally be described as follows:

1. Starting with a given permutation, $u=\pi[c]$, (where $\pi$ may initially be the identity transformation or an interleaver being designed using one or both of the above -described CI-3 or CI-4 design methods, but at a point in need of a roll-back, for example), determine a (preferably minimal) set of positions that can be removed from u that will prevent any sub-distance error sequences, $i_{P<}$, from occurring, so that no violations to the target MHD, $d_t$, occur in the concatenation $v=G[u]=G[\pi[c]]$. This can be done by removing the minimum number of coded bit positions from u, or by removing bits in steps of a fixed number of bits at a time, or any other sequential or grouped manner. Also, particular coded bits that have already been placed but are causing too many restricted zones to be present in the remaining bits to be placed can also be removed as a part of this first step.

2. Place the removed positions back into the holes created in u, but in a different order, such that the required MHD condition of the concatenation is achieved. The re-ordering can be done by placing the removed subject to a selected set of constraints. Alternatively the removed coded bits can be placed back into a randomly selected hole and followed by checking to see if any constraint violations have been made by that placement and only allowing valid placements. Similarly, any combination of the above mentioned placing or swapping methods can be used that checks for and prevents any sub-distance error sequences, $i_{P<}$, from occurring.

For example, consider how to apply RCID to perform a roll-back when the CI-3 and/or CI-4 design algorithm reaches a point where a roll-back is required. The RCID approach is preferably applied by considering all of the remaining positions to be placed into the holes created in step 1 of the RCID approach as outlined above. Additionally, already placed locations that are identified to be giving rise to excessive restricted zones for of the remaining positions can also optionally be removed as well prior to the reordering and replacement step 2. Then the CI-3 and/or CI-4 design approaches are continued as per step 2 to fill the holes and complete the CI-3 and/or CI-4 interleaver design.

If necessary, the interleaver gain in RCID can be improved by removing more bits than are needed from u and then randomly selecting their reordering to place them back subject to the selected interleaver constraints. In this sense, the CI-3 and CI-4 design methods can be viewed as special cases of RCID where all of the coded bit positions are removed from u and are then placed back to maximize the interleaver gain.

Parallel Architectures with Deterministic Constrained Interleaver (DCI)

Interleavers are often required exhibit the "Contention free" property, also known as "vectorizable." Such interleavers have the advantage that they can be efficiently implemented in decoder chips that employ a set of M parallel processing engines that are able to make repeated parallel accesses to a bank of M parallel memories without any memory address conflicts or memory contentions. For example, the LTE standard uses a QPP interleaver which is 8-way vectorizable, and LTE decoder chips are often organized as 8-way parallel processing systems. OTN also uses M-way vectorizable interleavers and parallel processing chips, but, most usually, with M>8 due to the very high data rates used in OTN applications. In the context of constrained interleavers, the "contention free"/"vectorizable" property can be formulated as an additional interleaver constraint. Herein, an "M-way vectorized deterministic constrained interleaver" corresponds to a DCI (deterministic constrained interleaver) that typically implements a SRCI such as CI -3 and/or CI-4, and also implements the vectorization constraint below. An M-way vectorized deterministic constrained interleaver also uses a deterministic pseudo -randomization function (such as the QPP or other deterministic interleaver). M-way vectorized deterministic constrained interleavers are preferably used in transmitters to generate CTBC codes that have vectorizable constrained interleavers. Also, a certain class of M-way vectorized deterministic constrained interleavers are used in high speed real time parallel access/parallel processing implementations of SISO decoders as described in more detail below. Also, a permutation is said to be deterministic and vectorizable if it meets the vectorization constraint below and can be generated by a pre -determined DCI using one or more predetermined mathematical formulas as discussed in further detail below.

Constraint 6 ("Vectorization Constraint"): Given that the c and u vectors are of length K, in order for an interleaver to be M-way vectorizable, Constraint 6 requires that the permutation $u=\pi[c]$ is selected to ensure that subsequences in c whose elements are spaced by multiples of K/M positions apart are permuted into re-ordered subsequences in u whose corresponding elements are also spaced by multiples of K/M positions apart.

Figure 7:
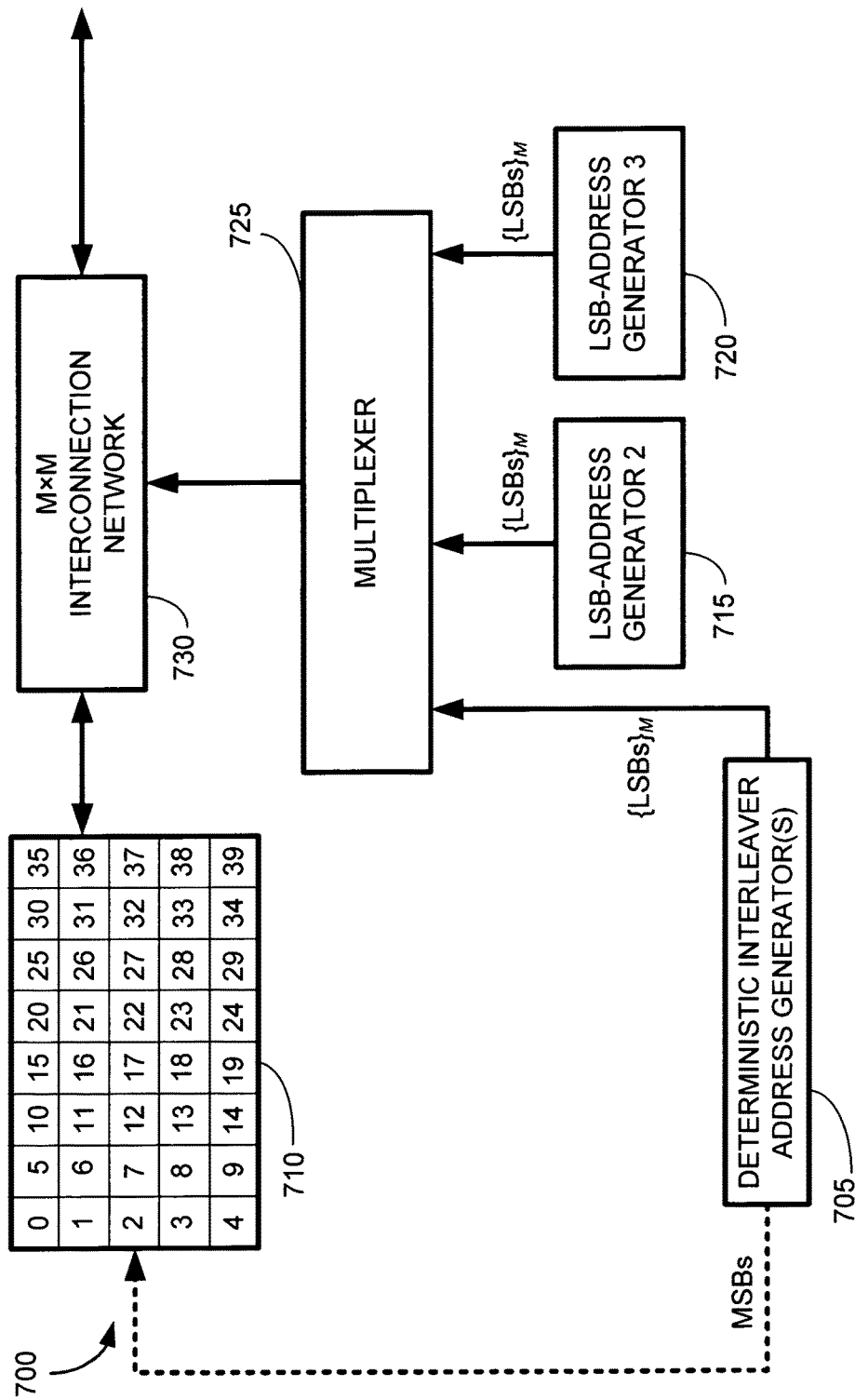
FIG. 7 is a block diagram of a memory structure, addressing logic and permutation hardware used by certain embodiments of contention free deterministic constrained interleavers.

Constraint 6 can be better understood by considering an example memory system 710 arranged as an K/M×M matrix as shown in FIG. 7. Although in practice the frame size K is usually much larger, FIG. 7 illustrates a small example where K=40, M=8, and K/8=5. Note that the elements of the matrix 710 can be viewed as the indices of the elements of the vector c loaded into the memory 710 in column-major order. The quantity "K/M" of Constraint 6 corresponds to the number of elements in each column of the matrix 710. The indices of the elements of each row, $i_{row}$, can be written in terms of the individual coded bit positions of the vector c, written as c(i), where $i=K/M*j_{col}+i_{row}$, $j_{col}=0, \ldots, M-1$, (i.e., "a subsequence in c whose elements are separated by multiples of K/M" as per Constraint 6).

Let $[C]_{K/M \times M}$ denote a K/M×M "vectorization matrix" into which the vector c is loaded in column-major order. Such a matrix C is shown as matrix 710 in FIG. 7 with K=40 and M=8. The coded-bit-position index, i, into vector c can be written, $i=K/M*j_{col}+i_{row}$. Therefore, given the index i, $j_{col}$=i DIV K/M and $i_{row}$=i MOD K/M, where DIV and MOD are integer division operators for quotient and remainder respectively. When M is a power of 2, for example when $M=2^3=8$, as shown in block 705 of FIG. 7, any such address can be viewed in binary form as having "MSB" and "LSB" portions that respectively refer to the "most significant bits" and the least significant bits." For example, when $K=2^x$ and $M=8=2^3$, the index, i, into the vector c can be written in terms of the bit positions of their binary addresses as [MSBs|LSBs]=[x−1, . . . 3|2 1 0], where the MSBs identify $i_{row}$, and the LSBs identify $j_{col}$.

Any permutation that satisfies Constraint 6, $\pi:c \rightarrow u$, can be factored as follows: $u=\pi[c]=\pi_{LSB}^{\pi i_{row}=\pi\{0,\ldots,K/M-1\}}[\pi_{MSB}[C]]$, where $\pi_{MSB}[\bullet]$ represents a single permutation over the integer ring $\{0, \ldots, K/M-1\}$ which is applied down each column of C, and $\pi_{LSB}^{\pi i_{row}=\pi\{0,\ldots,K/M-1\}}[\bullet]$ represents a set of K/M different permutations, each defined over the integer ring, $\{0, \ldots M-1\}$, and each respectively applied across $\pi_{MSB}[i_{row}]$ of C. Let $[U]_{K/M \times M}$ denote a K/M×M "implicit permutation matrix" that is implicitly loaded with the vector u in column-major order. In matrix notation, U is mathematically related to C according to $U=\pi[C]=\pi_{LSB}^{\pi i_{row}=\pi\{0,\ldots,K/M-1\}}[\pi MSB[C]]$, i.e., by applying $\pi_{MSB}[\bullet]$ down each column of C and then separately applying $\pi_{LSB}^{\pi i_{row}}[\bullet]$ to the $\pi_{MSB}[i_{row}]^{th} \Delta \pi i_{row}^{th}$ row of C. Using these notations, any given pair of row and column indices, $(i_{row}, j_{col})$, of the matrix C are permuted to the row and column indices, $(\pi_{MSB}[i_{row}], \pi_{LSB}^{\pi i_{row}}[j_{col}])$, of the matrix U. Constraint 6 ensures that any given row of elements in the matrix C maps to a row of the same elements, but in an intra-row-permuted ordering, in the matrix U. For example, Constraint 6 will require that the entire last row of the matrix 710 whose row index is $i_{row}$=4 will permute to row $\pi_{MSB}[i_{row}]$ in U in such a way that $[\pi(4), \pi(9), \ldots \pi(39)]$ will all be on the same row, $\pi_{MSB}[i_{row}]$, but with an a scrambled ordering in accordance with an intra-row permutation, $\pi_{LSB}^{\pi i_{row}}[\bullet]$. The M×M interconnection network 730 is provided to perform each of the needed intra-row permutations, $\pi_{LSB}^{\pi i_{row}=\pi\{0,\ldots,K/M-1\}}[\bullet]$.

The memory system 700 will be connected via the M×M interconnection network to a set of M processing engines, labeled as Proc($j_{col}$), $j_{col}$=0, . . . ,M−1 (not shown). The address generator 705 is configured to be able to count in natural order (to access any row of the C matrix in parallel), and also in permuted order (to access any row of the U matrix in parallel). For example, as discussed in further detail below in connection with FIGS. 11-12, during SISO (soft input soft output) decoder operations, the actual data elements stored in the memory 710 are LLR (log likelihood ratio) values. In the first half of the SISO iteration, each of the processors $\text{Proc}(j_{col})$, $j_{col}=0, \ldots, M-1$, will need to access a respective column of the matrix U. To allow this to happen without contention, each of the subsets of LLRs stored on each of a sequence of selected rows, $\{\pi_{MSB}[i_{row}], i_{row}=0, \ldots, K/M-1\}$, of the U matrix need to be accessed in parallel. In the second half of the SISO iteration, the subsets of LLRs stored on each of a sequence of selected rows of the C matrix will need to be accessed in parallel. By using the hardware arrangement 700, the data of the C matrix is stored in the memory 710 and there is no need to physically move the data from the matrix C to the matrix U. Instead, the data stays in place in the ordering as shown in the memory 710, and thus the matrix U is called the "implicit permutation matrix." Address generator(s) 705 and optional address generators 715 and 720, working with the M×M interconnection network 730 are used to allow the memory 710 to be accessed as both the C matrix and the U matrix.

To understand how the memory 710 can be accessed in accordance with both the C and U matrices, consider an example involving a QPP interleaver as used in the current 4G LTE turbo code. During the second half of each SISO iteration, the block 705 acts as a sequential up/down counter that increments/decrements the row index, $i_{row}$. During the first half of each SISO iteration, the block 705 performs QPP addressing as described above in connection with the Sun reference. A high speed M-way parallel hardware embodiment of the address counter 705 can be implemented to generate M consecutive QPP addresses in parallel. Inside the block 705, are M parallel QPP address generators that are configured to sequence through all of the addresses of all elements stored on each column of U. This way, all of the elements, $(\pi_{MSB}[i_{row}], \pi_{LSB}^{\pi i_{row}}[j_{col}])$, for $j_{col}=0, \ldots, M-1$ are generated in each parallel cycle by the address generator 705. Each of these M parallel QPP address generators are respectively initialized, similar to the discussion of recursion equations (2) and (3), but instead of each of them being initialized to zero, each recursive QPP address generator sub circuit is initialized with the a respective index that appears in the first row of the matrix C. In the small example shown in block 710, these M=8 QPP recursive parallel address generators/counters inside of the block 705 would be respectively initialized with the indices 0, 5, 10, . . . ,35. During forward recursion operations, each such parallel QPP address generator would increment using its respective QPP recursion counter with a stride of $d=\Delta i=M$ using the known techniques as described in the Sun reference. During backward recursion operations, as also explained in the Sun reference, these QPP recursion counters would increment backwards using a stride of $d=\Delta i=-M$. Due to the contention free property of QPP interleavers, once the M parallel address generators are initialized in this way, all of the parallel QPP address counters will be guaranteed to generate the same row address which can be extracted from the MSBs of any or all of the M parallel QPP address generators made up of the M=8 LSBs from these respective M=8 QPP parallel address recursion generators/counters are shown one of the outputs of block 705 in FIG. 7. The set, $\{LSBs\}_M$, defines the intra-row permutation $\pi_{LSB}^{\pi i_{row}}[\bullet]$ to be used on the $\pi_{MSB}[i_{row}]^{th} \underline{\Delta} \pi i_{row}^{th}$ row during the same cycle where the MSB output of the address generator 705 generates the row address, $\pi_{MSB}[i_{row}]$.

In the operation of the system described above, while addressing the matrix C, all the up/down row counter in the block 705 needs to do is to provide a single row address, $i_{row}$, because once this row is accessed in parallel, data elements $C[i_{row}, j_{col}]$, $j_{col}=0, \ldots, M-1$ can then be passed directly to the set of processors $\text{Proc}(j_{col})$, $j_{col}=0, \ldots, M-1$ (not shown in FIG. 7) via the M×M interconnection network 730. However, when the MSBs of each of the set of M parallel QPP address generators are used to generate the same sequence of row addresses, $\pi_{MSB}[i_{row}]$, the LSBs of each of the respective one of the M parallel-generated QPP addresses will be equal to $\pi_{LSB}^{\pi i_{row}}[j_{col}]$, for $j_{col}=0, \ldots, M-1$. Therefore, when the memory array 710 is being accessed in permuted order, elements $C[\pi_{MSB}[i_{row}], \pi_{LSB}^{\pi i_{row}}[j_{col}]]$, for $j_{col}=0, \ldots, M-1$ need to be passed to processors $\text{Proc}(j_{col})$, $j_{col}=0, \ldots, M-1$. To pass each row elements to the correct respective processor, the LSBs of each the M=8 parallel-generated QPP addresses are decoded and used to control the M×M interconnection network 730. A detailed description of the low level circuits that can be used to implement such decoding known to those skilled in the art and is described in the Studer reference. Based on the decoded $\{LSBs\}_M$ information, the M×M interconnection network 730 will permute the elements of row $\pi_{MSB}[i_{row}]$ of C so that each respective element, $U(i_{row}, j_{col})=C[\pi_{MSB}[i_{row}], \pi_{LSB}^{\pi i_{row}}[j_{col}]]$, is sent to its respective target processor, $\text{Proc}(j_{col})$, for $j_{col}=0, \ldots, M-1$.

Next consider an example where the memory system 700 is specifically used while decoding a CTBC code. To look at a larger example than that shown in the block 710, let the frame size be K=4096 ($2^{12}$) and let there be $M=2^3=8$-way vectorization, so that each column of the interleaver matrix 710 has $2^{12-3}=2^9=512$ bits per column. Assuming that the (8,4) Hamming code of Table 1 is being used as the OBC, there will be $2^3=8$ bits per OBC codeword, and thus each column of C will contain $2^{9-3}=2^6=64$ codewords of the OBC. In the first half of a SISO iteration, each of the M=8 processors will need to access a respective column of the implicit permutation matrix U. Since the U matrix is never explicitly formed, the address generator 705 is preferably configured to generate a set of QPP permuted row and column addresses using the parallel configuration based on the Sun reference as described in detail above. During the first half the of the CTBC code's SISO decoding operation, IRCC decoding is performed, so that each of the M=8 processors perform parallel decoding on a separate column of the U matrix in order to decode a respective length-K/M=512 subsequence of the CTBC codeword, v. During the second half of the SISO decoder cycle, the address counter 705 counts in natural order, 0, . . . ,K/M−1, and the M×M interconnection network 730 performs a direct pass through, so that each of the M=8 processors can perform, in parallel, an OBC SISO decoding cycle on a subsequence of 64 codewords stored in each column of the matrix C.

Certain permutations like the QPP are already factorizable, in which case a set of MSBs extracted from the address generator 705 can be used to select a row, and the LSBs of each of M parallel-generated QPP addresses can be decoded and used to control the interconnection network 730 to apply the intra-row permutation to the elements the selected row. However, one aspect of the present invention 700 contemplates that any valid permutation over the integer ring $\{0, \ldots, K/M-1\}$, $\pi_{MSB}[\bullet]$, can be used to select rows in the memory 710, whether $\pi_{MSB}[\bullet]$ is vectorizable or not.

Then any independent set of intra-row permutations, $\pi_{LSB}^{\pi i_{row}=\pi\{0,\ldots,K/M-1\}}[\bullet]$ can be applied across the selected rows of C, and this combination will give rise to a valid vectorizable permutation, $u=\pi[c]=\pi_{LSB}^{\pi i_{row}=\pi\{0,\ldots,K/M-1\}}[\pi_{MSB}[C]]$. As can be seen in FIG. 7, one or more permutation address generators, 705, 715, 720 can be used to generate alternative sets of $\{LSBs\}_M$. While three sources of intra-row permutation addresses are shown in FIG. 7, in general any number intra-row address generators can be used as needed to form DCIs as discussed below.

As previously discussed, a "random interleaver" can be defined in opposition to a "deterministic interleaver" that uses a mathematical formula to generate the deterministic interleaver permutation. A random interleaver is thus often implemented as a table look up or with a state-machine logic circuit whose sequencing logic does not use a fixed mathematical equation but whose state transition logic needs to be specifically designed for each is frame size. In this context, many of the deterministic interleavers defined herein can have some random components to them that rely on state transitions and state dependent logic that are different for each frame size. A design objective is to design and select DCI solutions that minimize the amount of hardware that needs to be specifically designed for each is frame size.

Figure 8:
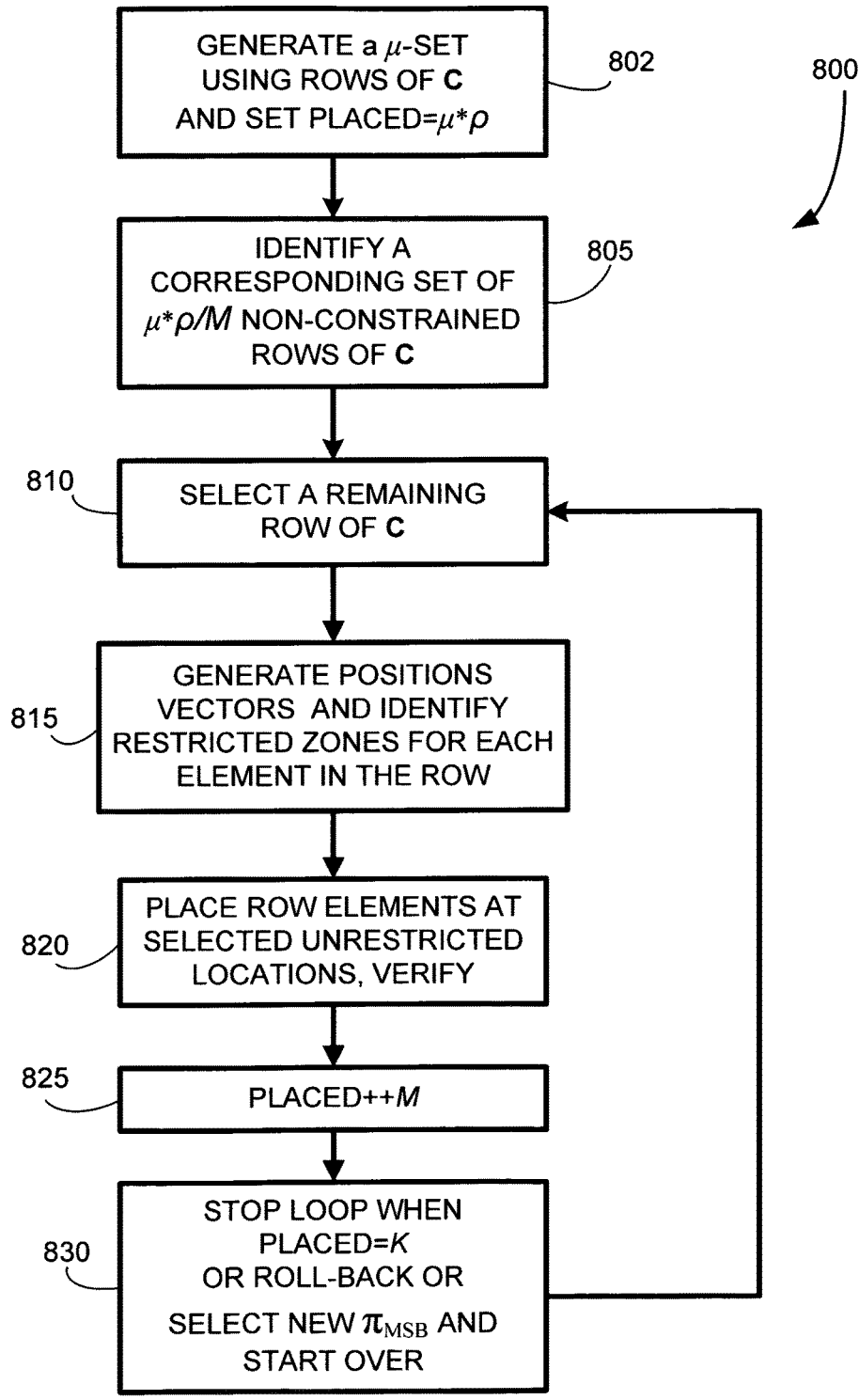
FIG. 8 is a flow chart that illustrates a method to design contention free deterministic constrained interleavers that also meet the constraints of either CI-3 or CI-4 interleavers or both.

Referring now to FIG. 8, a design method 800 is provided to design various types of deterministic constrained interleavers, $\pi_{DCI}$:c→u, that can be used in block 311 of FIG. 3 and in related CTBC decoders. The design method 800 makes use of the vectorization matrix C and the implicit permutation matrix U as a mathematical framework to design vectorizable CI-3, CI-4 and mixed CI-3/CI-4 interleavers. The method 800 is performed off line and is executed separately for each frame size, K, supported by a given system, and a different DCI is designed for each supported frame size. Also, the method 800 is carried out within an outer loop that searches over various sets of deterministic interleavers. For example, when the deterministic interleaver used in the method 800 is a QPP interleaver, various combinations of the QPP parameters $f_1$ and $f_2$ of equation (1) can be used to generate different starting points for the method 800. The method 800 can then be executed for each set of parameters, $f_1$ and $f_2$. Some sets of parameters will generate DCI solutions and others may not, and in the end, a best set of parameters will be identified for use at a given frame size. At run time, the selected set of parameters, $f_1$ and $f_2$ will be used along with any of the alternative intra-row permutations determined by the method 800 as discussed below. Other permutation functions beside QPP permutation functions can alternatively be evaluated and selected to perform the MSB row-selection permutation, $\pi_{MSB}[\bullet]$. Any deterministic interleaver can be used to generate a permuted sequence of row addresses, and this row address interleaver need not even be vectorizable. In such cases the sets $\{LSBs\}_M$ typically come from blocks 715 and/or 720 and/or a separate set of LSBs generators in the block 705.

The method 800 is first described in the context of designing CI-4 DCIs. As discussed in further detail below, the method 800 can also be configured to also design CI-3 and mixed CI-3/CI-4 DCIs. In the descriptions of certain preferred embodiments below, it is assumed that the block 705 is a QPP interleaver that generates both a sequence of permuted row addresses from the MSBs and also generates a set of M permuted column addresses using the LSBs from a set of M=8 QPP recursive permutation address generators as discussed above in connection with FIG. 7.

Action 802 is similar to action 602 as discussed above, and when a CI-4 DCI is being designed, the action 802 preferably generates a complete µ-set, $\{(nj+t)_\mu: j=0, \ldots, \rho-1\}$. However, in the method 800, elements of the µ-set are selected to be a subset of the rows in the vectorization matrix C. For example, if M=8, K=4096, K/M=512 and the (8,4) Hamming code of Table 1 is used, so that n=8, $\rho$=512, and µ=4, this means that half of the coded bits of c can be included in the µ-set. A selected µ-subset consisting of µ=4 bits will come from each codeword. Because the codewords of the OBC are loaded into the matrix C in column major order, the indices of all of the coded bits on each row of C will be congruent to the same value of t modulo n, given by $\pi[i_{row}]$ MOD n=t. This implies that half of the rows of the matrix C can be include in the µ-set. Hence in a typical embodiment, the action 802 randomly selects a sequence of $\rho\mu$-subsets, until, in this example, a selected set of K/M/2=256 rows has been placed, and the placement counter is set to PLACED=µ*$\rho$=4*512=2048. In some embodiments, in order to provide additional flexibility in mapping, the action 802 creates a partial µ-set in order to loosen the requirements later while placing coded bits subject to the constraints. Whether a complete or incomplete µ-set is selected, the action 805 identifies a corresponding set of permutation locations, $\{\pi(nj+t)_\mu: j=0, \ldots, \rho-1\}$, for the µ-set selected in the action 802. In the example of FIG. 7, a QPP interleaver can be used in the block 705 in order to generate the permutation $u=\pi[c]=\pi_{LSB}^{(i_{row}=0\ldots,K/M-1)}[\pi_{MSB}[C]]$, by applying $\pi_{MSB}[\bullet]$ to all the 256 rows in the selected µ-set, $\{i_{row}\}_{\mu256}$, and the LSBs for each respective intra-row permutation can be the QPP permutation ($\{LSBs\}_{M=8}$) generated in the block 705. In this type of embodiment, the intra-row permutations generated in by the address generator 705 are selected when possible to be used as the preferred default row permutations. With this placement of bits, none of the CI-4 constraints will have been violated because no codeword of the OBC will have completed.

Control next passes to action 810 where a remaining row of C, i.e., a row that has not yet been placed, is selected. In preferred embodiments, the selection 810 is generated using a pseudo random number generator that generates a row index into a vector that includes all the indices of the rows that have not been placed yet, although other selection criteria can be used. The currently selected row can be selected by first randomly selecting a value for the variable $i_{row}$ which is outside of the original µ-set, e.g., the 256-element µ-set denoted $\{i_{row}\}_{256}$. The selected row 810 is then given by $\pi_{MSB}[i_{row}]$.

Control next passes to an action 815 which performs an analysis function. The action 815 views the currently selected row as a mapping group as discussed in connection with the actions 615 and 620 above. All of the restricted zones for each coded bit position on the currently selected row, $\pi_{MSB}[i_{row}]$, of the matrix C are preferably evaluated in the action 815. In a preferred embodiment, the action 815 generates a set of positions vectors for each of the coded bit positions on the $\pi_{MSB}[i_{row}]^{th}$ row of the C matrix and passes these positions vectors to Algorithm 1 in order to identify their respective restricted zones. As discussed earlier, different target MHDs may be used in Algorithm 1 depending on LengthP of each positions vector. The action 815 preferably also maintains a data structure that records all of the positions vectors and restricted zones for all the elements that have been placed. As described below, the recorded information regarding the already placed positions vectors and restricted zones can be useful if a roll-back is required later, or for other purposes as discussed below in connection with FIG. 10.

Control next passes to an action 820 which starts by identifying a preferred default candidate intra-row permutation, $\pi_{LSB}^{i_{row}}[\bullet]$. When M=8, a set of M=8 candidate permutation positions, $\pi_{candidate-0}, \ldots, \pi_{candidate-7}$ can be identified for placing the M=8 coded bits of the $\pi_{MSB}[i_{row}]^{th}$ row of the C matrix. For example, the preferred default candidate intra-row permutation can be the $\{LSBs\}_{M=8}$ output of the block 705 in embodiments where a QPP interleaver is used in the block 705 of FIG. 7 as described above. If the default intra-row permutation is able to place the coded bit positions into the candidate locations, $\pi_{candidate-0}, \ldots, \pi_{candidate-7}$ on the $\pi_{MSB}[i_{row}]^{th}$ without placing any coded bit positions into any of their respective restricted zones, then the default intra-row permutation is preferably selected. In this case the action 820 places the bits from the currently selected row, $\pi_{MSB}[i_{row}]$, using the set of QPP-generated LSBs, $\{LSBs\}_{M=8}$, as generated by the block 705 as discussed above in connection with FIG. 7.

As shown in FIG. 7, blocks 705, 715 and optionally 720 and more similar $\pi_{LSB}^{i_{row}}[\bullet]$ address generator blocks may be used. First consider an embodiment where just the blocks 705 and 715 are used to generate two different sequences of intra-row permutations, and $\pi_{LSB-Alt}^{\pi i_{row}}[\bullet]$. In such an embodiment, if the preferred default candidate intra-row permutation, $\pi_{LSB}^{\pi i_{row}}[i_{row}]$, cannot place all of the coded bit positions in the $\pi_{MSB}[i_{row}]^{th}$ row of C into non-restricted zones, then an alternative intra-row permutation $\pi_{LSB-Alt}^{\pi i_{row}}[i_{row}]$ is identified that is able to place all of the coded bit positions in the $\pi_{MSB}[i_{row}]^{th}$ row of C into non-restricted zones. In such embodiments, the multiplexer 725 is used to select $\pi_{LSB-Alt}^{\pi i_{row}}[i_{row}]$ when the corresponding row address, $\pi_{MSB}[i_{row}]$, is generated that required the alternative intra-row permutation. Different such DCIs will need be designed and specified for use with each frame size, K. If, during the action 820, no such permutation can be identified, then one or more roll-backs can be attempted and/or the method 1000 as discussed below in connection with FIG. 10 can be used. If all of the roll-backs fail, then a different permutation, $\pi_{MSB}[\bullet]$, can be selected, for example, by checking another pair of the values $f_1$ and $f_2$ in embodiments where $\pi_{MSB}[\bullet]$ is a QPP permutation. Then the method 800 is started anew with this new permutation, $\pi_{MSB}[\bullet]$. In some embodiments a desired set of default intra-row permutation is not used and only one specifically designed set of permutations, $\pi_{LSB-Alt}^{i_{row}=0,\ldots,K/M-1}[\bullet]$ is identified. In such embodiments the block 705 only generates $\pi_{MSB}[\bullet]$ and the block 715 is used to generate the row-permutation sequence of LSBs, $\{LSBs\}_{M=8}$, and block 720 is not used. For example, coordinated instantiations of the method 800 can be run at different frame sizes and an set of alternative intra-row permutation sequences can be identified that provide DCI solutions at a plurality of different frame sizes.

In other kinds of embodiments, such as illustrated in FIG. 7, one or more intra-row permutation blocks like blocks 715 and 720, can each be configured like block 705 to count in accordance with a respective different permutation $\pi_{MSB-Alt}[i_{row}]$, and to generate a respective different sequence of intra-row permutations, $\{LSBs\}_{M-Alt}$. In such embodiments, two, three or more blocks 715 and 720 operate similar to the block 705 to count in different permutation orderings so as to provide different alternative intra-row permutations, for $\{LSBs\}_{M=8}$, and the multiplexer 725 selects one of the blocks 715, 720, etc., to provide a selected set $\{LSBs\}_{M=8}$ to be coupled to the M×M interconnection network, 730 for use in permuting the $\pi_{MSB}[i_{row}]^{th}$ row. In such embodiments, the block 705 generates the row address that is coupled to the memory 710, and the actions 815 and 820 are used to determine the selection control to the multiplexer 725 and to optimize the specific permutation rules used in blocks 715 and 720 and any additional such blocks, if used, in any given embodiment.

In all such embodiments of the method 800, control next passes to action 825 where the variable PLACED is incremented by M. If no valid placement could be found in the action 820, a flag is preferably set in the action 820 so that the action 825 will not increment the variable PLACED. Control next passes to action 830. If the variable PLACED has been incremented by M, and the value of PLACED is still less than K, then control passes from the action 830 back to the action 810. If an error condition has been marked in the action 820, then action 830 performs a roll-back and increments a roll-back counter. When a roll-back is carried out, the value of $i_{row}$ and thus $\pi_{MSB}[i_{row}]$ is rolled back to a previous value, and the value of PLACED is set to a lower value indicative of the roll-back point. If a certain number of roll-back attempts fail, a new deterministic interleaver can be selected for use as $\pi_{MSB}[\bullet]$. For example, if the deterministic interleaver is a QPP interleaver, the parameters $f_1$ and $f_2$ are adjusted and the method 800 started over again using this new $\pi_{MSB}[\bullet]$ permutation at the action 802. Also, If a certain number of roll-back attempts fail, the method 1000 as discussed below can be executed, especially for cases where the value of PLACED is close to K=μ*ρ.

To understand how roll-backs are performed, consider the above example where there are a total of 512 rows to be placed, and a "non placeable row" error condition is flagged when attempting to place row $\pi_{MSB}[i_{row}]$, which corresponds to the 507th row in the row-placement sequence. The probability of having a "non placeable row" error condition increases toward the end of the method 800 when the majority of the rows have already been placed. There are various approaches that can be performed to perform a roll-back. One approach it to not place the current non-placeable row, flag the current row as not having been placed, but to then increment PLACED, and continue to the next row, and continue doing this until PLACED reaches its final value. Assume that this is attempted, and by completion of the method 800, all of the rows could be placed except for rows, $\pi_{MSB}[i_{row}]$, for $i_{row} \in \{14, 210, 507\}$. To perform the roll-back, the stored positions vectors and restricted zones are analyzed and the codewords involved in the positions vectors are identified. An analysis is performed to determine which already placed rows contain codeword positions that caused the difficulty in the placement of the codeword positions in the rows that could not be placed. The roll-back is then preferably performed by causing certain earlier-placed rows to be placed in such a way as to alleviate all of the placement problems in the problematic rows. This can even go as far as causing certain alternative permutations to be applied in the μ-set. Once the changes are made to the placement of a subset of already placed rows, the method 800 is restarted at the point after the earliest row that was changed (or after the μ-set if changes were made in the way any of the rows of the μ-set). The method 800 is then allowed to run to completion or until another roll-back is needed. This process continues until the method 800 finds a solution or until a roll-back counter meets a threshold. If the roll-back threshold is met, a new deterministic interleaver is used in the block 705, and the method 800 is started over with this new deterministic interleaver. For example, if the deterministic interleaver used in block 705 is a QPP interleaver, the parameters $f_1$ and $f_2$ are adjusted and the method 800 started over again using this new $\pi_{MSB}[\bullet]$ permutation at the action 802. Also, the method 1000 as discussed below in connection with FIG. 10 can be invoked to attempt to find a DCI solution for the failed run of the method 800.

Like the method 600, the method 800 can be configured to perform an "analysis run" that does not place coded bit positions from c to u in actions 805 and 820. In analysis runs, the coded bit positions have all already been placed, so the method 800 is used instead to identify restricted zones for any specified MHD, e.g., MHD>$d_r$. The output of an analysis run includes a set of positions vectors (and their respective lengths) that correspond to low weight CTBC coded sequences whose weights are $d_t < d \leq d_f$, where $d_f$ corresponds to the highest weight of sequences that need to be identified in the analysis run. Other information such as restricted zones or other statistical information such as the category of each identified low weight positions vectors and counts of positions vectors in each category can also be provided.

The method 800 can also be configured to perform a CI-3 interleaver design, or a mixed CI-3/CI-4 interleaver design. First consider configuring the method 800 to perform a CI-3 interleaver design. To start, the action 802 is configured by setting the parameter $\mu$ to $\mu=1$. This causes action 805 to place just one row without constraints. Control next passes to action 810 which can select a next remaining row, $i_{row}$, for example, by using a random number generator, and can then select the next row of C to be placed to be $\pi_{MSB}[i_{row}]$. In CI-3 design embodiments, action 815 is configured to identify the restricted zones for all coded bit positions on the selected row due to Constraints 1-4. The same CI-3 checks (Constraints 1-4) are used as discussed in connection with action 615 of the method 600 when configured for CI-3 based designs as discussed in connection with FIG. 6 above. The placement of a row using CI-3 constraints in actions 815-820 is similar to the placement of a mapping group using CI-3 constraints as discussed in connection with actions 615-620 in connection with FIG. 6. In the action 820, each of the coded bit positions on the selected $\pi_{MSB}[\bullet]^{th}$ row of C can be placed similarly to a mapping group in the action 620 or to similarly to the embodiments described above in connection with the action 820 as used to design a CI-4 DCI, except using the restricted zones as determined using Constraints-1-4 in the action 815.

To configure the method 800 to design a mixed CI-3/CI-4 DCI, the method 800 is instantiated twice, with one instantiation configured to design a CI-3 interleaver as described above ("the CI-3 instantiation,") and the other instantiation configured to design a CI-4 interleaver as also described above ("the CI-4 instantiation.") These two instantiations will work on the same mixed CI-3/CI-4 DCI design problem together and communicate and synchronize each other as described above in connection with the method 600 that used a CI-3 instantiation of the method 600 in communication and in synchronization with the CI-4 instantiation of the method 600. The difference is that mixed CI-3/CI-4 vectorizable DCI uses a CI-3 instantiation of the method 800 in communication and in synchronization with the CI-4 instantiation of the method 800.

The method 800 can also be modified to operate with a plurality of different target MHDs. This type of operation is similar to the above described embodiments of the method 600, except the multiple target MHDs are applied in the action 820 instead of the action 620 as described above.

In an alternative embodiment of the method 800, the number of elements per row is set to M=1 so that there is only one column which has K/M=K coded bits in a single column (i.e., and entire frame). Length K DCIs that are not vectorizable have the disadvantage that they are not vectorizable, but have increased interleaver gain as compared to a vectorizable DCI. In such embodiments, the Constraint 6 will not be enforced. A starting deterministic interleaver is provided, $\pi_{MSB}[\bullet]$, that has a frame size of K. The actions 802 and 805 is operate like actions 602 and 605 to select and place a $\mu$-set, and action 810 behaves similarly to action 610 to preferably select a single coded bit to be placed. In such embodiments action 820 places each coded bit in accordance with the deterministic interleaver, $\pi_{MSB}[\bullet]$. A full data structure of related information such as positions vectors, restricted zones, and constraint violations in placing bits in accordance with $\pi_{MSB}[\bullet]$ are recorded. The final result is an analysis of $\pi_{MSB}[\bullet]$ to determine how close it is to a length K DCI. As discussed in connection with FIG. 9 and FIG. 10, additional hardware can be provided and actions taken to enforce the constraints at run time.

Figure 9:
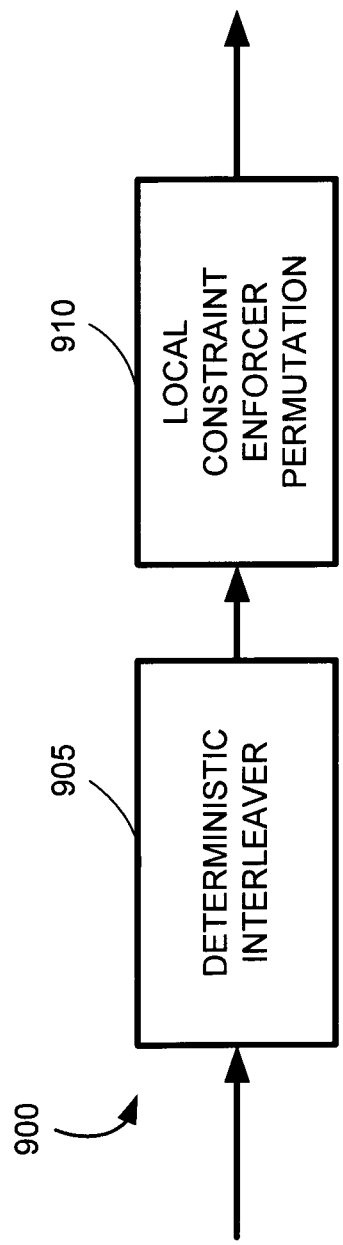
FIG. 9 is a block diagram of a deterministic constrained interleaver that uses a local constraints enforcement permutation to modify a deterministic interleaver's permutation function in order to provide an overall permutation function that corresponds to a deterministic constrained interleaver (DCI).

FIG. 9 is a block diagram of an alternative embodiment of a deterministic constrained interleaver DCI 900. Like a QPP interleaver, a control input to the deterministic constrained interleaver 900 is a set of indices, i=0, . . . K-1, or a set of recursion start-up parameters. The indices and/or the interleaved-addresses are typically used to index a vector containing data elements, where the data elements can be items like information bits, coded bits, branch metrics, extrinsic LLR (log-likelihood ratio) numbers, and the like. In applications where the deterministic constrained interleaver (DCI) 900 is used in encoder/decoder systems that do not use CTBC codes, the data elements could correspond to any other type of data element that is indexed by the set of indices and interleaved addresses that are generated by the DCI 900.

A deterministic interleaver 905 generates a set of permuted indices using a deterministic formula-based calculation to generate the deterministic interleaver's address sequences under state machine or program control. The output of the deterministic interleaver 905 is coupled to a local constraint enforcer permutation block 910. As the name implies, the purpose of the local constraint enforcer permutation block 910 is to perform a local post-permutation to transform the deterministic interleaver's output to a valid constrained-interleaver permutation function. The local constraint enforcer permutation 910 takes as input the deterministically permuted sequence of indices and applies a predetermined set of correction permutations to ensure that the resulting sequence, u, meets a set of interleaver constraints such as any one or more of interleaver Constraints 1-6 as discussed above. For example, the local constraint enforcer permutation can apply a predetermined set of swaps or sub-permutations to convert the output of the deterministic interleaver 905 into a valid deterministic constrained interleaver permutation, 900.

Similar concepts as described in connection with FIG. 6 and FIG. 8 can be used to determine the local constraint enforcer permutation 910. In practice the deterministic interleaver 905 is selected to be as close as possible to a DCI, and the local constraint enforcer permutation 910 is selected to perform a predetermined set of swaps or other type of reordering. The design objective is to minimize the hardware complexity needed to implement the local constraint enforcer permutation 910. As discussed in further detail below, the method 1000 can also be used to make improvements upon random (i.e., non-deterministic) constrained interleavers where the method 600 was not able to easily determine a CI-3, CI-4 or a mixed CI-3 /CI-4 solution. In such cases, the swap permutations identified to be performed by the local constraints enforcement permutation 910 are incorporated directly into the random constrained interleaver. In this sense the method 1000 acts as a second layer of a roll-back action for use when the method 600 needed additional help in finding a CI-3, CI-4, or a mixed CI-3/CI-4 solution.

Figure 10:
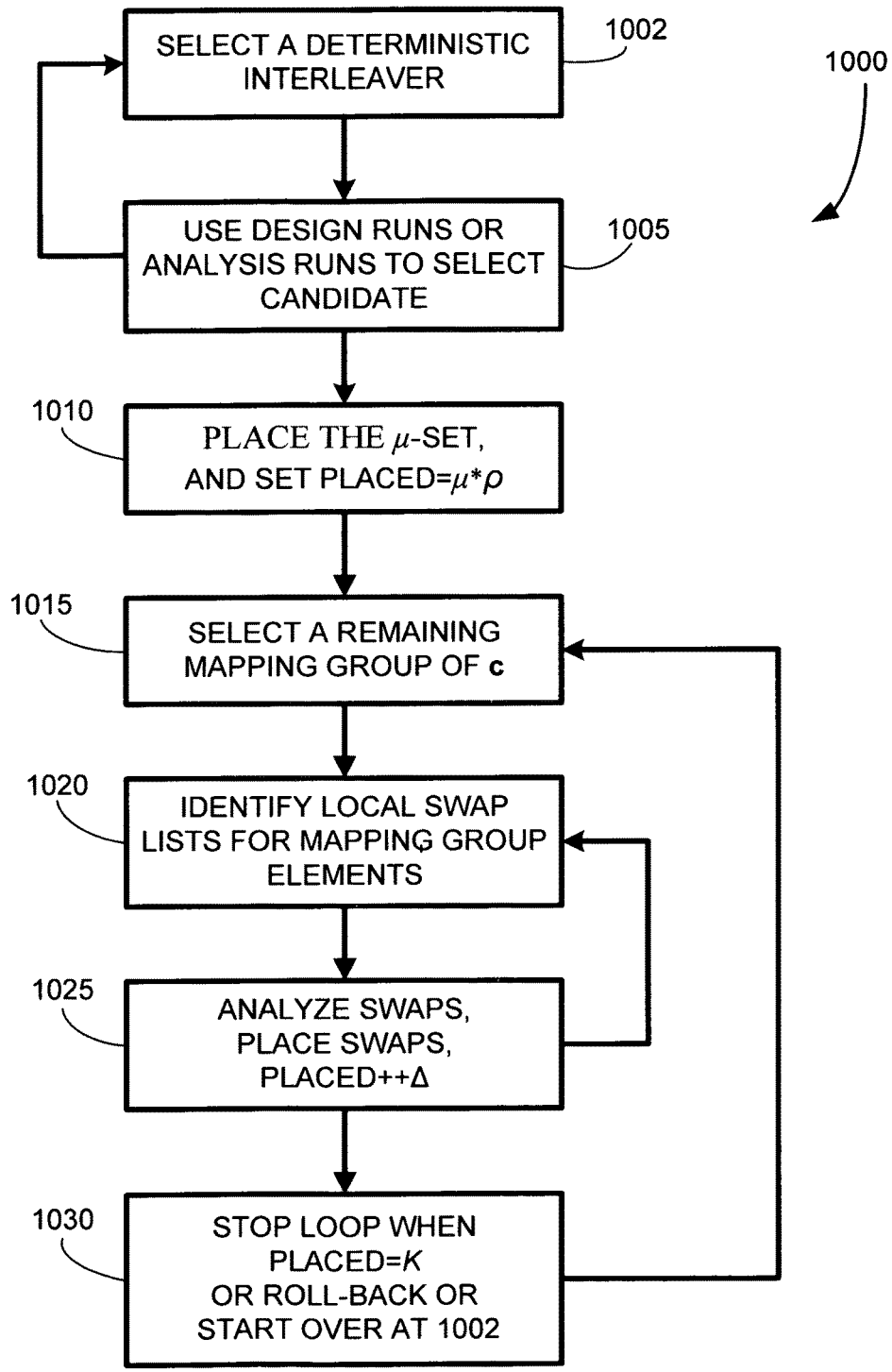
FIG. 10 is a flow chart that illustrates a design method used to design the local constraint enforcer permutation 910 of FIG. 9.

Referring now to FIG. 10, a method 1000 is provided to design the local constraint enforcer permutation 910. The design method 1000 can be used to design CI-3, CI-4 or mixed CI-3/CI-4 DCIs that implement all of Constraints 1-5. The method 1000 can also be used to design contention free DCIs that implement Constraint 6. As discussed below, local constraint enforcer permutation 910 can also be used to help the method 600 find random constrained interleavers in cases where a solution is difficult to find. The method 1000 is first described herein in the context of designing a CI-4 interleaver. The same types of modifications as discussed above in connection with FIG. 6 and FIG. 8 can be used to design the permutation enforcement permutation 910 to design CI-3 and mixed CI-3/CI-4 DCIs.

The method 1000 begins with an action 1002 that selects a deterministic interleaver, $\pi_D[\bullet]$, for use in the block 905 of FIG. 9. As discussed in connection with FIG. 8, the deterministic interleaver selected in action 1002 could be any deterministic interleaver. For example, different QPP interleavers could be selected by adjusting the parameters $f_1$ and $f_2$ of equation (1).

The deterministic interleaver 905, $\pi_D[\bullet]$, that is identified in action 1002 is then processed by action 1005 using an embodiment of the method 800. For example, any of the embodiments of the method 800 as described in connection with FIG. 8, or other similar variations thereof could be used. The method 800 can be configured as a design run that attempts to design a DCI, or as an analysis used run to measure the amount and extent of constraint violations that the deterministic interleaver $\pi_D[\bullet]$ selected in action 1002. As shown in FIG. 10, there is a loop between actions 1005 and 1002. This loop is used to select a good deterministic interleaver candidate for use with the method 1000 that is close as close to a DCI as possible. Closeness to a DCI is measured by recording all of the low weight CTBC vectors that exist in the deterministic interleaver 905 below a specified target MHD, $d_t$.

Alternatively, the method 1000 can be used similar to a roll-back for cases where the method 800 was not able to find a deterministic constrained interleaver permutation, $\pi_{DCI}[\bullet]$ to meet all the specified constraints. In such cases, the method 1000 can be viewed as an outer control loop that calls the method 800 to design a DCI from the action 1005. If the method 800 is able to find a valid DCI, then the method 1000 can exit at action 1005. If the method 800 is not able to find a DCI to meet a specified set of Constraints 1-6, then the analysis information provided by method 800 can be used to identify one or more interleavers that are close to a DCI but still have one or more identified constraint violations. Preferably a complete record of relevant of the information from the one or attempted design runs of the method 800 that provided the one or more best/closest approximations to a DCI are recorded in the action 1005. For example, the μ-sets, the lists of positions vectors used when placing each position, (nj+t), the respective restricted zones identified when placing each bit (nj+t), and the orderings used to make the rest of the placements after the μ-set as identified by each pass through action 810 would be identified for each candidate deterministic permutation $\pi_D[\bullet]$ that is identified to be close to a deterministic constrained interleaver permutation $\pi_{DCI}[\bullet]$. The data structure will have preferably recorded a set of one or more coded bit positions, (nj+t), that could not be placed in such a way as to meet the target MHD during the previous run of the method 800. This way, the complete state and history of the runs of the method 800 that resulted in each candidate $\pi_D[\bullet]$ could be made available to the method 1000. Depending on the embodiment of the method 1000, only a subset of all the recorded information described above may need to be recorded for use by the rest of the method 1000. In embodiments where the action calls the method 800 to provide only an analysis run, a similar set of information would be provided by the analysis run of the method 800.

Control next passes to an action 1010 that places a μ-set similar to the action 805 as described above. The same placement as used in the action 805 when the method 800 was called from the action 1005 is preferably used. The previous run of the method 800 could have been an analysis run or a failed design run as discussed above. Control next passes to an action 1015 which selects a next coded bit position or a mapping group to be placed. This action can be performed similar to any of the embodiments of the action 810 as described above. In preferred embodiments the action 1010 follows the stored ordering that was generated by looping through the action 810 by the method 800 when it was called from the action 1005. When this ordering is used, the information recorded in the previously described data structure will be perfectly synchronized with the current run of the method 1000. In alternative embodiments, the mapping group is selected based upon, for example, a window of positions in the vector u where the state information data structure provided by the previous run of the method 800 indicates that constraint violations exist that need reconciliation.

Control next passes to an action 1020 identifies one or more respective local swap lists associated with each of the one or more current bit positions in the current mapping group. For example, the action 1020 analyzes each bit position (nj+t) of the current mapping group to determined whether the deterministic interleaver 905's permutation location $\pi_D[(nj+t)]$, is in a restricted zone. If $\pi_D[(nj+t)]$ does not correspond to a location in any restricted zone of (nj+t), then a respective local swap list, $L_{swap}(\pi^D[(nj+t)])$, is left empty. In such a case, if there is only one element in the mapping group, then control then passes to actions 1025 and 1030 where the variable PLACED is incremented and control is looped back to the action 1015 to select the next placed element to be analyzed. If $\pi_D[(nj+t)]$ is in an identified restricted zone of (nj+t), then the local swap list $L_{swap}(\pi_D[(nj+t)])$ will need to be built. The local swap list will contain a list of positions that are both local to the mapped position $\pi_D[(nj+t)]$ and are outside any restricted zones of (nj+t).

The concept of "local" is relative to the underlying hardware on which the $\pi_{DCI}[\bullet]$ 900 is to be implemented. For example, if the interleaver $\pi_{DCI}[\bullet]$ 900 is not being designed to be a vectorizable interleaver, a local set of candidate swap locations can be defined as a window, $\pi_D[(nj+t)] \pm w_d$, where $w_d$ corresponds to a window distance and is used to define a window around the position $\pi_D[(nj+t)]$ in u. If the interleaver $\pi_{DCI}[\bullet]$ 900 is being designed to be a vectorizable interleaver, then "local" typically refers to a two-dimensional window area, given by $U(\pi_{MSB}[i_{row}] \pm w_{d\text{-}row}, \pi_{LSB}[j_{col}] \pm w_{d\text{-}col})$. Typically the smaller the value of $w_d$, $w_{d\text{-}row}$, and/or $w_{d\text{-}col}$, the lower complexity that will be required to implement the local constraints enforcement permutation 910. The window size used in a swap zone is preferably made as small as possible and the minimum possible window size is dependent on the distance to a nearest swappable position in u as discussed below. In many cases the window need not be centered on the position $\pi_D[(nj+t)]$, but as discussed below, the window edges will be determined by the edges of certain relevant restricted zones. When the current mapping group contains more than a single coded bit position, the minimum possible window size for use with a swap list can also be influenced by the other swap lists of other elements in the current mapping group.

Without loss of generality, assume for now that the DCI 900 being designed is not required to be contention free, so the simpler one-dimensional window, $\pi_D[(nj+t)] \pm w_d$ in u is in use. Also assume that the current mapping group only has one element, (nj+t), and that $\pi_D[(nj+t)]$ has been placed into a restricted zone of (nj+t). In this example the local swap list, $L_{swap}(\pi_D[(nj+t)])$, will need to be built. The local swap list is built by starting with the smallest window size possible. The smallest window size possible is influenced by the restricted zone in which the coded bit position, (nj+t), has been placed, i.e., the restricted zone of (nj+t) around $\pi_D[(nj+t)]$. In this example, suppose that the restricted zone into which (nj+t) has been placed can be defined as the range $[\pi_D[(nj+t)]-rz_1, \pi_D[(nj+t)]+rz_2]$, where $rz_1$ and $rz_2$ are parameters that define the restricted zone edges relative to the placed position, $\pi_D[(nj+t)]$.

Continuing with this example, and focusing on the increasing direction in u, there will be a neighboring bit position at $\pi_D[(nj_2+t)]=\pi_D[(nj+t)]+rz_2+1$. The action 1020 will next check to determine whether $\pi_D[(nj+t)]$ is in a restricted zone of bit position (nj$_2$+t). If $\pi_D[(nj+t)]$ is not in a restricted zone of bit position (nj$_2$+t), then $\pi_D[(nj_2+t)]$ can be added to the swap list $L_{swap}(\pi_D[(nj+t)])$. This is because, if the positions $\pi_D[(nj+t)]$ and $\pi_D[(nj_2+t)]$ are swapped in u, then after the swap, neither of $\pi_D[(nj+t)]$ will have moved out of its restricted zone and $\pi_D[(nj_2+t)]$ will still be outside of its restricted zones. The local swap list $L_{swap}(\pi_D[(nj+t)])$ can thus be built in this way in both the increasing and decreasing directions in u (or 2-dimensional indexing-area in U). The entire swap list, $L_{swap}(\pi_D[(nj+t)])$, need not all be built at once, but can be expanded as needed to include more elements. The idea is to start with the closest elements in u and to grow the list as needed. If another restricted zone of (nj+t) is encountered while expanding outward in any direction from the center position, $\pi_D[(nj+t)]$, those points are skipped over to one point beyond the distant edge of the newly encountered restricted zone.

Once one of more elements have been added to $L_{swap}(\pi_D[(nj+t)])$ in the action 1020, control next passes to an action 1025. Continuing with the simple example where there is only one element, (nj+t), in the mapping group, the action 1025 will typically start with the closest element of $L_{swap}(\pi_D[(nj+t)])$ and analyze whether this swap is a valid swap. A swap is said to be valid if it swaps $\pi_D[(nj+t)]$ with $\pi_D[(nj_2+t)]$ so as to eliminate the constraint violation in (nj+t) without introducing any new constraint violation associated with any (one or more) third coded bit position(s), $\pi_D[(nj_3+t)]$. To ensure the swap is valid, a check is first made by scanning each coded bit position in u in the vicinities of $\pi_D[(nj+t)] \pm w_d$ and $\pi_D[(nj_2+t)] \pm w_d$ and identifying any placed coded bit position in u, $\pi_D[(nj_3+t)]$, that is associated with a respective coded bit position (nj$_3$+t) whose position vectors contain any coded bits from completed codewords associated with the codeword positions $c_j$ and/or $c_{j2}$. If any such coded bit positions $\pi_D[(nj_3+t)]$ are found, then a further check is made to determine whether the proposed swap would cause a constraint violation associated coded bit position (nj$_3$+t) to occur. If no such placements $\pi_D[(nj_3+t)]$ in the local vicinity is found, the swap is determined to be valid, and the swap can be made or annotated in the list to be a valid potential swap for later use. If the swap is not valid, then additional positions in the local swap list can be checked, or control can pass back to the action 1020 to identify more elements to add to the swap list and then action 1025 is repeated looping in this way until at least one valid swap is found. Once one or more valid swaps are found, the counter PLACED is incremented and control passes to an action 1030.

As discussed above, in some cases a mapping group with $\Delta>1$ element is selected in the action 1015. In such cases, the above process is carried out, but by additionally observing the interactions between making multiple swaps. For example, if four elements are in the mapping group, it could turn out that several different valid swaps could have been made, but a particular valid swap caused a problem later. Hence computer-chess logic ("look ahead logic") is used to analyze a set of potential valid swaps ("moves") several moves into the future. Such added logic of looking into a trellis of paths containing several moves into the future can be used to find a set of potential valid swaps that avoid having an earlier swap cause a problem for a later swap. In fact, this type of optimized forward looking trellis logic can be used with a mapping group that includes all of the bit positions that have constraint violations.

At times, an invalid swap may purposely be made. An invalid swap is made in order to be able to chain swaps. Chained swaps are used when the distance of the swap is too large for the underlying hardware, so that an actual swap is implemented as two sub-swaps, selected such that after the two sub-swaps there will be no constraint violations.

The method 1000 can also be used in conjunction with the method 600 that designs a CI-3 or CI-4 or mixed CI-3/CI-4 random constrained interleavers. If a random interleaver is being designed as per the method 600, then the method 1000 can have its action 1005 call the method 600 instead of the method 800. The method 1000 runs similarly as described above, but all of the swaps can be carried out off line and used to correct the random interleaver's permutation function so that all the constraints are enforced. In such embodiments, no separate constraint enforcer permutation 905 is needed because it is incorporated directly into the random interleaver's permutation function.

Figure 11:
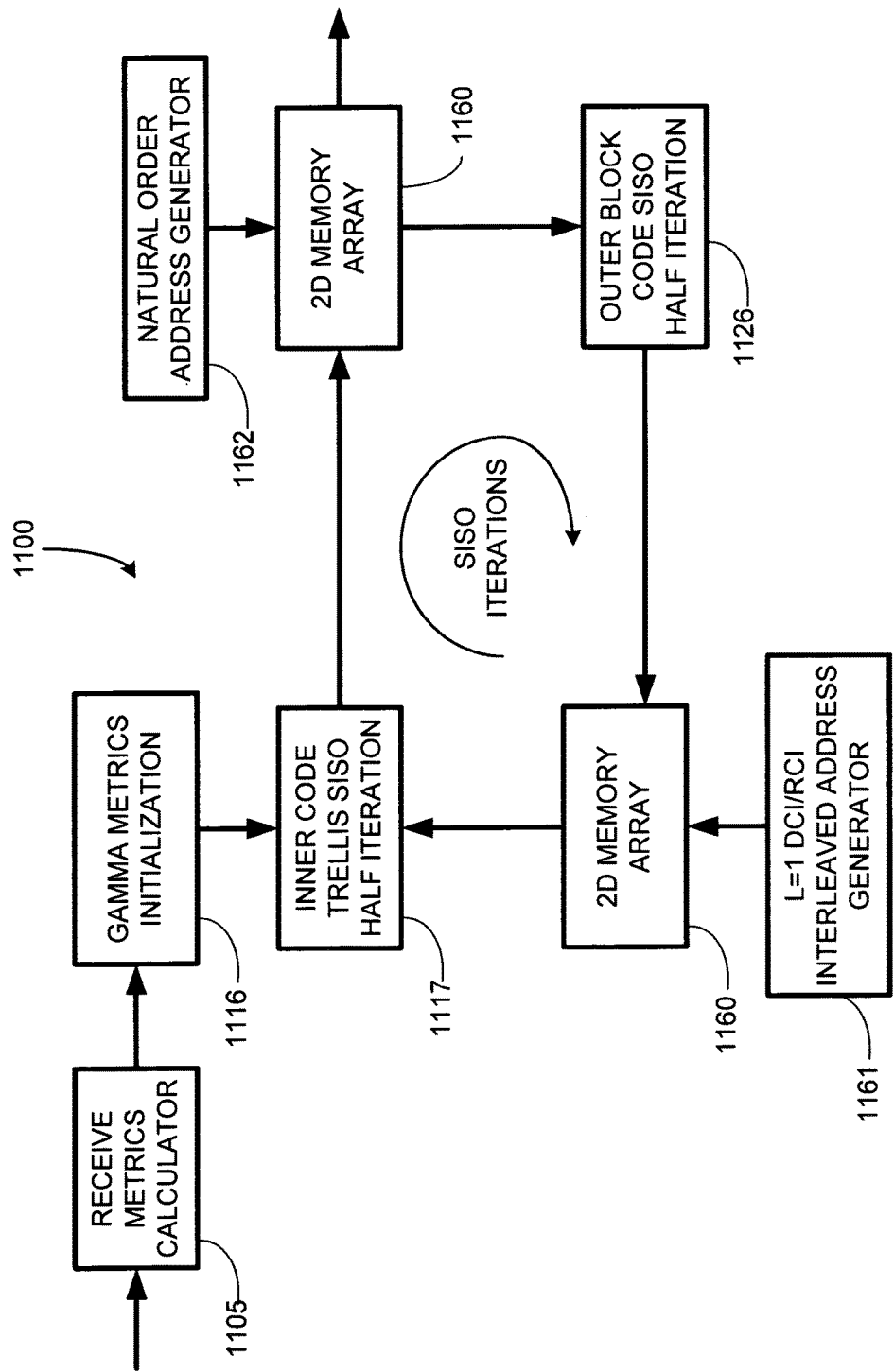
FIG. 11 is a block diagram of a CTBC code SISO decoder that uses a random or deterministic L=1 constrained interleaver constrained interleaver and a 2D memory based interleaver architecture.

FIG. 11 is a block diagram illustrating an embodiment of a receiver/decoder structure 1100 in accordance with the present invention. The receive metrics calculator 1105 (and block 1205 of FIG. 12) is generally preceded by a receiver front end. The receiver front end, for example, receives and demodulates a signal such as an OFDM signal or an optically modulated BPSK or QAM signal. The receiver front end portion of the block 1105 could generally be embodied to implement any type of known signal demodulator/demapper, or using any of the signal mapping and rate matching techniques disclosed hereinbelow in connection with FIGS. 15-24. The receiver front end portion of the block 1105 is typically implemented in a separate chip or subsystem as compared to the chip that performs SISO decoding. In some embodiments the signal metrics calculation related operations performed by blocks 1105 and 1205 can also be performed by a separate chip than the chip that implements the rest of the decoder 1100 and 1200.

The receive metrics calculator 1105 calculates a set of input signal metrics. When optional rate matching is in use, in accordance the received signal metrics calculator 1105 inserts dummy signal metrics to account for the bits that have been deleted due to the rate matching operation. Typically the signal metrics that are re-inserted based upon the puncture pattern generator 626 are set to zero, although other values could optionally be used. The receive metrics calculator 1105 couples these inverse rate matched receive signal metrics to a gamma and branch metrics initialization unit 1116.

The gamma metrics initialization unit 1116 is configured to initialize the gamma metrics, typically by filling a gamma memory using the calculated received signal metrics coupled from the receive metrics calculator 1105. The gamma memory is coupled to (or built into as an integral part of) an inner code trellis SISO half iteration block 1117. The inner code trellis SISO half iteration block 1117 generally uses the initial gamma values to perform forward and backward state metrics recursions used to support trellis decoding operations used in SISO decoding. After the first iteration, during each inner code trellis SISO half iteration 1117, the gamma values are updated and then the forward and backward state recursions (forward alpha and backward beta recursions) are carried out to update the alphas and the betas in block 1117. To do these updates, a set of a-priori extrinsic LLR values are read from a 2D memory array, 1160. An "$\alpha$-priori extrinsic LLR value" refers to an extrinsic LLR value before an update occurs and an "$\alpha$-posteriori extrinsic LLR value" refers to an extrinsic LLR value after an update occurs. Hence depending on exactly where the SISO iteration the SISO decoder 1100 is processing and from which point in the SISO decoder algorithms one is looking, a given extrinsic LLR in the 2D memory 1160 keeps switching from being an $\alpha$-priori extrinsic LLR value to an $\alpha$-posteriori extrinsic LLR value, and back to an $\alpha$-priori extrinsic LLR value and so on.

The order in which the $\alpha$-priori extrinsic LLR values read into and processed by the block 1117 is determined by the L=1 deterministic constrained interleaver (DCI) or random constrained interleaver (RCI) address generator 1161. The address generator 1161 makes sure the $\alpha$-priori extrinsic LLR values are sent to block 1117 in L=1 DCI or RCI interleaved order. After the inner code trellis SISO half iteration is complete, a set of updated ($\alpha$-posteriori)extrinsic LLR values are written back into the 2D memory array 1160 using the same interleaved ordering as discussed above, i.e., ordering determined by the DCI or RCI ordering used in the address generator 1161. The 2D memory 1160 can be viewed as holding the U matrix as described above and can be stored in the physical two-dimensional memory array memory 710 as discussed in connection with FIG. 7.

It can be noted that the 2D memory array block 1160 appears twice in FIG. 11. This is the same memory array 1160, but in the first half of the SISO iteration an interleaved-address ordering is used to access U matrix in the 2D memory, and in the second half of the SISO iteration, a natural-address ordering is used to access C matrix in the 2D memory. That is, once all the updated extrinsic LLR values have been returned to the 2D memory array by the inner code trellis SISO half iteration calculation unit 1117, i.e., when the first half iteration has completed, the second half of the SISO iteration begins. A natural order address generator 1162 is typically implemented in hardware as an alternative address sequence mode in the same module as the address generator 1161. The address generator 1161 is preferably configured to switch to the natural ordering mode 1162, i.e., to count as a simple natural order binary counter. The binary counter type natural-order address generator 1162 is coupled to the address bus of the 2D memory array 1160. The $\alpha$-priori extrinsic LLRs are thus read out to the outer block code SISO half iteration block 1126. The OBC half iteration block performs an iteration of block code soft decoding. In some applications other types of codes like LDPC codes couple optionally be decoded in the block 1126. In general, any soft block decoding type algorithm and any type of block code can be soft decoded in the block 1126. After the each $\alpha$-priori extrinsic LLR is updated by the block code decoding operation in block 1126, the $\alpha$-posteriori extrinsic LLR or a parallel set of extrinsic LLRs are returned to the 2D memory array 1160.

As is common practice, a stopping criterion is used to stop iterations. Although not shown, the stopping criterion may be implemented, for example, in block 1126 to indicate when the total LLRs have converged. To do this one or more total $\alpha$-posteriori LLR is checked for convergence. If the convergence criterion is not met, the $\alpha$-priori extrinsic LLR received from the memory 1160 is subtracted from this total $\alpha$-posteriori LLR to produce the $\alpha$-posteriori extrinsic LLR that is written back to the 2D memory array 1160 so that SISO iterations can continue. In this exemplary embodiment, if the convergence criterion is met, a control signal is generated to the 2D memory array 1160's control logic, and the block 1117 writes the total LLRs into the into the memory array 1160 and the control logic of the memory array 1160 causes the converged data values to be output from the system SISO decoder 1100. Alternatively, a fixed number of iterations may be used as the stopping criterion in the above description.

The memory architecture 700 can be used to support the memory accesses needed to support CTBC code SISO decoding. A discussion of the operation memory system 700 is provided in connection with FIG. 12 where all the description of the 2D Array LLR RAM largely comports with the memory array 710 in FIG. 7. Thus the discussion of the operation of FIG. 12 applies as well to the memory system of FIG. 7, and items mentioned about the memory system 700 optionally and preferably apply to the SISO decoder FIG. 12.

Figure 12:
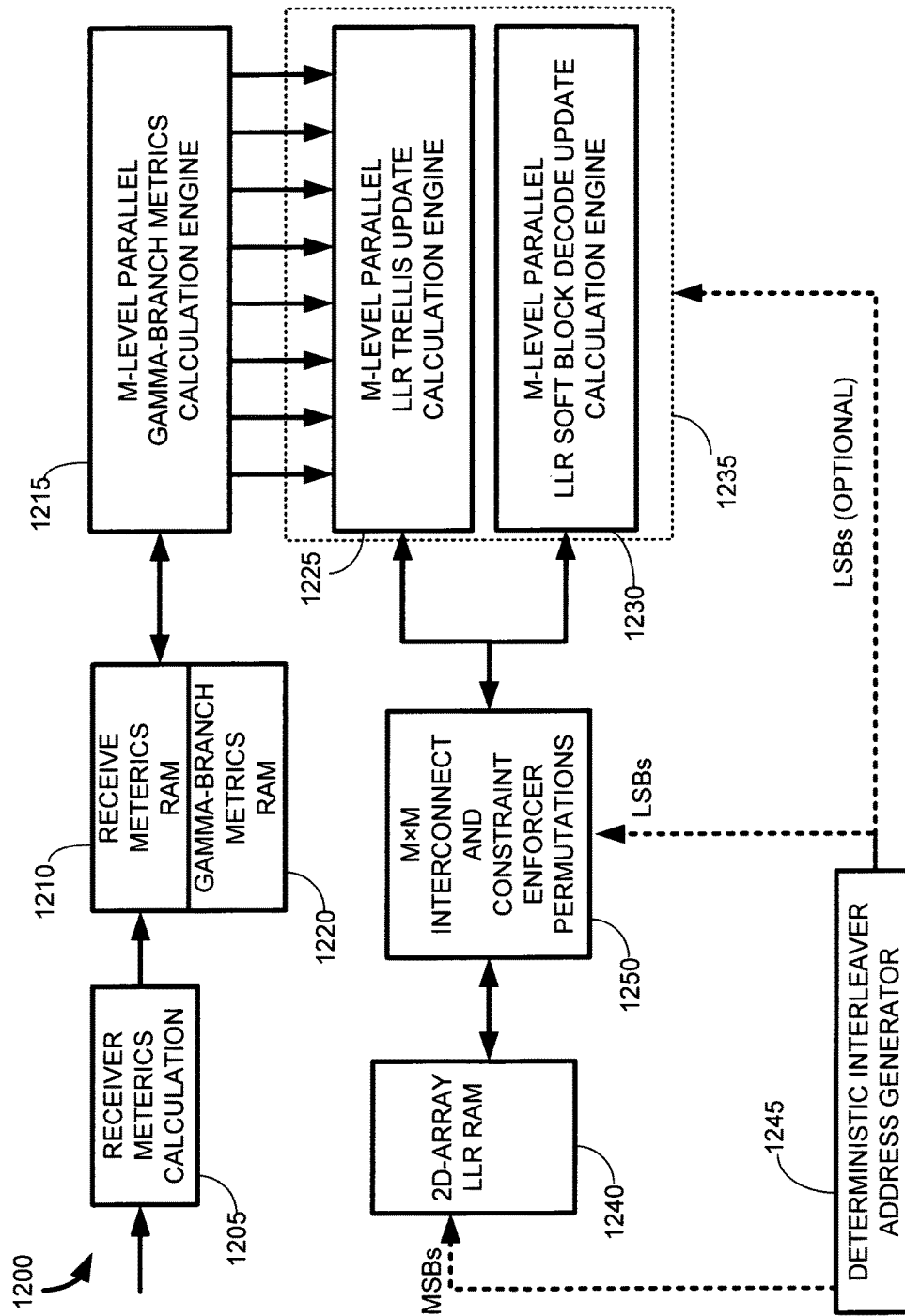
FIG. 12 is a block diagram of a memory structure and deterministic contention free interleaver hardware and addressing logic for use in parallel SISO decoders for CTBC codes.

Referring now to FIG. 12, a receiver/decoder 1200 is provided for signal reception and real time SISO decoding of CTBC codes in accordance with an aspect of the present invention. The architecture 1200 is designed to implement a particular class of embodiments of the inventive CTBC code SISO decoder algorithm as described in connection with FIG. 11 and preferably using the memory and interleaving architecture as described in connection with FIG. 7. The architecture 1200 could be embodied in many different ways, and for many different types of applications ranging from 4G/5G LTE, WiFi, satellite communications, OTN, magnetic recording, optical disk channels, and the like.

Before describing FIG. 12 in detail, some observations are made regarding the use of the architecture in decoding a CTBC code that is targeted for use in 4G/5G LTE type applications. The CTBC decoding embodiment is compared to the highly optimized implementation of the 4G LTE CTC decoder of the Studer reference. To begin, first consider one more reference: J. Li, K. R. Narayanan, and C. Georghiades, "Product accumulate codes: a class of codes with near-capacity performance and low decoding complexity," IEEE transactions on Information theory," pp. 31-46, vol. 50, No. 1, January 2004 ("the Li reference" herein). Page 36 of this article the authors prove that when the (known to those of skill in the art) Min-sum decoding algorithm is applied to decode a sequence that has been encoded by the rate-1 accumulator, that this is equivalent to applying the Max-log-Map decoding to the same rate-1 accumulator encoded sequence. A complexity analysis is performed on pages 36-37 of the same paper, and on page 37, it is shown that the Min-sum decoding of the rate-1 accumulator is requires ⅛ as much work as the Max-log-Map BCJR algorithm applied to the same rate -1 accumulator encoded sequence.

With the above result in mind, consider the hardware and computational complexity needed to implement the each of the half iterations of a SISO iteration to decode the 4G LTE CTC the Studer reference. The Studer reference uses a radix-2 and a radix-4 Max-log-Map BCJR algorithm. The 4G LTE trellis code is an eight-state trellis code. Thus decoding such a trellis code requires performing eight gamma branch metrics calculations, one for each of the 4G LTE CTC's eight states, plus eight forward alpha state metrics recursions, and eight backward beta state metrics recursions, plus an LLR update to update the extrinsic information (3×8+1=25 vector operations of length $K_{sub}$, where $K_{sub}$ is the length of each of the N=8 trellis subsequences). Therefore the order of complexity for decoding each of the N=8 trellis subsequences in of each of the two half iterations used in the Studer reference's ASIC to perform the Max-log-Map BCJR algorithm is given by O(25 $K_{sub}$). As can be seen by equations (2), (3), and (4) in the Studer references, around 6 or so additions and compare-select-max type operations, operations on average. Hence in terms of actual operations performed by adders and/or compare circuits, a closer estimate of complexity would be O(150 $K_{sub}$). Additionally some LLR based arithmetic is needed (scalar operations that do not add into the order of complexity calculations).

Next consider the complexity of first half iteration 1117 of the CTBC code whose inner code has been selected to be the rate-1 accumulator. The rate-1 accumulator does not require and 8-state trellis decoding operation but instead requires a 2-state trellis decoding operation. Changing the number "eight" to the number "two" in the above analysis gives a complexity of O(6 $K_{sub}$) if the Max-log-Map BCJR algorithm is to be used. However, as mentioned above in the Li reference, for the special case of decoding the rate-1 accumulator, the Max-log-Map BCJR algorithm used in the Studer reference is equivalent to the Min-sum algorithm and the complexity of the Min-sum algorithm is roughly ⅛ as inexpensive as compared to the Max-log-Map BCJR algorithm operating on the same rate-1 accumulator. An inspection of tables I and II of the Li reference reveal that the comparative complexity to implement the Min-sum O(3 $K_{sub}$). That is, the complexity to perform the first half of the SISO iteration 1117 is roughly (3/150)×100=2% as much work as is required to implement the first half iteration of the best current 4G hardware that relies on 8-state Turbo decoding.

When the OBC can is selected to be a simple (8,4) Hamming code, this code will need to be soft decoded during the second half of the SISO iteration. As discussed in connection with FIG. 13, this (8,4) Hamming code has only 16 codewords so can be efficiently optimally soft decoded in hardware. As per FIG. 14 below, it can be seen that each input extrinsic LLR requires computations of blocks 1410, 1415, 1420, and 1425. Adding up of the corresponding complexities of these blocks: 16+16+1+1)=34. That complexity is per bit, and there are $K_{sub}$ bits, so the complexity to perform the second half of the SISO iteration corresponding to the OBC requires O(34 $K_{sub}$). Now since (34/150)× 100=23%, this provides about a 77% drop in computational load as compared to the eight-state trellis decoding required by the CTC of the 4G LTE standard.

Figure 13:
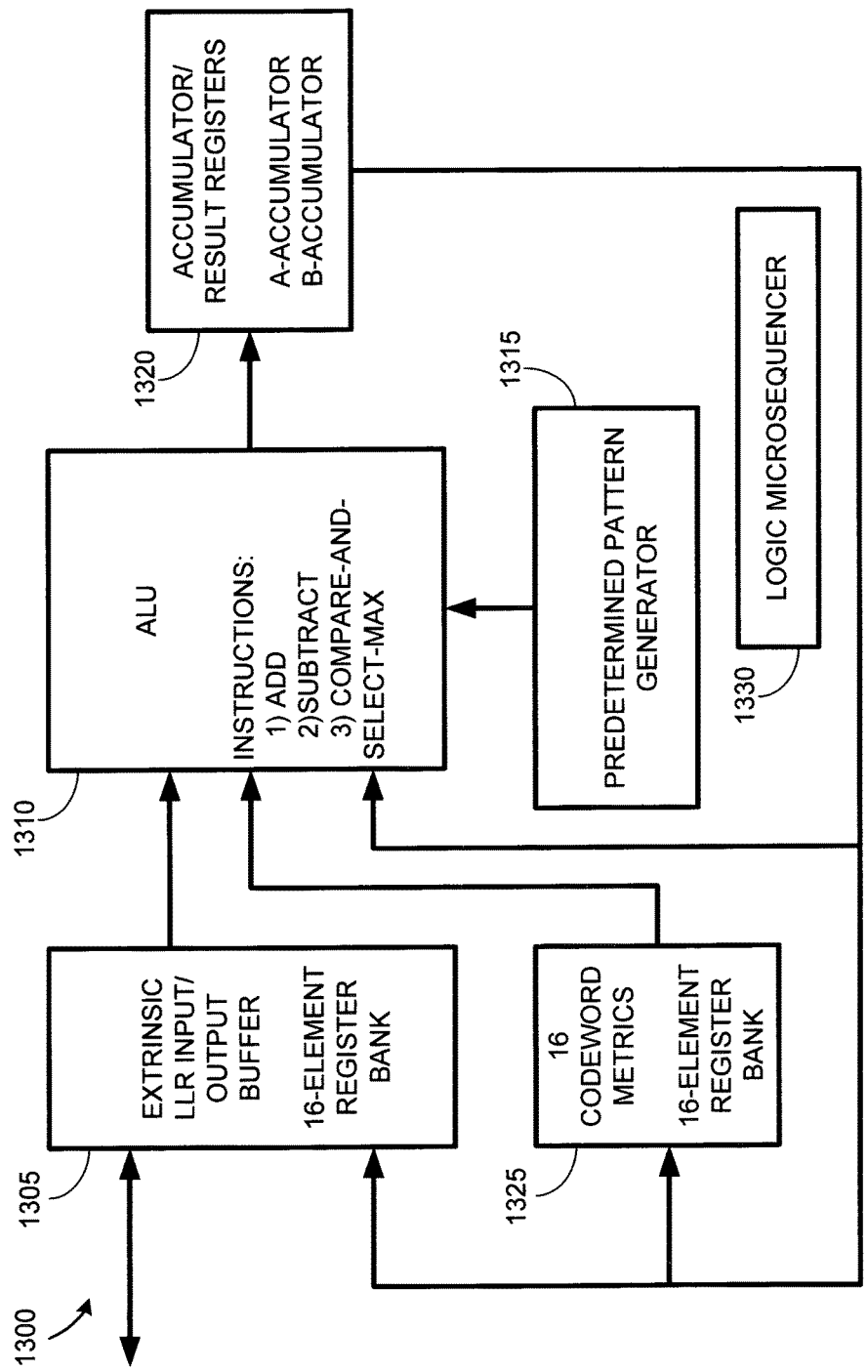
FIG. 13 is a block diagram of an embodiment of a parallel architecture suitable to for real time VLSI implementation of a SISO decoder designed for decoding CTBC codes.

The first half iteration 1117, can thus be implemented using about a 2% as much computational complexity while the second half iteration of the SISO iteration can be implemented using about 23% computational complexity. However, it can be noted that the hardware and memory requirements to implement both the first and second half iterations also drops considerably. The Min-sum algorithm requires three recursions, but not on a per-state basis (see table I of the Li reference). Hence roughly eight times the state-metrics related memory requirement is eliminated as well. As shown in FIG. 13, the memory requirements of the entire block decoder is just 32 memory locations. The hardware complexity of the functional unit 1300 and its operational program 1400 is very simple as well. The different 8-bit block codes are 100% parallelizable within each parallel subsequence. Hence five of the very simple functional units 1300 could easily be implemented in each one of the N parallel subsequence channels. These functional units could operate together using a circular buffer ordering. For example, five sets of 8 extrinsic LLRs are read into of the functional units 1300, one at a time. As soon as the data is loaded, the functional units begin processing. That is, the first functional unit could begin working while the second, third and fourth functional units were being loaded. Now the addresser could back and unload the results from the first functional unit and reload it with new α-priori extrinsic LLR values and move onto the next functional unit. This would be occurring in all N=8 subsequence channels. Hence with very little parallel hardware, the speed up would become more like 23/5=4.6% of the speed requirement for the second half iteration, and so on.

Next consider receiver/decoder 1200 in further detail. A received signal is received and demodulated prior to being processed in a receiver metrics calculation block 1205. The block 1205 is typically preceded by a received signal demodulator to demodulate the received signal that is has been modulated by a signal mapper that can include rate matching and spatial modulation components as are known in the art or as discussed in further detail below in the context of additional aspects of the present invention. The block 1205 can reside off chip from the rest of the decoder 1200, and can instead reside in one or more separate front-end circuits/chips designed to demodulate and preprocess the received signal.

The block 1205 computes a set of received signal metrics based upon the demodulated received signal. In embodiments where signal preprocessing includes rate matching, the receiver metrics calculation unit 1205 typically inserts a signal metric into the received signal metrics stream to compensate for a signal value that was deleted due to rate matching in the transmitter. In a preferred embodiment, the inserted signal metrics are set to zero, although other values could alternatively be used. To avoid cumbersome language, it is to be understood that when describing the receiver/decoder 1200, when the term "receive metrics" is used, it is to be understood that from here forward, this can refer to the inverse rate matched received signal metrics.

The receive metrics calculation block 1205 couples its output receive metrics to a receive metrics RAM block 1210. Associated with the receive metrics RAM 1210 is a gamma branch metrics RAM 1220. The receive metrics RAM 1210 and the gamma branch metrics RAM 1220 may be merged into one memory embodiment as the receive metrics are typically used to initialize the gamma metrics. The receive metrics/gamma metrics RAM 1220 typically holds sets of gamma values, alpha values, and beta values. The output of the RAM 1210/1220 is coupled to an M-level parallel gamma-branch metrics calculation engine 1215. In general, the blocks 1210 and 1220 may be implemented as distributed sets of sub-memories that are distributed and tightly coupled with (i.e., existing within) a set of specialized arithmetic-logic processing circuits within the M-level parallel gamma-branch metrics calculation engine 1215. For example, in the CTBC code example given discussed in connection with the CTC currently in use in the 4G LTE standard, there would preferably be N=8 processing clusters inside the M-level parallel gamma-branch metrics calculation engine 1215. Each of these sub-clusters would preferably contain three sets of arithmetic-logic processing circuits each, one to update a set of alpha values (forward branch metric recursion), another to update a set of beta metrics (backward branch metric recursion) and another to update a gamma value (gamma update recursion). Given that only a two-state trellis typically needs to be decoded by the M-level parallel gamma-branch metrics calculation engine 1215, some of these hardware units could be eliminated. For example one functional unit could be used to compute both the forward and the backward state metrics. If the Min-sum algorithm is used as discussed above to decode the rate-1 accumulator, even more reductions are possible. With the Min-sum algorithm, the work required is as if there were only one state in the trellis. Hence significantly low complexity hardware can be designed. See Table I of the Li reference for a comparison.

Therefore the block 1220 would preferably include small RAM blocks collocated with the alpha, beta and gamma updating hardware. That is, M-level parallel gamma -branch metrics calculation engine 1215 is preferably embodied using M sets of parallel processing circuits tightly coupled and integrated with M different sub-memory modules that make up the memory blocks 1210/1220. Methods of initializing the alpha beta and gamma values used in the various forms of the BCJR algorithm of each subsequence are well known to those of skill in the art. The receive metrics are used to initialize the gamma metrics and the alpha and beta metrics are thus initialized in a selected way as is known to those of skill in the art for parallel SISO decoding of Turbo codes. For example, see the Studer and Roth references to understand some techniques that would be known to one of ordinary skill in the art as to how to initialize the parallel trellis subsequences. Many algorithms can be used to perform the soft trellis decoding on the parallel subsequences to decode the IRCC using M-level parallelism and finer grain sub -parallelism. That is, the blocks 1210, 1215, 1220 and 1225 can be configured to compute the operations of first half SISO iteration as computed in block 1117 of the CTBC decoding algorithm of FIG. 11. Known SISO decoding algorithms such as MAP, Max -Log-MAP, Log-Map and SOVA (soft output Viterbi algorithm) can be used to compute these soft trellis decoding half iterations in the blocks 1117, 1210, 1215, 1220, 1225. As mentioned above, when the rate-1 accumulator is used as the IRCC, the Min-sum algorithm can be used and has significantly lower hardware and software memory requirements.

The decoder 1200 uses the 2D-array extrinsic LLR RAM 1240 to hold the updated the extrinsic LLR values similar to the 2D memory array 1160 of FIG. 11. The deterministic interleaver address generator 1245 and the 2D-array extrinsic LLR RAM 1240 can be implemented using a structure similar to the memory array 710 in FIG. 7. The DCI address generator block 1245 generally corresponds to any combination or sub combination of blocks 705, 715, 720, 725, and any additional optional LSB-address generator blocks as discussed in connection with FIG. 7. The M×M Interconnect and constraint enforcer permutations block 1250 corresponds to 730 of FIG. 7 and optionally additional hardware to implement block 1310 of FIG. 13 (optional). In the M×M interconnect and constraint enforcer permutations block 1250, the constraint enforcer permutations 1310 may more generally come after the block 730, before the block 730, may be integrated into the M×M spatial permutation 730 itself, or any combination thereof. Also, all double arrows shown in FIG. 12 can optionally be implemented as 2M data-word-wide, bi-directional, dual ported data paths having a dedicated set of M lanes of data words moving in both of the directions indicated by the double arrow. This is also true of all the double arrows shown in FIG. 7. Hardware block replication for east and west bound traffic is similar, e.g., block 1250 could be replicated to handle traffic moving to the left and moving to the right in FIG. 12.

Note that the M×M interconnect and constraint enforcer permutations block 1250 couples (optionally using the 2M lane bi directional data busses as described above) to the 2D-Array extrinsic LLR RAM 1240 and also to a processing array unit 1235 that includes both the M-level parallel extrinsic LLR trellis update calculation engine 1225 and an M-level parallel extrinsic LLR soft block decode update calculation engine 1230. In ASCI designs certain functional units that are used in trellis decoding are reconfigured or controlled by a different set program instructions or control signals to switch over to a second mode where they become engaged in block decoding SISO iterations as described below. That is, blocks 1225 and 1230 are inside a general block 1235 in order to indicate that certain hardware resources like functional units can be shared in a time division multiplexed fashion during the first and second halves of the SISO iteration. Also, the reason that the optional LSBs of the current extrinsic LLR address are shown as coming into the processor block 1235 is to indicate that the processors themselves may be programmed or configured to perform constraint enforcement permutation operations that so far have been described as occurring in the block 1250. This LSBs path could optionally carry additional information beside the LSBs that relates to the interleaving function. Using this data/control path, the processors could be controlled to read/write data elements stored in a local register bank in a predetermined order in order to enforce a pre-defined interleaver constraints. A state machine generating control signals in the block 1235 could cause extrinsic LLR values to be read into a local buffer accessed by a functional unit, and that functional unit would process those buffered elements in the prescribed order in accordance with a set of program instructions or hardware control signals.

Again referring to the M-level parallel extrinsic LLR updating engine 1235, each of the M internal processing engines in the M-level parallel extrinsic LLR soft block decode update calculation engine 1230 may use one or more parallel functional units to also optimally soft decode a specified block code such as an (8,4) Hamming code to update an extrinsic LLR value in the second half-SISO iteration. The optimal soft block decoding update is similar to the type of update that would be carried out in a half iteration of a SISO decoder configured to decode a turbo product code (TPC) (also known as block turbo code (BTC)). As discussed in connection with FIG. 13 below, the decoding of the (8,4) hamming code can be implemented in very simple and efficient high speed parallel hardware.

The exemplary short (8,4) Hamming code can be optimally decoded using the approach that is well known to those of skill in the art and which is outlined in outlined in C. Xu, Y-C Liang and W. S. Leon, "A low complexity decoding algorithm for turbo product codes," IEEE Radio and Wireless Symposium, pp. 209-212, January 2007, "the Xu reference" herein. Longer block codes can also be soft decoded according to the algorithms well known to those of skill in the art as taught in R. M. Pyndiah, "Near-optimum decoding of product codes: Block Turbo Codes," IEEE Trans. Comm. Vol. 46, No. 8, August 1998, pp. 1003-1010 "the Pyndiah reference herein." Depending the length of the codeword used and other implementational factors, the M-level OBC SISO decoder 1230 can be configured to implement various well known forms of the above approaches for soft decoding of block codes, for example, the Chase-Pyndiah algorithm (also referred to as the Pyndiah algorithm), low complexity Chase-Pyndiah algorithm, the OSD algorithm and its low complexity variations, the sum of product algorithm (SPA), or any similar soft decoding algorithm for decoding of block codes, as are well known in the technical publications literature.

In operation, the receiver and decoder 1200 performs as described above and performs the same CTBC code SISO iterations as described in detail in connection with FIG. 11 using a memory architecture similar to the one described in connection with FIG. 7 and optionally the local constraints enforcement permutation 1310. The main purpose of FIG. 12 is to show how a real time parallel CTBC SISO decoder can be implemented as a high speed ASIC or full custom VLSI chip, depending on the speed requirements of the application.

Referring now to FIG. 13, an architecture for a functional unit specifically designed to implement a soft decoder to soft decode a (8,4) Hamming code is provided. Note that this is an exemplary embodiment is designed to decode an OBC suitable for use in a 4G/5G type system that is based on a CTBC code instead of the current 4G LTE CTC. This specific example CTBC code uses the (8,4) Hamming code for the OBC, the rate-1 accumulator for the IRCC, and uses a QPP based DCI for the interleaver portion. In general, FIG. 13 could be modified by those of skill in the art to soft decode other short simple codes that may be chosen for use as the OBC in a CTBC code in other embodiments of the present invention. Short codes as discussed in connection with the functional unit 1300 are simpler to decode than a long code chosen for the OBC, for example a (72,64) BCH code, which was used in the Fonseka [3] reference in OTN applications to meet the coding overhead requirements. If such a long code is selected for the OBC, a low complexity Chase-Pyndiah, OSD or other such algorithm would be used. However, when a short code is used as the OBC in a CTBC code, the circuit complexity to soft decode the OBC becomes very small. Hence it is an aspect of the present invention to use a short code instead of a long code for the OBC, and to then perform rate matching as disclosed herein in order to meet, for example, an OTN coding overhead requirement or a 4G or 5G code rate requirement.

Also, as will be seen, since the memory and logic design of the functional unit 1300 is simple, so a more powerful functional unit could be created by chaining five or so such functional units together into a parallel functional unit embodiment whereby each parallel functional unit can be loaded and unloading in a circular buffer ordering. By the time the circle has completed in the circular buffer ordering, as one sub-functional unit 1300 is loaded the next functional unit (last functional unit loaded mod 5) has its results ready to read out. This way, with very little hardware, the block decoding portion of the SISO iteration could be balanced with the IRCC decoding speed.

The design of methods and circuits to decode short codes like (8,4) hamming codes and the like are well known. Such techniques can readily be used to design highly efficient soft decoders to decode one or more codewords of the OBC in parallel for use in each parallel processing channel of the M-level parallel LLR soft block code update calculation engine 1230 in FIG. 12. That is, in a preferred embodiment, the example functional unit 1300 is repeated one or more times in each of the M subsequence-channels inside the M-level parallel LLR soft block code decode calculation engine 1230. In the case of the exemplary CTBC code designed for 8=way parallel systems, the functional unit 1300 would be repeated M=8 times, and as mentioned above, possibly more, for example, 5×M=40 times in all.

In FIG. 13, a functional unit configured to soft decode an (8,4) Hamming code OBC is provided. An extrinsic LLR input/output buffer 1305 is coupled to one of the parallel lanes of the M-lane data bus shown between blocks 1250 and 1230 in FIG. 12. As mentioned before, each lane carries a respective extrinsic LLR value, and in some embodiments the bus is implemented as a 2M lane bus and dual port memories and buffers are used so that data traffic can be sped up per clock cycle by avoiding half-duplex related data delays. The extrinsic LLR input/output buffer 1305 is configured with either a single port or dual port bus interface as applicable depending on whether the M-lane or 2M-lane data bussing scheme is used on the double arrow to the left of block 1305, where input and output extrinsic LLRs are communicated to and from the block 1250.

The extrinsic LLR input/output buffer 1305 is a very small RAM that only uses 16 RAM/register locations (the microsequencer can be configured so that only 8 RAM/register locations are needed as will become apparent below). The extrinsic LLR input/output buffer 1305 is coupled to a very simple arithmetic logic unit (ALU) that preferably performs, for example, additions, subtractions, and compare-and-select-max instructions. A predetermined pattern generator 1315 is controllably coupled to the ALU 1310. The ALU executes a small predetermined set of instructions to perform addition, subtraction, and compare-and-select-max instructions, preferably using signed-number fixed point arithmetic. The ALU executes these instructions in response to the signals provided by the pattern generator 1315. The output of the ALU 1310 is coupled to a dual accumulator/result register 1320. The dual accumulator/result register 1320 includes an A-accumulator register and a B-accumulator register. The A- and B- accumulator registers are more generally A- and B- result registers that can generally hold any intermediate results needed to be held in order to support computations. Another small RAM is the codeword metrics memory 1325. Because the (8,4) Hamming code only has 16 possible codewords, the codeword metrics memory 1325 only requires 16 memory locations (i.e., registers). As can be seen from FIG. 13, the accumulator/result register 1320 has three feedback paths, one to the ALU 1310, another to the input of the codeword metrics memory 1325, and another to the extrinsic LLR input/output buffer 1305. The contents of both the A-accumulator and the B-accumulator can be fed back via these three feedback paths. In some embodiments, separate feedback data busses (2 lanes) could be provided so the contents of the A-accumulator and the B-accumulator could be fed back at the same time. In such embodiments, a buffer and a multiplexer would be preferably supplied at the three respective inputs to the blocks 1305, 1310, and 1325. Also, the ALU has three data path inputs, one from the extrinsic LLR input/output buffer 1305, another from the codeword metrics memory 1325, and another from the accumulator/result register 1320.

The functional unit 1300 also includes its own equivalent of a program memory, but this program memory is preferably implemented as a program logic microsequencer 1330. In some embodiments, some or all of this program logic microsequencer 1330 can be shared by all M of the functional units 1300 since most of the time they are executing exactly the same sequence of operations. In many embodiments, little or no instruction decoding is needed because the microsequencer 1330 can be configured to act as a pattern generator state machine that sequences through a set of states whose state outputs are a set of control signals that cause the different registers to be read and written in a specified order as discussed in more detail in connection with FIG. 14. The microsequencer 1330 can optionally be implemented in distributed hardware so that the state output control signals reside in logic or memory located right next to the register file or hardware device being controlled. If a microsequencer is not used, the functional units can each perform instruction decoding and all M of the functional units could decode the same instruction stream, and separate control issues could be handled using local condition codes as is known in the art. The pattern generator 1315 is an example of a distributed portion of the overall microsequencer 1330 in the embodiment shown of the functional unit 1300. Also, although not shown, the microsequencer 1330 can receive external control signals from other parts of the decoder 1200 such as the control signals from the M-level parallel extrinsic LLR soft block decode update calculation engine 1230 and change states accordingly to implement other functions such as outputting converged total LLR values as data values instead of outputting α-posteriori extrinsic LLR values.

Figure 14:
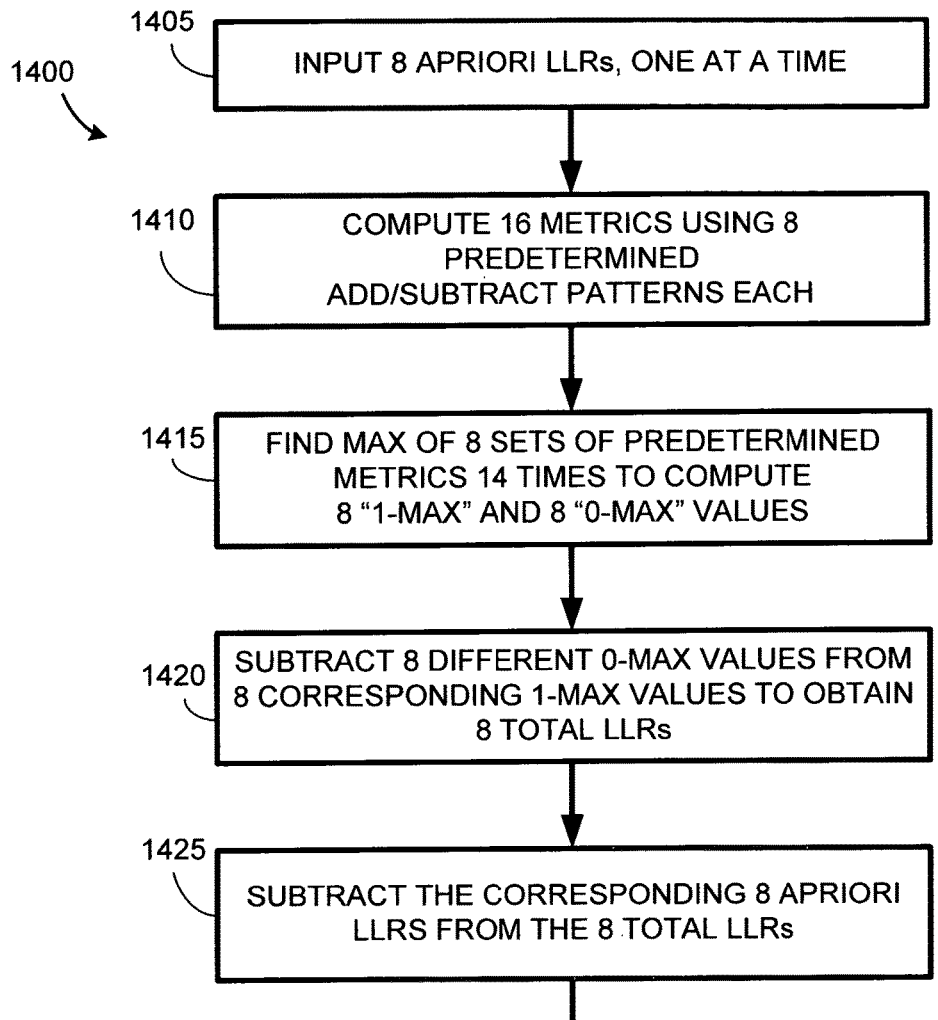
FIG. 14 shows an exemplary embodiment of a functional unit used in extrinsic LLR updating (8,4) Hamming code used for the outer block code.

To understand the operation of the (8,4) Hamming code soft decode functional unit 1300, consider the method/process 1400 of FIG. 14 which is tightly associated with the operation of the functional unit 1300 and the control sequences that emanate from the microsequencer 1330. In operation, at 1405, the extrinsic LLR input/output buffer 1305 receives, one at a time, eight different α-priori extrinsic LLR values. These eight extrinsic LLR values are stored into the first eight locations of the extrinsic LLR input/output buffer 1305.

Next at 1410 each of the eight LLR values is sent to the ALU in a circular buffer order, (i.e., LLR1, LLR2, . . . LLR8, LLR1, LLR2, . . . LLR8,. . . ) until all eight extrinsic LLRs have been cycled out to the ALU sixteen times. Each time a set of the eight stored LLR values is received in sequence at the ALU 1310, the pattern generator 1315 generates a respective sequence of eight bits corresponding to a respective one of the sixteen possible (8,4) Hamming codewords. Before the first set of the eight extrinsic LLR values is sent to the ALU 1310, accumulator-A of the accumulator/result register 1320 is set to zero. Next the eight extrinsic LLRs stored in the extrinsic LLR input/output buffer 1305 are sequenced in order to the ALU 1310. As each $i^{th}$ extrinsic LLR, for i=1, . . . ,8, is received at the ALU 1310, the corresponding $i^{th}$ bit of the first Hamming codeword is output from the pattern generator. If the $i^{th}$ bit of the first Hamming codeword is a one, the corresponding LLR is added by the ALU 1310 to the A -accumulator of the block 1320 and the result of the addition is stored back into the A -accumulator. If the $i^{th}$ bit of the first Hamming codeword is a zero, the LLR is subtracted from the A-accumulator by the ALU 1310, and a result of the subtraction is stored back into the A-accumulator. After all eight LLRs have been processed this way, the result of the A-accumulator is written into the first position in the codeword metrics memory 1325.

This process is then repeated for j=2, . . . ,16, once for each of the remaining 16 unique Hamming codewords associated with the 16 unique 8-bit Hamming codewords of the (8,4) Hamming code. That is, as the above periodic sequence of extrinsic LLRs are clocked in a circular buffer fashion out of the extrinsic LLR input/output buffer 1305, the pattern generator, in synchronization, clocks out the set of sixteen (8,4) Hamming codewords, and the ALU responds to 1's as add commands and 0's as subtract commands. The program logic microsequencer 1330 sends out control signals to control the circular-buffer reading order of the extrinsic LLR input/output buffer 1305, and to control the writing of the A-accumulator results to the codeword metrics memory 1325 after the eight extrinsic LLRs are processed this way each of the 16 times.

In the process above, if 2-lane bussing and dual ported register files are used inside the functional unit 1300, then the process can be sequenced to ping-pong between using the A-accumulator and the B-accumulator so that the a result can begin accumulating in the B-accumulator while the A-accumulator is being written out. Such lower level optimizations can be used throughout the decoder 1200 to save clock cycles wherever desired.

The process 1400, generally as carried out in accordance with the program logic microsequencer 1330, next advances to the sub-process 1415 in FIG. 14. In the sub -process 1415, a total LLR metric will be determined for each of the eight bit positions of each received α-priori extrinsic LLR stored in the input portion of the extrinsic LLR input/output buffer 1305. Due to a property of the (8,4) Hamming code, for each of the i=1,2, . . . 8 bit positions of the (8,4) Hamming codeword, of the 16 valid codewords, eight valid codewords will have a zero in the $i^{th}$ bit position, and eight valid codewords will have a one in the $i^{th}$ bit position.

Therefore, in accordance with 1415 as enforced by the microsequence 1330 and the pattern generator 1315 (which in general may be implemented as a part of the microsequencer 1330), a set of total LLRs will be computed. To begin, the A -accumulator and the B-accumulator are set to the most negative number representable by the signed fixed point numbering system used by the ALU 1310. Starting with the first bit position, the eight bit metrics corresponding to the eight (8,4) Hamming codewords that have a one in the first bit position are sequenced out of the codeword metrics block 1325 and are coupled to the ALU 1310. As each new codeword metric arrives at the ALU 1310, the pattern generator 1315 sends a control signal that causes the ALU to compute a compare-and-select-max instruction, comparing the incoming codeword metric with the contents of the A-accumulator and storing the max value back into the A -accumulator. After this has been performed eight times for all eight of the selected codeword metrics, the A-Accumulator will be left with the maximum of the codeword metrics that correspond to codewords that have a one in their first bit position. Next, staying with the first bit position, the eight bit metrics corresponding to the eight (8,4) Hamming codewords that have a zero in the first bit position are sequenced out of the codeword metrics block 1325 and are coupled to the ALU 1310. As each new codeword metric arrives at the ALU 1310, the pattern generator 1315 sends a control signal that causes the ALU to compute a compare-and-select-max instruction, comparing the incoming codeword metric with the contents of the B-accumulator. After this has been performed eight times for all eight of the selected codeword metrics, the B-Accumulator will be left with the maximum of the codeword metrics that correspond to codewords that have a zero in their first bit position.

Next in accordance with the sub-process 1420 of FIG. 14, the microsequencer causes the contents of the A-accumulator and the B-accumulator to be fed back to the input of the ALU 1310 while the pattern generator outputs a command telling the ALU to perform a subtraction and to put the result of the subtraction into the A-accumulator. The output of this subtraction is also stored back into the first one of the as yet unused eight (optional) locations of the 14-element extrinsic LLR input/output buffer 1305.

Next in accordance with the sub-process 1425 of FIG. 14, the first α-priori extrinsic LLR from the extrinsic LLR input/output buffer 1305 is fed to the ALU and control signals are generated to cause this first α-priori extrinsic LLR to be subtracted from the A-accumulator and written back to the first location on the extrinsic LLR input/output buffer 1305. This value corresponds to the α-posteriori extrinsic LLR value to be used in the next iteration. This process then repeated for all the remaining six bits, one at a time.

The sub-processes 1415, 1420, and 1425 have only been described for the first bit position. However, the same sub-processes 1415, 1420, and 1425 also sequence to be carried out for the remaining bit positions, i=2, . . . ,8. The α-posteriori extrinsic LLR values are sent back to the 2D memory 1240 to be used as α-priori extrinsic LLR values in the first half of the next SISO iteration. Additionally, the total LLR values may be used as a part of a stopping criterion. As SISO iterations continue, the total LLR values converge to the (8,4) Hamming codewords. The three parity bits can be discarded and the four data bits from each word correspond to the output sequence of the SISO decoder 1200.

In an alternative embodiment, one micosequencer is used. The K functional units 1300 are sequenced to generate K answers in parallel instead of the pipelined approach Mod 5. Also, more parallelism can be extracted at the 1300 level, for example, 16 ALUs can be configured to operate in parallel. That is, both higher level parallelism and lower level parallelism within the functional units can be extracted using single instruction multiple data or multiple instruction multiple data control.

Constrained Interleaved Coded Modulation(CICM)

CTBC codes can be designed to provide both high MHD and high interleaver gain. When a CTBC code is transmitted through a Gaussian channel using BPSK signaling with constellation points at ±α or using Gray coded QPSK signaling with constellation points at {±α, ±α}, the CTBC code's MHD=$d_f$ translates directly to a Minimum Squared Euclidean distance (MSED) of $D_{min}^2 = 4\alpha^2 d_f$. When this same CTBC code is transmitted through a Gaussian channel using a larger Gray coded signal constellation where the minimum squared Euclidean distance between two constellation points is $4\alpha^2$, then the CTBC code's MHD=$d_f$ also translates directly to a Minimum Squared Euclidean distance (MSED) of $D_{min}^2 = 4\alpha^2 d_f$.

Bit interleaved coded modulation (BICM) as is known in the art can be used to map the coded bits of an underlying code via an interleaver in such a way as to spread neighboring coded bits onto different symbols. The BICM interleaver is typically selected to be a uniform interleaver. BICM is known to perform better in fading channels because it can spread the neighboring coded bits of the underlying code onto different symbols.

"Constrained interleaved coded modulation" (CICM) is developed herein in accordance with an aspect of the present invention to map CTBC codes onto various sized signal constellations. As can be seen from the CI-3 and CI-4 design approaches, the complete set of low weight error sequences that dominate error performance (e.g., CTBC codewords with weights $d_t \le d \le d_f$ that correspond to the sequences $i_P$ in the tables $P(d_f \ge d \ge d_t)$) can be readily identified and enumerated. This allows CICM mapping rules to be designed to provide MSED advantages similar to Ungerboeck's trellis coded modulation (TCM). Also, similar to BICM, the CICM interleaver is preferably designed to spread the non-zero coded bits of the identified low weight CTBC codewords onto different symbols (i.e., constellation points) transmitted during different symbol intervals, and this leads to improved performance over fading channels.

CICM can be viewed as a two step mapping process. The first step involves identifying a constellation mapping rule to map subsets of m coded bits onto constellation points. The coding policy preferably assigns high distances between constellation points that differ by a single bit and progressively smaller distances between constellation points that differ by more bits up to m-bits. In a sense, this is the opposite of Gray coding which assigns low distances between constellation points that differ by a single bit and progressively larger distances between constellation points that differ by more bits up to m-bits. For this reason, the constellation mapping policies discussed herein for use with CICM are called "Reverse Gray Coded" (RGC) constellation mapping policies. The second step involves determining a CICM permutation function (interleaver rule) for use within the CICM mapper. If the frame size is big enough, the CICM interleaver can be designed to spread each possible pattern of $d_t$ non-zero coded bits of each of the identified lowest weight (weight $d_t$) CTBC codewords onto $d_t$ different symbols. Also, the permutation can be designed to ensure that changes in the values of each of these $d_t$ non-zero coded bits correspond to respective large Euclidian distances on the constellation. Thus a "CICM mapping rule" includes a CICM permutation rule followed by a selected constellation mapping rule. A "CICM signal mapper" includes a CICM permutation Γ (a different type of constrained interleaver as compared to the CI-3 or CI -4 type constrained interleavers, π) followed by a selected constellation mapper such as a RGC constellation mapper for a given $2^m$-ary signal constellation.

Figure 15:
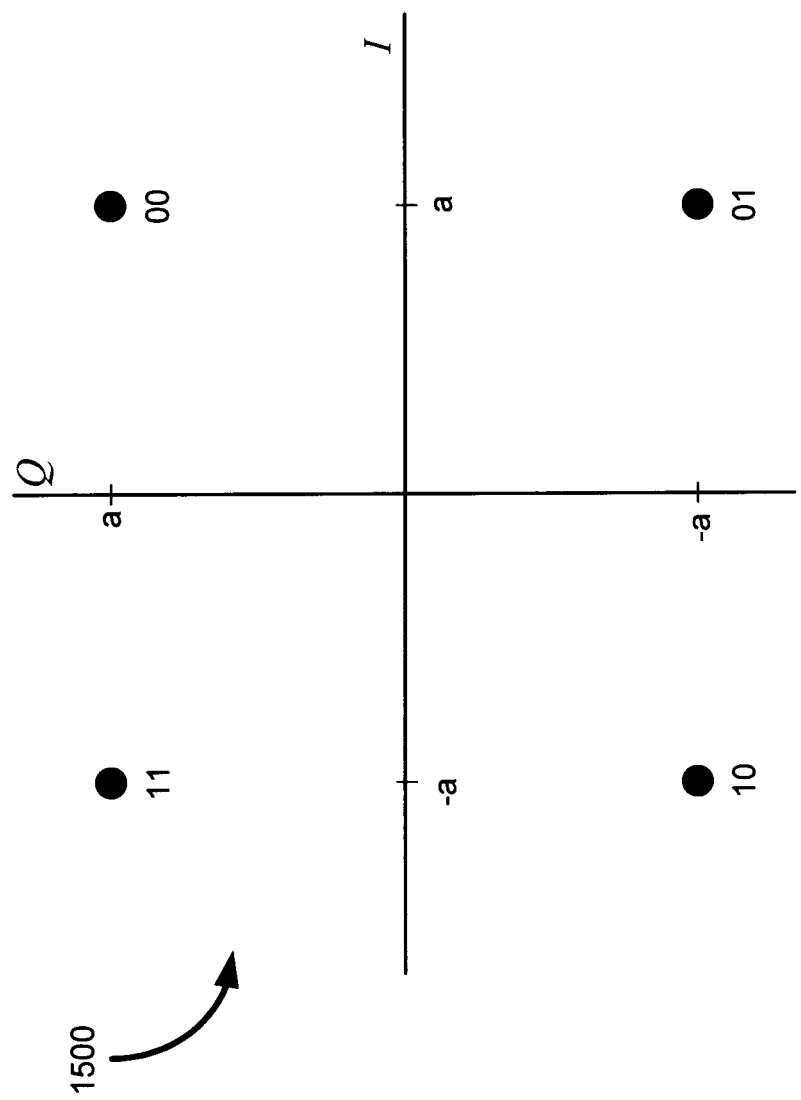
FIG. 15 illustrates a QPSK constellation that uses Reverse Gray Coding.

To better understand the mapping rule, consider the QPSK example of FIG. 15. In this example, the first step involves defining a constellation mapping rule that maps groups of m=2 bits onto QPSK symbols in such a way that a single bit change of the most significant bit is associated with a squared Euclidian distance of $8\alpha^2$, and a single bit change in the least significant bit is associated with a squared Euclidian distance of $4\alpha^2$. Note that the QPSK constellation that uses the reverse Gray coded constellation mapping rule as shown in FIG. 15 is not unique. For example, the 10 and 01 labels on the lower two constellation points could be swapped, and that would cause changes in second bit instead of the first bit to correspond to the higher distance on the constellation. RGC is the same as another type of constellation mapping known as "anti-Gray coding" for a QPSK constellation, but RGC differs from anti-Gray coding as the constellation size grows larger. The second step involves defining a CICM interleaver rule that places each set of the $d \ge d_t$ non-zero coded bits, associated with each identified weight $d \ge d_t$ CTBC codeword, onto $d \ge d_t$ different QPSK symbols. The CICM permutation will also be preferably designed to place all of these identified non-zero coded bits into the most significant bit positions in each of these QPSK symbols so as to cause the MSED to achieve $D_{min}^2=8\alpha^2 d_t$ as opposed to the $D_{min}^2=4\alpha^2 d_t$ achieved by Gray coded QPSK.

The minimum symbol Hamming distance, $d_s$, is the minimum number of symbols onto which the non-zero coded bits of any coded sequence, v, will be mapped. For example, if each of the $d_t$ non-zero-coded bits of a weight $d_t$ CTBC codeword are mapped onto separate respective symbols, then $d_s=d_t$. The maximum achievable $d_s$, denoted $d_{s,max}$, results when all the non-zero coded bits in every weight $d_t$ sequence of v are placed into different symbol intervals, so that $d_{s,max}=d_t$. On the other hand, if the size of the signal constellation is $M=2^m$, the lowest possible $d_s$, i.e., $d_{s,min}$, results if a coded sequence with weight $d_t$ is allowed to feed all its $d_t$ bits into only $\lceil d_t/m \rceil$ number of m-bit symbols. In the worst case, the weight $d_t$ sequence of v feeds its non-zero coded bits into $\lceil (d_t/m)-1 \rceil$ symbols completely and feeds any of its remaining bits into one other symbol. Hence, $d_{s,min}=\lceil d_t/m \rceil$, and the achievable $d_s$ satisfies, $\lceil (d_t/m) \rceil \leq d_s \leq d_t$. The CICM interleaver rule is designed to achieve the highest possible target value of $d_s$, denoted as $d_{s,t}$, subject to the constellation size, M, and the frame size, K.

In order to achieve any target symbol Hamming distance $d_{s,t}$, in addition to observing only weight $d_t$ sequences of v, it is also necessary to ensure that every higher weight sequence of v also results in at least a Hamming symbol weight of $d_{s,t}$. Specifically, if the size of the signal constellation is $M=2^m$, to achieve a symbol Hamming distance of $\lceil d_t/m \rceil < d_{s,t} \leq d_t$, it is necessary that all valid CTBC codewords, v, with Hamming weight up to $d_w=m(d_{s,t}-1)$ result in a symbol Hamming distance of at least $d_{s,t}$. Because every symbol is formed by m bits, a coded sequence v with weight $d > d_w = m(d_s-1)$ is guaranteed to feed its bits into at least $d_{s,t}$ symbols. Therefore, to achieve the target value, $d_{s,t}$, the non-zero coded bits of all low weight CTBC codewords with weight up to $d_w$ need to be placed in such a way as to achieve the target symbol Hamming distance, $d_{s,t}$. All CTBC codewords with weight higher than $d_w$ will thus be guaranteed to have a symbol Hamming distance greater than or equal to $d_{s,t}$.

Next consider how to achieve a target MSED. If the minimum squared Euclidean distance between any two constellation points is $4\alpha^2$, since a symbol is formed by m bits, every subset of m bits of v contributes at least $4\alpha^2$ to the squared Euclidean distance of that sequence and thus any weight d sequence of v is guaranteed to have a squared Euclidean distance of at least $4\alpha^2 \lceil d/m \rceil$. Therefore, at the sequence level, in order to maintain an MSED of $D_{min}^2$, it is necessary to make sure that all sequences of v with Hamming weight from $d_t$ and up to $d_e=\lfloor mD_{min}^2/4\alpha^2 \rfloor$ achieve the selected MSED of $D_{min}^2$. Here "$d_e$" denotes the Hamming weight that is needed to meet the target MSED, and the subscript e denotes Euclidian. In order to ensure that the CICM mapping rule achieves a target symbol Hamming distance and a target MSED, it is necessary to consider all sequences v with weights starting from $d_t$ and up to $d_f=\max\{d_w,d_e\}$. Here "$d_f$" denotes the final Hamming distance that is needed to meet both the target minimum Hamming distance $d_s$, and target MSED $D_{min}^2$, as described above in connection with $d_w$ and $d_e$. In most practical cases, $d_e > d_w$ so that $d_f = d_e$.

The CICM interleaver constraints assume that the low weight CTBC codewords can be enumerated according to their weights. Recall that the CI-4 design algorithm identifies and eliminates all low weight CTBC codewords whose weights are less than $d_t$. Similarly, an analysis run of the CI-4 design algorithm can be used to identify all of the low weight CTBC codewords at any desired Hamming weight $d \geq d_t$. All such low weight CTBC codewords, enumerated as $i_P=0, \ldots, N_P(d \geq d_t)-1$, where $N_P(d \geq d_t)$ is the number of unique positions in the table $P(d \geq d_t)$, can thereby be identified by a listing of their respective positions vectors, $p(i_P)$ into table $P(d \geq d_t)$, where each positions vectors, $p(i_P)$, lists the positions of "1"s (i.e., non-zero coded bits) of a respective weight d sequence, $v(i_P)$. The table $P(d \geq d_t)$ can be viewed as being built up as a sequence of constituent tables, $\{P(d)\}$, which each constituent table tabulates all of the positions vectors, $p(i_P)$, associated with respective CTBC codewords with a respective weight, d. That is, $P(d \geq d_t)=\{P(d_t), P(d_t+1), \ldots, P(d)\}$. The number of elements each positions vector, $p(i_P)$, has is equal to the weight of its associated CTBC codeword, $v(i_P)$, which is denoted as $d(i_P)$. In any constituent table $P(d)$, each positions vector, $p(i_P)$, in the table $P(d)$ can be enumerated and referred to as $i_P=0, \ldots, N_P(d)-1$. Herein, the "sequence $i_P$" is used to generally refer to the positions vector, $p(i_P)$, and/or the associated the low weight coded sequence, $v(i_P)$.

The CICM mapping rule involves: (a) selection of a constellation mapping policy to map each m-bit combination of coded bits onto a respective constellation point, and (b) selection of the CICM interleaver rule to permute the coded bits of the vector v, subject to the constraint that, once mapped, the CICM mapped sequence will exhibit the best set of target values of $d_{s,t}$, and $D_{min}^2$ that can be achieved for a given frame size. The CICM interleaver rule can be viewed as a constrained interleaver whose constraints involve placing all of the non-zero coded bits of the low weight sequences identified in the Table $P(d \geq d_t)$ in such a way as to enforce: (a) the target minimum symbol Hamming distance $d_{s,t}$, and (b) the target squared MSED, $D_{min}^2$. In practice, an iterative algorithm will be used that will be initialized with the maximum possible $d_{s,t}=d_{s,max}=d_t$ and the maximum possible $D_{min}^2=D_{min,max}^2$ for the selected signal constellation and its constellation mapping rule. Using these values of $d_{s,max}$ and $D_{min,max}^2$, starting values for $d_w$, $d_e$, and $d_f$ are next computed using the formulas provided above. Next, subject to the selected constellation mapping rule and the specified frame size, K, it is attempted to construct a CICM interleaver rule that meets the interleaver constraints for $d_{s,max}$ and $D_{min,max}^2$. If the frame size is too small, the target $d_{s,t}$ and $D_{min}^2$ values will be incrementally lowered and the design process will be repeated until a valid CICM interleaver rule is found to achieve the final values of $d_{s,t}$, and $D_{min}^2$.

To design the CICM interleaver rule, an m×K/m permutation matrix, $\Gamma$, is defined. Each column of $\Gamma$ can be considered to correspond to a respective symbol interval. The individual elements of $\Gamma$ can be considered to be permutation indices pointing back into the vector v. Each column of $\Gamma$ thus contains the indices of the coded bits from v that need to be constellation-mapped onto a symbol in each symbol interval. Similar to the CI-4 design approach, a "coded bit position" in v identifies a physical memory location, i, in the vector v, where $0 \leq i \leq K-1$. A "position" typically is used to refer to an index, i, in v, where a respective nonzero coded bit (i.e., a "1") occurs in a respective one of the low weight error sequences identified by the table $P(d \geq d_t)$. Also, while the elements of the permutation matrix $\Gamma$ are actually indices into the vector v, similar to the discussion of the CI-4 design process, the concept of "placing" a coded bit (position) from v into $\Gamma$ will be used herein.

CICM Mapping Rule Design Algorithm

To begin, the same sequential bit placement approach as used in the CI-4 design algorithm can be used to identify all of the coded sequences v with weight d, starting with $d=d_f$. For example, once the CI-3 and/or CI-4 (or DCI) interleaver is designed, the same bit-placing ordering as used in the CI-4 design algorithm can be followed and Algorithm 1 can be called, but by replacing $d_t$ with $d \geq d_t$ to identify all of the CTBC codewords having weight d. That is, an analysis run as described above can be performed, and this analysis run will cause Algorithm 1 to enumerate all possible CTBC coded sequences with weights $d \geq d_t$. The results of the analysis run can be used to create the table, $P(d \geq d_t)$ which tabulates all of the positions vectors of all of the respective CTBC codewords of weights $d \geq d_t$. The table $P(d \geq d_t)$ can be readily sub-divided into a set of constituent tables, $P(d_t)$, $P(d_t+1)$, ..., $P(d)$, which each respectively list all of the positions vectors corresponding to the CTBC codewords that exists at each respective weight, $d_t$, $d_t+1$, ..., d.

In the analysis runs of the CI-4 design algorithm, the bits of c will already have been placed into u in such a way as to ensure that no CTBC codewords with weight less than $d_t$ will exist. In each analysis run, no bits are placed, but all of the positions vectors identified by Algorithm 1 corresponding to the CTBC codewords with the weight d are tabulated into the Table P(d). As will be seen later, it is useful to also tabulate information that identifies the contents of the non-zero OBC codeword positions, $\{c_j\}$ of the c vector associated with each tabulated sequence, $i_P$.

Given the table P(d), a set E(d) is defined to be a set whose members are the distinct positions that appear in any of the positions vectors contained in P(d). The number of elements in the set E(d) is denoted as N(d). The number of times a given position, i, occurs in E(d) is denoted as Popularity(i,d). For example, if position v(50) only occurs in one of the sequences in the Table P(d), then the index value i=50 would be included in E(d), the i=50 index would be counted once in N(d), and Popularity(i=50,d)=1. If position v(55) occurs in ten different ones of the sequences in Table P(d), then the index value i=55 would be included in E(d), the i=55 index would be counted once in N(d), and Popularity(i=55,d)=10. Note that if a given position, i=70, is not used to hold any non-zero coded bits of any low weight sequences listed in Table $P(d \geq d_t)$, then popularity of i=70 at this weight of d is zero, i.e., Popularity(i=70,d)=0.

The iterative CICM mapping rule design algorithm will attempt to place all the positions of v into Γ to achieve the maximum possible $d_{s,t}=d_{s,max}=d_t$ and the maximum possible $D_{min}^2=D_{min,max}^2$. However, the values of the parameters such as $d_t$, the frame size, K, and the constellation size, $M=2^m$ will determine the actual highest possible values of the targets $d_{s,t}$ and $D_{min}^2$ that can actually be reached. Specifically, if the signal constellation size is $M=2^m$, the CICM mapping rule design algorithm computes the associated value of $d_f$, and then starts off by considering only Hamming weight $d=d_t$ sequences in v. Next the design algorithm gradually increases d until a limiting condition is reached or until the $d_{s,t}=d_{s,max}=d_t$ and $D_{min}^2=D_{min,max}^2$ objectives are achieved with the final value of $d=d_f$. In the event that the $d_{s,max}=d_t$ and $D_{min,max}^2$ objectives cannot be achieved, then $d_s$ and/or $D_{min}^2$ are decreased to achieve the next highest possible values of $d_{s,t}$ and $D_{min}^2$. As discussed in further detail below, the amount by which $d_{s,t}$ and/or $D_{min}^2$ are decreased depends on the maximum number of coded bits from a weight d sequence that will need to be loaded into any particular symbol, and the positioning of those bits on different symbols. Next a new (lower) value of $d_f$ is calculated, and the process is repeated, building the table $P(d \geq d_t)$, for each $d=d_t$, $d_t+1$, ..., $d_f$ and attempting to place all the positions of v from each constituent table P(d) into Γ to achieve the current (lowered) values of $d_{s,t}$ and $D_{min}^2$. If the mapping is able to achieve the current values of $d_{s,t}$ and $D_{min}^2$ all the way up to $P(d_f)$, then the algorithm stops. Otherwise then $d_{s,t}$ and/or $D_{min}^2$ are decreased again, and the design process is repeated until a valid CICM interleaver rule can be found to achieve a final pair of target values of $d_{s,t}$ and $D_{min}^2$ at the specified frame size, K.

Without loss of generality, the CICM mapping rule design algorithm computes the normalized squared Euclidean distance by dividing it by the MSED on the constellation itself (which is $4\alpha^2$), i.e., the normalized squared Euclidean distance is given by $D_{en}^2=D_e^2/(4\alpha^2)$. This normalization is slightly different from the standard squared normalized Euclidean distance used in the literature given by $D^2=D_e^2/(2E_{b,avg})$, or the normalized squared MED $d_{min}^2=D_{min}^2/(2E_{b,avg})$, which also takes into account of the number of bits transmitted per interval, where $E_{b,avg}$ is the average bit energy.

As the iterative design algorithm proceeds, certain quantities associated with individual sequences, $i_P=0, \ldots, N_P(d \geq d_t)-1$, as listed in each Table $P(d \geq d_t)$ can evolve. The quantities $d_{s,temp}(i_P)$ and $D_{en,temp}^2(i_P)$ respectively represent the contributions to the symbol Hamming distance and to the normalized squared Euclidean distance due to the already placed positions of $i_P$. The quantities $d_s(i_P)$ and $D_{en}^2(i_P)$ respectively represent the actual symbol Hamming distance and the actual normalized squared Euclidean distance of the low weight sequence, $i_P$, once it has finished being placed into Γ. The quantities $d_{s,max}(i_P)$ and $D_{en,temp}^2(i_P)$ respectively represent the maximum possible values that $d_s(i_P)$ and $D_{en}^2(i_P)$ can possibly achieve for each low distance error sequence $i_P$ as listed in the Table P(d). These maximum possible values, $d_{s,max}(i_P)$ and $D_{en,max}^2(i_P)$, are the values reached by the sequence $i_P$ based on its already placed positions in Γ, assuming that its remaining positions can be placed in Γ so as to meet the CICM interleaver constraints. Once a sequence $i_P$ is fully placed in accordance with the CICM interleaver constraints, $d_{s,temp}(i_P)=d_s(i_P)=d_{s,max}(i_P)$ and $D_{en,temp}^2(i_P)=D_{en}^{2(i)}(i_P)=D_{en,max}^2(i_P)$. The maximum achievable $d_{s,t}$ and $D_{min,n}^2$ can be calculated at any point as $d_{s,t}=\min\{d_{s,max}(i_P)\}$ and $D_{min,n}^2=\min\{D_{en,max}^2(i_P)\}$.

CICM Mapping Rule Design Algorithm: QPSK Example

By way of example, consider the QPSK example using the coding policy as illustrated in FIG. 15. The steps below explain how to design the CICM interleaver rule, Γ, at a specified frame size, K, for the specific QPSK constellation and coding policy as illustrated in FIG. 15.

Step 1. Set $d=d_t$ and perform an analysis run of the CI-4 design algorithm to identify all weight $d_t$ CTBC codewords $\{v(i_P)\}$, for $i_P=0, \ldots, N_P(d_t)-1$, and tabulate their respective positions vectors, $\{p(i_P)\}$, into the table $P(d_t)$. Form the set of all distinct positions of the set of all weight $d_t$ CTBC codewords, $E(d_t)$, and find the number of elements in $E(d_t)$, $N(d_t)$, and the Popularity($i,d_t$) for each position, i, in $E(d_t)$. Arrange the elements of $E(d_t)$ in the descending order of their popularity, i.e., the first element in the set $E(d_t)$ appears most in all sequences in $P(d_t)$ and the last element appears least. At this time, there is no information that suggests that $d_{s,max}$ and $D_{min,max}^2$ cannot be reached, so in order to aim for the highest possible targets $d_{s,t}$ and $D_{min,n}^2$, initialize each tabulated sequence, $i_P$, as follows: $d_{s,max}(i_P)=d_{sm}=d_t$, $d_{s,t}=\min\{d_{s,max}(i_P)\}=d_t$, $D_{en,max}^2(i_P)=D_{en,max}^2/4\alpha^2=8\alpha^2 d_t/4\alpha^2=2d_t$, and $D_{min,n}^2=\min\{D_{en,max}^2(i_P)\}=2d_t$.

If $K/2 \geq N(d_t)$, then all elements of $E(d_t)$ can be placed on the first row of $\Gamma$. The first row of $\Gamma$ contains the most significant bits of each of the K/m different m-bit symbols that are stored down the columns of $\Gamma$ (m=2 in this example). Each of these most significant bits have a squared Euclidian distance of $8\alpha^2$ in the example of FIG. 15. If $K/2 \geq N(d_t)$, place each of the unique positions as listed in $E(d_t)$ onto the first row of $\Gamma$. In this QPSK example, it will be assumed that the positions in the set $E(d_t)$ will be placed into the first row in the same popularity-ranked order as they occur in the set $E(d_t)$. Alternatively, a random number generator could be used to assign the members of the set $E(d_t)$ (i.e., the positions, i, of the "1"s in the weight $d=d_t$ CTBC codewords, v) to column numbers of $\Gamma$. Other orderings could also be used, as discussed in further detail below. If the frame size K is large enough to assign all of the elements of $E(d_t)$ to the first row of $\Gamma$, the highest possible target value of $d_{s,t}$ will have been achieved, so that $d_{s,t}=d_{sm}=d_t$, and the highest possible $D_{min}^2=8\alpha^2 d_t$ will also have been achieved, so that $D_{min,n}^2=D_{min,n,max}^2=2d_t$. This means that coded sequences with weight $d_t$ alone do not force $d_{s,t}$ and $D_{min}^2$ to be lowered and the interleaver constraints have so far been met. Further, if $K/2 \geq N(d_t)$, go from here directly to step 3.

Step 2. However, if $K/2 < N(d_t)$ some elements of $E(d_t)$ will need to be on the second row of $\Gamma$. This suggests that it will not be possible to achieve a $D_{min,n}^2$ of $D_{min,n,max}^2=2d_t$ because there will be at least one coded sequence with weight $d_t$ that cannot place all its non-zero positions on the first row (i.e., the most significant bit in FIG. 15). Under these conditions, define a subset, H, $H \subset E(d_t)$, that contains the $(N(d_t)-K/2)$ positions from the set $E(d_t)$ that will need to be placed onto the second row of $\Gamma$. It is desirable to determine the subset H that lowers the $D_{en}^2(i_P)$ values of the fewest number of sequences, $i_P$. Therefore, the subset H is selected to include the least popular $(N(d_t)-K/2)$ positions of $E(d_t)$, and these positions will be tabulated at the end of $E(d_t)$ since the elements of $E(d_t)$ are rank ordered from highest to lowest popularity. Once this subset H is identified, place the first K/2 unique positions as listed in the set $E(d_t)$ directly on the first row of $\Gamma$ using the existing ordering of the set $E(d_t)$.

Next the positions of the subset H need to be placed onto the second row of $\Gamma$ in such a way as to achieve the highest possible value for $d_{s,t}$. In the specific example of FIG. 15, since m=2, there is only one remaining position in each column, i.e., row 2, but in general there are (m-1) rows below the first row. In order to maintain the highest possible value of $d_{s,t}$, the elements of $E(d_t)$ should be placed in such a way that no two positions of any sequence, $i_P$, in $P(d_t)$ are placed into the same column. This is preferably done by filling the columns of $\Gamma$ one by one as described below.

Starting with the column whose first element contains the position, i, in $E(d_t)$ whose popularity, Popularity($i,d_t$), is the highest, the design algorithm attempts to match this position with the position(s) in the subset H that have the highest popularity. This is because the higher a position's popularity, the more potential conflicts it will have when being considered for placement into any candidate column, and thus the more difficult it will be to place later when there are not too many vacant locations left in $\Gamma$. Therefore, the design algorithm places the more difficult positions first and leaves the easier to place positions with lower popularities for later.

To accomplish the above, because of the popularity-rank ordering in which the first K/2 positions of $E(d_t)$ have been placed into the first row of $\Gamma$, the (1,1) position in $\Gamma$ (the first position in the first row) will have the highest popularity. Next identify the position in the subset H with the highest popularity that is not a position of any sequence $i_P$ that contains the (1,1) position. Due to the way that $E(d_t)$ has been rank ordered according to popularity, this can be done by checking each position of H from left to right and selecting the first position in H that is not a position of any sequence, $i_P$, that contains the position stored in the (1,1) location of $\Gamma$. Place the identified position of the subset H below the (1,1) location of $\Gamma$ (i.e., the (2,1) location). Continue in this way by moving from column to column along the first row of $\Gamma$ until all positions in H are placed into the second row of $\Gamma$ in such a way that no column contains more than one position from any given sequence $i_P$ in $E(d_t)$. If this can be successfully done, it is still possible to achieve $d_{s,t}=d_{sm}=d_t$ based on all weight $d_t$ coded sequences. If all positions of H cannot be placed in such a way that no column contains more than one position from any given sequence $i_P$, one or more roll-back attempts as discussed above in connection with the CI-4 design algorithm can be made, but if the roll-back attempts fail, two positions of the same sequence $i_P$ will have been placed in at least one column of $\Gamma$, and thus $d_{s,t}$ must be lowered. Therefore, if two positions of the same sequence had to be placed in at least one column of $\Gamma$, update all of the $d_s(i_P)$, $D_{en,max}^2(i_P)$, $d_{s,t}$, $D_{min,n}^2$ and $d_f$ values.

Next step 3 is executed to place the any remaining positions of v. If $d_{s,t}$ had been lowered below $d_{sm}=d_t$, then if necessary, some of the positions that were initially placed on the first row with the aim of achieving $d_{s,t}=d_t$ can be judiciously removed from $\Gamma$ to create room for the remaining positions of v as discussed in further detail below.

Step 3. Set $d=d+1$ and perform an analysis run of the CI-4 design algorithm to identify all of the CTBC codewords having weights d, and tabulate their respective positions, $\{p(i_P)\}, i_P=0, \ldots, N_p(d)-1$, into the table P(d) and use these identified sequences to update the table $P(d \geq d_t)$. Next identify the positions that have already been placed in $\Gamma$, and using these already-placed positions, calculate $d_{s,temp}(i_P)$ and $D_{en,temp}^2(i_P)$ for sequence, $i_P=0, \ldots, N_P(d)-1$, listed in the table P(d). The $d_{s,temp}(i_P)$ and $D_{en,temp}(i_P)$ values represent the symbol Hamming distance and the Euclidean distance contributions respectively made by the already placed positions of each of the $N_P(d)$ weight d CTBC codewords identified by table P(d). Furthermore, the values of $D_{en,temp}^2(i_P)$ are calculated only using positions from the positions vectors $p(i_P)$ of table P(d) that have already been placed on fully completed columns of $\Gamma$. For example, if a non-zero coded bit from a CTBC codeword, $i_P$, has been placed onto the first row, this would indicate a MSED of $8\alpha^2$ for that coded bit. However, it may be necessary to later place another coded bit of the same sequence onto the second row of the same column. If that happens, that $8\alpha^2$ contribution would be lowered to $4\alpha^2$. For this reason, $D_{en,temp}^2(i_P)$ is only updated based upon completed columns. If any sequence, $i_P$, has all of its positions placed into $\Gamma$, then $d_{s,temp}(i_P)$ and $D_{en,temp}^2(i_P)$ will have reached their highest values, so in such cases set $d_s(i_P)=d_{s,temp}(i_P)$ and $D_{en}^2(i_P)=D_{en,temp}^2(i_P)$. Note that if $d_{s,temp}(i_P) \geq d_s$ and $D_{en,temp}^2(i_P) \geq D_{min}^2$, then any remaining position of the entry $i_P$ in P(d) can be placed at any available place in $\Gamma$ because that placement will not lower the targets $d_{s,t}$ or the $D_{min}^2$. This is because, if the "temp" values are already above the target values, there is no need to consider the additional weight or distance above the threshold target values. If $d_{s,temp}(i_P) < d_{s,t}$ and/or $D_{en}^2(i_P) < D_{min,n}$, record $d_{s,max}(i_P)$ and $D_{en,max}^2(i_P)$. This indicates the best case numbers for the weight d sequences that still need to be placed.

In order to systematically place the additional positions of the set P(d), identify the subset of sequences, $P'(d) \subset P(d)$ for which $d_{s,temp}(i_P) < d_{s,t}$ or $D_{en,temp}^2(i_P) < D_{min,n}^2$. The set P'(d) thus contains the sequences, $i_P$, that still need to be placed so as to meet the target values, $d_{s,t}$ and $D_{min,n}^2$. For sequences that already have $d_{s,temp}(i_P) \geq d_s$ or $D_{en,temp}^2(i_P) \geq D_{min,n}^2$, there is no need waste key positions in Γ for the additional positions of the sequences in P(d) that have already satisfied Γ's interleaver constraints. Such positions can be placed later after all of Γ's interleaver constraints have been met.

Next construct a set E'(d) consisting of the popularity-ranked unique positions in P'(d), and construct a set H'(d) by removing all of the positions in E'(d) that have already been placed into Γ. Next identify a candidate position from H'(d), starting from left to right (highest popularity to lowest popularity) and attempt to place this candidate position from H'(d) into the left-most column of Γ that has a vacant position on the second row. Similar to step 2, before the placement can be made, it should be verified that the position already occupying the first row of the same column is not a position associated with any sequence $i_P$ in P'(d) that contains the candidate position. If the first row does not contain any position associated with any sequence $i_P$ that contains the candidate position, the candidate position is placed into the left most column of Γ that has a vacant position on the second row. If not, the process is repeated by attempting to place the candidate position into the next left most column of Γ with a vacant position on the second row and ensuring that the above described constraint is satisfied. This process is repeated until the candidate position is placed. Once the candidate position from H'(d) is placed in Γ, for all affected sequences, $i_P$, in P(d), update $d_{s,temp}(i_P)$, $D_{en,temp}^2(i_P)$, $d_{s,max}(i_P)$ and $D_{en,max}^2(i_P)$. Continue placing the remaining elements of H'(d), one at a time, until $d_{s,temp}(i_P) \geq d_s$ and $D_{en,temp}^2(i_P) \geq D_{min,n}^2$ for all $i_P$ in P'(d) or until it is determined that it is impossible to do so. The above process will ensure that the elements of E'(d) will be placed in such a way that no two positions of any sequence, $i_P$ in P'(d) will be placed into the same column, thereby maximizing the $d_{s,temp}(i_P)$ values, and thereby achieving the highest value of $d_{s,t}$.

In the case where it is possible to meet these conditions for all sequences $i_P$ in P'(d), it may also be the case that these conditions are met before all of the positions in H'(d) have been placed. If there are such additional unconstrained positions in H'(d), do not place them at this time so as leave as many vacant locations in Γ as possible for the later placement of positions from higher weight sequences of v subject to Γ's interleaver constraints.

On the other hand, if it was not possible to place all positions of H'(d) to satisfy $d_{s,temp}(i_P) \geq d_s$ and $D_{en,temp}^2(i_P) \geq D_{min,n}^2$ for all the sequence $i_p$ in P'(d), then a roll-back can be attempted. Start by identifying positions on the first row (as mentioned at the end of step 2) that can be moved to the second row (or lower rows) without lowering the targets $d_{s,t}$ or $D_{min}^2$. Note that, if the values of $d_{s,t}$ and $D_{min,n}^2$ had to be lowered one or more times, there will have been positions placed not only on the first row but also on the second row (or other rows) for some sequences that are no longer needed to maintain the now less restrictive interleaver constraints, $d_{temp}(i_P) \geq d_s$ and $D_{en,temp}^2(i_P) \geq D_{min,n}^2$. In order to systematically indentify the positions on rows that can be removed without violating constraints, identify the subset $P_Q(d \geq d_t) \subset P(d \geq d_t)$ whose elements are sequences, $i_P$, which have values of $d_s(i_P) > d_{s,t}$ and $D_{en}^2(i_P) > D_{min,n}^2$ that are high enough so that at least one position of each of these sequences can afford to be moved out of Γ to create a vacancy in Γ while still maintaining $d_s(i_P) \geq d_s$ or $D_{en}^2(i_P) \geq D_{min,n}^2$ of all affected sequences, $i_P$, in P(d≥$d_t$).

Next form a set $E_Q(d \geq d_t)$ containing a popularity-ranked (descending order of the popularity of its distinct entries in $P_Q(d \geq d_t)$) set of positions that can be removed from Γ without lowering the targets $d_{s,t}$ or $D_{min}^2$. That is, all of the positions in the subset $E_Q(d \geq d_t)$ can be removed from Γ while still maintaining $d_s(i_P) \geq d_s$ and $D_{en}^2(i_P) \geq D_{min,n}^2$ for all sequences in P(d≥$d_t$). Note that sequences in $P_Q(d \geq d_t)$ can afford to lower their distances whereas the sequences in P'(d) have to increase their distances. With that in mind swap positions of the sequences of P'(d) placed in H'(d) from left-to-right with the positions of $E_Q(d \geq d_t)$ from right-to-left. By doing so, the distances of the least number of sequences that can afford to lower their distances are lowered while the highest number of sequences that are in need of increasing their distances are increased. After every swap, update $d_s(i_P)$ and $D_{en}^2(i_P)$ of all affected sequences in P(d≥$d_t$), and update P'(d), $P_Q(d \geq d_t)$, and $E_Q(d \div d_t)$. Continue this process to try to make $d_s(i_P) \geq d_s$ and $D_{en}^2(i_P) \geq D_{min,n}^2$ for all sequences $i_P$ in P(d). If all sequences in P'(d) can be made to satisfy the constraints $d_s(i_P) \geq d_s$ and $D_{en}^2(i_P) \geq D_{min,n}^2$, repeat step 3 until $d = d_f$. If any potential swap would cause any CICM interleaver constraint to be violated for any sequence $i_p$, the swap is not made.

Note that during step 3, some (or all) of the positions that were moved out of Γ for later placement could be picked up by the next set (or sets) of weights $d \geq d_f$. Hence, it is possible to get Γ mostly (or totally) filled by different positions before reaching $d = d_f$. At this point, in order to guarantee the target $d_{s,t}$ and $D_{min,n}^2$ values, it is still necessary to keep generating coded sequences of v until we reach $d = d_f$. In that process, it is possible to find sequences of v whose positions are already almost or fully placed in Γ. If all of the positions of a newly identified sequence $i_P$ have already been fully placed, then their $d_s(i_P)$ and $D_{min}^2(i_P)$ can be directly calculated. For other sequences for which the positions are partially placed in Γ, $d_{s,max}(i_P)$ and $D_{en,max}^2(i_P)$ can be calculated. If any of $d_s(i_P)$, $D_{en}^2(i_P)$, $d_{s,max}(i_P)$ and $D_{en,max}^2(i_P)$ values happen to fall below their corresponding target values ($d_s$ and $D_{min,n}^2$), it is necessary to make changes in Γ by swapping already placed positions in it until all constraints are met by all sequences in P(d≥$d_t$). Any violation of a constraint can result from either category (a): the sharing of columns of Γ by the coded bits of a given sequence $i_P$, and/or category (b): positions of v that are mostly placed on the second row that make lower contributions to $D_{en}^2(i_P)$. As discussed below, the additional constraints can be enforced during the placement of positions in Γ to avoid the sharing of columns of Γ by the coded bits of a given sequence $i_P$.

In fact, if all the additional conditions such as inter-column conditions and inter-sequence constraints as described below can be fully satisfied during the placement of positions in Γ, violations caused by sequences that fall under category (a) can be completely eliminated. In situations where all inter-column conditions and inter-sequence constraints as described below cannot be fully satisfied and the case of category (a) occurs for any given sequence $i_P$, then it becomes necessary to move some of the positions, preferably starting from the positions of the sequence $i_P$ that share the same columns in Γ. In any such sequence $i_P$, it is first desirable (may even be sufficient) to move positions that share the same columns of Γ. This change can be done by swapping with positions on the same row. For example, if such a sequence $i_P$ currently has four positions of it in two columns of Γ, a position from one of the rows from each column can be swapped with a different position on the same row. In the selection of the row of the selected column, it is preferable to select the row that contains the position that has the lower popularity to minimize the number of affected sequences. Such a swap increases the $d_s(i_P)$ and $D_{en}^2(i_P)$ values of that sequence. Further, it is desirable to find a position that can be swapped without lowering $d_s(i_P)$ and $D_{en}^2(i_P)$ of any other sequence including the sequences that contain the position selected for the swap on the same row. It is also desirable to select a position on the same row that is contained by only sequences on $P(d \geq d_t)$ that barely satisfy the two constraints. This is because if only such a sequence(s) is involved it is not really necessary to use up the other sequences that can afford to lower their $d_s(i)$ and $D_{en,min}^2$ values on these swaps, and instead, it is better to save them to form $E_Q(d \geq d_t)$. Any sequence that satisfies the two constraints and does not qualify to feed positions to $E_Q(d \geq d_t)$ can be considered as such a sequence that barely satisfies the constraints. Hence, it is helpful to form a set, $E_Q(d \geq d_t)$, for each row separately that list the positions on the respective row, in the decreasing rank popularity order, that are not in the set $E_Q(d \geq d_t)$ and can thus be used for the swaps. In order to systematically handle sequences that fall under category (a), (i) identify the set of all sequences that do not satisfy one or both constraints and come under category (a), (ii) identify the set of distinct columns that are shared by the sequences found in (i), (iii) identify each position on the least popular row of each of the selected columns, and (iv) find the least popular position from $E_Q(d \geq d_t)$ of the same row that can be used for the swap with each selected position in step (iii). After every swap, re-calculate $d_s(i_P)$, $D_{en}^2(i_P)$ of all completed sequences, and $d_{s,max}(i_P)$ and $D_{en,max}^2(i_P)$ of all partially completed sequences to identify the sequences that still do not still satisfy any of the two constraints. If the above steps (i) through can be successfully completed, all $d_s(i_P)$ and $d_{s,max}(i_P)$ values will be guaranteed to satisfy the condition $d_s(i_P) \geq d_{s,t}$. However, some sequences may still need to increase their $D_{en}^2(i_P)$ values. For those sequences, it is necessary to swap selected positions of them on the second row with positions on the first row as mentioned in category (b). The sequences under the category (b) mentioned above can be handled by using the same approach used to find places in $\Gamma$ for positions in $H'(d)$ using the set $E_Q(d \geq d_t)$. Instead of $H'(d)$, the set of distinct positions of all the sequences $i_P$ that fall under category (b) in their descending rank popularity order can be used instead.

However, at any value of d, if step 3 fails to make all sequences of $P'(d)$ to satisfy the constraints, then:

(a) lower $d_{s,t}$ and/or $D_{min}^2$ and recalculate all needed parameters such as $d_f$ as discussed above for these lower values.

(b) repeat step 3 with these new lower values. In failing, (c) go back to step 1 with these lower values of $d_{s,t}$ and $D_{min}^2$. If that also fails, (d) repeat (a)-(d) until all sequences $i_P$ in $P(d \geq d_t)$ can satisfy $d_s(i_P) \geq d_s$ and $D_{en}^2(i_P) \geq D_{min,n}^2$.

Once all of the interleaver constraints have been met for all $d_s \leq d \leq d_f$ as described above, any and all of the remaining positions, $i=0, \ldots K-1$ that have not already been placed into $\Gamma$ can be placed anywhere in $\Gamma$ without violating the interleaver constraints. The values of $d_{s,t}$ and $D_{min,n}^2$ at the point of stopping are the values that can be finally reached.

It is important to note here that throughout the above discussion we have used one $d_{s,t}$ and one $D_{min}^2$ value for all sequences of v. However, because v is generated from a concatenated code that achieves different interleaver gains for different sequences, it can be desirable to employ different $d_s(i_P)$ and $D_{min}^2(i_P)$ values for different categories of sequences of $v(i_P)$ as described above in connection with the CI-3 and CI-4 design algorithms. Since all calculations that are used to design $\Gamma$ employ $d_s(i_P)$ and $D_{min}^2(i_P)$ values individually on sequences, the above method can be directly used for varying sets of $d_{s,t}$ and $D_{min}^2$ values for different sequences if desired. Since the higher weight sequences v of the concatenation usually achieve higher interleaver gains, even though it is necessary to consider all weights up to $d_f$, it may be sufficient to only consider weights up to a weights less than $d_f$ to achieve good performance for selected CTBC codes. Hence it is to be understood that in any of the algorithms and examples presented herein, the interleaver constraints can be modified to employ different $d_s(i_P)$ and $D_{min}^2(i_P)$ constraint thresholds depending upon the category any given sequence $v(i_P)$ belongs.

A. Inter-column constraints: In order to understand the impact of the constellation-mapping of bits onto symbols has on $D_{min}^2$, consider a given sequence $i_P$ listed in $P(d)$. Let $x(i_P)$ be the number of columns of $\Gamma$ that contain one position from the sequence $i_P$ on first row and zero positions of $i_P$ on the second row. Let $y(i_P)$ be the number of columns of $\Gamma$ that contain zero positions from the sequence $i_p$ on the first row and one position from the sequence $i_P$ on the second row. Let $z(i_P)$ be the number of columns of $\Gamma$ that contain two positions from the sequence $i_P$, one on the first row and anther on the second row. With these definitions and the constellation mapping rule of FIG. 15, the resulting normalized squared Euclidean distance of the sequence $i_P$ will be given by $$D_{en}^2(i_P) = (2x(i_P) + y(i_P) + z(i_P)). \quad (11)$$

Further, since the sequence $i_P$, is taken from $P(d)$ and thus has weight $d=d(i_P)$, the parameters $x(i_P)$, $y(i_P)$ and $z(i_P)$ will necessarily satisfy $$x(i_P) + y(i_P) + 2z(i_P) = d(i_P) \quad (12)$$

where $d(i_P)$ is the weight of the sequence $i_P$. It follows from (11) and (12), that $$D_{en}^2(P) = [(x(i_P) - z(i_P)) + d(i_P)] \quad (13)$$

and $d_s(i_P) = x(i_P) + y(i_P) + z(i_P)$. Further, from equations (11) through (13) it follows that for any pre-selected pair of values $d_{s,t}$ and $D_{min,n}^2$ if the sequence $i_P$ satisfies both constraints, then $x(i_P)$ and $z(i_P)$ must satisfy, $$z(i_P) \leq (d(i_P) - d_{s,t}), \quad (14a)$$

and $$x(i_P) \geq [D_{min,n}^2 - d(i_P) + z(i_P)]. \quad (14b)$$

Also, it follows from (14) that the maximum allowable value of $z(i_P)$, $z_{max}(i_P)$, and the minimum required value of $x(i_P)$, $x_{min}(i_P)$, can be computed as $$z_{max}(i_P) = (d(i_P) - d_s) \quad (15a)$$

and $$x_{min}(i_P) = [D_{min,n}^2 - d(i_P) + z(i_P)]. \quad (15b)$$

As can be seen from equations (14) and (15), it is desirable to have a low value of $z(i_P)$ (like $z(i_P)=0$). This is because a lower value of $z(i_P)$ can increase the value of $d_{s,t}$ and an decrease the required value of $x(i_P)$. However, when placing the positions of any sequence $i_P$ into $\Gamma$, a potential current lack of available locations in $\Gamma$ may give rise to the requirement that $z(i_P)>0$. Hence, as each of the main algorithmic steps 1 through 3 as described above are executed, for each sequence $i_P$ in the table $P(d \geq d_t)$, it is desirable to compute and record $x_{min}(i_P)$ and $z_{max}(i_P)$ and to then use these values to guide the placement of the positions of each sequence $i_P$ into $\Gamma$.

When the CICM mapping rule design algorithm begins to execute, or at each new pass through step 3, for each identified sequence $i_P$ in P(d), $z(i_P)$ is initialized to $z(i_P)=0$, and the starting value of $x_{min}(i_P)$ is computed from equation (15b). However, as each additional position from the set E'(d) or H'(d) is placed into $\Gamma$, the values of $z(i_P)$ for all affected sequences, $i_P$, may need to be increased, and at such time, any such affected value of $x_{min}(i_P)$ is then updated in accordance with equation (15b). In order to monitor the progress of the values of $x(i_P)$ and $z(i_P)$, as each one of the positions from the set E'(d) or H'(d) is placed into $\Gamma$, for all affected sequences, $i_P$, first update $x_{min}(i_P)$ and $z_{max}(i_P)$ using equation (15), and additionally monitor the current $x(i_P)$ value, $x_{temp}(i_P)$, and the current $z(i_P)$ value, $z_{temp}(i_P)$. Initially, before any of the positions of any such sequence ip have been placed, initialize $x_{temp}(i_P)=z_{temp}(i_P)=0$. Note that all of these parameter updates are computed only when both rows of a column in $\Gamma$ are filled. This is because the above parameters are only fixed (not subject to future change) after the both of the locations column in $\Gamma$ have been filled.

In order to satisfy the inter-column constraints, the goal is to achieve $x_{temp}(i_P) \geq x_{min}(i_P)$ and $z_{temp} \leq z_{max}$ when all positions of any sequence, $i_P$ have been placed, thereby satisfying (14a) and (14b). If this cannot be done for all sequences, $i_P$, all the way up to weight $d_f$, then a roll-back can be attempted and steps 1 through 3 of the CICM mapping rule design algorithm can be executed again to see if a valid $\Gamma$ can be found. If the roll-back attempt fails, then lower $d_{s,t}$ and/or $D_{min,n}^2$ as discussed above, and keep executing the CICM mapping rule design algorithm until equation (14) can be satisfied for all sequences, $i_P$, in P(d≥$d_f$).

B. Inter-Sequence Constraints: The above steps 1 through 3 of the CICM mapping rule design algorithm implement constraints and perform processing based upon each of the individual coded sequences, $i_P$, in P(d), for d=$d_t$, . . . ,$d_f$. In addition to considering single sequences, additional inter-sequence constraints are needed to avoid conditions that can arise where multiple different sequences interact to cause the $D_{min}^2$ value of the constellation to decrease. There is no need to implement inter-sequence constraints to ensure that the target symbol Hamming distance is maintained at $d_{s,t}$ because the target symbol Hamming distance is only affected by the placement of the positions in each sequence, $i_P$, when considered alone.

To understand the inter-sequence constraints that ensure that $D_{min,n}^2$ is not lowered due to combinations of sequences, consider a specific example involving a weight $d_t$ sequence, $i_{P1}$ from the table P($d_t$). In this example it is desired to maintain $D_{min,n}^2=1.5d_t$ by placing $x(i_{P1})=d_t/2$ positions on the first row, $y(i_{P1})=d_t$ positions on the second row, and to have $z(i_{P1})=0$. Next consider a second weight $d_t$ sequence, $i_{P2}$, also from the table P($d_t$). In this example, $d_t/2$ positions of the second sequence $i_{P2}$ are also placed on the first row, and in the same columns where $d_t/2$ of the positions of the sequence $i_{P1}$ have been placed on the second row. Also, $d_t/2$ of the positions of $i_{P2}$ are placed on the second row in the same columns where $d_t/2$ positions of the sequence $i_{P1}$ have been placed on the first row. In the end the combination of the two sequences still maintain $d_{s,t}=d_t$ but $D_{min,n}^2$ for the combination is now lowered to $d_t$ because the two sequences in combination generate $d_t$ number of "11" QPSK symbols. The easiest way to prevent these types of undesirable inter-sequence interactions is to limit the number of columns any two different sequences can share. In the above mentioned example, sequences $i_{P1}$ and $i_{P2}$ are allowed to share $d_t$ positions. However, such cases can be prevented by imposing an inter-sequence constraint to limit the number of columns that certain potentially troublesome pairs of sequences, $i_{P1}$ and $i_{P2}$, can share.

Specifically, the potentially troublesome pairs of sequences, $i_{P1}$ and $i_{P2}$, are called "disjoint sequences" herein. To understand what a pair of disjoint sequences is, first note that the sequences $i_{P1}$ and $i_{P2}$, are each low weight sequences as listed in the table P(d) or P(d≥$d_t$) and thus have respective weights $d(i_{P1})$ and $d(i_{P2})$. Next note that each of the sequences, $i_{P1}$ and $i_{P2}$, are associated with CTBC codewords, $v(i_{P1})$ and $v(i_{P2})$. Also, due to the way the CTBC coded v-sequences are formed, i.e., $v=G[u]=G[\pi[c]]$, each of the positions vectors, $i_{P1}$ and $i_{P2}$, are also associated with two OBC coded sequences, $c(i_{P1})$ and $c(i_{P2})$. Recall that each sequence c can be viewed as a naturally ordered set of OBC codewords positions, $\{c_j\}$, for j=0,1,2, . . . , ρ−1. Therefore, two sequences, $i_{P1}$ and $i_{P2}$, are said to be disjoint sequences if the nonzero codeword positions in the vectors $c(i_{P1})$ and $c(i_{P2})$ are disjoint, i.e., non-overlapping. Inter sequence constraints are developed below to specifically eliminate potential ill effects due to higher weight CTBC codewords, v, that include at least two disjoint low weight vectors $c(i_{P1})$ and $c(i_{P2})$, that correspond to sequences, $i_{P1}$ and $i_{p2}$, in the table P(d≥$d_t$).

In order to identify disjoint sequences at any weight d, start by performing an analysis run of the CI-4 design algorithm in order to construct the table, P(d). Next, for each positions vector, $i_P$ in P(d), identify the corresponding vectors v and c, such that $v=G[\pi[c]]$. Next, for each sequence $i_{P1}$ in the table P(d≥$d_t$), identify a corresponding set of disjoint sequences $\Delta_{dis}(i_{P1})$, where if $i_{P2}$ is disjoint relative to $i_{P1}$ (i.e., there is no overlap in $c(i_{P1})$ and $c(i_{P2})$), then $i_{P2}$ is included as a member of $\Delta_{dis}(i_{P1})$. Each time step 3 is entered so that the weight d is incremented, if $i_P$, was already in the set $\{P(d_t), . . . , P(d-1)\}$ then the set $\Delta_{dis}(i_P)$ need only be updated by adding any of the weight d sequences in P(d) that are disjoint to $i_P$. Also, by observing the associated vectors $c(i_{P1})$, $c(i_{P2})$, and $c(i_{P3})$, it can be readily seen that if $i_{P2}$ and $i_{P3}$ are two entries of $\Delta_{dis}(i_{P1})$, then even though $i_{P2}$ and $i_{P3}$ are disjoint relative to $i_{P1}$, $i_{P2}$ and $i_{P3}$ are not necessarily disjoint sequences relative to each other.

Define the quantity, $sh(i_{P1},i_{P2})$, to be the highest number of columns that any two selected sequences $i_{P1}$ and $i_{P2}$ can share without causing MED to be lowered below $D_{min}^2$. Recall that the weight of the sequence $i_{P1}$ is $d(i_{P1})$ and the weight of the sequence $i_{P2}$ is $d(i_{P2})$. Then for the two sequences achieve an MED of at least $D_{min}^2$, the following inequality must be satisfied, $$[x(i_{P1})+x(i_{P2})]-[z(i_{P1})+z(i_{P2})]+[d(i_{P1})+d(i_{P2})]-2sh(i_{P1},i_{P2}) \geq D_{min,n}^2 \quad (16)$$

and hence, $$sh(i_{P1},i_{P2}) \leq \lfloor[(x(i_{P1})+x(i_{P2}))-(z(i_{P1})+z(i_{P2}))+(d_{iP1}+d_{jP2})-D_{min,n}^2]\rfloor \quad (17)$$

To better understand the inequality (16), note that each of the two sequences $i_{P1}$ and $i_{P2}$ each individually satisfies equation (12) at their respective weights, $d(i_{P1})$ and $d(i_{P2})$. Also, the combination of the two sequences form $(x(i_{P1})+x(i_{P2}))$ columns with a one on the first row and a zero on the second, $(y(i_{P1})+y(i_{P2}))$ columns with a zero on the first row and a one on the second, $(z(i_{P1})+z(i_{P2})+sh(i_{P1},i_{P2}))$ columns with a one on both rows. The sum of squared Euclidean distance contributions from all rows is at least $D_{min}^2$.

Since the two sequences can have only $(x(i_{P1})+x(i_{P2}))$ number of free ones on the first row, and $y(i_{P1})+y(i_{p2})$ number of free ones on the second row, the maximum number of columns the combination can form with ones on both rows, i.e., $sh(i_{P1},i_{P2})$, is further restricted by $$sh(i_{P1},i_{P2}) \le \min\{(x(i_{P1})+x(i_{P2})),(y(i_{P1})+y(i_{P2}))\}. \quad (18)$$

However, the $sh(i_{P1},i_{P2})$ values can be calculated after all values, $x(i_{P1})$, $x(i_{P2})$, $z(i_{P1})$ and $z(i_{P2})$ are known, and these values only become available after all the positions of $i_{P1}$ and $i_{P2}$ are placed. Hence, the following temporary values are calculated $$x_t(i_{P1})=\max\{x_{temp}(i_{P1}),x_{min}(i_{P1})\} \quad (19a)$$

$$z_t(i_{P1})=\min\{z_{temp}(i_{P1}),z_{max}(i_{P1})\} \quad (19b)$$

$$x_t(i_{P2})=\max\{x_{temp}(i_{P2}),x_{min}(i_{P2})\} \quad (19c)$$

$$z_t(i_{P2})=\min\{z_{temp}(i_{P2}),z_{max}(i_{P2})\} \quad (19d)$$

to use in place of the respective values, $x(i_{P1})$, $x(i_{P2})$, $y(i_{P1})$ and $y(i_{P2})$ in equation (17). Note that for any two disjoint sequences $i_{P1}$ and $i_{P2}$, it is also possible to use the parameters of equation (9) to calculate a temporary $sh(i_{P1},i_{P2})$ value, $sh(i_{P1},i_{P2})_{temp}$, that indicates the highest allowable number of columns the two sequences can share based on the currently available information. Once the positions are placed in $\Gamma$, these $sh(i_{P1},i_{P2})_{temp}$ values can be updated to ensure that in the end equation (17) is satisfied.

Further, it is noted that if $D_{min,n}^2 \le d_t$, inter-sequence constraints are not needed. This is because two sequences cannot interact to lower $D_{min,n}^2$ below $d_t$. This is because for any two sequences, each with weight d, the worst case for $D_{min,n}^2$ is to have both the sequences completely aligned in d columns, in which case, $D_{en}^2(i_P)=d$. Similarly, if $d_t < D_{min,n}^2 \le 1.5d_t$, equation (17) must be satisfied by every pair of disjoint sequences, but no more than pairs of sequences need be considered. This is because more than two sequences cannot interact to lower $D_{min,n}^2$ below $1.5d_t$.

However, if $1.5d_t < D_{min,n}^2 \le 2d_t$, it should be ensured that equation (17) is satisfied for all pairs, and in addition, it should be ensured that no combinations of three mutually disjoint sequences achieve a normalized squared MED below $D_{min}^2$. A set of sequences are called mutually disjoint if every two sequences of that set are disjoint. Consider three mutually disjoint sequences $v(i_{P1})$, $v(i_{P2})$ and $v(i_{P3})$ with respective weights $d(i_{P1})$, $d(i_{P2})$ and $d(i_{P3})$ and with their respective parameters, $x(i_{P1})$ & $z(i_{P1})$, $x(i_{P2})$ & $z(i_{P2})$, and $x(i_{P3})$ & $(i_{P3})$. Following the same logic of equation (17), equation can be extended to three mutually disjoint sequences as $$(sh(i_{P1}, i_{P2}) + sh_{ik}(i_{P1}, i_{P3}) + sh_{jk}(i_{P1}, i_{P3})) \le \left\lfloor \left[ \sum_{k=1}^{3} [x(i_{Pk}) - z(i_{Pk}) + d(i_{Pk})] - D_{min,n}^2 \right] \Big/ 2 \right\rfloor \quad (20)$$

Hence, when updating any $sh(i_{P1},i_{P2})$ value, it is not only necessary to ensure that it satisfies equation (17) but also it is necessary that it satisfies (20) based on the already available values of $sh(i_{P2},i_{P3})$ and $sh(i_{P1},i_{P3})$. Since the highest achievable $D_{min,n}^2$ of the QPSK constellation in FIG. 15 considered in this example is $2d_t$, it is only necessary to watch for combinations of up to three disjoint sequences which are taken care of by (17) and (20). However, in constellations with more constellation points, combinations of multiple disjoint sequences need to be checked by equations similar to (20).

In order to reduce the complexity of implementing inter-sequence constraints, Method 1 and Method 2 are presented. Under broad conditions, Methods 1 and 2 can reduce or altogether avoid the need to check equation (20) and similar equations that deal with combinations of more than three disjoint sequences.

Method 1: This method imposes stronger restrictions on pairs of sequences given by (17) so that multiple combinations automatically satisfy the MED condition. For example, if the division by 2 in (17) is changed to a division by 4, equation (20) will be guaranteed to be always satisfied.

In order to better understand why, consider a combination of weight d mutually disjoint sequences in an application, similar to the 16-QAM example discussed later, that maintains the same Euclidean distance for all one bit, 2-bit, and so on up to m-bit differentials on the constellation. Let us also consider the case, when $x_1(i_P)=d(i_P)$, i.e., all coded bits of every weight d sequence $i_{P1}$ is placed in $d(i_{P1})=d$ different columns and on the first row whose associated distance is $D_1^2$. Then each such sequence $i_P$ individually achieves a normalized squared Euclidean distance of $D_{en}^2(i_P)=dD_1^2$. Next consider the case that any two disjoint sequences, $i_{P1}$ and $i_{P2}$, both of weight $d(i_{P1})=d(i_{P2})=d$ and these two sequences can only share one column, i,e., $sh(i_{P1},i_{P2})=1$. Hence, in this case the highest possible minimum squared Euclidean distance achieved by any two sequences $i_{P1}$ and $i_{P2}$, is $D_{en}^2(i_{P1},i_{P2})=2(d-1)D_1^2+D_2^2$ (where $D_2^2$ is the distance associated with the a two bit differential on the constellation). Similarly, the highest possible minimum squared Euclidean distance achieved by any three weight d sequences $i_{P1}$, $i_{P2}$, and $i_{P3}$, is $D_{en}^2(i_{P1},i_{P2},i_{P3})=3(d-2)D_1^2+3D_2^2$. Hence, the minimum squared Euclidean distance achieved by the worst case of (d+1) sequences $i_{p1}$, $i_{p2}$, $i_{p3 1}, \ldots, i_{p(d+1)}$ is $D_{en}^2(i_{P1},i_{P2},i_{P3}, \ldots, i_{p(d+1)})=[d(d-1)/2]D_2^2$. Depending on the values of d, $D_1^2$ and $D_2^2$, $[d(d-1)/2]D_2^2$ can be larger than $dD_1^2$. Note that if $sh(i_{P1},i_{P2})>1$, fewer than (d+1) number of disjoint sequences can result in a squared Euclidean distance that is dependent only on $D_2^2$. Hence, depending on d, $D_1^2$, and $D_2^2$, the highest possible value of $sh(i_{P1},i_{P2})$ between any two sequences $i_{P1}$, and $i_{P2}$ can be chosen to make the squared Euclidean distance of any combination of disjoint sequences to be larger than $dD_1^2$.

Therefore, by choosing $sh(i_{P1},i_{P2})$ values to ensure $D_{en}^2 \ge D_{min,n}^2$, it is possible to guarantee that any combination of disjoint sequences is guaranteed to generate the desired MED. When Method 1 is compared to equation (17), equation (17) allows two sequences $i_{P1}$, and $i_{P2}$ to share more columns. Note that equation (20) must then also be satisfied separately, and based upon the number columns shared by sequences $i_{P1}$, & $i_{P2}$ and $i_{P2}$, & $i_{P3}$, equation (20) determines how many columns $i_{P1}$, & $i_{P3}$ can be allowed to share. This suggests that it is always desirable to limit the number of columns any two disjoint sequences can share even if it imposes additional restrictions on finding locations in $\Gamma$ to place the positions contained in $E(d \ge d_t)$.

Method 2: Method 2 is based on the fact that equations (17) and (20) apply only to pairs of disjoint sequences. Hence if each column of $\Gamma$ is constrained hold a subset of positions whose associated subset of sequences, $\{i_{P1}\}$, do not include any disjoint sequences, this would avoid all of these problematic situations completely. Hence, for example, when placing a position into a candidate location on the second row of a column of $\Gamma$, first identify all of the sequences in $P(d \ge d_t)$, $\{i_{P1}\}$, that contain the position already placed into in the first row above the candidate location. Then identify all of the $\Delta_{dis}(i_P)$ sets corresponding to all of the sets of sequences $\{i_P\}$ that contain the position $i_{P1}$ in the row above, and find a position to load into the candidate location that is not a member of any of these identified sets, $\{\Delta_{dis}(i_{P1})\}$.

In practice, the following sequence can be used. First attempt to place a position into the current candidate location using Method 2. In failing, it will be necessary to place a position of a disjoint sequences relative to a position already placed in the same column above in $\Gamma$. Next use Method 1 with the smallest possible $sh(i_{P1},i_{P2})$ values as discussed in Method 1. In failing increase $sh(i_{P1},i_{P2})$ values up to the levels as required to meet equation (17) and then make sure that (20) is also satisfied.

When the inter-sequence constraints are used as in any of the ways discussed above, it is desirable to create a second table $P^+(d \geq d_t)$ along with $P(d \geq d_t)$ to list the linear combinations of the distinct coded sequences. The table $P^+(d \geq d_t)$ can be derived from all the $\Delta_{dis}(i_P)$ entries. If $i_{P2}$ is an entry of $\Delta_{dis}(i_{P1})$ then the modulo 2 addition of the $v(i_{P1})$ and $v(i_{P2})$ are listed into to $P^+(d \geq d_t)$. Before adding a new weight d sequence $i_p$ into $P(d)$, check to see if $i_P$ corresponds to any entry of $P^+(d \geq d_t)$. If so, it is not necessary to add that sequence to $P(d)$.

In accordance with the definition of $d_e$, in order to maintain the normalized squared MED at $D_{min,n}^2$, it is necessary to ensure that no coded sequence of weight up to $d_e = 2D_{min}^2$ can generate a normalized squared MED less than $D_{min,n}^2$. Hence, even if the inter-sequence constraints are ignored in the design stage, all problematic cases will be found in that search. However, it is highly desirable to impose the inter-sequence constraints during the design. This is because otherwise once troublesome combinations of disjoint sequences that reduce $D_{min,n}^2$ are found, it is necessary to swap positions when all positions are placed and it becomes harder to keep doing it for a larger number of cases. Instead if the inter-sequence constraints are imposed it is not even necessary to check for any combination of already checked disjoint sequences as they are guaranteed to satisfy the MED requirement. Hence, one good way to implement this procedure is to create a second Table $P^+(d \geq d_t)$ along with $P(d \geq d_t)$ to list the linear combinations of the disjoint coded sequences. The set $P^+(d \geq d_t)$ can be derived from all the $\Delta_{dis}(i_{P1})$ entries. If $i_{P2}$ is an entry of $\Delta_{dis}(i_{P1})$ then the modulo 2 addition of $v(i_{P1})$ and $v(i_{P2})$ are added into the table $P^+(d \geq d_t)$. Hence, when a new candidate sequence is identified for inclusion into $P(d \geq d_t)$, before entering it into $P(d \geq d_t)$, check to see if it is an entry of $P^+(d \geq d_t)$. If so, do not add this new candidate sequence into $P(d \geq d_t)$. This way, $P(d \geq d_t)$ can be made shorter and checks for higher weights can be made easier.

CICM 16-QAM Constellation Example

Figure 16:
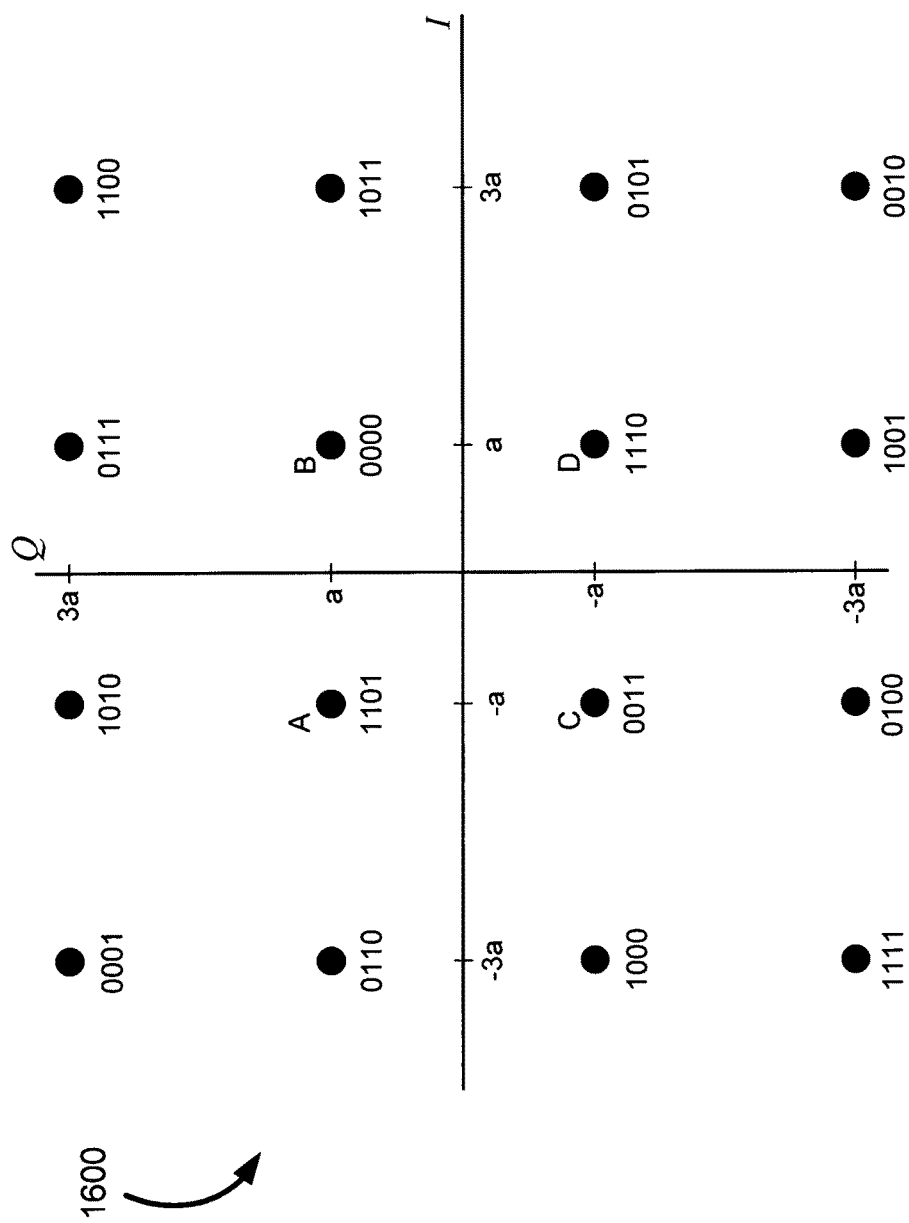
FIG. 16 illustrates a 16-QAM constellation that uses Reverse Gray Coding.

With the knowledge gained from the previous example, we now consider the systematic construction of $\Gamma$ with a 16-QAM constellation. First a constellation mapping rule is chosen to maximize the Euclidean distance for single bit separations, and decreasing Euclidean distances for higher bit separations. FIG. 16 shows a 16-QAM constellation that uses this constellation mapping policy that attempts to maintain the same Euclidean distance for all single bit differences. Even though the corner constellation points have different Euclidean distances for different one bit differences (due to the nature of the 16-QAM constellation), the constellation points A, B, C and D in FIG. 16 do achieve the same highest possible squared Euclidean distance, which is denoted as $D_1^2 = 20\alpha^2$. This same squared Euclidean distance is maintained as the minimum squared Euclidean distance for all one bit differences relative to every constellation point. Hence, in this 16-QAM example, in contrast to the previous QPSK example, each row of $\Gamma$ will have a similar MED contribution, and thus the higher rows in $\Gamma$ will not be favored over the lower rows. Therefore, in this 16-QAM example, the CICM mapping rule seeks to place the positions of each sequences $i_P$ in separate columns without concern for the rows. As a result, the highest achievable MED of this 16-QAM example is $D_1^2 d_t$ where $D_1^2 = 20\alpha^2$ and the highest achievable minimum symbol Hamming distance is $d_{s,max} = d_t$. The corresponding highest achievable normalized MED is $D_{min,n}^2 = D_{min}^2/4\alpha^2 = 5d_t$.

In order to establish the mathematical background for analysis in a general manner, let us consider the placement of the positions associated with a weight d sequence $i_P$ into $\Gamma$. In general, consider a $M=2^m$-ary constellation that has minimum Euclidean distance $D_b$ for every b-bit separation, $b=1,2,\ldots,m$. Now let us say that this weight d sequence $i_P$ is placed in $\Gamma$ such that it occupies $x_b$ columns with weight b, $b=1,2,\ldots,m$. For example, when $d=d_t$, it is desired to have $x_1 = d_t$ and all other $x_b = 0$ to achieve $d_{s,max} = d_t$ and $D_{min,max} = d_t D_1^2$. However, for a general distribution of $x_b$'s, the resulting symbol Hamming distance, $d_s(i_P)$ and the squared normalized Euclidean distance, $D_{en}^2(i_P)$, of this general weight $d(i_P)$ sequence $i_P$ can be written as $$D_{en}^2(i_P) = \sum_{b=1}^{m} x_b(i_P) D_b^2 \tag{21}$$

$$d_s(i_P) = \sum_{b=1}^{m} x_b(i_P) \tag{22}$$

subject to the constraint imposed by its weight $d(i_P)$ $$\sum_{b=1}^{m} b x_b(i_P) = d(i_P). \tag{23}$$

In order to ensure the target symbol Hamming distance $d_{s,t}$ is always met, it needs to be ensured that no sequence $i_P$ of weight up to $d_w = m(d_{s,t}-1)$ can create a symbol Hamming weight, $d_s(i_P)$, less than $d_{s,t}$. Similarly, in order to ensure a normalized squared Euclidean distance of $D_{min,n}^2$ no sequence $i_P$ of weight up to $d_e = \lfloor m D_{min}^2/4\alpha^2 \rfloor$ can generate a $D_{en}^2(i_P)$ value less than $D_{min,n}^2$. Again, $d_f = \max\{d_w, d_e\}$ is used to identify the highest weight of sequences $i_P$ that need to be eventually included into $P(d \geq d_t)$ to in order to ensure both the selected target $d_{s,t}$ and $D_{min,n}^2$ values are achieved.

Referring again to the 16-QAM constellation with the constellation mapping rule shown in FIG. 16, it can be seen that $D_1^2 = 20\alpha^2$, $D_2^2 = 8\alpha^2$, $D_3^2 = 4\alpha^2$ and $D_4^2 = 32\alpha^2$. Hence, for any sequence $i_P$, it follows from (21) that $D_{en}^2(i_P)$ can be bounded by $$D_{en}^2(i_P) \geq x_1(i_P) D_1^2 + x_\alpha(i_P) D_\alpha^2 \tag{24}$$

where $D_\alpha^2 = \min\{D_j^2\}$, $j=1,2,\ldots m$, and $j=j_m$ minimizes over j, i.e., $D\alpha^2 = D_{jm}^2$ $$x_\alpha(i_P) = \{(d(i_P) - x_1(i_P))\lfloor (d(i_P) - x_1(i_P))/j_m \rfloor\}. \tag{25}$$

The bound in (24) derived from (21) observes the following facts: (a) the highest contribution of (21) comes from the first term of it, (b) there are at least $x_\alpha(i_P)$ number of additional columns occupied by any sequence $i_P$, and (c) each of these $x_\alpha(i_P)$ additional columns contributes at least $D_m^2(i_P)$ to $D_{en}^2(i_P)$.

By considering $D_{en}^2(i_P)$ in terms of its bound in (24), the design of Γ in the 16-QAM constellation can be easily related to that of the QPSK constellation in FIG. 15. The two constellations can be related by considering $x_1(i_P)$ and $x_\alpha(i_P)$ values of the 16-QAM equivalent to $x(i_P)$ and $z(i_P)$ in the QPSK example. Hence, in one way, the 16-QAM constellation becomes a little simpler because there is no need to consider a $y(i_P)$ parameter for every sequence, but however, now it is necessary to consider m=4 rows (as opposed to two in QPSK) of Γ. Other than these minor differences, a similar method of constructing Γ can be applied in this second example involving the 16-QAM constellation of FIG. 16.

The algorithms starts off, similar to the QPSK example, by attempting to achieve $d_{s,t}=d_t$ and $Dmin,n^2=D_1^2d_t$, and then, if necessary, these targets are lowered gradually until a solution, Γ, is found. The steps can be summarized as:

Step 1. Find all weight $d_t$ sequences $i_P$ of the concatenation and load their positions vectors into $P(d_t)$. The information of every sequence $i_P$ includes, $x_{1,min}(i_P)$ and $x_{\alpha,max}(i_P)$ (like $x_{min}(i_P)$ and $z_{max}(i_P)$ of the QPSK example), and $c(i_P)$. Once all weight d sequences are loaded on to $P(d_t)$, find (or update) $\Delta_{dis}(i_P)$ for each sequences $i_P$ in $P(d_t)$ and form the set $P^+(d_t)$ using the modulo 2 addition of the disjoint sequence in $P(d_t)$ as previously discussed. Check every new candidate sequence, $i_P$, to see if it is already in $P^+(d_t)$, and if this sequence already appears in $P^+(d_t)$, do not enter it in $P(d_t)$.

2. Identify $E(d_t)$ the set of distinct positions of weight $d_t$ sequences. Rearrange $E(d_t)$ in the order of descending popularity of the positions among the sequences on $P(d_t)$. Place as many positions of $E(d_t)$ as possible on the first row of Γ. If $E(d_t)$ has any remaining positions, in contrast to the QPSK case, this alone does not mean that $D_{min}^2$ needs to be lowered. Place the remaining positions of $E(d_t)$ (set H) by filling in columns one at a time. Try to fill in the left most possible columns first, and in failing move to the right. Try to place the most popular positions first and try to maintain $d_{s,t}$ and maintain $x_{1,min}(i_P)$ for all sequences. In addition, by using $\Delta_{dis}(i_P)$ and following the analysis in (17)-(20), and Methods 1 and 2, make sure that all the inter-sequence constraints are satisfied. If it is necessary to have disjoint sequences share columns try to avoid the situation where mutually disjoint sequences share any of the same columns. If all positions of $E(d_t)$ cannot be placed in Γ to satisfy the above conditions, first try swapping positions. If that fails too, lower $d_{s,t}$ and/or $D_{min,n}^2$ until all positions of $E(d_t)$ can be placed in Γ while meeting the CICM interleaver constraints for $d_{s,t}$ and $D_{min,n}^2$.

3. Set d=d+1. For every sequence $i_P$ in every set of sequences $P(d \geq d_t)$ record $d_{s,temp}(i_P)$ and $D_{en}^2(i_P)$. As described in step 3 of the QPSK case identify sets $P(d \geq d_t)$, $P'(d \geq d_t)$, $P^+(d \geq d_t)$, $E'(d)$, $H'(d)$, $E_Q(d \geq d_t)$, and $\overline{E}_Q(d \geq d_t)$. Place the positions of $E'(d)$, $H'(d)$ similarly as described in step 3 of the QPSK example, but without favoring the first row, and in order to best meet the $d_{s,t}$ and $D_{min,n}$ constraints, while also and satisfying the inter-sequence constraints. If needed, swap positions until all sequences can maintain $d_s(i_P) \geq d_s$ and $D_{en}^2(i_P) \geq D_{min,n}^2$. If $d<d_f$, repeat step 3.

It is interesting to compare the performance of the QPSK and 16-QAM examples with the same concatenated code with BPSK transmission. For that comparison, we use the standard normalized squared Euclidean distance $d_{min}^2 = D_{min}^2/2E_{b,avg}$ that considers the average bit energy $E_{b,avg}$, and observe that $E_{b,avg}$ in the QPSK and the 16-QAM schemes are respectively, $E_{b,avg,QPSK}=\alpha^2$ and $E_{b,avg,16-QAM}=5\alpha^2/2$. Hence, the highest achievable $d_{min}^2$ for the QPSK and 16-QAM schemes (assuming that the interleaver Γ can be designed to achieve the highest possible $D_{min}^2$) are $d_{min,QPSK}^2=4Rd_t$ and $d_{min,16-QAM}^2=4Rd_t$ respectively, where R is the rate of the CTBC code. Note that with BPSK signaling (or QPSK with standard Gray mapping) $d_{min,BPSK}^2=2Rd_t$. Hence, the CICM design of the QPSK is clearly better than the usual QPSK that uses Gray mapping. Interestingly, even the CICM-16-QAM which transmits 4 bits per interval has a higher value of $d_{min}^2$ than the standard QPSK with Gray mapping.

CICM Higher Order PSK Example

The next example shows demonstrates how to determine a CICM mapping policy using PSK constellations. Similar to set partitioning in Ungerbock's TCM, it is shown how to systematically expand a $M=2^m$ point PSK constellation to form a $2^{m+1}$ point PSK constellation. With the CICM mapping rule, the MSED of the constellation at the sequence level does not reduce each time the constellation size is doubled.

Figure 17:
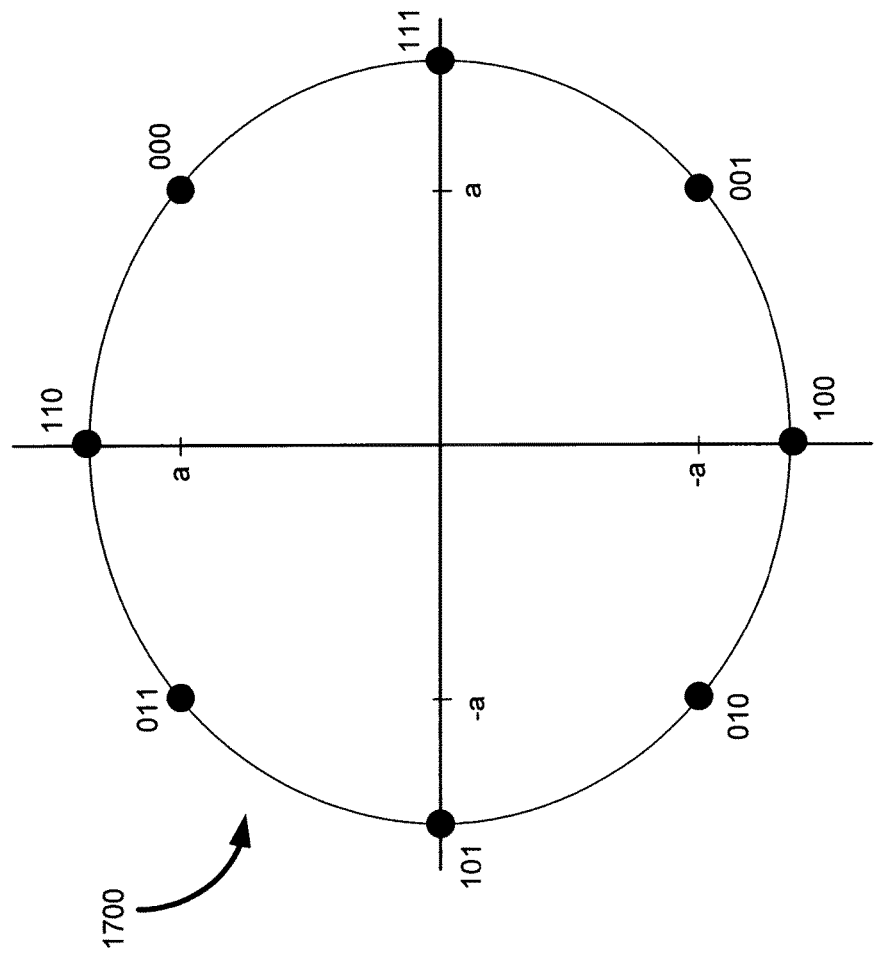
FIG. 17 illustrates a 8-PSK constellation that uses Reverse Gray Coding.

To begin, consider the construction of a reverse Gray coded 8-ary PSK constellation whose phase angles are in their standard positions, $\{0, \pm\pi/4, \pm\pi/2, \pm 3\pi/4, \pi\}$, as shown in FIG. 17. This 8-ary PSK constellation can be viewed as being composed of the constellation points from the 4-ary PSK (QPSK) constellation as shown in FIG. 15, plus a second copy of the 4-ary constellation shown in FIG. 15 rotated clockwise by 135 degrees. The coding of the LSBs of the resulting 8-ary PSK constellation points in FIG. 17 come directly from these two copies of FIG. 15, while the MSB of the constellation points in FIG. 17 is set to "0" for the original points from FIG. 15, and the MSB is set to "1" for the copy in FIG. 15 that was rotated clockwise by 135 degrees. The resulting constellation in FIG. 17 still maintains the same Euclidean distance $D_1^2$ for all one bit differences as the 4-PSK constellation of FIG. 15. Hence, a CTBC code and a properly designed Γ with m=3 along with the constellation shown in FIG. 17 is capable of achieving a maximum squared Euclidean distance of $D_{min}^2=4Ed_t$ (the same as in the 4PSK constellation), and a corresponding normalized squared Euclidean distance of $d_{min}^2=4Ed_t/(2E_{b,avg})=4Ed_t/(2E/3)=6d_t$, where $d_t$ is the minimum Hamming distance of the CTBC code and $E=2\alpha^2$ (note that the coordinates of FIG. 17 are ($\pm\alpha,\pm\alpha$) and its rotation of 135 degrees).

Similarly, two copies of the 8-ary constellation in FIG. 17 can be used to construct a 16-ary PSK constellation. This 16-ary PSK constellation can be viewed as being composed of the constellation points from the 8-ary PSK (QPSK) constellation as shown in FIG. 17, plus a second copy of the 8-ary constellation shown in FIG. 15 rotated clockwise by 157.5 degrees. The coding of the LSBs of the resulting 16-ary PSK constellation points come directly from these two copies of FIG. 17, while the MSB the constellation points in the resulting 16-PSK constellation are set to "0" for the original points from FIG. 17, and the MSB is set to "1" for the copy in FIG. 17 that was rotated clockwise by 157.5 degrees. With a CTBC code and a properly designed Γ with m=4 along with this 16-ary constellation is capable of achieving a squared minimum Euclidean distance of $D_{min}^2=4ED_t$, and a normalized squared Euclidean distance of $d_{min}^2=4Ed_t/(2E_{b,avg})=4Ed_t/(2E/4)=8d_t$.

It can be seen from FIGS. 1 and 3 and the discussion above that the same procedure can be extended to systematically construct any $2^{m+1}=2M$-ary PSK constellation by simply i) making a first copy of current $2^m=M$-ary PSK constellation, ii) creating a second copy of this current M-ary PSK constellation by rotating the first copy of the M-ary PSK constellation clockwise by $[180\text{-}(90/2^{m-1})]$ degrees, and then iii) merging these two copies together by assigning MSB=0 to the first copy and MSB=1 to the second copy to form the resulting 2M-ary PSK constellation. Applying this process to FIG. 17 gives the 16-PSK constellation of FIG. 18.

It is interesting to compare the above CICM mapped 16-ary-PSK constellation with the above CICM mapped 16-QAM constellation that is capable of achieving $d_{min}^2=4Rd_t$. The CICM-mapped 16-PSK constellation can be designed to achieve $d_{min}^2=8Rd_t$ and thus to perform better than the 16-QAM constellation over both Gaussian channels and fading channels. In fact, if the frame size is large enough so that $\Gamma$ can be designed to meet the CICM interleaver constraints, then $d_{min}^2$ of CTBC codes can be increased by increasing the order of signaling M. With the above construction for building reverse Gray coded PSK constellations, each time the PSK constellation size, M, is doubled, the resulting 2M-ary PSK constellation will maintain the same $D_{min}^2$ value as the original 4-PSK constellation. However, as M increases, both $D_{min,n}^2$ and $d_e$ also increase, thereby adding more and more sequences the sequences $i_P$ into the table $P(d \geq d_t)$, and the number of available columns of $\Gamma$, K/m, also decreases. As a result, it becomes more difficult to design a valid $\Gamma$ to achieve higher values of $D_{min,n}^2$ without increasing the frame size. Hence, in practice, different orders of signaling can be tested and the best possible order in terms of $d_{min}^2$ can be chosen. In addition, compared with the 16-QAM constellation, the PSK constellations comes with additional advantages due to their constant envelope property. The constant envelope property offers the scheme with a simpler (inexpensive) power amplifier at the transmitter and a simpler CSI recovery and equalization at the receiver.

Figure 18:
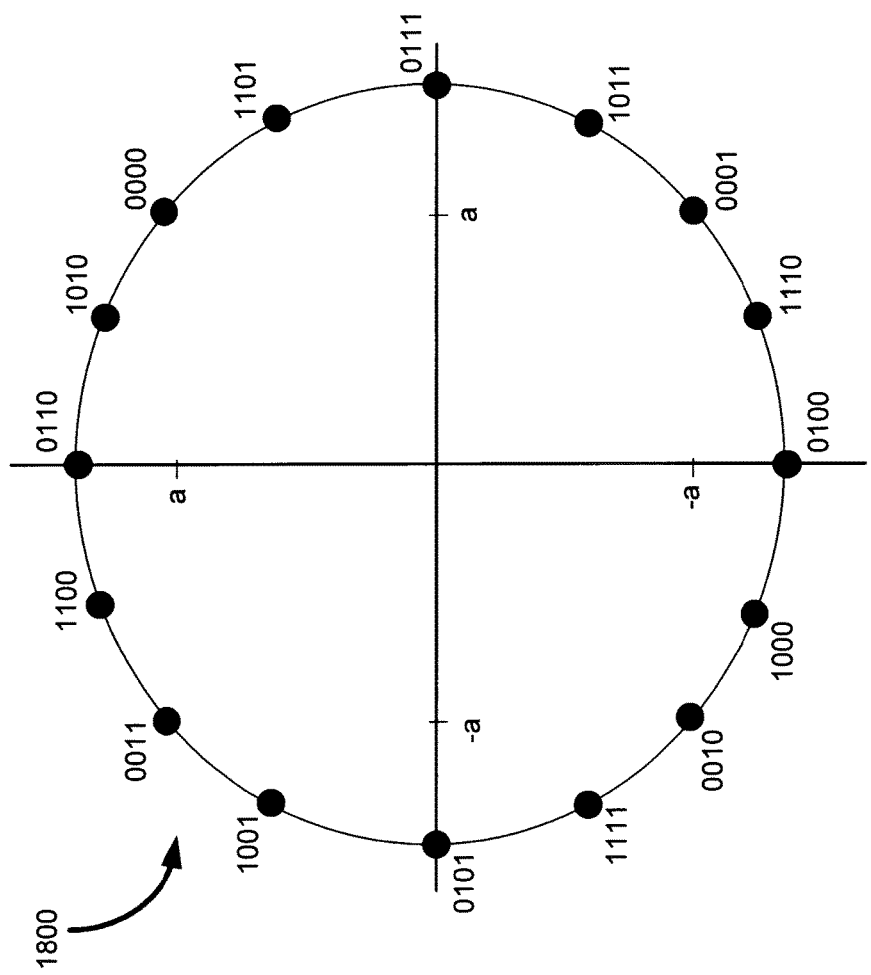
FIG. 18 illustrates a 16-PSK constellation that uses Reverse Gray Coding.

The construction of the interleaver $\Gamma$ of the 8-ary constellation in FIG. 17 and the 16-ary constellation in FIG. 18 follow from that of the construction in the QPSK example. For example, in the 16-ary case in FIG. 18, $\Gamma$ should be constructed with four rows and K/4 columns. Keeping the radius of the circle in FIGS. 17 and 18 the same as that of FIG. 15 which is $\sqrt{2\alpha}$, the bit energy is $E=4\alpha^2$. Also, in FIG. 18, all single bit changes in the third bit position (out of 4) achieves the highest squared Euclidean distance contribution of $8\alpha^2=4E$. Similarly, the squared Euclidean distances all single bit changes at the first, second and fourth bit positions can be easily calculated using the cosine theorem as $7.6955\alpha^2=3.8478E$, $6.828\alpha^2=3.4142E$, and $4\alpha^2=2E$ respectively. Hence, in the construction of $\Gamma$, the third row should get the highest preference, then the next levels of preference respectively follow the first, second and the fourth rows. With these individual contributions the same procedure used in the QPSK example can be used to construct $\Gamma$ with the 16-ary constellation in FIG. 18.

Alternatively, if the reverse Gary coded bit vector of FIG. 18 is written as [b3 b2 b1 b0], then if all the bits are consistently rearranged as [b1 b3 b2 b0], then first row of $\Gamma$ would correspond to a squared Euclidean distance of 4E, the second row 3.8478E, the third row 3.4142E, and the last row, 2E. Hence it should be understood that the constellation mappings can be modified or the rows of $\Gamma$ can be assigned to bits of the constellation to ensure that the upper rows are associated with the higher distances. Also, while reverse Gray coding is preferable in many cases, all that is really needed is that the distances between the codewords that differ by just one bit are assigned as high of a distance as is practical or possible (so that known anti-Gray coding would also be a possible constellation mapping rule for use with CICM). In some cases the distances between codewords that have differences in more than one bit can vary from embodiment to embodiment and do not need to progress in any prescribed way.

Application of CICM to More General Codes

In the CICM mapping rule design algorithms discussed above, the permutation matrix, $\Gamma$, was designed to map coded bits of a CTBC code on to a higher order constellation. While the above CICM mapping rule design algorithms map the coded bits from a CTBC code onto a target constellation, many aspects of CTBC codes were not required in the above presented design algorithms. The CICM mapping rule design algorithm made use of the tables table $P(d \geq d_t)$, $d=d_t, d_t+1, \ldots, d_f$. Hence, the CICM mapping rule design algorithm can be easily extended to work with any type of an outer code for which the tables $P(d \geq d_t)$ can be prepared. All that is needed to do this is to have to the ability to identify the low weight sequences. Note that typical BICM systems can be viewed as an outer code, that feeds into a uniform interleaver, and the output of the interleaver feeds into a constellation mapper that takes the place of an inner code. Therefore, many different types of codes can be used as outer codes, and if these outer codes can be used to prepare the tables $P(d \geq d_t)$, then the uniform interleaver in the BICM can be replaced by the CICM interleaver, $\Gamma$. These outer codes include block codes, convolutional codes, turbo product codes, and others.

For example, consider a system that involves a simple (8,4) extended Hamming code with $d_0=4$, and that feeds $\rho$ codewords of this code into an interleaver before constellation-mapping onto a QPSK symbol stream. The (8,4) code has the all zero codeword, the all ones codeword and 14 weight d=4 codewords. Therefore, the table $P(d \geq d_t)$ of this (8,4) code up to weight d=8 will contain (a) 14 codewords of each of the $\rho$ codewords (14$\rho$ in total), (b) all ones codewords of each of the $\rho$ codewords ($\rho$ in total), and (c) $(_2{}^\rho)^* 14^2$ combinations of two codewords each with weight d=4. If the weight on $P(d \geq d_t)$ needs to increase, we can extend the table to a desired weight.

Similarly, if there is a way to identify the lowest weight sequences and to thus prepare a corresponding table $P(d \geq d_t)$, the same method can be applied to other kinds of codes such as various types of convolutional codes. Additional gains can be achieved by using the permutation $\Gamma$ that is chosen in accordance with the CICM interleaver constraints to rearrange the coded bits of the outer code to form symbols for transmission. It is interesting to note that, even with a relatively simple outer code, $\Gamma$ can be designed to work with a target signal constellation in order to achieve very good performance. The systematic design of $\Gamma$ and a signal constellation mapped according to a properly identified constellation mapping rule (such as a reverse Gray coded (RGC) constellation mapping rule) to allow the CICM mapping approach to be applied in a variety of situations beyond CTBC encoded applications.

As of present, it is difficult to enumerate all of the low weight codewords of turbo codes and LDPC codes that have large frame sizes. However, the CICM approach can be applied to certain turbo codes and LDPC codes with small to moderate frame sizes where the low weight error sequences can be enumerated and thus the table $P(d \geq d_t)$ can be found. All that is needed to apply CICM is the table $P(d \geq d_t)$ can be built. Also, for larger frame sizes, if exhaustive algorithms or other kinds of long-running, off-line algorithms are used to identify the low weight error sequences to build the table $P(d \geq d_t)$, then a CICM mapper can be designed for any such turbo code or LDPC code for which the table $P(d \geq d_t)$ has been constructed.

Puncturing, and Variable Redundancy

Two example approaches are provided below in order to achieve variable redundancy (also known as Rate Matching) in systems that use CTBC codes.

1. Puncturing: In this approach, we first consider a concatenation with a low rate OBC and an accumulator. Then in order to adjust the rate, puncturing is performed at the output of the accumulator. It is well known that a low rate OBC usually comes with a high MHD $d_0$. Even a standard CI-2 would square the effect of this increase in the MHD. For example, consider a (8,4) OBC with $d_0=4$, which can be used with an accumulator and a CI-2 interleaver to construct a concatenation with rate ½ that has MHD=16. Consider a (12,4) shortened BCH code derived from a (15,7) BCH code with $d_0=5$. If this (12,4) OBC is used the same way to construct a concatenation, and if the frame size is large enough, the resulting concatenation can achieve a MHD of 25. However, to bring the rate up to ½, puncturing can be applied to puncture out, on the average, one bit out of three bits, at the output of the accumulator. This puncturing can be done in an optimal manner by following the construction of the interleaver $\Gamma$. A set of K/3 bits is selected at the output of the accumulator that would maintain the highest MHD of the punctured code. This can be done by trying to preserve most of the coded bits of low weight coded sequences by monitoring the non-zero positions of the low weight sequences as in the construction of $\Gamma$. Also, during the execution of the CICM mapping rule design algorithm, the orderings of the sets E(d) and H(d) and/or the constraints used to place the positions in these sets and related sets of positions could be preferably placed to maintain higher values of $d_{s,t}$ and $D_{min,n}^2$ within a subset containing K/m/3 columns of $\Gamma$ than are achieved in the rest of the columns of $\Gamma$.

That is, the puncturing and the design of $\Gamma$ to assign the punctured coded bits to bit positions within symbols can be done jointly. As an example, consider the above stated concatenation of a (12,4) OBC and an accumulator. Following steps 1 and 2, we can first form the set of distinct positions of all lowest weight sequences, E(d). If the length of E(d) is more than 2K/3, there is no way we can remove N/3 bits at the output of the accumulator while preserving the overall MHD of the punctured code at $d=d_t=25$. However, if the length of E(d) is less than 2K/3, there is a chance. The goal is to identify a set of positions that can later be punctured so as to maintain the highest possible MHD after puncturing. This can be done using the sequences that are needed to build $\Gamma$, that is, the sequences $i_P$ in the tables $P(d \geq d_t)$, i.e., the sequences in the tables P(d) where $d_t \leq d \leq d_f$. If the MHD can be maintained at $d_t$, no positions of $E(d_t)$ can be removed. Similarly, one position from each of the sequences in $E(d_t+1)$ can be removed. It will need to be checked that any position removed from $E(d_t+1)$ is not also a member of $E(d_t)$. So, in general if the target MHD after puncturing is $d'_t$, then up to $(d-d'_t)$ number of positions can be removed from every sequence in P(d), $d > d'_t$. When selecting positions to remove, always try to find the least popular newly added positions at every weight d to thereby affect the least number of sequences in P(d) while also maintaining the desired MHD for lower weights also.

2. Use of a SPC code with the inner code: In this approach, a high rate OBC is used. Then to adjust the rate lower, a ($\lambda$+1, $\lambda$) SPC encoder is used to further encode the output of the accumulator. As a result, the IRCC is formed by the concatenation of the accumulator and the SPC code. With this construction, the rate of the overall CTBC code can be readily adjusted by adjusting $\lambda$.

CICM Transmitter and Receiver Embodiments

Figure 19:
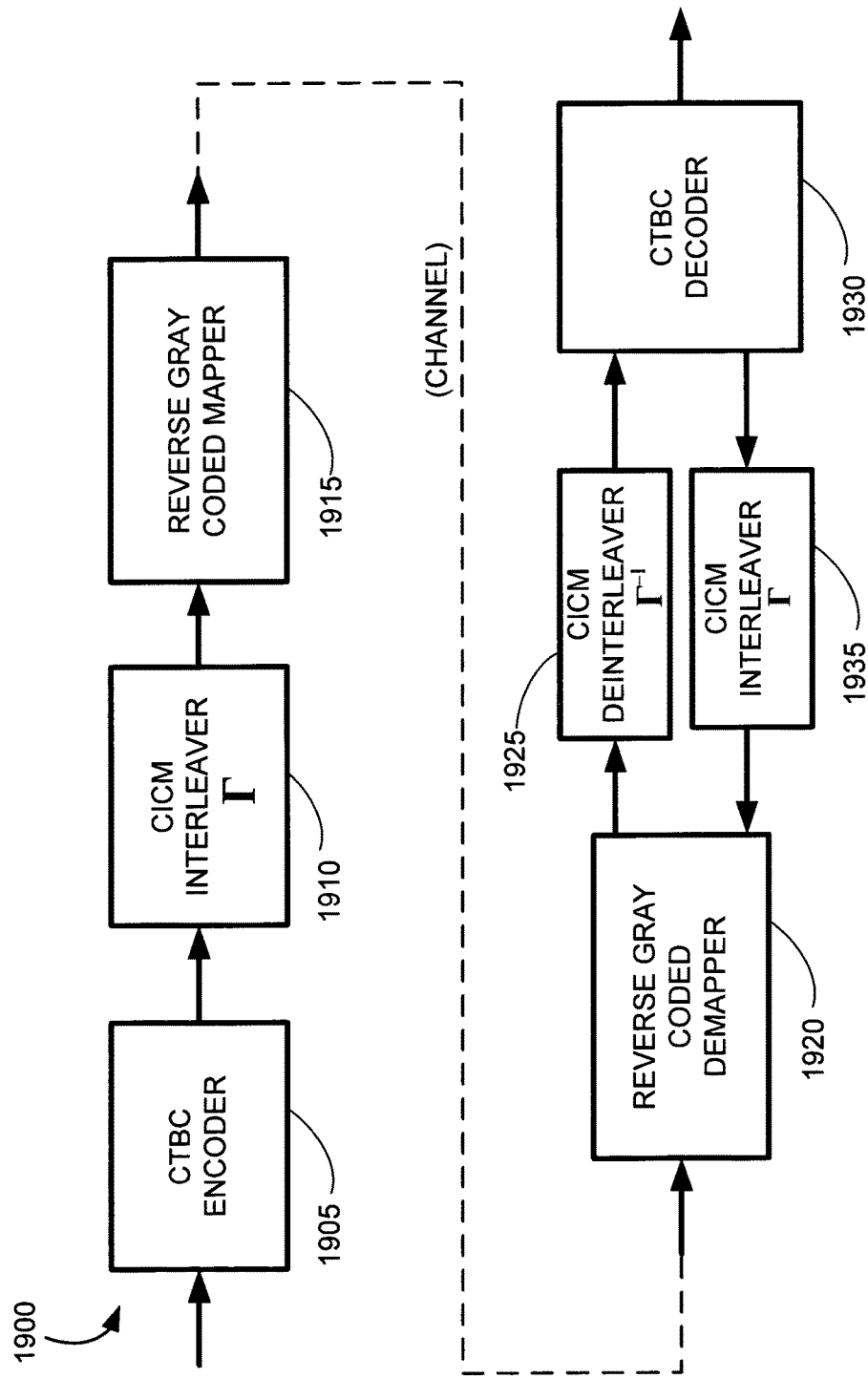
FIG. 19 is a block diagram of a transmitter, channel, and a receiver that uses constrained interleaved coded modulation (CICM) in accordance with an aspect of the present invention.

Referring now to FIG. 19, a transmitter method, apparatus, and/or system 1900 involving a CICM signal mapping subsystem is shown coupled via a communications channel to a receiver method, apparatus or system involving a CICM signal demapping subsystem.

The CICM based transmitter involves a CTCB encoder 1905 that is coupled to a CICM signal mapper that includes a CICM interleaver 1910 that is in turn coupled to a Reverse Gray coded (RGC) constellation mapper 1915. The CTBC encoder block can be implemented using any of the valid CTBC encoder embodiment as discussed herein. The CICM interleaver performs interleaving in accordance with an CICM interleaver rule $\Gamma$ that is designed as discussed herein to meet one or more CICM interleaver constraints, to include CICM interleaver rule to permute the coded bits of the vector v, subject to the constraint that, once mapped, the CICM mapped sequence will exhibit the best set of values of $d_{s,t}$ and $D_{min}^2$ that can be achieved for a given frame size and for a given constellation size and the RCG constellation mapping rule. Also, $\Gamma$ can be designed to meet subordinate types of constraints such as inter-column and inter-sequence constraints as discussed herein. The RCG constellation mapper maps, for example in accordance with the QPSK or the 16-QAM constellations or 8-PSK constellations as shown in FIGS. 15-18, or some other constellation, such as 16-PSK or 32-QAM, for example, that makes use of a RGC mapping policy. Also, other mapper/demapper rules beside reverse Gray coded or anti-Gray coded constellation mappers could be used, as long as the constellation mapper is able to help meet the MSED requirement at the sequence or codeword level.

The CICM based receiver involves a RCG constellation demapper 1920 that is coupled to a CICM deinterleaver 1925 that is coupled to a CTBC decoder 1930. The RGC constellation demapper 1920 performs the inverse operation of the RGC constellation mapper 1905, and in practical embodiments is used to compute a set of bit metrics for later decoding in a SISO decoder. The CICM deinterleaver 1925 performs deinterleaving in accordance to the inverse of the CICM interleaver rule $\Gamma$, which is denoted as $\Gamma^{-1}$. The output of the CICM deinterleaver 1925 is typically a set of bit metrics that are coupled to CTBC decoder 1930. The CTBC decoder 1930 can be implemented in accordance with any of valid CTBC decoder embodiment as discussed herein. However, as each pass is made through the SISO algorithm implemented in the CTBC decoder, in order to compute new bit metrics based on the updated extrinsic information, the bits from the v sequence will need to map via the CICM interleaver 1935 to the RGC signal constellation information so that the bit metrics can be updated. The updated bit metrics then pass back through the CICM deinterleaver 1925 for further SISO decoding in the block 1930.

In the transmitter and/or the receiver 1900, rate matching and other forms of variable redundancy can be implemented using the (λ+1, λ) SPC encoder at the output of the accumulator inside the CTBC encoder/decoder blocks 1905, 1930. In such embodiments, the IRCC in the CTBC code is formed by the concatenation of the accumulator and the SPC code as discussed above. In systems where rate matching and/or other forms of variable redundancy functions are designed into the CICM permutation rule Γ, the blocks 1910 and 1925 can be implemented as discussed above to cause a subset containing less than the full K/m columns of Γ to be transmitted in any given variable redundancy frame or sub-frame.

For example, consider a case where the full CTBC code, v, will be transmitted as three sub-frames. In this case, the permutation Γ can be arranged to send the first set of K/m/3 columns in a first sub-frame, the second K/m/3 columns in a second sub-frame, and the third K/m/3 columns in a third sub-frame. Preferably the columns of Γ are organized so that the first K/m/3 columns of Γ contain a carefully constructed set of columns that maximize a given performance measure, such as the MHD of the CTBC coded vector v, in light of the fact that only the first K/m/3 columns of Γ will be available to the SISO decoder 1930. The K/m/3 columns of Γ preferably contain a carefully constructed set of columns that maximize the MHD of the CTBC coded vector v in light of the fact that only the first 2K/m/3 columns of Γ will be available to the SISO decoder 1930. When the final K/m/3 columns of Γ have been transmitted, all of the elements of v will be available to the SISO decoder 1930. If now further redundancy is needed, a retransmission protocol can be used so that any specified subset of the columns of Γ can be retransmitted to further increase the probability of correct decoding of the vector, v.

In embodiments where the CICM interleaver 1910 and deinterleaver 1925 are designed to work in variable redundancy systems, there will be additional control logic associated with the blocks 1910 and 1925 to implement the variable redundancy protocol. Information at a control channel level or some other higher layer such as a radio link layer or a radio physical layer control entity or data stream will be coupled to a control element associated with each of the blocks 1910 and 1925, and these control elements can be considered to be a part of the blocks 1910 and 1925 in such embodiments involving rate matching or other forms of CTBC/CICM adaptive modulation and coding.

In embodiments as mentioned above where some other form of coding is used beside CTBC codes, the blocks 1905 and 1930 can be configured to encode and decode in accordance any selected form of coding for which the table $P(d \geq d_t)$ can be constructed for $d = d_t, \ldots, d_f$. For example, any type of block code, and most types of trellis codes, convolutional codes, and certain turbo codes and LDPC codes can be used in the blocks 1905 and 1930 in these types of embodiments to achieve the benefits of CICM and CICM based variable redundancy as described herein.

In typical CICM communications embodiments, an encoder will be used that converts a sequence of input bits to an encoded bit sequence in accordance with an encoding rule. The encoding rule can be CTBC encoding or could be any other coding rule such as a block code or a convolutional code or any other code that produces a frame of K of encoded bits, and where the encoding rule has the property that, for all possible sequences of input bits, all possible low weight encoded bit sequences, $i_p$, of weights $d_t \leq d \leq d_f$ can be identified and enumerated, where none of the possible low weight encoded bit sequences, $i_p$, can have a weight less than $d_t$, and the weights $d_t \leq d \leq d_f$ correspond to Hamming distances. Such embodiments will also include a constrained interleaver that is configured to implement an m×K/m permutation rule. The m×K/m permutation rule is configured to permute the K encoded bits of the encoded bit sequence to a sequence of K/m number of subsets that each contain m encoded bits. This permutation can be optionally/preferably implemented using the CICM permutation matrix, Γ. A constellation mapper will then receive the sequence of K/m number of subsets and use a pre-defined constellation mapping rule to convert the sequence of K/m number of subsets to a sequence of K/m number of $2^m$-ary signal constellation points. The m×K/m permutation rule and the constellation mapping rule are jointly selected to ensure that a pre-defined target value of MSED is maintained for all of the possible low weight encoded bit sequences, $i_p$, of weights $d_t \leq d \leq d_f$. The m×K/m permutation rule and the constellation mapping rule are preferably also jointly selected to ensure that a pre-defined target value of minimum symbol Hamming distance, $d_s$, is maintained for all of the possible low weight encoded bit sequences, $i_P$, of weights $d_t \leq d \leq d_f$. The Hamming distance $d_f$ is preferably selected to ensure that any possible encoded bit sequence, $i_P$, that has a weight $d > d_f$ will be guaranteed to have at least the pre-defined target value of MSED and the pre-defined target value of minimum symbol Hamming distance, $d_s$. In typical embodiments, The constellation signal mapper uses either anti-Gray coding of RGC.

Figure 21:
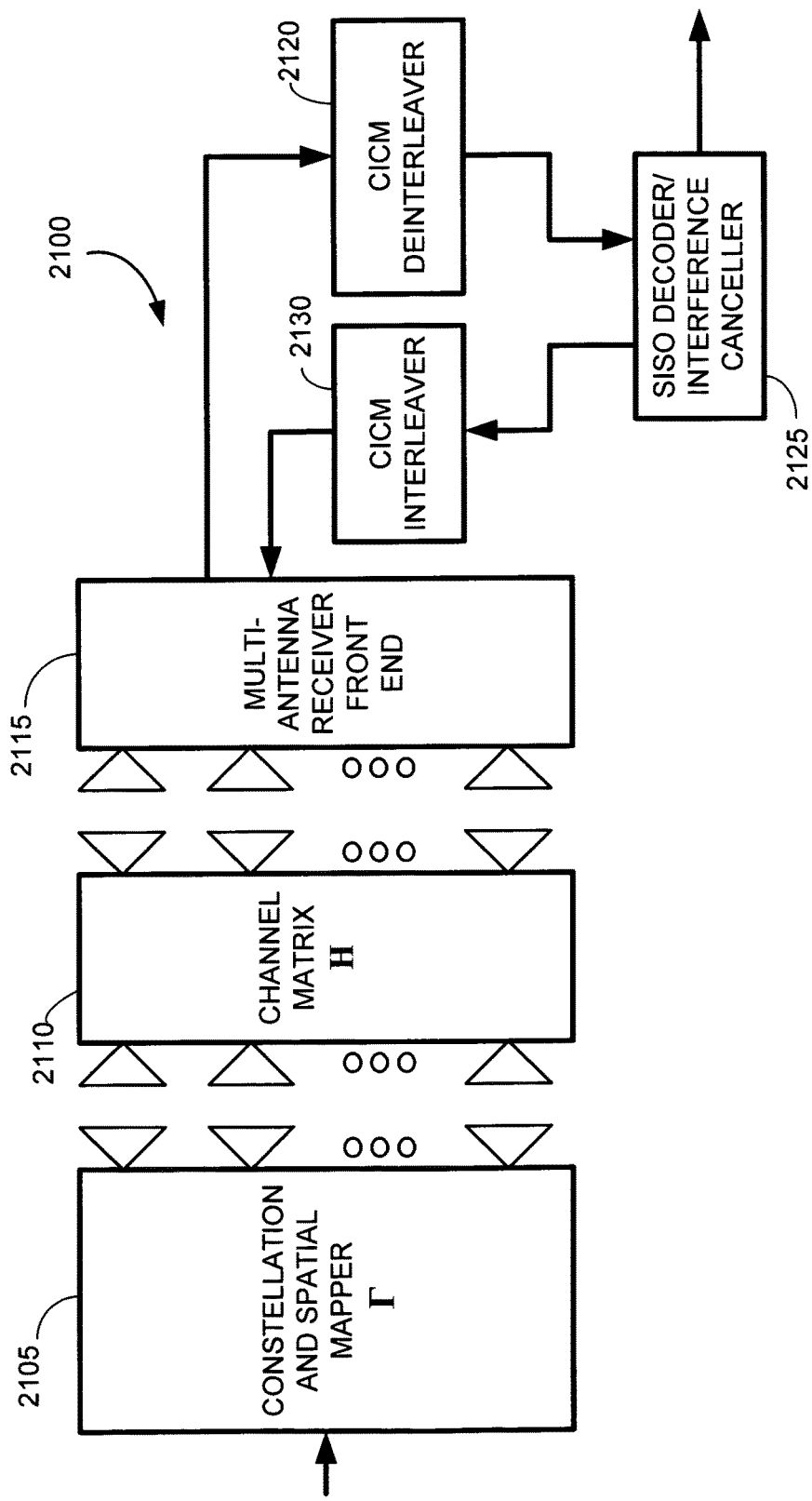
FIG. 21 is a block diagram of a multi antenna embodiment of a CICM-MIMO-SM system that includes a transmitter, a channel and a receiver.
Figure 23:
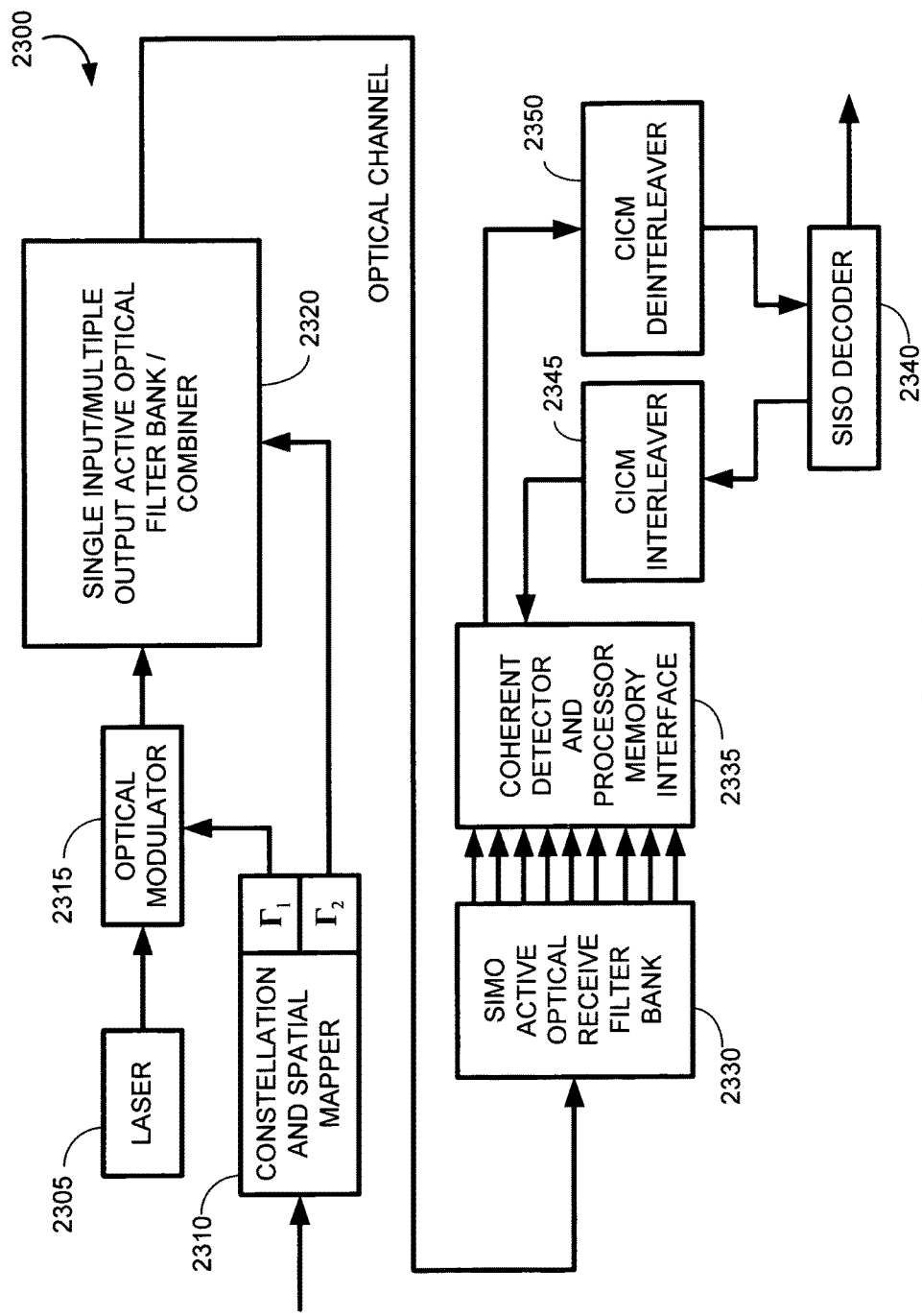
FIG. 23 is a block diagram of a embodiment of an optical CICM-SM system that includes a transmitter, a channel and a receiver and is designed for use in fiber optic and other types of laser communications systems.
Figure 24:
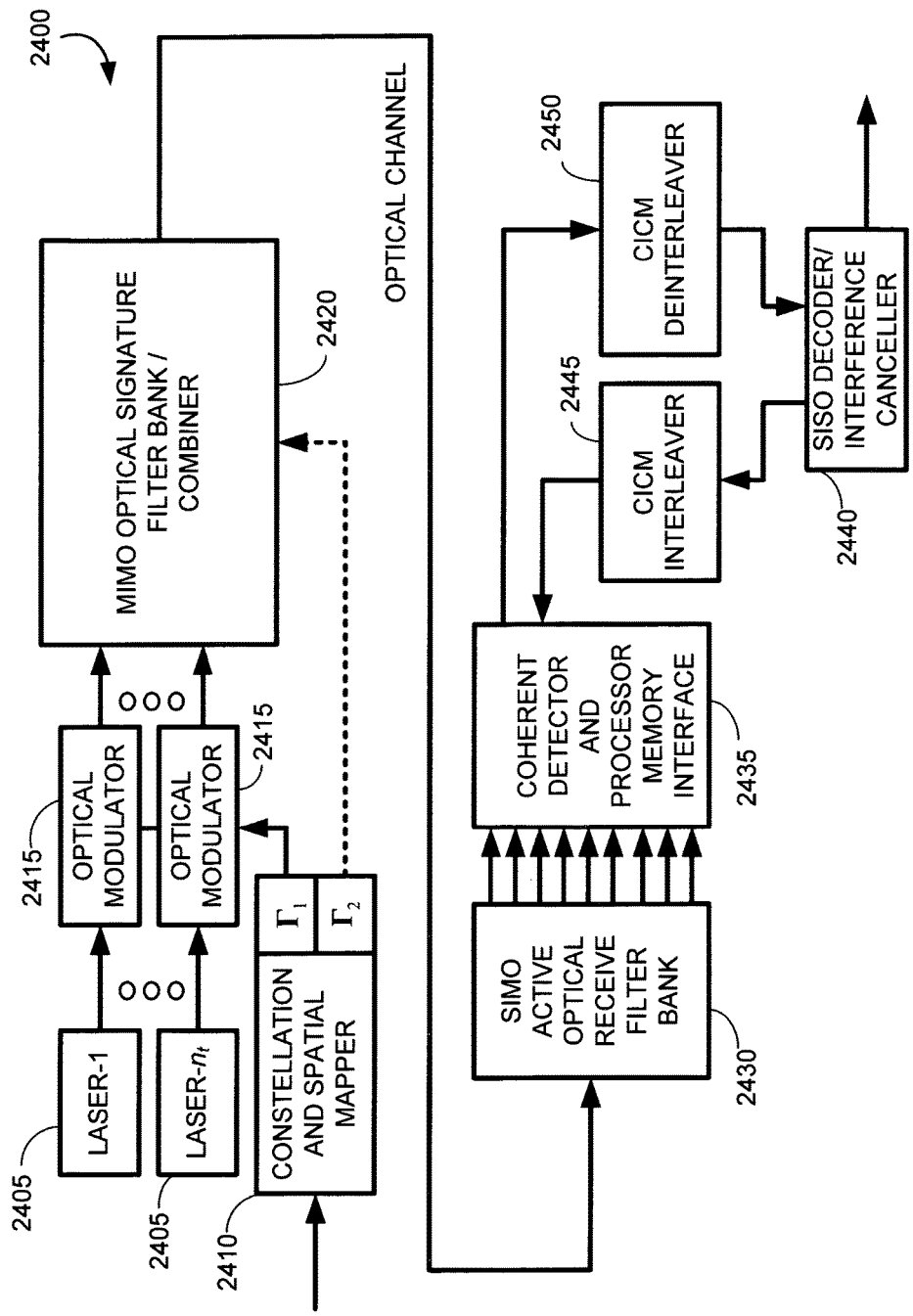
FIG. 24 is a block diagram of a embodiment of an optical CICM-MIMO system that includes a transmitter, a channel and a receiver and is designed for use in fiber optic and other types of laser communications systems.

As is discussed in further detail below in connection with FIGS. 21, 23, and 24, the CICM mapping rule/CICM signal mapper can include a spatial mapper. In such cases CICM signal mapper can be viewed as a constellation and spatial mapper that is configured to couple a frame of K/m number of $2^m$-ary signal constellation points through a sequence of selected ones of a plurality of spatial channels. A spatial modulation algorithm together with CICM signal mapping is used to identify the sequence of selected ones of a plurality of spatial channels so as to ensure that the pre-defined target value of MSED is maintained for all of the possible low weight encoded bit sequences, $i_P$, of weights $d_t \leq d \leq d_f$ that traverse the plurality of spatial channels. In CICM constellation and spatial mappers that also optionally maintain a minimum symbol Hamming distance, the sequence of selected ones of a plurality of spatial channels is also selected to ensure that the pre-defined target value of minimum symbol Hamming distance, $d_s$, is maintained for all of the possible low weight encoded bit sequences, $i_P$, of weights $d_t \leq d \leq d_f$ that traverse the plurality of spatial channels. The spatial channels can involve channels between a given transmit and receive antenna in a multi-antenna embodiment, or paths between one or more lasers and a given one of coherent laser-signal detector. In the case of MIMO/SM laser channels, different filter paths through a discrete time or other type of transmit optical filter bank and the various path through a receive optical filter bank to a selected coherent detector make up the MIMO type channel structure. FIGS. 21-24 and the discussion thereof provide more details. As discussed in greater detail below, a MIMO modulation rule may alternatively be used whereby a plurality of different constellation points are coupled through a plurality of different spatial channels simultaneously.

CICM Mapping Rule Design Algorithm Embodiments

Figure 20:
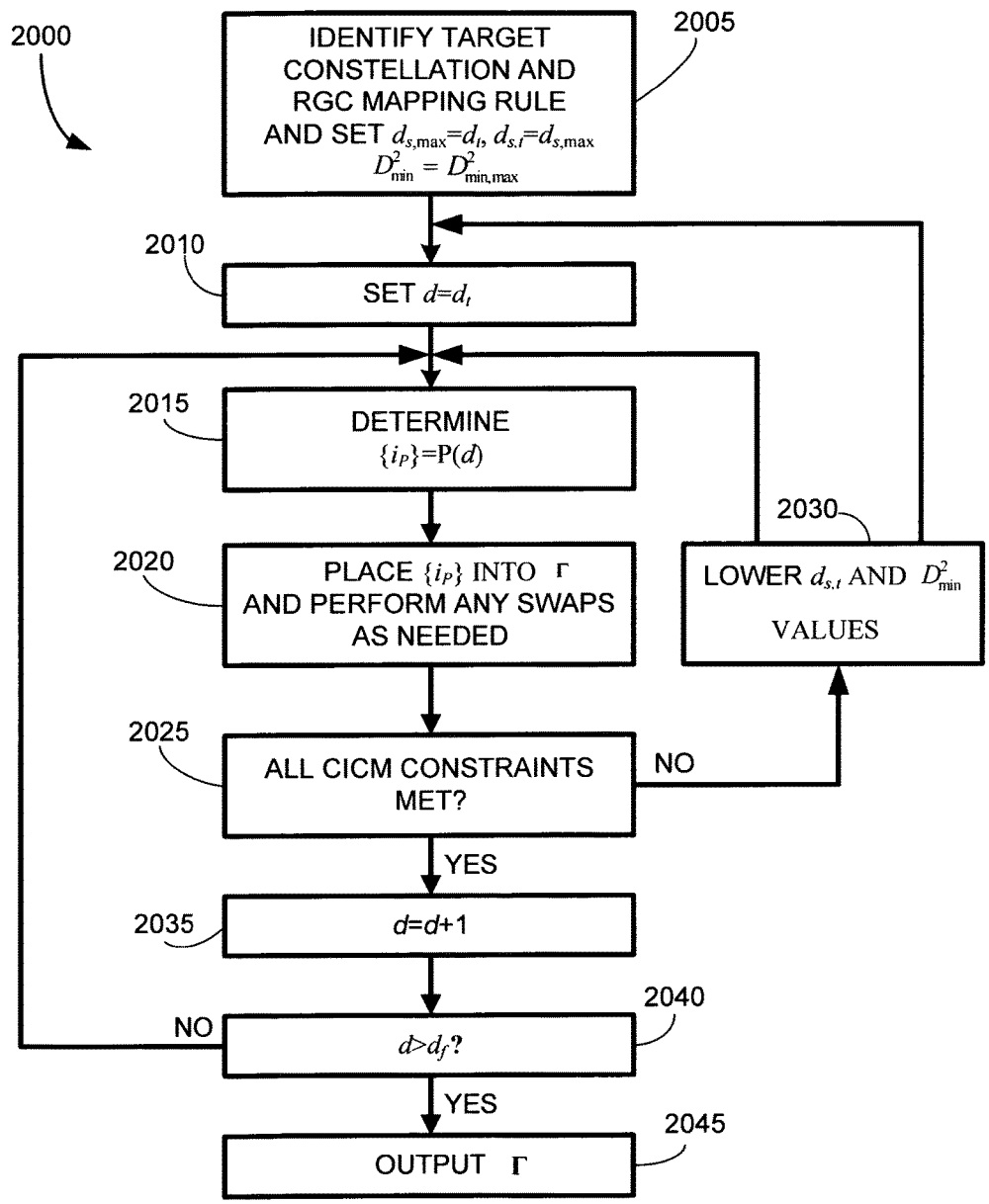
FIG. 20 is flow chart that illustrates a method to design contention free deterministic constrained interleavers for use in the CICM permutation, Γ.

Referring now to FIG. 20, a CICM mapping rule design algorithm 2000 is provided to design a CICM mapper 1910, 1915, and its CICM mapper inverse 1920, 1925, such as shown in FIG. 19. The method 2000 begins by identifying a target signal constellation, which can be, for example, QPSK, 16-QAM, 8-PSK, or any other selected signal constellation, such as, for example a 4-dimensional constellation as used in optical communications which two 2-dimensional constellations are transmitted simultaneously on the horizontal and vertical polarizations. Once the target signal constellation is identified, a RGC constellation mapping rule is also identified to map bits onto the identified signal constellation. The RGC constellation mapping rule is preferably designed to assign higher distances between constellation points that differ by a single bit and progressively smaller distances between constellation points that differ by more bits up to m-bits. Next the action 2005 initializes $d_{s,max}=d_f$, $d_{s,t}=d_{s,max}$ and $D_{min}{}^2=D_{min,max}$, where these values are selected based upon the identified signal constellation and the target MHD value, $d_f$, of the CTBC coded sequences to be mapped using the CICM mapping rule 1910,1915.

Next control passes to an action 2010 which initializes d to $d=d_t$. Control next passes to an action 2015 which determines a set o sequences, $\{i_p\}=P(d)$ which includes the positions vectors $p(i_P)$ for the weight d CTBC coded sequences, $i_P=0, \ldots, N_p(d)-1$. Other information can be optionally included in the table P(d) such as the sets of associated vectors $v(i_P)$ and $c(i_P)$, for example. Also, the newly identified constituent table P(d) can be used to update an aggregate table, $P(d>d_t)$, and the sequences $i_P=0, \ldots, N_P(d)-1$ can be added to a larger set of sequences with weights $d \geq d_t$, $i_P=0, \ldots, N_P(d \geq d_t)-1$.

Control next passes to an action 2020 which attempts to place into Γ any and all of the positions associated with the sequences $i_p$ in P(d) that have not already been already placed. As discussed above, all such placements are made in accordance with the CICM constraints i.e., $d_s(i_P) \geq d_{s,t}$ and $D_{en}{}^2(i_P) \geq D_{min,n}{}^2$. The placements of these positions can also optionally be made in accordance with the inter-column and inter-sequence constraints as discussed above. Moreover, any of the swaps discussed above or similar types of swaps can be made with the goal enforcing the CICM interleaver constraints on all sequences in $P(d \geq d_t)$ for the current value of d as determined by the action 2010 or 2035.

Control next passes to an action 2025 which determines whether the CICM interleaver constraints were able to be achieved in the action 2020. If the CICM interleaver constraints were achieved, control passes to the action 2035 where the distance, d, is incremented as $d=d+1$. If the CICM interleaver constraints were not achieved, control passes to the action 2030 where the target minimum symbol hamming distance, $d_{s,t}$ and the target normalized minimum Euclidian distance $D_{min,n}{}^2$ are decreased to their next lower values that preferably corresponds to their highest possible values that are lowered relative to their current values. Control first passes out of action 2030 to action 2015 to allow the design algorithm to attempt to place the current set of $\{i_P\}$ sequences in P(d) using these lowered values. When this branch is taken out of the action 2030, the action 2030 preferably removes already placed positions that can be removed from Γ without violating the CICM interleaver constraints subject to the lowered $d_{s,t}$ and $D_{min,n}{}^2$ values. If the action 2030 is reentered after this attempt fails, the second branch out of the action 2030 will be taken to restart the algorithm 2030 at the action 2010 using the original $d=d_t$ value.

Control passes out of action 2035 to action 2040 where it is determined if the incremented value of d is greater than $d_f$.

If d is not greater than $d_f$, then control passes from the action 2040 to the action 2015. If d is greater than $d_f$, then control passes from the action 2040 to the action 2045. This logic ensure that the algorithm is allowed to run for $d=d_t$, $d_{t+1}, \ldots, d_f$. The action 2045 provides a valid CICM permutation matrix, Γ, which identifies the CICM interleaver rule.

CICM-DCI Embodiments

Next consider the problem of designing vectorizable permutations for the CICM permutation, Γ. The CICM permutation has been defined in terms of the m×K/m permutation matrix, Γ. If the m×K/m permutation matrix, Γ, is viewed as $$\Gamma = [\Gamma_1\ \Gamma_2\ \ldots\ \Gamma_{K/m}] \in Z^{m \times K/m}, \quad (26)$$

where each $\Gamma_j \in Z^m$, for $j=1, \ldots K/m$, then one can define $$\Gamma'_{DCI} = \begin{bmatrix} \Gamma_1 & \Gamma_{K/(M^*m)+1} & \cdots & \Gamma_{(M-1)K/(M^*m)+1} \\ \Gamma_2 & \Gamma_{K/(M^*m)+2} & & \vdots \\ \vdots & & & \vdots \\ \Gamma_{K/(M^*m)} & \cdots & & \Gamma_{K/m} \end{bmatrix} \in Z^{K/M \times M}. \quad (27)$$

The elements of the matrix $\Gamma'_{DCI}$ as defined in equation (27) correspond to permutation indices that point back into the vector v. In terms of the CI-2, CI-3, or CI-4 type permutations, $c=\pi^{-1}[v]$, so that indirection can be used (Γ→v→c) to construct another permutation matrix, $\Gamma_{DCI}$. That is, $\Gamma_{DCI}$ is defined to be a matrix just like $\Gamma'_{DCI}$ of equation (27), but whose elements correspond to permutation indices pointing back into the vector c instead of the vector v. The elements of the matrix $\Gamma_{DCI}$ are related to the elements of the matrix $\Gamma'_{DCI}$ via the constrained interleaver permutation $u=\pi[c]$. The reason $\Gamma_{DCI}$ is defined in terms of the coded bit positions of the vector c is because of the way data is stored in the parallel access 2D memory 710, 1160, 1240 used within the above described SISO decoders described in connection with FIGS. 7 and 11-12.

As discussed in connection with FIGS. 7-12 above, just like $U=\pi[C]$ is defined to be the matrix representation of the constrained interleaver permutation $u=\pi[c]$, $\Gamma_{DCI}=\pi_{CICM}[C]$ is defined to be a matrix representation of a permutation from the positions of the c vector to the CICM symbols arranged similarly to equation (27). However, additional steps will be provided to ensure that the permutation matrix, $\Gamma_{DCI}$, satisfies the vectorization Constraint 6.

If the CICM permutation matrix, Γ, is already known, then the construction of $\Gamma_{DCI}$ via $\Gamma'_{DCI}$ of equation (27) is straight forward. However, in practice it will often be desirable to select the permutation $\pi_{CICM}[\bullet]$ to satisfy Constraint 6, so that it can be factored as $\Gamma_{DCI}=\pi_{CICM}[c]= \pi_{LSB,CICM}{}^{\pi i_{row}=\pi\{0,\ldots,K/M-1\}}[\pi_{MSB,CICM}[C]]$, where $\pi_{MSB,CICM}[\bullet]$ represents a single permutation over the integer ring $\{0, \ldots, K/M-1\}$ which is applied down each column of C, and $\pi_{LSB,CICM}{}^{\pi i_{row}=\pi\{0,\ldots,K/M-1\}}[\bullet]$ represents a set of K/M different permutations, each defined over the integer ring, $\{0, \ldots M-1\}$, and each respectively applied across row $\pi_{MSB,CICM}[i_{row}]$ of C. Using these notations, row and column indices, $(i_{row}, j_{col})$, of the matrix C are permuted to row and column indices, $(\pi_{MSB,CICM}[i_{row}], \pi_{LSB,CICM}{}^{\pi i_{row}}[j_{col}])$, of the matrix $\Gamma_{DCI}$. Constraint 6 ensures that any given row of elements in the matrix C maps to a row of the same elements, but in an intra-row-permuted ordering, in the matrix $\Gamma_{DCI}$. For example, Constraint 6 will require that the entire last row of the matrix 710 whose row index is $i_{row}=4$ will permute to row $\pi_{MSB,CICM}[i_{row}]$ in $\Gamma_{DCI}$ so that $[\pi(14),$ π(9), . . . π(39)] will all be on the same row, $\pi_{MSB,CICM}[i_{row}]$, but with an a scrambled ordering in accordance with an intra-row permutation, $\pi_{LSB,CICM}^{\pi i_{row}}[\bullet]$. An M×M interconnection network similar to 730 can be provided to perform each of the needed intra-row permutations, $\pi_{LSB,CICM}^{\pi i_{row}=\pi\{0,\ldots,K/M-1\}}[\bullet]$.

To understand how the memory 710 and related 2D memories used in the SISO decoder (1160, 1240) can be accessed in accordance with all of the C, U, and $\Gamma_{DCI}$ matrices, consider an example where the constrained interleaver, U=π[C] is a DCI with $\pi_{MSB}[\bullet]$ selected to correspond to the MSBs of a QPP interleaver as discussed above in connection examples discussed using FIGS. 7-12. In this example, assume that $\pi_{MSB,CICM}[\bullet]$ is also selected to correspond to the MSBs of a QPP interleaver, but one that uses different parameters, $f_1$ and $f_2$, as compared to the QPP interleaver used to implement $\pi_{MSB}[\bullet]$. During the first half of the SISO iteration, block 705 counts/increments the row index, $i_{row}$ in accordance with the QPP ordering of $\pi_{MSB}[\bullet]$. After the first half of the SISO iteration, the block 705 generates a sequence of row addresses, $i_{row}$ using a QPP address generator that implements the permutation rule, $\pi_{MSB,CICM}[\bullet]$. This allows the individual bits of $\Gamma_{DCI}$ to be accessed in the ordering shown in equation (27) and used to update a set of bit metrics as described in further detail below. As each row is accessed, M (e.g., M=8 way parallelism in FIGS. 7, and 11-12) bits from M different symbols, $\Gamma_j \epsilon Z^m$, will be accessed. The intra-row permutations, $\pi_{LSB,CICM}^{\pi i_{row}=\pi\{0,\ldots,K/M-1\}}[\bullet]$ will be implemented using the M×M interconnection network 730, 1250 to update the receive metrics 1210 which correspond to bit metrics that are updated as discussed in further detail below. During the second half of each SISO iteration, the block 705 acts as a sequential up/down counter that increments/decrements the row index, $i_{row}$.

As is known to those of ordinary skill in the art, M. Isaka et al., "On the iterative decoding of multilevel codes," IEEE JSAC, Vol. 19, No. 5, May 2001, pp. 935-943 ("the Isaka reference") teaches know known ways update a set of bit metrics when higher order constellations are in use. Using this as a starting point, an aspect of the present invention uses this concept to update a set of bit metrics after the soft decoding of the inner code. Similar to calculating the extrinsic information (LLR values) of the input bits of the inner code, the extrinsic information of the output bits of the inner code can also be found at the same time during the soft decoding of the inner code. Just like the calculation of the extrinsic information of the input bits, the extrinsic information of the output bits can again be calculated by considering the transitions that favor bit 0 and bit 1 separately for the output bit in consideration. Using these extrinsic LLR values of the output bits of the inner code which form the M-ary transmitted symbols, the probability of each of the M symbols during every interval can be calculated.

For example, consider the case where 8-PSK is used for transmission. For example, in such a system, during any interval, three output bits of the CTBC code, $v_1$, $v_2$ and $v_3$, are used to form a 8-PSK constellation point. Let, $Le_1$, $Le_2$ and $Le_3$ be the extrinsic information of these three bits found in the decoding of the inner code. In order to calculate the updated bit metric of $v_1$, identify a set of constellation points, $S_0$, that favor the event that $v_1=0$ and another set of constellation points, $S_1$, that favor the event that $v_1=1$. In this 8-PSK example, the sets, $S_0$ and $S_1$, will contain four constellation points each. Note that any $i^{th}$ extrinsic LLR value, denoted $Le_i$ can be expressed in terms of the probabilities as $Le_i=\ln\{\{P(v_i=0)\}/\{P(v_i=1)\}\}$. Hence, $P(v_i=0)$ and $P(v_i=1)$ can be expressed as, $$P(v_i=0)=e^{le_i}/(1+e^{le_i}) \text{ and } P(v_i=1)=1/(1+e^{le_i}). \quad (28)$$

Therefore, for every constellation point $s_j$ in $S_0$ and $S_1$, the probability contribution to constellation point $s_j$ can be found using the extrinsic information from the remaining bit positions 2 and 3 by multiplying the respective probabilities of the bit positions 2 and 3 obtained according to equation (28). Then the bit metric for $v_1$, $b(v_1)$, can be updated by following equation (27) of the Isaka reference as, $$b(v_1) = \ln\left[\left\{\sum_{s_j \in S_0} P(r|s_j)P(s_j)\right\} \bigg/ \left\{\sum_{s_j \in S_1} P(r|s_j)P(s_j)\right\}\right] \quad (29)$$

The same process can be continued to calculate the updated bit metric of the other two bit positions $v_2$ and $v_3$ as well. For example, to calculate $b(v_2)$ the sets $S_0$ and $S_1$ will be defined in accordance with bit $v_2$ instead of bit $v_1$. The value of $b(v_1)$ in the above equation can be approximately calculated by considering only the significant term in each summation which results in equation (18) of the Isaka reference as $$b(v_1) \approx \max_{s_j \in S_1}\{\ln(P(r|s_j))\} - \max_{s_j \in S_0}\{\ln(P(r|s_j))\} + \quad (30)$$
$$2(x_{21} - x_{20})Le(v_2) + 2(x_{31} - x_{30})Le(v_3)$$

where, $x_{20}$ and $x_{21}$ represent the second and third bits (in natural binary) of the constellation points $S_\alpha$ and $S_b$ chosen, in the in set $S_0$ and $S_1$ respectively in the maximization. Similarly, $x_{30}$ and $x_{31}$ represent the third bit positions of $S_\alpha$ and $S_b$ respectively.

Note that each $\Gamma_j \epsilon Z^m$ in equation (26) have different weights per element, e.g., 4E, 3.8478E, 3.4142E, 2E. As discussed above, it is important that certain specified elements of various low weight sequences listed in the relevant tables P(d) map to rows of Γ that correspond to the higher weights. Therefore, certain permutations $\pi_{MSB,CICM}[\bullet]$ will be favored over others. For example, if a particular permutation $\pi_{MSB,CICM}[\bullet]$, maps the bulk of the elements of the low weight sequences listed in the relevant tables P(d) to the higher weighted rows of Γ, this permutation will be favored over other candidate permutations. This criterion can be used to select a good candidate permutation, $\pi_{MSB,CICM}[\bullet]$, over other candidates. For example, if a QPP permutation is being used to implement $\pi_{MSB,CICM}[\bullet]$, a set of QPP parameters can be selected based on a measure of the permutation to permute the coded bits of the low weight error sequences to the higher weighted rows in $\Gamma_{DCI}$. Also, the permutation $\pi_{MSB,CICM}[\bullet]$ can be specially designed as a deterministic permutation rule that provides a good measure of the mapping of the coded bits of the low weight error sequences to the higher weighted rows in $\Gamma_{DCI}$.

It is also possible to define a modified permutation $\pi_{MSB,CICM}[\bullet]$ that is modified to perform local inter-row permutations, e.g., if m=3, $[i_{row}, i_{row}+1, i_{row}+2] \rightarrow [i_{row}+2, i_{row}, i_{row}+1]$. The local inter-row permutations can be used to find more favorable permutations to be applied to the columns in accordance with the weighting of the rows of $\Gamma_{DCI}$. Such permutations could be applied per m rows and per column. That is, different groups of m rows and different columns could be modified on an individual basis. All such modifications are contemplated; however it is realized that such embodiments involve more hardware complexity. In the discussion below, a simpler permutation rule design example is provided, but it is understood that such additional modifications can be made to improve the ability to find good permutations at the expense of additional real-time hardware requirements and complexity.

To understand how to design $\Gamma_{DCI}$, refer again to FIG. 18 and consider the action 1820. When a CICM-DCI is being designed, the action 1820 amounts to first applying $\pi_{MSB,CICM}[\bullet]$ to all columns of C, and then identifying row permutations $\pi_{LSB,CICM}{}^{\pi_{row}=\pi\{0,\ldots,K/M-1\}}[\bullet]$ that will accomplish the result of the swaps of FIG. 18, i.e., the row permutations are selected to attempt to meet the CICM interleaver constraints. In the event that the constraints cannot be met, a modified permutation $\pi_{MSB,CICM}[\bullet]$ as described above can optionally be used at the expense of additional hardware complexity to meet the CICM interleaver constraints. Otherwise a different $\pi_{MSB,CICM}[\bullet]$ can be selected and/or the parameters $d_{s,t}$ and $D_{min}{}^2$ can be lowered. Similar to the constrained interleaver design techniques of FIGS. 8 and 10, a key design concept is to select $\pi_{MSB,CICM}[\bullet]$ to be an easily implemented deterministic permutation such as a QPP interleaver, and to then use the row permutations $\pi_{LSB,CICM}{}^{\pi i_{row}=\pi\{0,\ldots,K/M-1\}}[\bullet]$ to ensure the interleaver constraints are enforced. The key difference is that in FIG. 18, the CICM interleaver constraints are used instead of the CI-3 or the CI-4 interleaver constraints. However, Constraint 6, the vectorization constraint is commonly enforced in order to generate a vectorizable DCI embodiment.

Once $\Gamma_{DCI}$ is designed and is available, the method, apparatus and systems of 700 and 1100 of FIGS. 7 and 11 can be used to perform SISO iterations with CICM bit metric updating. A SISO iteration begins as previously described in accordance with FIGS. 7 and 11. However, after the actions 1117 and 1126, a bit metrics update will be preferably performed. The bit metrics update is computed by having the address generator 705 increment according to $\pi_{MSB,CICM}[\bullet]$ so that the permutation-count $\pi_{MSB,CICM}[i_{row}]$ is produced as $i_{row}=0,\ldots,K/M-1$. Then $\pi_{LSB,CICM}{}^{\pi i_{row}=\pi\{0,\ldots,K/M-1\}}[\bullet]$ is applied to each $\pi_{MSB,CICM}[i_{row}]^{th}$ row. This way, the sequencing of actions 1117 and 1126 cause the individual $\Gamma_j \in Z^m$ vectors within $\Gamma_{DCI}$ to be produced. Note that the 2D memory array 710 is thus able to provide all of the u/v (inner code), c (outer code), and $\Gamma$ (CICM mapper's) sequencing in a fully parallel/vectorizable manner.

Hence it should be understood that an aspect of the present invention is a parallel, vectorizable DCI that is able to provide three or more different permutation sequences from the same memory, 710. The present invention contemplates that such structure and functionality can lead to improved joint coding and modulation/signal mapping systems with improved coding performance that is derived from improved Euclidian distance and/or symbol Hamming distance.

CICM with Unequal Error Protection Embodiments

Multimedia applications usually require unequal error protection for different types of information streams. For example, in systems where both data and Voice over IP (VoIP) packet streams are present, the data streams and the VoIP streams can have different required levels of error probability/error rates. Similarly, in live streaming video, the video stream and the audio stream can have different required levels of error probability/error rates. Multilevel codes are often used to provide unequal levels of error protection to different data streams by employing a more powerful code for the data stream(s) that require a higher levels of protection.

While the CICM mapping rule design algorithms described above were used to design mapping rules that had the same error probability for all message bits, CICM mapping rules can also be designed to provide different levels of error protection for different subsets of the message bits. For example, before being passed over a data link connection, a network layer or link layer interface unit can be used to examine a packet stream to be sent over the data link/physical channel. The bits in the packet stream may be categorized as packet header bits and according to packet payload type as indicated by the header bits. In a given example, header bits and TCP packet payloads could be assigned a first error protection level, while VoIP and audio payloads could be assigned a second error protection level and video payloads a third error protection level. In broadcasting applications, different error protection levels could be assigned for use with control bits, audio data stream bits, and video data stream bits.

To understand the how a CICM mapping rule can be designed to provide unequal levels of error protection, consider a specific example where an (8,4) block code is used to perform the coding and the coded bits of this (8,4) code are then constellation mapped onto a QPSK constellation using a reverse Gray code mapping. In this example, assume that each frame of N message bits can be divided into a first stream that has N/2 message bits and a second stream that also has N/2 message bits. The first stream is assumed to require a lower error probability (higher error protection), while the second stream requires lower level of error protection (allows a higher error probability) as compared to the first stream. In this example, K/2=N coded bits from the first stream and K/2 coded bits from the second stream are to be transmitted jointly in a frame of K coded bits using QPSK modulation while maintaining the lower error rate for the first stream. This can be accomplished by placing all of the K/2 coded bits of the first stream on row 1 of the CICM interleaver, $\Gamma$, and all of the K/2 coded bits of the second stream on row 2. In this example using the (8,4) Hamming code and the reverse Gray coded QPSK constellation, the minimum squared Euclidean distance of the first stream will be $D_{min,1}{}^2=4*8\alpha^2=32\alpha^2$, while the minimum squared Euclidean distance of the second stream will be $D_{min,2}{}^2=4*4\alpha^2=16\alpha^2$. Hence, instead of using two different codes as is performed in MLC systems, the CICM interleaver rule can be used to produce unequal error protection while using just a single block code applied separately to both of the bit streams associated with each of the reverse Gray coded bits of the QPSK constellation.

The above example can be extended to any constellation with any number of data streams. The codewords of the block code of any identified stream are permuted to a specified row of $\Gamma$ so as to meet a desired minimum squared Euclidean distance. For example, in the above case of two streams, if 16PSK or 16-QAM is used, then the first and second rows of the CICM interleaver matrix may be primarily used for the first stream that requires higher protection while the last two rows can be primarily used for the second stream.

While the previous used a single block code, this same basic approach can also be extended to applications where a convolutional code or a concatenated code, like a CTBC code, is used in lieu of the above-described (8,4) block code to supply the coded bits to be constellation mapped, e.g., to a reverse-Gray coded constellation, via CICM. In general, any of the above-mentioned codes or any other code whose P(d) tables can be identified can be used. In such situations, CICM is generally designed using a respective set of P(d) tables and by then ensuring that different low distance error sequences as listed in the P(d) tables end up achieving corresponding different desired MSEDs while also maintaining a corresponding symbol Hamming distance, $d_s$. The discussion below explains how this is achieved in the context of a CTBC code.

When the coding is performed in accordance with a CTBC code, and when it is desired to provide unequal error protection to different sub-streams of message bits, it is necessary to first identify a subset of codewords of the OBC to be used to encode the message bits from the different sub-streams. For any given sub-stream, there will be an associated set of OBC codewords that will correspond to the inputs of the IRCC that end up generating a corresponding subset of coded bits, $v_s$, of the entire sequence, v. Next consider the error sequences that involve any of the coded bit positions that correspond to elements of $v_s$. All low distance error sequences that need to be considered will be listed in the P(d) tables used to design the CICM interleaver, $\Gamma$. If all of the low distance error sequences involving coded bit positions from the subset $v_s$ can be ensured to have a specified higher Euclidean distance, then it is possible to maintain the specified higher level of protection for the message bits associated with the corresponding subset of codewords of the OBC that correspond to the coded bit positions of $v_s$.

Hence, when designing a CICM mapping rule, it is desirable to use rows of $\Gamma$ with a higher Euclidean distance for the coded bit positions involved in the error sequences that include any of the elements of $v_s$. Depending on the constellation and the desired number of streams, the low distance error sequences listed in the $P(d \geq d_t)$ tables can be used to form different groups of coded bits that will need respective unequal error protection levels.

In order to systematically select the sets of codewords of the OBC for different levels of error protection, let us consider the case where we have already constructed a $\Gamma$ for equal error protection. At this point the $P(d \geq d_t)$ table that lists all the coded sequences of v up to weight $d_f$ will have already been prepared. The sequences in the $P(d \geq d_t)$ table can then be used to calculate the actual Squared Euclidean Distance (SED) of each coded sequence in the table $P(d \geq d_t)$, each of which, by construction, must be at least as high as $D_{min}^2$. The goal is to next identify two sets of codewords, $CW_1$ which contains codewords that have a higher level of protection, i.e, of at least $D_{min,1}^2$, and $CW_2$ that contains the remaining codewords which have a lower level of protection, i.e, of at least $D_{min,2}^2$, where $D_{min,2}^2 < D_{min,1}^2$.

At this point some observations will be made that will help to develop algorithm to identify the sets $CW_1$ and $CW_2$ given a particular code and given a starting CICM permutation matrix, $\Gamma$, that was developed for equal error protection. The CICM permutation matrix, $\Gamma$, will then need to be modified/adjusted in a way that maintains the symbol Hamming distance at $d_s$ and achieves the targets $D_{min,1}^2$ and $D_{min,2}^2$ for the identified sets $CW_1$ and $CW_2$. In order determine how to identify the sets $CW_1$ and $CW_2$ and to modify $\Gamma$ to achieve these goals, the following observations are made:

Observation 1: Consider any codeword $c_j = (c_{j0}, c_{j1}, c_{jn-1})$ of the OBC that places its $t^{th}$ coded bit, $c_{jt}$, at the position of $i^{th}$ position of u at the input of the IRCC, i.e., $u(i) = c_{jt}$. Identify the corresponding v(i) (output of the IRCC) for the corresponding $u(i) = c_{jt}$. For this $c_{jt}$, identify each sequence $i_P$ listed on $P(d \geq d_t)$ that contains the corresponding position i. Note that the position i can be listed in multiple sequences contained in the tables $P(d \geq d_t)$. Next calculate the SED, denoted as $SED(i_P)$, for each identified sequence $i_P$ that contains position i. Using all the identified sequences $i_P$ that contain the position i, find the minimum of all the $SED(i_P)$ values. Denote the minimum $SED(i_P)$ value for position i which corresponds to $c_{jt}$ as $D^2(c_{jt})$. Continue this process for all of the bit positions in the codeword $c_j$ for $t = 0, \ldots, n-1$. Repeat the same process for all codewords $c_j$, $j = 0, \ldots, \rho-1$. At this point the squared Euclidean distance of each coded bit positions of each of the codewords $c_i$ will have been computed for all coded sequences in the tables $P(d \geq d_t)$. Next find the minimum of $D^2(c_{jt})$ among all $t = 0, \ldots, n-1$, for each of the codeword $c_j$ as $D^2(c_j) = Min_t\{D^2(c_{jt})\}$. This calculation implies that the current CICM permutation $\Gamma$ will cause each codeword $c_j$ to have a MSED of $D^2(c_j)$.

At this point, it may be possible to choose the group of codewords $c_j$ with higher $D^2(c_j)$ for the set $CW_1$ and the rest for $CW_2$, without making any changes to $\Gamma$. If this is not the case, modification/adjustments can be made to $\Gamma$ in order to increase the MSED separation between the sets $CW_1$ and $CW_2$.

Observation 2: As stated in observation 1, $D^2(c_{jt})$ is the minimum taken over all sequences on $P(d \geq d_t)$ that has position v(i), and $D^2(c_j)$ is the minimum of $D^2(c_{jt})$ over all t in each codeword position $c_j$. Hence, in order to increase $D^2(c_j)$, one needs to focus on the $c_{jt,min}$ that determined $D^2(c_j)$, i.e., $D^2(c_j) = D^2(c_{jt,min}(1))$. Note that $D^2(c_{jt,min}(1))$ will have been determined by one or few of the low weight coded sequences listed in $P(d \geq d_t)$. Further, if $D^2(c_{jt,min}(1))$ can be increased up to the next lowest $D^2(c_{jt})$ value among $t = 0, \ldots, n-1$, denoted by $D^2(c_{jt,min}(2))$, then $D^2(c_j)$ will have been increased up to $D^2(c_{jt,min}(2))$. In order to realize an increase in $D^2(c_j)$, it will be needed to judiciously swap some positions in $\Gamma$, preferably with the smallest number of swaps. If possible, one can attempt to increase each $D^2(c_j)$ value gradually in n steps up to $D^2(c_{jt,max})$ for all codewords in a set which would become $CW_1$, where $D^2(c_{jt,max})$ is the maximum $D^2(c_{jt})$ among all $t = 0, \ldots, n-1$. Each such increase will come about as a result of a modification/adjustment in $\Gamma$.

Observation 3: It was seen in observation 2 above that any $D^2(c_{jt})$ can be adjusted performing a sequence of swaps that cause the SED of selected corresponding coded sequences in $P(d \geq d_t)$ to be adjusted. Hence, next consider how to perform swaps to change the $SED(i_P)$ value corresponding to any low weight coded sequence $i_P$ listed in $P(d \geq d_t)$. Due to the assumed previous construction of $\Gamma$, all of the positions of $i_P$ will already have been placed into $\Gamma$. With respect to the previously discussed QPSK example, some of the positions of $i_P$ could have been placed on row 1 while the rest on row 2. Denote the portion of $i_P$ on row 1 by $i_{P-1}$ and the portion of $i_P$ on row 2 by $i_{P-2}$. Hence, $i_{P-1}$ represents the positions of $i_P$ that can be swapped to lower the corresponding $SED(i_P)$ value, while $i_{P-2}$ represents the positions of $i_P$ that can be swapped to increase the $SED(i_P)$ value. If either of the $i_{P-1}$ or $i_{P-2}$ sets are empty, then the corresponding coded sequence $i_P$ can only increase (if $i_{P-1}$ is empty) or decrease (if $i_{P-2}$ is empty) the $SED(i_P)$ value. Further, for every coded sequence in the tables $P(d \geq d_t)$, one can also determine the maximum possible SED that coded sequence can achieve, $SED_{max}(i_P)$, which will be realized if all of the positions in $i_{P-2}$ can be moved to row 1.

Observation 4: Based on observations 1-3 above, the MSED of any OBC codeword $c_j$ will be determined by the $D^2(c_{jt})$ values of one or a few of its coded bits $c_{jt}$. Further, each of the $D^2(c_{jt})$ values will be determined by the $SED(i_P)$ values associated with each coded sequence $i_P \in \{(i_P(c_{jt})\} = \{i_{P,cjt}(1), i_{P,cjt}(2), \ldots, i_{P,cjt}(kjt)\}$, where $k_{jt}$ is the total number of coded sequences that can influence $D^2(c_{jt})$. Hence, it is seen that the MSED of codeword $c_j$, $D^2(c_j)$ will be determined by the SED of a particular coded sequence, for example, $i_{P,cjt}(1)$. The value of $D^2(c_j)$ can be increased by swapping one or more positions of $i_{P,cjt-2}(1)$ with $i_{P,cjt-1}(1)$. This will have the effect of swapping positions of the coded sequence $i_{P,cjt}(1)$ that are currently placed on row 2 with positions not directly related to $i_P$ that are currently placed on row 1. Before making such a swap, a check can be made to determine whether the movement of the position currently in row 1 to row 2 will violate any prescribed conditions. Further, the highest SED that codeword $c_j$ can reach is $D_{max}^2(c_j)$, can also be found by assuming that the SED of the worst case coded sequences related to $c_j$ can be increased up to its maximum $D_{max}^2(c_j)$ by successfully moving all of the associated positions from row 2 to row 1. That is, for every coded sequence $i_P$ listed in $P(d \geq d_t)$, $SED(i_P)$ could be increased up to $SED_{max}(i_P)$, if all its positions on the second row can be successfully swapped.

Consider a set of $n_s$ sequences on $P(d \geq d_t)$, $i_{P,ns} = \{i_{P1}, i_{P2}, \ldots, i_{Pns}\}$ for which $SED_{max}(i_{Pi}) \geq D_{min,1}^2$ for $i=1,2,\ldots n_s$. Note that some of these coded sequences may have an $SED(i_{Pi})$ value that is above the threshold $D_{min,1}^2$, i.e. $SED(i_{Pi}) \geq D_{min,1}^2$. Because the CI will define a bidirectional permutation, $\pi$, between $c_{jt}$ and its corresponding position $i$ as per $v(i)$, a reverse permutation (inverse constrained interleaving operation, $\pi^{-1}$), i.e., $v(i) \to c_{jt}$, can be defined which is referred to as "de-permuting" herein. Using this de-permuting process, next find the corresponding coded bit positions, $c_{jt}$, of each and every position found in any of the low weight sequences in the set $i_{P,ns}$. After that de-permuting process, if all the coded bits of a set of $\rho_1$ codewords can be found whose $SED(i_{Pi})$ values all satisfy $SED(i_{Pi}) \geq D_{min}^2$, then those $\rho_1$ codewords can be used to form a set like $CW_1$ to maintain a MSED of $D_{min,1}^2$.

Therefore, to identify a set of $\rho_1$ codewords of the OBC for a level of protection determined by $D_{min,1}^2$, first find the $SED_{max}(i_P)$ values for every coded sequence $i_P$ listed in the tables $P(d \geq d_t)$. Next form the set of sequences $i_{P,ns}$ by considering the set of coded sequences $i_P$ for which $SED_{max}(i_P) \geq D_{min,1}^2$. Next de-permute all the positions of all sequences in $i_{P,ns}$. At this point, it is determined whether at least $\rho_1$ codeword positions satisfy $D^2(c_j) = Min_t \{D^2(c_{jt}) \geq D_{min,1}^2$. If not, this means no modifications/adjustments can be made to the current CICM permutation matrix $\Gamma$ in order to cause $\rho_1$ codewords to achieve a MSED of $D_{min,1}^2$. In addition, for all sequences in $ip_{ns}$, let $ch(ip)$ denote the number of positions of the sequence $i_{P-2}$ that need to be moved from the second row of $\Gamma$ up to the first row in order to enforce $SED(i_P) \geq D_{min,1}^2$. This parameter can be calculated as $ch(i_P) = (D_{min,1}^2 - SED(i_P))/4\alpha^2$, because moving each position from row 2 to row 1 increases the SED by $4\alpha^2$ (i.e., from $4\alpha^2$ to $8\alpha^2$).

Next consider methods 1-4 below that can be used to select the candidate subsets of codeword positions to be used to construct set $CW_1$ for unequal error protection. All of methods 1-4 below also be used to construct the set $CW_2$ instead of $CW_1$. In such cases, the methods 1-4 are modified by starting with the lowest SEDs instead of the highest SEDs. Depending on the code and the parameters, it is sometimes easier to construct $CW_2$ as opposed to $CW_1$. The methods are:

1. De-permute the positions of the coded sequences for which $SED(i_P) > D_{min,1}^2$. If at least $\rho_1$ codeword positions satisfy $D^2(c_j) = Min_t \{D^2(c_{jt}) \geq D_{min,n}^2$, identify these $\rho_1$ codeword positions and stop. No additional work is needed. The current design of $\Gamma$ for equal error protection can also be used for unequal error protection.

2. Identify the coded sequences $i_P$ with the highest $SED_{max}(i_P)$ values and de-permute all positions in these coded sequences. Then do the same for the sequence with the next highest $SED_{max}(i_P)$ values. Continue the process by de-permuting sequences one by one selecting the sequence with the highest $SED_{max}(i_P)$ value. Stop when $\rho_1$ such codeword positions of have been identified. At that point, $\rho_1$ codeword positions for the set $CW_1$ will have been identified. Also identify the highest possible $D_{min,1}^2$ value which will be equal to the last $SED_{max}(i_P)$ used to construct the set $CW_1$. This method can be used when the highest possible $D_{min,1}^2$ is required.

3. De-permute the positions of the coded sequences for which $SED(i_P) > D_{min,1}^2$. If no set of $\rho_1$ codeword positions satisfies the condition of method 1, de-permute one coded sequence at a time starting from the coded sequence with the lowest $ch(i_P)$ and moving to next coded sequence with the next lowest $ch(i_P)$. Continue this process until all coded bits of $\rho_1$ codeword positions are observed in the set of de-permuted coded bits. The purpose of this approach is to find the set $CW_1$ to lower the number of swaps needed.

4. De-permute the positions of the coded sequences for which $SED(i_P) > D_{min,1}^2$. If no set of $\rho_1$ codeword positions satisfies the condition of method 1, find the codeword position $c_j$ that satisfy $SED(i_P) > D_{min,l}^2$ and has the highest number of coded bit positions. Permute the remaining coded bits of that codeword on to $v$ (i.e. find the corresponding $v(i)$'s). Find the sequence $i_P$ that contains each $v(i)$ with the smallest $ch(i_P)$ value. De-permute all of the positions, $i$, in that $i_P$. Note that de-permuting of $i_P$ can fill in other coded bits of remaining codewords too. Continue the process until $\rho_1$ codewords have been filled. This approach tries to identify codeword positions $c_j$ that have most of their coded bit positions $c_{jt}$ that satisfy $SED(i_P) > D_{min,1}^2$.

Using a candidate set of codeword positions identified in one of the methods 2-4, next consider how to identify swaps that are used to modify/adjust $\Gamma$ so as cause at least $\rho_1$ codeword positions to satisfy $D^2(c_j) = Min_t \{D^2(c_{jt}) \geq D_{min,1}^2$. Note that when a position that is placed on the first row is moved down to the second row, all coded sequences $i_P$ that include the coded bit position being swapped will lower their SEDs by $4\alpha^2$ (from $8\alpha^2$ to $4\alpha^2$). Hence, to identify a position that can afford to tolerate that swap, look at all coded sequences in $P(d \geq d_t)$ that include the candidate position to be swapped and make sure that all such sequences can afford to lower their SED by $4\alpha^2$ and still maintain the required MSED values of $CW_1$ and $CW_2$ ($D_{min,1}^2$ and $D_{min,2}^2$ respectively). Therefore, to prepare a list of valid positions to swap:

1. Identify coded sequences in the tables $P(d \geq d_t)$ that can afford to lower their SED.

2. For each selected sequence, search through each position on the first row to determine whether all other sequences that contain that position and can afford to lower their SEDs also. If so, add that position to the list of valid positions to swap.

3. Repeat steps 1 and 2 for each position of each coded sequence that can afford to lower its SED.

However, it is also important to note that each coded sequence $i_P$ can only afford move up to a maximum number of positions from the first row to the second row of $\Gamma$. Based on the positions involved in the coded sequence, that coded sequence will need to maintain a SED of $D_{min,1}^2$ or $D_{min,2}^2$. This is because when positions of the sequence $i_P$ are de-permuted, if all of the positions in $i_P$ fall into $CW_2$, then $i_P$ needs to only maintain a $SED(i_P)$ of at least $D_{min,2}^2$. However, if even a single de-permuted position falls into $CW_1$, then $i_P$ needs to maintain a $SED(i_P)$ of at least $D_{min,1}^2$. Hence, if the current SED of the coded sequence is $SED(i_P)$ and the sequence is required to maintain a SED of $D_{min,1}^2$, then it can only afford to move $npos(i_P)=[SED(i_P)-D_{min,1}^2]/4\alpha^2$ positions from it. Once $CW_1$ and $CW_2$ are identified, it is possible to find all $npos(i_P)$ values for all coded sequences $i_P$ in $P(d \geq d_t)$. Note that if $npos(i_P)$ number of positions of a sequence $i_P$ are swapped, then more positions of that sequence cannot be swapped and all remaining positions of that sequence should be discarded from the list of valid positions. Also note that the valid list of positions to swap is formed by positions from sequences $i_P$ that de-permute to coded bit positions in $CW_1$ and/or $CW_2$ that have relatively high SED values. Further, when swapped with the positions from the list, it is seen that the $D^2(c_j)$ values that are lower will increase while those that are higher (which are likely to represent the list of valid positions) will start to decrease. Note that when $D_{min,1}^2$ is higher more swaps will likely be needed. That means a longer list of valid positions will be needed. The longer the list of valid positions is, the more likely that $D_{min,2}^2$ will need to be lowered so as to create more possibilities for positions to be moved from row 1 to row 2 in $CW_2$.

One other important point is that when $D_{min,1}^2$ is higher than the $D_{min}^2$ used to construct the initial Γ for equal protection (which is usually the case), $d_t$ will also need to be adjusted according to $D_{min,1}^2$. Each time $d_t$ is increased, this will cause more sequences to be added to $P(d \geq d_t)$. All added sequences need to be considered while Γ is modified/adjusted to accommodate unequal error protection. Hence, a method to design Γ for unequal error protection can be outlined as follows:

1. Select the potential sets $CW_1$ and $CW_2$ using any of the above methods 1-4.
2. Expand $P(d \geq d_t)$ as needed by adding more coded sequences to it to match $D_{min,1}^2$.
3. Prepare the list of valid positions for swapping as described above.
4. Start swapping positions. For each position selected to move from row 2 to row 1 find a partner from the list of valid positions for swapping. Note that whether the pair of positions come from different columns or from same column the symbol Hamming distance will not be affected from that swap. It is desirable to swap one pair at a time targeting increasing the MSED of the set $CW_1$ while trying to not lower the MSED of $CW_2$. When swapping is done one pair at a time, the swaps are preferably selected to cause the SEDs of all codewords in each set to be more similar to each other and closer to the MED of that set. The quality of Γ: Note that the design of Γ for both equal and unequal error protection is suboptimal in the sense that for example, we cannot claim that the designed Γ achieves the highest possible $D_{min}^2$ for equal error protection. Then how good is the designed Γ? After the above discussion, we can answer that question at least to some extent. If all codewords $SED(c_j)$ have very similar values close to $D_{min}^2$ it can be considered to be a good design. If not and $SED(c_j)$ values vary a lot the design likely has room for further improvement. That is it may be probable that the low $SED(c_j)$ values could be increased by lowering the high $SED(c_j)$ values. This can be done by swapping positions that of the already constructed Γ. That is, the codewords with lower $SED(c_j)$ values could be increased by using the same method described above by finding the list of swapping positions and then swapping positions. Hence, the unequal error protection design method described herein can be considered as a fine tuning process in the design of Γ. Interestingly any design of Γ to begin with can be used for the tuning up process. However, it is desirable to start with a Γ design that satisfies the symbol Hamming distance condition. Then the fine tuning process can be used to achieve a high $D_{min}^2$ value while simultaneously maintaining the symbol Hamming distance condition.

Similarly, in the unequal error protection applications, a good Γ design should maintain similar $SED(c_j)$ values all close to $D_{min,1}^2$ for the set $CW_1$ and similar $SED(c_j)$ values close to $D_{min,2}^2$ for all $c_j$ in $CW_2$. The above fine tuning process outlined for the design of two sets can be continued until similar SEDs in the two sets are reached.

It can be noted that other variations are possible. For example, if a constellation is being used that has four levels, it may be desirable to apply a strong code such as a CTBC code to only encode the first level or the first two levels, for example. Then weaker codes such as block codes could be used to encode the third and and/or fourth levels. By doing so, we can use both the codes and the design of Γ to generate a bigger separation between the levels of protection than by using the same code and using only Γ to provide different levels of protection.

In the previous discussion, we considered how to design Γ to provide unequal error protection using an already-designed constrained interleaver of a given CTBC code. It is also possible to design the constrained interleaver used in the CTBC code from the get go in order to make the design of the corresponding Γ simpler. For example, the constrained interleaver used in the CTBC code can be specifically designed using one or more additional constraints that causes each of the sequences listed in the $P(d \geq d_t)$ tables to have all of their positions de-permute to either $CW_1$ or $CW_2$, but not both. If the constrained interleaver of the CTBC code is constrained in this way, the Γ design for unequal error protection as described above becomes much simpler.

Hence, the unequal error protection constraints used in the CTBC code's constrained interleaver design will ensure that no low Hamming weight sequences in the listed on $P(d \geq d_t)$ tables are generated by combinations of codewords from $CW_1$ and $CW_2$ jointly. That is, combinations of codewords from only $CW_1$ and only $CW_2$ are allowed to generate the low weight sequences of v, but combinations from both $CW_1$ and $CW_2$ are not. With this additional constraint, the constrained interleaver will not allow any combination of codewords from $CW_1$ and $CW_2$ to generate sequences of v with weight less than $d_t$. This ensures that every sequence listed in the $P(d \geq d_t)$ tables will have all of their positions de-permute to either from only $CW_1$ or only $CW_2$.

One way to implement this additional interleaver constraint is to start by arbitrarily selecting $\rho_1$ codewords for $CW_1$. Then instead of placing one coded bit of every codeword (as described before in the CTBC code's constrained interleaver design), place all coded bits of the $\rho_1$ codewords in $CW_1$ into v to maintain the desired MHD $d_t$. This can be done by placing one coded bit at a time of the codewords in $CW_1$ into v as described above in connection with the CI-3 and CI-4 constrained interleaver design methods, for example. Next place coded bits of $CW_2$ into v in such as way as to maintain the desired MHD (of preferably $d_t$ or lower if necessary since the MHD of $CW_2$ will be lower than $d_t$). However, while placing coded bits of $CW_2$, ensure that any combination of codewords that involve codewords from $CW_1$ and $CW_2$ end up generating a high MHD (preferably at least $d_f$ calculated according to $D_{min,1}^2$. If necessary, allow only as few of sequences of v as possible with lower weights (lower than $d_f$) to involve from combinations of positions that de-permute into $CW_1$ and $CW_2$. In such cases where it was not possible to completely separate $CW_1$ and $CW_2$, most of the sequences on $P(d \geq d_t)$ will be from either only from $CW_1$ or only from $CW_2$ with only few from both $CW_1$ and $CW_2$. With such a $P(d \geq d_t)$ table, it becomes easier to design $\Gamma$ using the approach as explained above for unequal error protection. If it was possible to completely separate $CW_1$ and $CW_2$, then it becomes much easier to design $\Gamma$.

Alternatively, starting from any CTBC code's constrained interleaver, positions can be swapped on u (therefore on v also in the corresponding locations) to try to move towards a situation where the sequences on $P(d \geq d_t)$ are completely separated in accordance with $CW_1$ and $CW_2$ as described immediately above. That is, for each low weight sequence on $P(d \geq d_t)$, swaps are performed to move positions in u so that a given low weight sequence either becomes a high weight sequence or becomes a low weight sequence but whose positions come from only $CW_1$ or $CW_2$.

CTBC codes that use CICM with unequal protection can thus be designed by designing both the CTBC code's constrained interleaver ($u=\pi[c]$) and $\Gamma$ as discussed above. Also, using the same concepts, the CTBC code's constrained interleaver and the $\Gamma$ constrained interleaver can designed jointly. If the CTBC code's constrained interleaver cannot be designed to have all of the respective positions of each respective low weight sequence in the $P(d \geq d_t)$ tables to de-permute to completely separated sets $CW_1$ and $CW_2$, then the separation that could not be carried out in the CTBC code's constrained interleaver can be carried out during the design of the $\Gamma$ constrained interleaver. Similarly, if the $\Gamma$ design becomes difficult with not enough positions to swap, then the CTBC code's constrained interleaver can be adjusted to help the $\Gamma$ design. This way, the CTBC code's constrained interleaver and the $\Gamma$ constrained interleaver can be designed and adjusted jointly. Swaps or other design steps can be carried out in one constrained interleaver design algorithm until a limiting condition is encountered. Next at this time a joint design algorithm switches over to the other interleaver and performs adjustments there, until another limiting condition is encountered. Then the joint design algorithm switches back to the first constrained interleaver design algorithm, and so on, until all of the constraints of both the CTBC code's constrained interleaver and the $\Gamma$ constrained interleaver are jointly designed/adjusted to meet all of the interleaver constraints. Once the interleaver constraints are met, the symbol Hamming distance and the multiple MHD requirements of the unequal error protection coding scheme will be satisfied.

It should be noted that any of the embodiments that use unequal error protection as described above can be used in accordance with FIG. 19 and FIG. 20 and the discussion thereof. The modifications of enforcing additional constraints can be applied to FIG. 19 and FIG. 20 to provide alternative embodiments of transmitters, receivers/decoders, and contention-free deterministic constrained interleavers, $\Gamma_{DCI}$.

MIMO and Spatial Modulation

MIMO systems employs $n_t>1$ transmitting antennas at the transmitter and $n_r>1$ receiving antennas at the receiver. A fading or stationary channel can be described by an $n_r$ by $n_t$ channel matrix H. Any $j^{th}$ column of H represents the channels from the $j^{th}$ to transmitting antenna to each of the receiving antennas. The channel matrix H can be transformed to show that the channel can be represented in terms of $n_{min}=\min(n_t, n_r)$ number of independent data streams. MIMO modulation rules allow $n_{min}$ number of constellation points to be transmitted simultaneously on the MIMO channel. Since each such data steam is capable of carrying m number of bits per interval using a signal constellation with $M=2^m$ constellation points, the resulting MIMO system using the MIMO modulation rule is capable of transmitting $mn_{min}$ number of bits per interval. Hence, a MIMO system can transmit $mn_t$ bits per interval as long as $n_r \geq n_t$. Therefore, by increasing the number of antennas, it is possible to increase the throughput of the system by increasing the transmitted data rate of a MIMO system. The V-BLAST system developed by the Bell Labs is such a system that can increase the data rate. In V-BLAST, the transmitted signal during any interval is a combination of symbols, $s_1, s_2, \ldots, s_{nt}$, which can be represented using a vector $x=[s_1, s_2, \ldots, s_{nt}]$, where each $j=1,2, \ldots, n_t$ is an independent symbol selected for transmission from the set of symbols $\{s\}=(s_1, s_2, \ldots, s_M)$ used in the $M=2^m$-ary constellation. In matrix-vector notation, the received column vector y is formed by all received signals from all $n_r$ antennas at the receiver during a frame interval. Hence, in presence of a noise vector w, y can be expressed in matrix-vector notation as $$y=Hx+w \qquad (31)$$

where H corresponds to a MIMO channel matrix. Various forms of mathematical MIMO channel models are well known to those of skill in the art. For a more detailed discussion of the MIMO channel model, see G. R. Raleigh and J. M. Cioffi, "Spatio-temporal coding for wireless communication," IEEE TR Comm. Vol. 46, No. 3, March 1998, pp. 357-366 ("the Raleigh reference). In the Raleigh reference, the MIMO channel matrix is representative of a channel for sending an entire frame of information. This channel matrix type can be used to model a transmit and receive filter pairs that effectively exist among and between the different transmit and receive antenna channels. In such channel models, the vector y corresponds to an entire frame of data. The goal at the detector is to estimate $\hat{x}$ from y thereby estimating each transmitted symbol $s_j$ from antenna j. It is assumed that the channel state information (CSI) is available at the receiver, i.e., the receiver knows the channel matrix, H. Channel state information derived at the receiver used to estimate the channel matrix, H.

In V-BLAST channel coding is not applied across data streams. Instead, the data streams coming from each antenna can be viewed as being stacked up in time domain vertically, which is what the V stands for in V-BLAST. As a result, V-BLAST can suffer under slow flat fading as some of the data streams can be severely faded. In order to overcome this drawback of V-BLAST, D-BLAST (diagonal BLAST) has been proposed. In D-BLAST every coded block of a data stream is spread over all the antennas. D-BLAST also does not transmit from the beginning of each frame so that interference between coded blocks can be cancelled at the receiver more effectively. While not transmitting from certain antennas at the beginning of selected intervals lowers the throughput of D-BLAST compared with V-BLAST, it makes successive interference cancellation (SIC) in the receiver/decoder as discussed in further detail below, easier and more efficient.

Spatial modulation (SM) (also called SM-MIMO) is a technique that uses the spatial domain to transmit information. As opposed to V-BLAST which assumes all of the transmitting antennas are transmitting simultaneously, SM selects one antenna among $n_t$ available transmitting antennas for transmission during each symbol interval. SM uses $\log_2(n_t)$ number of bits from the data stream to select one antenna out of the $n_t$ antennas to transmit an m-bit symbol during each symbol interval. Therefore, SM is able to transmit a total of $[\log_2(n_t)+m]$ number of bits each symbol interval. That is, $\log_2(n_t)$ bits are transmitted in the spatial domain (antenna selection) while m bits are transmitted in the signal domain (symbol selection). Stated another way, SM transmits $\log_2(n_t)$ bits on the spatial constellation (which is the available set of antennas) while simultaneously transmitting m bits on the signal constellation (which is the available set of signaling points).

The SM receiver is capable of identifying, for each symbol interval, both the transmitting antenna and the transmitted symbol. This is accomplished by observing and processing the received signal array y over an entire coding frame of length K. The receiver is able to determine the transmitting antenna because each transmitting antenna, as viewed by the full set of $n_r$ receive antennas, has its own electronic signature that can be used to differentiate between antennas. The signature of a transmitting antenna as observed by the full set of $n_r$ receiving antennas comes from the transmitted signal and the fading or other channel effects from the channel matrix, H, between the transmitting antenna to each receiving antenna. One significant advantage of SM over regular MIMO is that it uses only one RF signal during any interval. As a result there is no interference between the different transmitting antennas in SM as in MIMO. This lack of inter-antenna interference and the lack of a need to compensate for it at the receiver is the reason that SM receivers are much simpler than MIMO receivers such as V-BLAST. SM thus trades off some spectral efficiency for a much simpler receiver design and much better energy efficiency in terms of battery life and the like once processing-related power consumption is taken into account. The SM receiver must detect which of the transmit antennas sent the symbol (estimation of a spatial constellation coordinate) and must detect the symbol that was transmitted from that antenna (estimation of one or more signal constellation coordinates). For example, the ML (maximum likelihood) detection of SM requires minimization of the squared Euclidean distance, i.e., $\min\|y-H\hat{x}\|^2$, over the set of antennas, $\{c\}=\{c_1,c_2,\ldots,c_{nt}\}$, and the set of symbols $\{s\}=\{s_1,s_2,\ldots,s_M\}$, where the $\hat{x}$ is the ML estimate of x in equation (31). Hence, ML detection of SM requires only $Mn_t$ number of Euclidean distance checks as opposed to the $M^{nt}$ needed in a full MIMO system, thereby greatly reducing receiver complexity.

Various types of the SM systems are known to those of skill in the art. For example, space shift keying (SSK), space time shift keying (STSK), and generalized spatial modulation (GSM) are all reported in the literature. In SSK, only one signal is transmitted making m=0. That is, the information in SSK is transmitted completely from the selection of the antenna. In STSK, the role of the selection of antenna is generalized to a role of selecting one of a pre-selected set of dispersion matrices that can have channel response effects that span multiple symbol intervals. When Q number of dispersion matrices are used, STSK can transmit $\log_2(Q)$ bits over the channel response duration of the dispersion matrices. In GSM, more than one antenna is selected for transmission during each symbol interval, thereby increasing number of bits that can be transmitted over the spatial domain. Hence, GSM can be viewed as a combination of SM and MIMO. If $n_m<n_t$ number of antennas out of all $n_t$ antennas are selected for transmission, GSM is capable of transmitting up to $$\log_2\left(\binom{n_1}{n_m}\right)$$

bits from the spatial constellation and $n_m*m$ bits from the signal constellation in any given interval. However, as in MIMO, the signals transmitted from the different antennas interfere in GSM, and hence GSM requires a more complex receiver as compared to pure SM where only one transmit antenna is active at a time.

Consider the case of SM where only one transmit antenna is active at any given time. Assume that CSI can be estimated at the receiver and made available to the receiver signal processor. Besides the ML detection, a simpler two step detection process is known that first detects the transmitted antenna in the spatial constellation and then detects the signal transmitted in the signal constellation. Similarly, the above receiver structures can be extended for soft detection. For example, in ML soft decoding, all the $(n_tM)$ Euclidean distances that correspond to different transmitted bit combinations, can be used to calculate the L values (i.e, the log likelihood values, where, for the $j^{th}$ bit, $L(b_j)=\log(\Pr(b_j=1)/\Pr(b_j=0)))$ of each bit. This is done as in Pyndiah's soft decoding of block codes. For soft decoding of any bit position $b_j$, $j=1,2,\ldots,(m+\log_2(n_t))$, we first identify the $n_tM/2$ distances (which can be called metrics) in favor $b_j=1$ and the others in favor of $b_j=0$. Using these two groups, we find the L value of $b_j$.

Performance analysis of the ML detection of SM as described in the literature identifies three components that limit ML performance. These components are: (a) $P_{signal}$; a probability of error component that depends on the signal domain which is similar to the contribution when transmitting from a single antenna, (b) $P_{spatial}$; a probability of error component that depends on the spatial domain, and (c) $P_{joint}$; a joint probability of error component that depends on both signal and spatial domains. The lower the values of $P_{signal}$, $P_{spatial}$, and $P_{joint}$, the lower the total probability of error and the higher the performance. This analysis suggests that the signal constellations that are used in normal communications may not be the best in SM. Instead, constellations where all the signal points have high relative amplitudes are preferred. The best such constellation is a PSK constellation where all signal points have the same amplitude. Intuitively, the above statement makes perfect sense because if it is necessary to identify which transmitted antenna transmitted the signal, it is desirable for that signal to have as high of an amplitude as possible. In absence of noise, the received signal from the transmitted antenna will be high while that from all the other antennas will be zero. In addition to $P_{spatial}$ and $P_{joint}$, it is also necessary to reduce $P_{signal}$. In order to reduce $P_{signal}$, it is necessary to maintain a high Euclidean distance of the signal constellation. Up until now, a star constellation was shown to perform the best in SM systems as compared to other known constellations. However, with CICM, the present invention identifies that a CICM encoded PSK constellation is able to provide higher performance than the star constellation.

CICM MIMO and CICM SM

Next consider designing a SM system that makes use of a CTBC code and maps the CTBC coded bits using a CICM mapping rule. The CICM interleaver rule, $\Gamma$, can be designed to maintain as high of a Euclidean distance and a symbol Hamming distance as is possible. Hence, the design of $\Gamma$ along with a reverse Gray coded constellation mapping onto symbols of the selected constellation ends up achieving as low of a value for $P_{signal}$ that is possible. That means the remaining aspects of the constellation should be selected by focusing on the other two contributions, $P_{spatial}$ and $P_{joint}$. However, because the CICM-mapped-PSK constellations are all constant-envelope constellations, CICM -mapped PSK constellations are also optimal in terms of $P_{spatial}$ and $P_{joint}$. As described above, CICM-mapped QPSK, 8-PSK, and 16-PSK have been developed herein, and a general approach was provided to derive higher order CICM-mapped PSK constellations, e.g., 32-PSK, 64-PSK, and the like.

As stated before, SM transmits bits both on the signal constellation and on the spatial constellation. Specifically, during every interval, m coded bits are transmitted on the signal constellation while $m_{spatial}=\log_2(n_t)$ bits are transmitted on the spatial constellation. Hence, when designing $\Gamma$ with CTBC codes for SM, it is first important to form groups of coded bits, each with $m_{total}=(m+m_{spatial})$ number of CTBC-encoded bits (or whatever other underlying code is being used to encode the bit stream). A group with $m_{total}$ number of bits are transmitted during every interval by feeding m number bits from it to the signal constellation and the remaining $m_{spatial}$ number of bits to the spatial constellation. The task of designing $\Gamma$ in SM is to (a) best form $K/m_{total}$ number of groups, each with $m_{total}$ number of bits, from the K coded bits coming out of the CTBC code, and (b) to identify which m bits in a group should be fed to the signal constellation and which bits should be fed to the spatial constellation.

When dealing with only the signal constellation, $\Gamma$ was designed to permute the coded bits onto symbols to maximize the symbol Hamming distance and the Euclidean distance on the signal constellation. Hence, when designing $\Gamma$ in SM, it is important to first get an idea about the symbol Hamming distance measure and the Euclidean distance measure on the spatial constellation. Symbol Hamming distance is straight forward as it is equal to the minimum number of symbol intervals that the positions of any given coded sequence listed on $P(d \geq d_t)$ map into.

However, the Euclidean distance measure on the spatial constellation is not all that straightforward. In SM, during each symbol interval, one selected antenna will effectively transmit a signal constellation point. In order to roughly estimate a Euclidean distance type measure for the spatial constellation, consider the squared distance separation between an antenna that transmits an energy E during a symbol interval and an antenna that stays idle is $D^2=E$. Hence, the energy E of a signal point can be used as an approximate measure of the squared Euclidean distance in the spatial domain. However, the actual impact of the selected Euclidean distance in the spatial domain is also dependent on the channel matrix H (to include the fading model in wireless systems). When CTBC codes or other codes are used with the CICM-PSK constellations and mappings discussed above, this PSK modulation will maintain the highest possible energy E for all possible transmitted symbols. The approximate Euclidean distance E on the spatial constellation is also comparable with that in the CICM-PSK signal constellations. For example, the QPSK constellation shown in FIG. 1 has minimum $D^2$ equal to $E=2\alpha^2$, even though the squared Euclidean distance between 00 and 01 (or 11 and 10) is 4E. Further, as explained earlier, the other higher-order PSK constellations shown in FIGS. 3 and 4 that were systematically constructed using the 4-ary PSK constellation in FIG. 1 have 4E as the highest distance associated with any one-bit change on the constellation and have 2E as the lowest distance associated with any one-bit change on the constellation. Hence, when CICM-PSK is used, the spatial domain squared Euclidean distance measure of $E=2\alpha^2$ is a reasonable approximation during the design of $\Gamma$. In other embodiments, other approximations may be alternatively used.

Because SM treats the $[m+\log_2(n_t)]$ bits transmitted during a symbol interval as mapping to a single SM symbol, the CICM mapping rule design algorithm discussed above can be directly applied to design of $\Gamma$ and to the design of the mapping policy. For example, assume that 16-PSK is to be used as the signal constellation using the reverse Gray coded mapping policy of FIG. 4. That is, in this example there are four bits assigned to the signal constellation portion of the SM constellation. Also assume in this simple example that there are four antennas, so that $\log_2(4)=2$ bits are used in the spatial dimension of this same SM constellation. Following the discussion of the CICM-16-PSK example above, one way to design $\Gamma$ for a SM-CICM using this 16-PSK signal constellation would be to form $\Gamma$ so that its rows had the following energies [4E, 3.8478E, 3.4142E, 2E, E, E], where the first four rows correspond to the signal constellation and the last two rows correspond to the spatial constellation. With $\Gamma$ formed in this way the CICM mapping rule design algorithm as generally depicted in FIG. 18 can be used to design $\Gamma$.

However, another variation is to split the design of $\Gamma$ into two parts, design of $\Gamma_1$ for the signal constellation and design of $\Gamma_2$ for the spatial constellation. $\Gamma_1$ can be designed as an array with m rows and $K/m_{total}$ columns while $\Gamma_2$ can be designed with $m_{spatial}$ rows and the same number of $K/m_{total}$ columns. The idea is to form groups of bits for transmission during each interval by combining columns of $\Gamma_1$ with columns of $\Gamma_2$. Every group is constructed by merging one column of $\Gamma_1$ with one column of $\Gamma_2$. Combining columns of $\Gamma_1$ and $\Gamma_2$ will merge $\Gamma_1$ and $\Gamma_2$ to form the final array $\Gamma$ with $m_{total}=m+m_{spatial}$ rows and $K/m_{total}$ columns for transmission. Designs of $\Gamma_1$ and $\Gamma_2$ are similar to the design of $\Gamma$ for a signal constellation previous discussed.

For example, if the signal constellation chosen is the 4-ary PSK constellation shown in FIG. 1, the first row of $\Gamma_1$ is preferred as it can contribute the highest squared Euclidean distance of 4E. However, since only part of the coded bits from the CTBC code can be placed in $\Gamma_1$, coded bits of many sequences listed on $P(d>d_t)$ can have their positions split into $\Gamma_1$ and $\Gamma_2$. Note that every position on every row of $\Gamma_2$ can roughly contribute to the squared Euclidean distance by an amount E, while the first and second rows of $\Gamma_1$ can contribute a squared Euclidean distance of [4E, 2E] respectively. Hence, by following the same design steps of $\Gamma$, we can handle any splitting of coded bits of a sequence into $\Gamma_1$ and $\Gamma_2$ to maintain the highest possible $d_s$ and $D_{min,n}^2$ values. In general $\Gamma_1$ can have different Euclidean distance contributions from different rows depending on the selected constellation and its bit assignments to symbols. When a PSK constellation is used, $\Gamma_2$ will usually have the same Euclidean distance contribution from all rows, subject to variations in the channel matrix, H. Hence, in terms of the Euclidean distance, when placing a sequence of P(d) in $\Gamma_1$ and/or $\Gamma_2$ with the larger 16-ary PSK example described above, the first preference should be given for the first row of $\Gamma_1$. Then the preference goes to the second row and then the third row of $\Gamma_1$, and the last row of $\Gamma_1$ and then any row of $\Gamma_2$. As before, the goal is to maintain the highest $d_{s,t}$ and the highest $D_{min}^2$ while designing $\Gamma_1$ and $\Gamma_2$.

The same steps described above and as shown in FIG. 18 can be used to construct $\Gamma_1$ and $\Gamma_2$. However, the construction of $\Gamma_1$ and $\Gamma_2$ separately does not complete the task of constructing $\Gamma$. It will also be required to merge $\Gamma_1$ and $\Gamma_2$ to form the final CICM interleaver matrix, $\Gamma$, while trying not to lower $d_{s,t}$ and/or $D_{min}$ during the merging. For example, if a sequence of $P(d \geq d_t)$ is placed on $d_{s,t1}$ columns of $\Gamma_1$ and $d_{s,t2}$ columns of $\Gamma_2$, the aim is to maintain a symbol Hamming distance of $(d_{s,t1}+d_{s,t2})$ for that sequence during transmission. This can happen only if none of the $d_{s,ti}$ columns occupied by a given sequence in $\Gamma_1$ are grouped with any of the $d_{s,t2}$ columns occupied by that sequence in $\Gamma_2$. Hence, when placing positions on $\Gamma_1$ and $\Gamma_2$, it is necessary to keep track of the columns of $\Gamma_2$ (or $\Gamma_1$) that should be avoided when merging with $\alpha$ of column of $\Gamma_1$ (or $\Gamma_2$). This can be done by monitoring the set of columns, $\Gamma_c(j)$, occupied by all sequences of $P(d \geq d_t)$ on $\Gamma_2$ (or $\Gamma_1$) that have a position placed in column j of $\Gamma_1$ (or $\Gamma_2$), j=1, 2, ..., $K/m_{total}$. Hence, when merging columns of $\Gamma_1$ with $\Gamma_2$, it is undesirable to merge column j of $\Gamma_1$ with any column of $\Gamma_2$ in $\Gamma_c(j)$. In terms of merging columns of $\Gamma_1$ and $\Gamma_2$, it is desirable to have the sets $\Gamma_c(j)$ as empty as possible thereby making it easier to find a column from $\Gamma_2$ to merge with each column of $\Gamma_1$. In other words, in terms of merging, it is desirable to place sequences of $P(d \geq d_t)$ mostly either in $\Gamma_1$ or in $\Gamma_2$ without splitting them too much. However, this needs to be done by maintaining the highest possible $d_{s,t}$ and $D_{min}^2$. Since the signal constellation offers a higher Euclidean distance, one good strategy is to try to place shorter sequences of $P(d \geq d_t)$ mostly in $\Gamma_1$ and longer sequences of $P(d \geq d_t)$ (which can have more Euclidean distance contributions) mostly in $\Gamma_2$. In light of merging of columns of $\Gamma_1$ and $r_2$, if necessary, we may choose to change the general steps of construction of $\Gamma$ described above. Specifically, in the general steps 2 and 3, the most popular positions were placed along the same columns of $\Gamma$. Even though it still makes sense to follow the same approach in the design of $\Gamma_1$ and $\Gamma_2$, this may create problems later in the merging stage. Hence, if the CICM mapping rule design algorithm as described above fails in the merging stage because proper combinations of columns from $\Gamma_1$ and $\Gamma_2$ cannot be found, it is first desirable to go back to the designs of $\Gamma_1$ and $\Gamma_2$ and relax that condition of forcing most popular positions to be placed into the same columns as possible until valid combinations of columns can be found in the merging stage. In failing, lower $d_{s,t}$ and/or $D_{min}^2$ and continue searching and performing roll-backs and swaps as necessary. Upon successful completion, the interleavers from $\Gamma_1$ and $\Gamma_2$ will have been merged in such a way as to form a final signal-spatial CICM interleaver rule $\Gamma$, that can be used along with the signal mapping policy and the antenna selection policy to transmit a symbol from the signal constellation via a selected one of the $n_t$ antennas.

CICM-MIMO-SM Multi-Antenna Embodiment

Referring now to FIG. 21, a transmitter, a channel and a receiver for CICM based MIMO spatial modulation (SM) communication is illustrated in block diagram form. The transmitter and receiver depicted in FIG. 21 can be embodied as a method, an apparatus, a device, or a system. A constellation and spatial mapper $\Gamma$ 2105 is provided to receive a bit stream with is presented to the block 2105 on the input arrow to the left. The bit stream can be a CTBC encoded bit stream, for example. As discussed earlier in connection with CICM, the input bit stream can be any coded bit stream for which a set of tables P(d), for d=$d_t$, $d_t+1$, ..., $d_f$ can be constructed. This would include block codes, convolutional codes, turbo product codes, and other codes like selected turbo codes and LDPC codes for which these tables can be constructed.

The output of the constellation and spatial mapper $\Gamma$ 2105 is typically sent to a set of radio frequency circuits which include modulator circuits, transmitter amplifiers, and $n_t$ different transmit antennas. These transmit antennas are represented as the triangles to the right side of the block 2105. In a typical SM-CICM embodiment only one transmit antenna is active at any given time. The input coded bit stream is separated into groups of $[m+\log_2(n_t)]$ bits, and during each symbol interval, m of those bits are used to select a signal constellation point and the remaining $\log_2(n_t)$ bits are used to select a transmit antenna. In the example of CICM-16-PSK and four transmit antennas, the matrix $\Gamma$ will have $[m+\log_2(n_t)]$ rows and $K/(m+\log_2(n_t))$ columns.

The ultimate output of the block 2105 is SM transmission signal that is sent out over the $n_t$ different antennas as a function of time and the input coded bit stream. This multi-antenna output is then processed via a channel matrix, H. The channel matrix H is actually a mathematical representation of a combination of transmit and receive signal processing in addition to a stationary or time-varying fading channel. All of these channel effects are termed the channel matrix, H, herein. In practice the channel matrix, H, is embodied as a physical multiple input-multiple output transmission channel. The output of the channel matrix, H, is coupled to a multi-antenna receiver front end 2115. The multi-antenna receiver front end 2115 is coupled to receive the output of the channel matrix, H. The multi-antenna receiver front end 2115 then performs front end receiver processing and baseband processing in order to provide a detection signal. In practice the detection signal is digitized on the I and Q channels and is then processed to form a set of bit metrics that are to be used in conjunction with a SISO decoder 2125.

The output, typically in the form of computed bit metrics, is passed via a CICM deinterleaver block 2120 to the SISO decoder 2125. As the SISO decoder 2125 performs SISO iterations, extrinsic information will be updated. When every SISO iteration- completes, new updated bit metrics will be needed. Hence the SISO decoder sends a subset of its extrinsic information via a CICM interleaver 2130 back to the multi-antenna receiver front end 2115 (a memory structure therein that holds information associated with the received digitized I/Q signal points derived from the multi-antenna receiver front end 2115). The updated bit metrics are derived using the information associated with the received signal points from the multi-antenna receiver front end 2115 and the available extrinsic information. The updated bit metrics are sent via the CICM interleaver 2120 back to the SISO decoder 2125. SISO iterations continue in this way until the coded bit stream has been decoded and the original information bits become available. The output of the SISO decoder is then coupled from the output arrow to the right of the SISO decoder block 2125.

It can be noted that the system 2100 has many key advantages. First of all, in embodiments that use CICM-PSK, the constellation is constant envelope and is able to accommodate multiple bits while maintaining a high MSED at the coded sequence or codeword level. Secondly, the constellation and spatial mapper $\Gamma$ 2105 will maintain as high of a symbol Hamming distance as is possible. Thirdly, because the PSK constellation is constant envelope, all signal points will have the same amplitude, and this will cause the performance of the spatial constellation aspects of the SM constellation to be maximized. If CTBC coding is used, the SISO decoder will reap all of the benefits discussed above in connection with CTBC encoding and decoding. Also, as in SM systems, because only one transmit antenna is active at any given time, the receiver complexity is greatly reduced relative to traditional MIMO systems.

It should be noted that aspects of the present invention can alternatively be used with MIMO modulation rules that are used to transmit a plurality of different constellation points through a plurality of different spatial channels simultaneously. For example, the system 2100 can be embodied to use GSM and MIMO systems such as V-BLAST, D-BLAST and the like. During each symbol interval, two up to $n_t$ number of CICM-mapped symbols (such as CICM-mapped 16-PSK) can be transmitted via $n_t$ number of separate antennas. In such systems, the class of CICM-PSK type constellations are considered to be optimal because all of the signal points have the same highest energy values.

In such systems, to maintain a system-wide symbol Hamming distance, the CICM mapping rule design algorithm can be designed to avoid allowing more than one antenna to transmit a bit from a given low weight sequence during a given symbol interval. In such cases, a single CICM permutation matrix, $\Gamma$, is designed with between two and $m*n_t$ number of columns, depending on the number of signal points that will be simultaneously transmitted in a single symbol interval. In full V-BLAST/D-BLAST type embodiments there will be $n_t$ number of columns that correspond to each Euclidian distance. The symbol Hamming distance can be computed as only be effective within each one of the separate $n_t$ different channels, or can be considered per symbol interval. In such embodiments, a single CICM permutation matrix, $\Gamma$, can be designed that has m rows and K/m columns as in the single-channel case. Now, however, a set of up to $n_t$ columns of $\Gamma$ will be mapped to separate antenna channels during each symbol interval.

For use in MIMO modulation embodiments of the system 2100 where more than one antenna transmitting at the same time, e.g., STSK, GSM, V-BLAST and D-BLAST systems, the SISO decoder/interference canceller 2125 is preferably implemented to detect the multiple symbols that were transmitted from different antennas at the same time. In such embodiments, the SISO decoder/interference canceller block 2125 can be configured to perform ML estimation or can be augmented to additionally perform interference cancellation type functions as described below.

The block 2125 can be configured to perform optimal maximum likelihood (ML) detection. ML detection detects all streams jointly by searching over all possible x vectors to determine the best estimate of x, $\hat{x}$, that minimizes $\|y-H\hat{x}\|^2$, which is equivalent to minimizing the Euclidean distance. Hence, the ML decision rule is to find the vector, $\hat{x}$, that solves $$\min\|y-H\hat{x}\|^2. \tag{32}$$

Since the above minimization requires checking $M^{n_t}$ Euclidean distances, even in the uncoded case, the complexity of ML detection increases rapidly as the number of antennas increases.

The block 2125 can be also be configured to function as a linear decorrelator detector. This technique detects streams individually. From equation (31) it can be seen that every element of y (signal received by any single received antenna) has contributions from every signal transmitted from every transmitted antenna. Hence, when detecting $s_j$ from antenna j, it is necessary to remove the interference on y caused by the signals transmitted from all other antennas. The removal of interference is done by decorrelation and the decorrelation can be done by using a transformation on y. Specifically, when detecting $s_j$, the decorrelator maps y on to a space that is orthogonal to $h_1, h_2, \ldots, h_{j-1}, h_{j+1}, \ldots, h_{n_t}$, to form a new signal y'. As a result, the mapped signal y' does not have any interference from signals transmitted from any antenna other than the desired signal transmitted from the $j^{th}$ antenna. The mapped signal y' is then passed through a matched filter to detect $s_j$. The combination of the mapper that maps y to y' and the following matched filter is the decorrelator. The decorrelator detector consists of a bank of $n_t$ decorrelators, with one for each antenna j, j=1,2, ..., $n_t$.

The block 2125 can also be configured to perform Successive Interference Cancellation (SIC) coupled with a decorrelator. In this method already decoded symbols are used to cancel out the interference caused by the already decoded symbols on a symbol that is currently being decoded. When decoding $s_1$ through $s_{n_t}$ in a predetermined order, decoding of $s_j$ can be assisted by removing the interference caused by $s_1$ through $s_{j-1}$ on y. This is done before the mapping of y to y' thereby making the mapping process easier.

The block 2125 can also be configured to act as a minimum mean squared error (MMSE) Receiver. The above described decorrelator performs well at high SNR when the interference is dominant, but it does not perform well at low SNR when the noise is dominant. Hence, in order to perform well at all SNR values, each decorrelator in the receiver can be replaced by a MMSE receiver. The MMSE receiver can be constructed as a transformation of y using the MIMO channel matrix, H. The block 2125 can also be configured to act as an MMSE receiver combined with SIC. This is very similar to the SIC described above, with the only difference that each decorrelator is replaced by a MMSE receiver discussed above. In addition, the block 2125 can also be configured to perform other MIMO detection algorithms such as sphere detection (SD). SD is a simplification of ML detection that limits the search to a sphere around the received vector y. Other techniques that could be implemented in the block 2115 include a developed matched filter (DMF) as is known in the art and signal vector based decoding (SVD) as is also know to those of skill in the art.

SIC plays an important role in the detection of the individual data streams associated with each component of the vectors x and y. However, it is known that SIC can introduce error propagation by passing incorrectly decoded symbols of different antennas for the detection of the signals on successive antennas. An aspect of the present invention is based on the observation that the type of error propagation that occurs in V-BLAST and D-BLAST in MIMO transmission systems is structurally similar to the error propagation that occurs in the multi-stage decoding (MSD) of multi-level codes (MLCs). U.S. Pat. No. 8,532,229. "Hard iterative decoder for multilevel codes" to E. M. Dowling and J. P. Fonseka ("the Dowling reference") describes a hard iterative decoding (IHID) technique that improves upon MSD decoding. U.S. Pat. No. 8,532,229 is incorporated by reference herein to provide the full details of how to implement the IHID algorithm in the MIMO receiver algorithms and system described below which can be implemented in the block 2125 of the system 2100.

An aspect of the present invention is to first follow the steps of SIC (such as an MMSE based approach that uses SIC as described above). Start by using the IHID algorithm decoding at least a subset of signals from antenna 1, and using the symbol decisions from antenna 1, remove/cancel the interference caused by the signal on antenna 1 while decoding the signal on antenna 2. Next use the IHID algorithm decode the signal on antenna 2 and using the symbol decisions from antennas 1 and 2 to remove/cancel the interference caused by antennas 1 and 2 while decoding the signal on antenna 3. This process can be continued until the signal on the last antenna $n_t$ is decoded by removing interference from previously decoded signals on antennas 1 through (i-1) while decoding of the signal on antenna i. In addition, as in IHID, once the normal SIC steps are complete, loop back to antenna 1 with all the currently known information about decoded signals and repeat the process. In the second pass through the loop, any or all of the $n_t$-1 decoded symbols from the previous pass through the loop can be used to remove interference from an antenna's signal stream that is currently being decoded. That is, in the IHID based SIC approach, hard decisions of the decoded symbols on a given antenna can be used to remove the interference caused by those symbols on the remaining antennas. If the transmitter staggered the transmission of the signals on the different antennas during a start up phase similar to D-BLAST, the earlier iterations can process fewer symbols than the later iterations. This IHID based interference cancellation and decoding algorithm is continued by repeating the SIC steps in an iterative manner. This process can be stopped as soon as no change is seen in the decoded sequences on all antennas.

Soft interference cancellation with SISO decoding works because after an initial number of SISO iterations, the correct decoded sequence will begin to emerge. At that point, using the received signal and the regenerated signal based on the currently decoded message, the interference and the level of interference can be estimated. This estimated interference can be used to cancel out the interference for the next iteration. In general, interference can come from other sources such as ISI, IQ imbalance, and polarization interference in optics. Also, soft interference cancellation can be used to estimate the carrier phase in a non-coherent system for use during joint soft decoding and carrier phase tracking. In soft interference cancellation with soft decoding, the interference and the level of interference are estimated and updated and used to perform interference cancellation for us in each SISO iteration.

For use when CTBC codes or other codes that are soft decoded, the present invention contemplates methods, apparatus and systems for soft interference cancellation to be used with soft iterative decoding. Consider an example where a CTBC code is constructed using either CI-3 or CI-4 and is then mapped on to symbols using a CICM interleaver rule, Γ. In this example, there will be K/m number of $2^m$-ary symbols ready for transmission. In accordance with CICM based MIMO transmission of the present invention, split these K/m symbols into K/(mn_t) segments of symbols and feed those segments one by one to each antenna. These segments can be formed by simply dividing the symbol sequence in an orderly manner starting from the first symbol. With this construction, there will be a set of data streams available, placed vertically one below the other in time, as in V-BLAST. These segments can then be simultaneously transmitted from the respective antennas. In effect all K bits of the CTBC coded frame are transmitted during K/(mn_t) intervals achieving the same data rate of V-BLAST. However, unlike V-BLAST and similar to D-BLAST, the above scheme has coding across different data streams.

In the decoding, bit metrics related to coded bits of the CTBC codes need to be extracted from the received vector y. This can be done by modifying the last step of any of the above receivers to extract soft information or by using any other known soft detection method described in the literature for MIMO applications. Next run the first SISO iteration on a frame of the CTBC code. At that point there will be the log likelihood ratio values (L values) of each coded bit. These L values indicate the best estimates of the bit values (1 or 0) of the CTBC coded sequence along with the reliabilities (which are the probabilities of these bit value decisions). Using the L values of these coded bits, next identify the corresponding decoded symbols 1 through K/m and the probability that the decision on each of those symbols is correct. At this point, based on the current information, the algorithm has identified each of the most likely symbols transmitted from each antenna and their probabilities. In any normal iterative decoding process that involves higher-order symbols (m>1) and has no interference, these probabilities can be used to better estimate the bit metrics from the received signal. However, in MIMO systems, since inter-antenna interference is present, the present invention introduces an additional step to be used to remove the interference in a soft manner. This is accomplished using the estimated probabilities of the symbols before updating the bit metrics. In the above IHID based SIC approach, hard decisions of the decoded symbols on a given antenna were used to remove the interference caused by those symbols on the remaining antennas. In soft decoding, the probabilities of the decisions of the decoded symbols is also available. Therefore, the interference caused by these soft decoded symbols can be removed/cancelled in a soft manner by using the estimated probabilities of the symbols.

Specifically, in soft interference cancellation, the interference from every symbol is first calculated as any of the SIC approaches described above, and is then multiplied by the probability of that symbol found from the L values to estimate the interference contribution from that symbol. If sm is the symbol having the highest L value, then L=log(P (symbol=sm)/(1-P(symbol=sm)), therefore P(symbol=sm) can be easily found from the L value. Next, after the soft interference cancellation operation, all interference contributions can be subtracted to update the bit metrics using the signal constellation. The updated bit metrics can then be used for the next iteration. Since the decisions made at the beginning of the iterations can be rather unreliable, the soft interference cancellation procedure can be started after a preselected initial number of iterations, $n_{Init}$. As the iterations proceed, they will typically converge to a solution and the reliability of most symbols will become high and the soft interference cancellation will be similar to the above described SIC solutions.

Joint soft interference cancellation and soft decoding initially performs one or more soft decoding iterations to initially estimate a set of interference parameters. In some embodiments, the initial interference estimate for use in a current frame of data can be based upon interference parameters estimates from the immediately preceding frame of data. Once the initial interference cancellation parameters are available, and from then forward, soft interference cancellation subtracts an estimate of the interference from the received signal to perform a current SISO iteration. The estimate of the interference will be based upon information the previous SISO iteration.

Consider an example that involves the transmission of CTBC signals using the QPSK constellation in FIG. 15. In this example, assume that there is a non-zero I/Q imbalance.

The received signal on the I and Q channels during any $k^{th}$ interval can be written as $$y_I(k)=\alpha_I*\alpha_I(k)+\beta_Q*\alpha_Q(k)+n_I(k) \quad (33a)$$

and $$y_Q(k)=\alpha_Q*\alpha_Q(k)+\beta_I*\alpha_I(k)+n_Q(k) \quad (33b)$$

for k=1,2...K/2, where, $(\alpha_I(k),\alpha_Q(k))=(\pm\alpha,\pm\alpha)$ represents the transmitted symbol, $\alpha_I$ and $\alpha_Q$ are interference parameters that account for amplitude distortion of the I and Q signal components (diagonal components of a 2×2 rotation/distortion matrix), $\beta_I$ and $B_Q$ are interference parameters that account for the interference from the I channel to the Q channel and from the Q channel to the I-channel respectively (off-diagonal components of the 2×2 rotation/distortion matrix), and $n_I(k)$ and $n_Q(k)$ are the I and Q channel noise components. Due to the 2×2 distortion matrix, even in absence of noise, the received signal, $(y_I(k)\ y_Q(k))$, will not necessarily match the transmitted sequence, $(\alpha_I(k),\alpha_Q(k))$.

Initially, the SISO iterations can start off by assuming that $\alpha_I=\alpha_Q=1$ and $\beta_1=\beta_Q=0$. After the decoded sequence starts to emerge, estimates for $\alpha_I(k)$ and $\alpha_Q(k)$, for all k become available. As the estimates for $\alpha_I(k)$ and $\alpha_Q(k)$ become more reliable, equations (3a) and (3b) can be used to estimate $\alpha$, and $\beta$. Upon estimating, $\alpha$ and $\beta$ values, the $y_I(k)$ and $y_Q(k)$ estimates can be modified to cancel out the I/Q imbalance and to thereby form still more reliable estimates for $(\alpha_I(k), \alpha_Q(k))$. These improved estimates can then be used to calculate the bit metrics for the next iteration. If desired, the $\alpha$, and $\beta$ values can be estimated every iteration or once every few iterations. Hence, in this example the joint soft interference cancellation and soft decoding forms initial estimates of the transmitted sequence using soft decoding, estimates the interference due to the I/Q imbalance, cancels the interference, and then continues to iteratively improve the reliability of both the interference estimates and SISO decoded bit stream until convergence.

In situations where the some or many decoded symbols have low probabilities, only the intervals that have higher probabilities of the decoded symbols can be made to contribute significantly to the estimates formed in equations (33a) and (33b). In some embodiments the $\alpha$ and $\beta$ parameters of the 2×2 distortion matrix of (33a) and (33b) preferably are calculated/updated based only upon subset of decoded symbols whose reliabilities are above some threshold or relative measure.

The algorithm described above to cancel I/Q imbalance distortion can be viewed as a hard interference cancellation approach because the hard decoded symbols $(\alpha_I(k), \alpha_Q(k))$ are used in equations (33a) and (33b). A soft interference cancellation approach can be obtained by replacing $\alpha_I(k)$ and $\alpha_Q(k)$ in equations (3a) and (3b) by $$a'_I(k) = \sum_{i=1}^{M} p(i,k)a_I(i) \text{ and } a'_Q(k) = \sum_{i=1}^{M} p(i,k)a_Q(i),$$

where p(i,k) represents the probability of symbol i during symbol interval k. This way, all M symbols are taken into account each symbol interval in accordance to their respective probabilities. However, as the SISO iterations converge to a solution, these summations will converge to the contribution from only the correct symbol. This use of soft decoded data estimates with their probabilities are used in many preferred embodiments.

Figure 22:
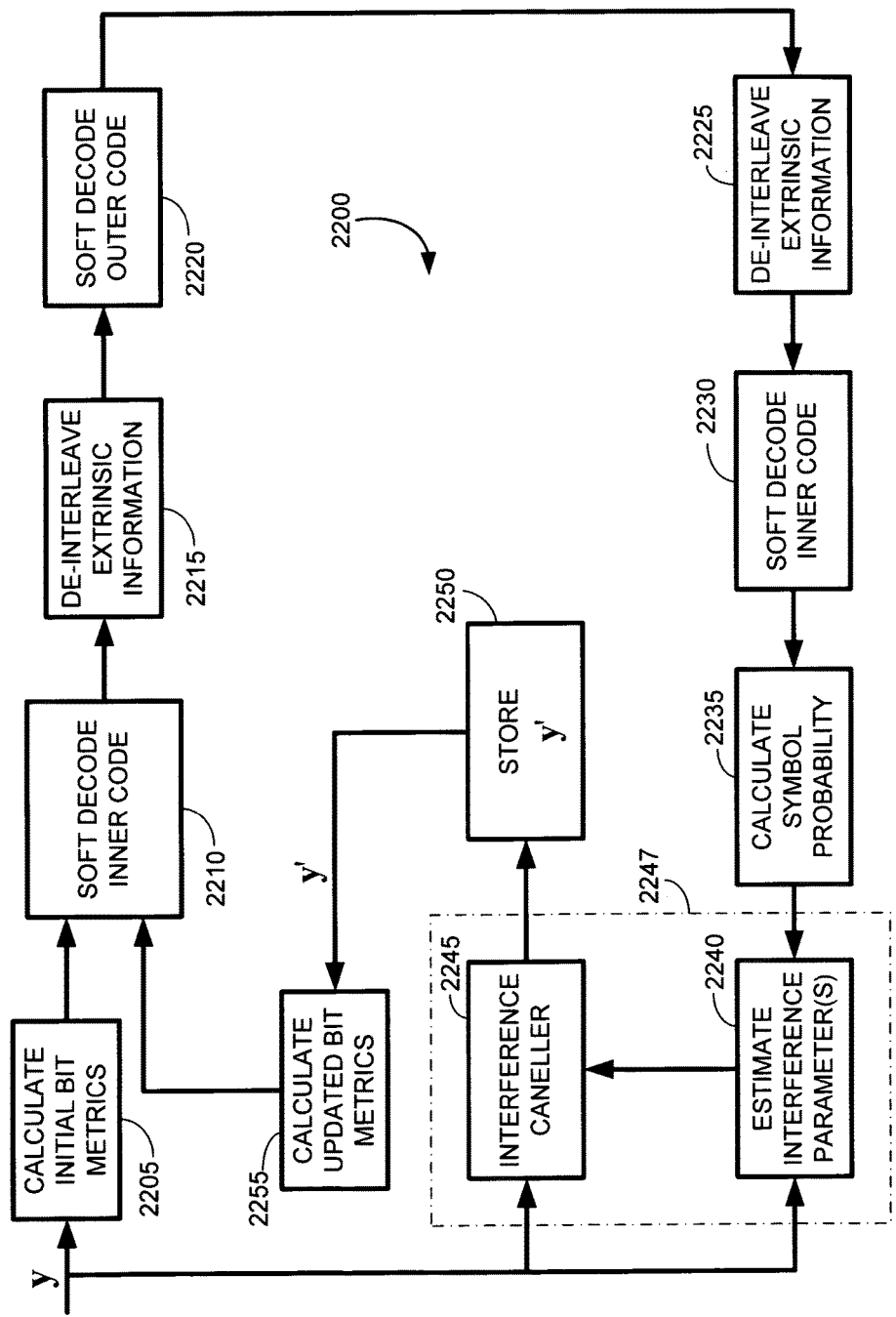
FIG. 22 is a block diagram of a soft iterative decoder that also performs soft interference cancellation.

Referring to FIG. 22, a joint interference cancellation and SISO decoding method, apparatus and system 2200 are illustrated in block diagram form. A sequence of received signal points y, is received from a channel and is used to calculate an initial set of bit metrics in the block 2205. One of more initial SISO iterations are carried out (e.g., in blocks 2210, 2215, 2220, 2225) as discussed in further detail below and the initial bit metrics can be updated each time one of these initial SISO iterations is completed. After to the one or more initial SISO iterations have been computed, joint SISO iterations with soft interference cancellation are allowed to begin.

During joint SISO iterations with soft interference cancellation, a block 2210 performs soft decoding using a modified set of bit metrics that have been updated in a block 2255. These modified bit metrics are then processed through a SISO half iteration involving the inner code in the block 2210. When CTBC codes are in use, the output of the block 2210 is then deinterleaved in accordance with a CI-2, CI-3 or CI-4 or any other constrained interleaver that implements a set of constraints as needed to support the underlying CTBC code. The de-interleaved sequence is then coupled to a block 2220 that performs soft decoding in accordance with the outer code. The soft decoded outputs of the block 2220 are then coupled to a block 2225 that performs de-interleaving and the deinterleaved sequence is fed to a block 2230 that performs soft decoding in accordance with the outer code, and which may be a software substantiation that shares some or all of the same hardware as the block 2210. The output of the inner decoded sequence is then passed to a block 2235 which symbol estimates along with their probabilities. The probabilities of all M symbols are calculated during each interval, and this calculation can be based on the likelihood (L) values of the coded bits generated during the SISO iterations.

Once the symbol estimates and their probabilities are known, hard type decisions $(\alpha_I(k),\alpha_Q(k))$ or soft type decisions $((\alpha_I'(k),\alpha_Q'(k))$ can be made similar to those discussed in connection with equations (33a) and (33b). In a block 2247 certain operations can be performed every iteration or every couple or few iterations, depending on the embodiment and signal conditions. In a block 2240 interference parameters are calculated. For example, depending on the embodiment, the interference parameters could be the components of a 2×2 rotation/distortion matrix as in the I/Q imbalance correction example of equation (3) or in polarized channels type embodiments where channel imperfections cause the horizontal and vertical polarized channels to have a degree of cross talk. Other examples include V-BLAST, D-BLAST, GSM and other MIMO communications systems where there is more than one active transmitter at any given time. In such embodiments, the interference parameters computed in the block 2240 will be used to cancel interference due to other simultaneously transmitted channels (off-diagonal terms in an $n_r \times n_r$ inter-channel distortion matrix) from a selected channel (on-diagonal terms in the $n_r \times n_r$ inter-channel distortion matrix.) If desired, only a subset of intervals that have higher probabilities for the decoded symbols can be used to estimate the interference parameters. Once the interference parameters are available, the block 2245 is used to compute a new interference-cancelled signal estimate vector, y'. The signal estimate vector, y' is then stored in memory in a block 2250. The sequence y' along with the estimated probabilities of the symbols is then used to compute a set of interference-cancelled bit metrics in the block 2255. The output of the block 2255 is then used in the next SISO iteration.

In many prior systems, interference cancellation is performed using interference cancellation parameters have been estimated during previous frames. However, the method 2200 estimates the parameters based upon information from the frame being currently decoded. Even if there are slow time variations in the parameters inside of the current frame, the method 2200 will be able to track those slowly time-varying interference cancellation parameters. Since the number of estimated parameters are typically low, the method/system 2200 can be modified for calculating interference cancelation parameters for a variety of different types of interference during that occurs in the same frame being soft decoded. For example, the approach 2200 can be used in partially coherent or non-coherent systems to jointly perform SISO decoding and carrier phase recovery.

In many embodiments, the estimates that were made in the previous frame can also be used to provide a set of starting parameters to be used in the beginning of the current frame. That is, information from blocks 2240 and/or 2245 from the previous frame can be provided to block 2205 to start off the iterations in the current frame, v, using a vector y' based upon the received signal information in the current frame and the interference cancellation parameters computed based on information from the previous frame.

A main benefit of the SISO decoder/soft interference cancellation is that the block 2125 of FIG. 21 can be implemented in an efficient manner. The SISO decoding used to decode the underlying code (e.g., such as a CTBC code that has been CICM-mapped for transmission using $n_t$ number of antennas that transmit in parallel) can be SISO decoded using a SISO decoder that is augmented with a soft interference canceller. The soft interference canceller makes use of the same bit metrics and likelihood values that are used by the SISO decoder. The soft information used in the SISO decoder is related to the separate information streams that have been transmitted via n, different antennas in the same symbol intervals. This soft information is also used by the soft interference canceller in the block 2125. The SISO decoder and the soft interference canceller to provide an integrated and seamless technique to converge to a MIMO solution using soft data.

The above soft interference cancellation approach 2200, the block 2125 can also be applied to other forms of soft interference cancellation that do not involve multi-antenna MIMO systems. For example, the soft interference cancelling approach of the present invention can be applied in systems where there are other forms of MIMO processing and multiple data streams. Consider a specific example where a single antenna transmits on both the horizontal and vertical polarization. In such a case the channel can introduce a rotation so that the horizontal and vertical polarization channels interfere with one another. In such an example, the same above described soft interference cancellation technique could be used to cancel the interference between the horizontal and vertical polarizations as an integral part of soft decoding with soft interference cancellation. The method/apparatus/system 2200 can be applied to many other kinds of codes beside CTBC codes. This would include other types of serially concatenated codes, parallel concatenated codes such as turbo codes, convolutional codes, block codes, or generally any kind of code that is soft decoded using a SISO decoder. Hence it is to be understood that the soft interference cancellation technique described above could be applied to a variety of different communications systems where there is more than one data stream being sent simultaneously, there is cross talk between channels, and the channels are encoded in such a way that a SISO decoder is located in a receiver that is designed to decode the plurality of received signals.

CICM Spatial Modulation OTN Embodiment

Referring now to FIG. 23, a transmitter, a channel and a receiver for CICM based optical spatial modulation (OSM) communication is illustrated in block diagram form. The transmitter and receiver depicted in FIG. 23 can be separately or jointly embodied as one or more methods, apparatus, devices, or systems. As is true generally with all block diagrams herein, in certain cases more than one blocks could be implemented on a single substrate or enclosure, and any one block could be implemented on more than one substrate or enclosure. A laser 2305 provides an optical carrier wave for optical communications. In many practical embodiments, where dense wavelength division multiplexing (DWDM) is used, the laser 2305 and the entire system 2300 would be repeated for every optical channel in the DWDM channel bank. Also, the entire system 2300 would be repeated for each of the horizontal and vertical polarizations in the fiber. For example, if the DWDM system had 80 channels, then the laser 2305 and the system 2300 would be repeated 160 times, once at each of the 80 wavelengths, and once for horizontal and vertical polarizations at each wavelength. From here forward, the system 2300 will be described at a single wavelength, and a single polarization, knowing that the following discussion of the system 2300 could be repeated at each wavelength and/or each polarization.

A constellation and spatial mapper $$\Gamma = \begin{bmatrix} \Gamma_1 \\ \Gamma_2 \end{bmatrix} 2310$$

is provided to receive an input bit stream which is presented to the block 2310 on the input arrow to the left. For example, the input bit stream can be a CTBC encoded bit stream. As discussed earlier in connection with CICM, the input bit stream can be any coded bit stream for which a set of tables P(d), for $d=d_i, d_i+1, \ldots, d_f$ can be constructed. This would include, in addition to CTBC codes, block codes, convolutional codes, turbo product codes, and other codes like selected turbo codes and LDPC codes for which these tables can be constructed.

The output of the laser 2305 couples to a first input of an optical modulator 2315. The optical modulator receives at a second input m bits representative of a signal constellation point input that tells the optical modulator how to modulate the laser input to produce a modulated laser output. The modulation is performed in accordance with the signal constellation point supplied as a column of the submatrix $\Gamma_1$ by the constellation and spatial mapper 2310. For example, when m=4, each column of the submatrix $\Gamma_1$ could identify a four coded bits that identify a 16-PSK signal point to which the four coded bits will be mapped in a given symbol interval. In this example a particular CTBC code is used to encoded the bit stream input to the block 2310, and then encoded bit stream is mapped to a sequence of constellation points using a CICM-16-PSK mapping as previously described.

The modulated laser output of the optical modulator 2315 is coupled to a single input multiple output (SIMO) active optical filter bank/combiner 2320. The SIMO active optical filter bank/combiner 2320 receives a spatial constellation point input that tells the SIMO active optical filter bank how to configure its SIMO transfer function so that the single input containing the output of the optical modulator 2315 is coupled through one of $n_t$ internal optical signature filters that exist inside the SIMO active optical filter bank. The outputs of the different $n_t$ internal optical signature filters within the SIMO active optical filter bank is sent to a combiner. The combiner can be implemented using known optical technology to include merging optical paths in an optical integrated circuit or fiber couplers that have multiple optical input fibers which are length matched and combined to form a single output.

The selection of which one of the $n_t$ optical signature filters through which the modulated laser signal is coupled is performed in accordance with the $\log_2(n_t)$ bits that correspond to a spatial constellation point supplied as a column of the submatrix $\Gamma_2$. For example, if there are sixteen possible optical signature filters inside of the SIMO active optical filter bank, then $n_t=16$ and the submatrix $\Gamma_2$, will have $\log_2(n_t)=4$ bits per column. Therefore, in each symbol interval, m=4 bits will be coupled from a selected column of the submatrix $\Gamma_1$ to the optical modulator to identify a 16-PSK signal point, and $\log_2(n_t)=4$ bits will be mapped from the same column of $\Gamma_2$ to identify the selected one of the $n_t=4$ optical signature filters through which the modulated laser signal will be coupled during that same symbol interval. Note in this example where sixteen selectable optical signature filters exist within the SIMO active optical filter bank, that the line rate is doubled over what is sent by the CICM-16-PSK portion, because in addition to the four bits sent each symbol interval to select a 16-PSK constellation point, four more bits are sent each symbol interval to select a spatial constellation point (i.e., to select an optical signature filter through which to couple the 16-PSK modulated laser signal). The output of the SIMO active optical filter bank/combiner 2320 is output to an optical channel. The optical channel is typically implemented as a fiber optic communication channel, although free space laser communication channels could also be used.

To better understand the structure and function of the SIMO active optical filter bank/combiner 2320, let the output of the optical modulator 2315 be denoted as s(t), let the vector $x=e_i$ be a standard unit basis vector of all zeros except for a "1" in the $i^{th}$ component, and let $H_t$ be a MIMO channel sub-matrix associated with a single symbol interval, then the output of the SIMO active optical filter bank, $y_t(t) \in C^{n_i}$ can be written as, $$y_t(t)=H_t x s(t). \quad (34)$$

The combiner effectively creates a single output signal $s_t(t)$ to couple to and through the optical channel. The signal $s_t(t)$ is created by summing all of the elements of the vector signal $y_t(t)$ at each point in time. Because the vector x is equal to a standard unit basis vector, $e_i$, where the subscript, i, corresponds to a currently selected one of the possible $\log_2(n_t)$ spatial constellation indices, the output of the combiner will be equal to the signal s(t) convolved through the $i^{th}$ optical signature filter transfer function. In this model, it can be noted that the $H_t$ sub-matrix can be described as a matrix whose elements correspond to filter transfer functions. These transfer functions are optical transfer functions and are applied during each symbol interval. As the constellation and signal mapper 2310 outputs each new pair of signal and spatial constellation points, a new coherently modulated laser signal s(t) is generated, and the spatial constellation point is mapped to a selected index, i, for the corresponding symbol interval, and the output of the SIMO active optical filter bank/combiner 2320 corresponds to the $i^{th}$ optical-signature-filtered and modulated laser signal, $s_t(t)$.

Each of the active optical signature filters can be implemented in accordance with known technology, such as by using optical integrated circuit technology or fiber gratings and the like. For further details of the technology used to design and implement active optical filters, see U.S. Pat. No. 6,687,461: "Active optical lattice filters," D. L. MacFarlane and E. M. Dowling, and U.S. Pat. No. 7,042,657: "Filter for selectively processing optical and other signals," D. L. MacFarlane both of which are incorporated by reference herein. In addition to the active components, which can include semiconductor optical amplifier regions (SOARs), the active optical signature filters can be designed to include passive optical filter sections. To see a number of optical filter architectures that are known to those of skill in the art and can be used inside the SIMO active optical filter bank, also see C. K. Madsen and J. H. Zhao "Optical filter design and analysis: a signal processing approach," Wiley, 1999 ("the Madsen reference").

The SIMO active optical filter bank/combiner 2320 will include a set of active components which can include voltage controlled reflection coefficients and voltage-controlled SOARs, for example. These active components can be used to alter the transfer functions of the optical signature filters inside of the SIMO active optical filter bank. For example, at the line rate, and in response to the $\log_2(n_t)$ bits that correspond to a spatial constellation point supplied as a column of the submatrix $\Gamma_2$, the active components can be used to cause the optically modulated laser signal from the block 2315 to be coupled through a selected one of the optical signature filters that are otherwise implemented using passive optical components. In other embodiments, the active components in the SIMO active optical filter bank can be used to alter the transfer function of an active optical filter to select one or more transfer functions of one or more corresponding optical signature filters. In other embodiments, the gains of certain particular SOARs could be used to select a sub-bank in the filter bank, and then inside that sub-bank, a single active optical filter could be responsive to one or more sub-components the spatial constellation point to select from a plurality of pre-designated optical signature filter transfer functions that can be realized by the single active optical filter to realize a subset of transfer functions associated with the sub-bank. As discussed in the Madsen reference, optical filters can be designed using multi-stage moving average (MA), multi-stage auto-regressive (AR) and multi-stage auto-regressive moving average (ARMA) based architectures. MA filters are also known as FIR (finite impulse response) filters, AR filters are also known as all pole IIR (infinite impulse response filters, and ARMA filters are also known as IIR filters with arbitrary poles and zeros. Therefore, any of the $n_t$ different optical signature filters in the SIMO active optical filter bank/combiner 2320 can be implemented as any of these filter types. Other filter types are known such as ring resonators and multi-port couplers, 2D lattice filters, N×M 2D-Lattice filters, higher dimensional lattice filters, 2D active lattice filters, and such architectures could also be used to construct the entire SIMO active optical filter bank/combiner 2320, or sub-portions thereof.

Each optical signature filter used within the SIMO active optical filter bank/combiner 2320 can be designed to form a portion of the information contained in the channel matrix, H. It can be desirable to design the optical signature filters to be an orthogonal basis set. For example, the filter bank may preferably constructed using discrete-time optical FIR filters that are preferably implemented using a multistage MA architecture as described in the Madsen reference. In such an example, if the filter coefficients of the FIR filters form a set of orthogonal basis vectors, then the optical signature filters correspond to a set of orthogonal filters. However, as discussed below, the total channel matrix, H, can include additional filters at the receiver, potentially matched to those in the transmitter, in which case, the combination of the transmit and receive filter banks may be designed to be an orthogonal basis set. Also, for example, if space time shift keying (STSK) is being used in the system 2300, then the optical signature filters used within the SIMO active optical filter bank/combiner 2325 could implement a portion of the dispersion matrix associated with each optical signature filter in the filter bank 2320. Likewise, instead of having the signature filters within the discrete-time optical filter bank implement an orthonormal basis set, it is possible to use different types of optical filters such as an all-pole optical lattice filters as described in chapter 5 of the Madsen reference. Such filters are easy to implement and could be used to provide a significant amount of signal separation as opposed to orthonormality. This type of design could lead to more compact and efficient optical signature filter banks at the expense of the SISO decoder or other related signal processing hardware to have to work harder. That is, it is not required to implement an orthonormal basis set of filters, nor an approximation thereto. All that is really needed is to ensure that the filters are selected so that the overall channel matrix H is invertible, full rank, or has enough rank so that the SM-modulated or MIMO-modulated signals can be suitably recovered/reconstructed after passing through the channel H. The transmit and receive filters will influence H as will any noise and distortion effects of the optical channel itself.

The output of the optical communication channel is coupled to a receiver subsystem whose front end comprises a single input multiple output (SIMO) active optical receive filter bank 2330. The SIMO active optical receive filter bank 2330 includes internal active optical components that effectively splits the received signal into $n_r$ different receiver channels. In preferred embodiments of the system 2300, at this time, it is deemed desirable to set $n_r=n_t$. For example, if the SIMO active optical receive filter bank 2330 includes $n_r=n_t=16$ internal receive filters, then a single input, multiple output SOAR can be designed to distribute the single input from the optical channel to the inputs of a set of $n_r$ optical receive filters arranged into a parallel filter bank. While an architecture involving a SIMO SOAR that distributes the optical receive signal from the optical channel to $n_r$ different optical receive filters arranged in parallel can be desirable, other optical filter architectures could alternatively be used. For example 2D active optical lattice filters, N×M 2D active optical lattice filters, higher dimensional active optical lattice filters, or other architectures such as SIMO optical ring resonators and the like could be used to implement the voltage-controlled SIMO transfer function of the SIMO active optical receive filter bank 2330. The SIMO transfer function can also be viewed as a set of transfer functions in parallel from the single input to the multiple outputs.

It should be noted that the combination of the SIMO active optical filter bank/combiner 2320 and the SIMO active optical receive filter bank 2330 collectively provide an optical computing structure/architecture to emulate/perform the mathematical operation of the channel matrix, H. The system 2300 is able to implement the equivalent of a MIMO system, but makes use of the fact that a form of spatial modulation is used where a non-zero modulated signal is only applied to one of the active optical signature filters in the SIMO active optical filter bank/combiner 2320 at a time. As a symbol passes through filter number i in the optical filter bank 2320, the filters will be designed so that as much energy as possible of this symbol will pass through filter i in the receive filter bank 2330, while as much energy as possible is blocked from passing through the other filters, $j \neq i$. The optical signature channel number corresponding to the receive filter that has the highest energy generally corresponds to the spatial constellation point's coordinate.

In preferred embodiments, the SIMO active optical filter bank/combiner 2320 and the SIMO active optical receive filter bank 2330 act as a set of matched filters that are maximally orthogonal. That is, if the laser modulated signal s(t) is coupled to channel i of the SIMO active optical signature filter bank 2325, then the optical receive filter i of the SIMO active optical receive filter bank 2330 will be matched to provide at its output as much of the signal s(t) as is possible. Also, the rest of the optical receive filters in the active optical receive filter bank 2330 will be designed to provide at their output as little of the signal s(t) as is possible. This can be achieved, for example, by designing the cascade of each pair optical signature filter/optical receive filter i to be (as close as possible) to an orthogonal basis vector relative to all the other filter channels, $j \neq i$. For systems like STSK, where dispersion matrices are used, the filters in the signature and receive filter banks can be designed in accordance with a desirable and selected set of fixed dispersion matrices, for example.

The output of the SIMO active optical receive filter bank 2330 is coupled to a coherent detector and processor/memory interface 2335. The coherent detector and processor/memory interface 2335 uses a set of $n_r$ coherent detectors to convert the $n_r$ different (multiple) outputs from the SIMO active optical receive filter bank 2330 from optical signals to electrical signals. The $n_r$ coherent detectors are sampled at a sample instant and converted into $n_r$ different respective digital signals, each with real and imaginary components (complex numbers) corresponding to the I and Q components. The set of $n_r$ received complex-number signal points are then stored in a memory. The memory is preferably arranged in an ordering related to the ordering of the signal points as observed at the receiver front end where the signal points are sampled. This memory preferably is double buffered and keeps track of all of the information related to the received signal that was received in each symbol interval of a coding frame from each of the spatial channels (outputs of each of the optical receive filters in the SIMO active optical receive filter bank 2330). While one memory is being processed by a SISO decoder 2240, another memory is being loaded from new information received from the optical channel. The information that is stored in the memory associated with the block 2335 will be used to compute an initial set of bit metrics to be used in the SISO decoder 2340 that is operably coupled to the memory. The information stored in the processor/memory interface portion of the block 2335 is processed via a CICM deinterleaver 2350 and used to compute the initial set of bit metrics used by the SISO decoder 2340. Each time the SISO decoder 2340 executes a SISO decoding iteration, the updated extrinsic information is processed via a CICM interleaver 2345 and used to compute updated bit metrics. The updated bit metrics are then passed through the CICM deinterleaver 2350 for use in the next SISO iteration. The SISO decoder is allowed to compute SISO iterations until a convergence criterion or stopping condition is met. The output of the SISO is a decoded frame of information bits which exits the SISO decoder on the output arrow to the right to the right of the SISO decoder block 2340. In a preferred embodiment the SISO decoder is designed to decode a CTBC code. As discussed above, the CICM approach can also be used with other types of codes such as block codes, convolutional code, turbo product codes, and depending on the actual/particular selected code, certain turbo codes and LDPC codes where the P(d) table can be determined.

In some alternative embodiments the constellation and spatial mapper 2310 can be implemented using other spatial modulation techniques instead of CICM. In non -CICM SM embodiments of the system 2300, the P(d), for d=$d_t$, $d_t$+1, . . . , $d_f$ tables do not need to be determinable. For example, if the bit stream is encoded using an LDPC code for which these tables cannot be determined, possibly concatenated with large block codes or the like as is used sometimes in OTN, or if for any other reason CICM is not desired to be used in a given embodiment, then block 2310 would perform any selected SM algorithm other than CICM-SM to constellation map and spatially map the coded input bits coming into the left of block 2310 onto a sequence of constellation/spatial constellation points. That is, the system 2300 is general enough to be used with CICM or any other SM identified technique. Key novel features beyond SRCI CTBC codes and CICM include the use of the 2320 and 2330 and other blocks in the system 2300 that allow the optical signal that traverses the optical channel to be processed as a SM type signal similar to the way shown in FIG. 23.

That is, an aspect of the present invention as relates to the use of an optical filter bank 2320 to transform an optical-modulated laser signal (output of block 2315) to an SM-multichannel signal. The SM-multichannel signal can be viewed as a collection of $n_t$ number of optical filter bank channel outputs of optical filter bank inside block 2320. The optical filter bank preferably includes a collection of discrete-time optical filters arranged in parallel and the implementation is preferably using multistage architectures as are known to those of skill in the art via the Madsen reference and the numerous citations to related work provided therein. The optical filter bank inside block 2320 uses the same structure as shown in blocks 2105, 2110, but instead of the SM-multichannel signal exiting from multiple antennas and passing through transmit portion, $H_t$, of the channel matrix H, the optical SM-multichannel signal is the multichannel output of the optical filter bank ($H_t$) inside block 2320. The block 2320 also includes a combiner that is coupled to receive the SM-multichannel signal and combine the $n_t$ number of multichannel component signals to form a single modulated laser signal. The combining operation is equal to or similar to a summation operation and is preferably carried out/implemented/embodied using one or more optical combiners. The output of the block 2320, i.e., the single modulated laser signal is then transmitted onto the optical channel. At a receiver, 2330 2335, 2340, 2345, 2350, a noisy and optical-channel -distorted version of the single modulated laser signal is then received from optical channel. At the receiver, the SIMO optical filter bank 2330 or a variation thereof is used to decompose the single modulated laser signal into a plurality of multichannel component signals. This plurality of multichannel component signals can be viewed as a reconstruction of an estimated version of the SM-multichannel signal. While the preferred embodiment uses a multichannel SISO decoder 2340, 2345, 2345 to decode the estimated version of the SM-multichannel signal, other types of decoders can alternatively be used with the present invention. Other types of decoders would include hard iterative decoders, or any other type of decoder used to decode any kind of code, such as an LDPC decoder, possibly in operation with block code decoders, or turbo product decoders as are commonly used in OTN applications, or the like. Even simple channel decoders such as a multichannel equalizer followed by a conventional slicer/decision circuit could be used in the place of blocks 2340, 2345, 2350 in FIG. 23.

It can also be noted that an aspect of the present invention as per the system 2300, in its broader context, teaches a broader genus of inventions that need not necessarily be implemented in optics. As is well known, digital filter banks can be readily implemented. For example, fred j harris, "Multirate signal processing for communication systems," Prentice-Hall, 2004 ("the harris reference") describes how multirate digital signal processing techniques can be used to construct digital filter banks that involve sub -band processing. Multirate signal processing make extensive use of bandpass sampling and can be useful to lower the computational load associated with filtering a band pass modulated signal, especially in embodiments where the modulated signal output of 2315 is centered at a RF (radio frequency) carrier frequency. Single rate digital filter banks can also be readily constructed and used in embodiments that do not perform resampling but have all parallel filters operating in all filter channels at a single sampling rate that is the same as the input and/or output signals. Also, MISO (multiple input, single output) type digital filter banks are well known that can be viewed as having multiple parallel inputs that feed to multiple parallel filter channels, and a summing junction (digital combiner) that is used to add the outputs of the multiple parallel filters to provide a single output. Therefore, the block 2320 could be implemented as a MISO digital filter bank using purely digital hardware. Similarly, SIMO digital filter bank could be used to implement the block 2330. A SIMO digital filter bank sends a single input stream to multiple parallel digital filter channels and provides a multi-channel output signal. Being digital, digital filter banks can be implemented using one or instruction set processors coupled to memory. This could be dedicated hardware or shared with other digital signal processing hardware in the system.

In all-digital embodiments, the laser 2305 and the optical modulator 2315 are replaced by a standard digital physical layer channel interface such as an BPSK, QPSK, QAM, OFDM, or any other kind of modulator for a given channel that can be used with spatial modulation. The modulated signal output of non-optical version of physical layer block 2315 is passed to the block 2320 in digitized form which performs SIMO filter bank operations. Since in SM only one transmit channel is used at a time, the spatial modulation constellation point coming from $\Gamma_2$ of block 2310 will select a filter from the SIMO filter bank to be applied to the modulated signal during a given symbol interval. The output of the block 2310 will thus be a filtered version of the modulated signal, where a selected filter from the digital filter bank 2320 is applied each symbol interval. The filters inside the digital filter bank 2320 are preferably selected to allow the spatial modulation constellation point to be resolved at the receiver. The output of the block 2320 can be sent directly to a digital to analog converter (DAC), or to a line/channel interface that includes and an analog reconstruction filter. In 5G wireless and similar types of wireless embodiments, the channel interface could be an air interface such as used in 3G, 4G or 5G cellular, or as used in WiFi wireless local area networks, or as used in 802.16 type WiMAX systems. In other types of embodiments, the line interface could correspond to a DSL (digital subscriber line) broadband twisted pair telephone line, or could correspond to a cable modem type channel interface.

An advantage to using this alternative MISO/SIMO approach 2300 as opposed to a multi-antenna embodiment is that the filters in the digital filter bank can be made to be adaptive. The filter response of adaptive filters can be changed varied and a function of current channel conditions. Therefore, adaptive filters can be adjusted or otherwise changed or updated to improve the properties of the overall channel matrix, H. While multi-antenna embodiments rely on a complicated MIMO type channel model, the above described MISO/SIMO approach 2300 can better select and control the overall channel matrix, H. Another advantage is that while current SM systems as used in cellular networks can have a large number of antennas in the downlink from the base station to the mobile, the mobile unit (handset) itself can only have a small number of antennas due to mobile-unit size constraints. When the above described alternative MISO/SIMO approach 2300 is used, the mobile unit can have a large number of equivalent SM channels. Also, even in the base station, it can be more cost effective to implement the multiple downlink channels using a digital filter bank because this eliminates extra antennas and also provides more control in selecting and maintaining a desired channel matrix, H.

The digital, analog, or discrete time filter banks can be used to implement the transmitter and/or receiver portions of the channel matrix H. That is, the SM/MIMO channel matrices $H_t$ and $H_r$ (where $H=f(H_t, H_{ch}, H_r)$) can be implemented using the filter banks in the transmitter and/or receiver, and $H_{ch}$ would be the actual communication channel. The actual communications channel matrix $H_{ch}$ may be a scalar if both the transmitter and the receiver include the above-described filter banks and only one antenna or only one line interface is used. Also, mixed systems that use filter banks to implement $H_t$ and $H_r$ but also use multiple antennas/physical channels may also be constructed. Similar to the optical embodiment described above, the filters in these digital, analog or discrete-time filter banks can be selected to be orthonormal, square-root orthonormal, or some other type of non-orthogonal basis functions such as an all-pole filters or filters with poles and zeros, That is, it is not required to implement an orthonormal basis set of filters, nor an approximation thereto. All that is really needed is to ensure that the filters are selected so that the overall channel matrix H is invertible, full rank, or has enough rank so that the SM-modulated or MIMO-modulated signals can be suitably recovered/reconstructed after passing through the channel H. The transmit and receive filters will influence H as will any noise and distortion effects of the optical channel itself.

In yet another embodiment, instead of implementing the blocks 2320 and 2330 using parallel MISO and SIMO digital filter banks, either analog filter banks or discrete-time filter banks (such as tapped delay lines or SAW (surface acoustic wave) filter banks are used. That is, the modulated signal such as the BPSK, QPSK, QAM, OFDM, or any other kind of modulated signal for a given channel is generated at the block 2315 and the block 2320 is operative to pass the modulated signal to a selected analog or discrete-time filter, where the selection is made in accordance with the spatial constellation point supplied by the spatial modulator during the give symbol interval. That is, all operations are similar to the above-described digital filter bank embodiment/approach, except the DAC operation is performed before the block 2320 instead of after it, and ADC (analog to digital conversion) is applied after the block 2330 instead of before it. Such embodiments are practical in some cases because the center frequency and/or the bandwidth of the modulated signal can make the digital filter bank operations require very high processing speeds. It is envisioned that a single chip could be used to implement the blocks 2320 and 2330 for use in a handset using either analog filter technology or discrete-time filter technology, and in the case of block 2320, under digital selective control in accordance with the spatial modulation constellation point coming in each sampling interval from the block 2310 ($\Gamma_2$).

In the discussion below, FIG. 24 is described in connection with an OTN optical communications embodiment. While FIG. 23 deals with an SM embodiment, FIG. 24 deals with a MIMO embodiment. The key differences between the systems/methods of FIG. 23 and FIG. 24 is thus while block 2320 applies one filter during each sample interval, block 2420 applies a plurality of filters to a plurality of different modulated signals each symbol interval. Hence all of the above discussion relating to embodiments of FIG. 23 that alternatively use digital filter banks, analog filter banks, or discrete-time filter banks also applies to the MIMO-modulation embodiment of FIG. 24.

CICM MIMO OTN Embodiment

Referring now to FIG. 24, a transmitter, a channel and a receiver for CICM based optical MIMO communication is illustrated in block diagram form. The transmitter and receiver depicted in FIG. 24 can be embodied as a method, an apparatus, a device, or a system. A set of $n_t$ number of lasers 2405 provides a set of $n_t$ number of optical carrier waves for optical communications. Similar to the system 2300, where dense wavelength division multiplexing (DWDM) is used, then the bank of lasers 2405 and the entire system 2400 would be repeated for every optical channel and polarization in the DWDM channel bank. For example, if the DWDM system had 80 channels, then the bank of lasers 2405 and the system 2400 would be repeated 160 times, once at each of the 80 wavelengths, and once for horizontal and vertical polarizations at each wavelength. From here forward, the system 2400 will be described at a single wavelength, and a single polarization, knowing that the following discussion of the system 2400 could be repeated at each wavelength and/or each polarization.

A constellation and spatial mapper 2410 is provided to receive an input bit stream which is presented to the block 2410 on the input arrow to the left. For example, the input bit stream can be a CTBC encoded bit stream. As discussed earlier in connection with CICM, the input bit stream can be any coded bit stream for which a set of tables P(d), for $d=d_i$, $d_i+1, \ldots, d_f$ can be constructed. In the MIMO embodiment 2400, the signal mapper 2410 can optionally include a spatial constellation mapper component. This optional spatial mapping component is shown in dotted lines as an optional output from the mapper 2410 to a MIMO optical signature filter bank/combiner block 2420. In embodiments where the optional spatial mapping component is supplied by the signal mapper 2410, the signal mapper 2410 becomes a constellation and spatial mapper 2410 (as shown in FIG. 24). Block 2410 preferably includes a constellation-mapper so that its output includes a constellation signal point. Also, in such embodiments, the block labeled 2420 becomes a MIMO active optical signature filter bank/combiner block 2420. The active components can optionally be used even when there is no spatial modulation component coming from the signal mapper 2410, but when such a spatial modulation component is present, the active optical filter and/or amplifier components are needed in the block 2420 to allow it to adapt its transmit MIMO transfer function in accordance with the spatial modulation component. An example of the this type of system is a GSM embodiment and other types of embodiments where a subset comprising more than one antenna can be selected during each symbol interval by the spatial modulation component.

In embodiments that use MIMO vector modulations such as V-BLAST and D-BLAST, the constellation and spatial mapper 2410 performs spatial mapping by providing $n_t$ number of signal constellation points to be transmitted via the vector, x, each symbol interval. In such modulations the dotted arrow coming from the spatial modulation submatrix, $\Gamma_2$, is empty and there is no separate spatial modulation matrix $\Gamma_2$. Instead, in this case, the spatial portion of the modulation is performed by virtue of mapping $n_t$ number of signal constellation points to be transmitted via the vector, x, each symbol interval.

The outputs of the lasers 2405 couple to the laser-inputs of a bank of optical modulators 2415. The optical modulators each receive a second input of m bits each, where each m-bit input is representative of a signal constellation point that tells each respective optical modulator how to modulate its laser input to produce a modulated laser output. The modulation is performed in accordance with the signal constellation point supplied as a column of the submatrix $\Gamma_1$ by the constellation and spatial mapper 2410. For example, when m=4, each column of the submatrix $\Gamma_1$ could identify $n_t$ groups of four coded bits each that respectively identify a respective 16-PSK signal point to which the each respective group of m=4 coded bits will be mapped in a given symbol interval. In this example a particular CTBC code is used to encode the bit stream input to the block 2410. During each symbol interval, the encoded bit stream is mapped to a vector comprising $n_t$ CICM-16-PSK constellation points. For example, if $n_t=4$, this will increase the data rate by $n_t=4$ times the data rate of a single CICM-16-PSK channel. If $n_t=16$, this will increase the data rate by $n_t=16$ times the data rate of a single CICM-16-PSK channel. In general, this type of transmission can provide a speed up of $n_t$ times the data rate of a conventional system that does not use the MIMO processing of the system 2400.

In the system 2400, to maintain a system-wide symbol Hamming distance, the CICM mapping rule design algorithm can be configured to create a CICM constellation and spatial mapper that does not allow more than one bit from any given low weight error sequence to be transmitted during any given symbol interval. In such embodiments, a single CICM permutation matrix, $\Gamma$, is designed with $m*n_t$ number of bits per column. In such embodiments there will be $n_t$ number of columns that correspond to each Euclidian distance in the signal constellation. In other embodiments, the symbol Hamming distance will only be effective within each one of the $n_t$ different channels. In such embodiments, a single CICM permutation matrix, $\Gamma$, can be designed that has m rows and K/m columns as in the single-channel case. Now, however, a set of $n_t$ columns of $\Gamma$ will be mapped to separate filter channels during each symbol interval.

Also, as applies to the system 2300 as well, if transmission is occurring on both the vertical and horizontal polarizations, the CICM mapping rule can be designed to treat the horizontal and vertical polarizations as being imperfectly coupled, in which case it is desired to view the symbol Hamming distance as involving the bits sent on both the horizontal and vertical polarizations during a given symbol interval. However, because it is common to apply a small 2×2 rotation matrix to correct for imperfections in the horizontal and vertical polarizations, the CICM mapping rule can be alternatively designed to treat the horizontal and vertical polarizations as being perfectly isolated, in which case it is desired to view the symbol Hamming distance as involving the bits sent only on the horizontal or the vertical polarization during a given symbol interval. If the vertical and horizontal polarizations are considered to be perfectly isolated, then one column of $\Gamma$ will be mapped to the horizontal polarization and another column of $\Gamma$ will be mapped to the vertical polarization during each symbol interval. Similarly, when the systems 2300 and 2400 are applied in DWDM systems, since the different wavelengths can generally be considered to be isolated, and assuming isolated/corrected polarizations, a full 160 columns of $\Gamma$ can be mapped each symbol interval. As mentioned above, soft interference cancellation can also be used with the SISO decoder to cancel the effect of the polarization cross talk.

The MIMO optical signature filter bank/combiner 2420 receives a length-$n_t$ vector of signal constellation points. If the submatrix $\Gamma_2$ is in use, a column from $\Gamma_2$ indicates a subset of the $n_t$ vector inputs to process during a given symbol interval. The $n_t$ outputs of the internal optical signature filters within the MIMO optical signature filter bank is sent to a combiner that is located within the block 2420. The combiner can be implemented using known optical technology to include merging optical paths in an optical integrated circuit or fiber couplers that have multiple optical input fibers which are length matched and combined to form a single output. The single output is coupled to an optical channel such as a fiber optic cable or a free space laser channel. The output of the optical channel is coupled to a SIMO active optical receive filter bank 2430. Each of the active optical signature filters 2420 and optical receive filters 2430 can be implemented in accordance with known technology, as described above in relation to the Dowling, MacFarlane and Madsen references, for example. The structure and operation of the optical receive filter bank 2430 is largely the same as described in connection with FIG. 23.

Because in this case the vector x can be carrying information symbols on up to all $n_t$ channels per symbol interval, the action of the combiner in the block 2420 will be to form a linear combination of all of the columns of the submatrix $H_t$ each interval and eventually the matrix H each frame. These signals can be separated in the receiver as long as all of the columns of $H_t$ and/or H are linearly are independent. The more orthogonal the columns of $H_t$ and/or H are, the easier it will be to effectively invert these matrices using an predetermined and matched orthogonal matrix in the receiver. The transfer functions inside the $H_t$ submatrix are optical transfer functions and are applied during each symbol interval.

If the portion of the channel matrix H of equation (31) that is active during any symbol interval is factored as $H=H_rH_t$, then the MIMO optical signature filter bank can be viewed as having a matrix transfer function of $H_t$ while the SIMO active optical receive filter bank 2430 can be viewed as having the transfer function $H_r$. In certain preferred embodiments, the channel matrices are constructed using orthogonal basis sets so that the matrix H is, or approximates, a constant times an identity matrix, and the matrices $H_r$ and $H_t$ can be viewed as orthogonal filter matrices.

The blocks labeled 2435, 2445 and 2450 perform similar functions and have similar structures to the corresponding blocks 2335, 2345 and 2350 in FIG. 21. However, in addition to the operations as described connection with FIG.

21, the data in the memory of block 2435 and the SISO decoder/interference canceller 2440 also performs one or more additional functions. The reason is that in the system 2300, data is only be transmitted through one active signature filter at any time, at least to within relatively short-timed dispersion matrix time constants. In the system 2400, the SISO decoder/interference canceller 2440 needs to detect each of the $n_t$ transmitted signals in the presence of interference due to the other signals transmitted during the same interval through different optical signature filters in the MIMO optical filter bank/combiner 2420. Therefore the SISO decoder/interference canceller 2440 uses the same structure and performs the same functions as described in connection with the block 2125 in FIG. 21.

OFDM Related Embodiments

Another class of embodiments contemplated by the present invention involves OFDM (orthogonal frequency division multiplex) systems, also known as DMT (discrete multitone) type systems. These systems map an entire frame of data onto a set of N carriers, usually using a DFT (discrete time Fourier Transform) that is implemented using an FFT (fast Fourier Transform) and its inverse transform. In such systems, each sub carrier is typically viewed as carrying one QAM type data symbol each frame. The collection of all QAM symbols on all sub carriers per OFDM frame is called an OFDM symbol. The OFDM symbol interval is thus the OFDM frame size plus possibly a cyclic prefix duration that is used as a guard interval to separate the OFDM symbols in time enough so that FFT processing can be employed in a demodulator. As is known in the art, the collection of QAM data symbols on the various subcarriers can be encoded using FEC and/or TCM.

In accordance with an aspect of the present invention, the OFDM symbol is formed by modulating the carriers using a CTBC encoded data sequence. The CTBC code's frame size may be the same as the number of bits mapped per OFDM symbol interval, or for example, one CTBC frame of data can be mapped to an integer or fractional number of OFDM symbols. For example, if K=1024 and the number of sub-carriers is 256, then the CTBC frame would be carried by four OFDM symbols. If K=1024+128=1152, then the CTBC frame would be carried by four and a half OFDM symbols. In actual OFDM systems, certain sub carriers may be used as reference tones for synchronization purposes, but the general idea is that CTBC encoded data may be mapped to one or more OFDM symbols.

Also, in the OFDM transmitter, instead of using TCM-QAM, for example, CICM -PSK could be used to modulate each sub-carrier. In systems like DSL (digital subscriber line) modems, where different numbers of bits are mapped to different sub-carriers depending on channel conditions, different sized PSK constellations could be used at different subcarriers. The CICM permutation and constellation encoding could be carried out separately for each subcarrier, or could be carried out across subcarriers, k, depending on the embodiment. Hence the present invention specifically contemplates all variations using CICM in the time and subcarrier domains or a combination of both.

In certain embodiments of the present invention would encode a frame data into a K-bit CTBC encoded frame, then apply CICM interleaving, and then a reverse Gray coded or other similar constellation mapping such as anti-Gray coding to each subcarrier. For example a CICM-16-PSK could be used to modulate each subcarrier. Depending on the embodiment, each subcarrier could carry a separate CTBC/CICM encoded data frame, or a single data frame could be spread across the entire set or a subset of the subcarriers. A 5G LTE system could be designed using a CTBC code and CICM-PSK type modulation.

Also, embodiments of the present invention are envisioned that do not use CTBC codes but instead use any of the types of codes that are discussed above that can be used with CICM. For example, as discussed in the unequal error protections section above, a single (8,4) or longer block code could be used with CICM to provide equal or unequal error protection. In an OFDM embodiment, the CICM can be used with any suitable code as discussed above and does not need to be a CTBC code. That is, any suitable code can be used to create a valid CICM signal mapper with a CICM permutation and a selected constellation mapper, and this CICM can then be used to modulate either a single subcarrier or could be spread across multiple sub-carriers. If CICM is used with a block code or a convolutional code, something similar to TCM results, however CICM can perform better than TCM over fading channels. Therefore, the current TCM-QAM used in various standards to modulate subcarriers can be substituted with an appropriate CICM scheme, such as a CICM-PSK scheme that is derived from a block code or a convolutional code. Other codes such as turbo product codes, turbo codes and LDPC codes can also be used as long as their P(d) tables can be constructed as discussed above.

As is discussed in R. Y. Mesleh et al., "Spatial Modulation," IEEE TR Vehicular Technology, Vol. 57, No. 4, July 2008, pp. 2228-2241, ("the Mesleh reference) both SM -OFDM and VBLAST-OFDM (MIMO) are known. The present invention contemplates that known SM-OFDM and MIMO-OFDM can also be improved by using CTBC coding of the bit stream, and/or CICM encoding of each subcarrier, preferably using CICM-PSK for each subcarrier's constellation mapping. The present invention also contemplates using the optical and/or non-optical versions of the SM and MIMO system configurations as shown in FIGS. 21, 23 and 24. Moreover, especially in systems implemented in accordance with FIGS. 23 and 24, whether they be implemented using an optical or wireless, or wireline channel, when blocks 2320, 2330, 2420, 2430 are used, it is noted that a much higher number of channels can be practically implemented as compared to prior art multiple antenna SM-OFDM and MIMO-OFDM (e.g., VBLAST-OFDM) based designs that require $N_t$ transmit and $N_r$ receive antennas to implement the spatial channels. With the present invention SM-OFDM and MIMO-OFDM can even be implemented in systems where there is only one transmit and antenna and one receive antenna. The present invention allows $N_t$ and $N_r$ to represent, instead of the number of transmit and receive antennas, the number of outbound spatial channels leaving the transmitter and the number of inbound spatial channels entering into the receiver. This allows $N_t$ and $N_r$ to be made to be much higher without the cost adding extra antennas. When $N_t=N_r$, the spectral efficiency of SM-OFDM rises as a function of $\log_2(N_t)$ and the spectral efficiency of MIMO-OFDM rises linearly with $N_t$.

Figure 25:
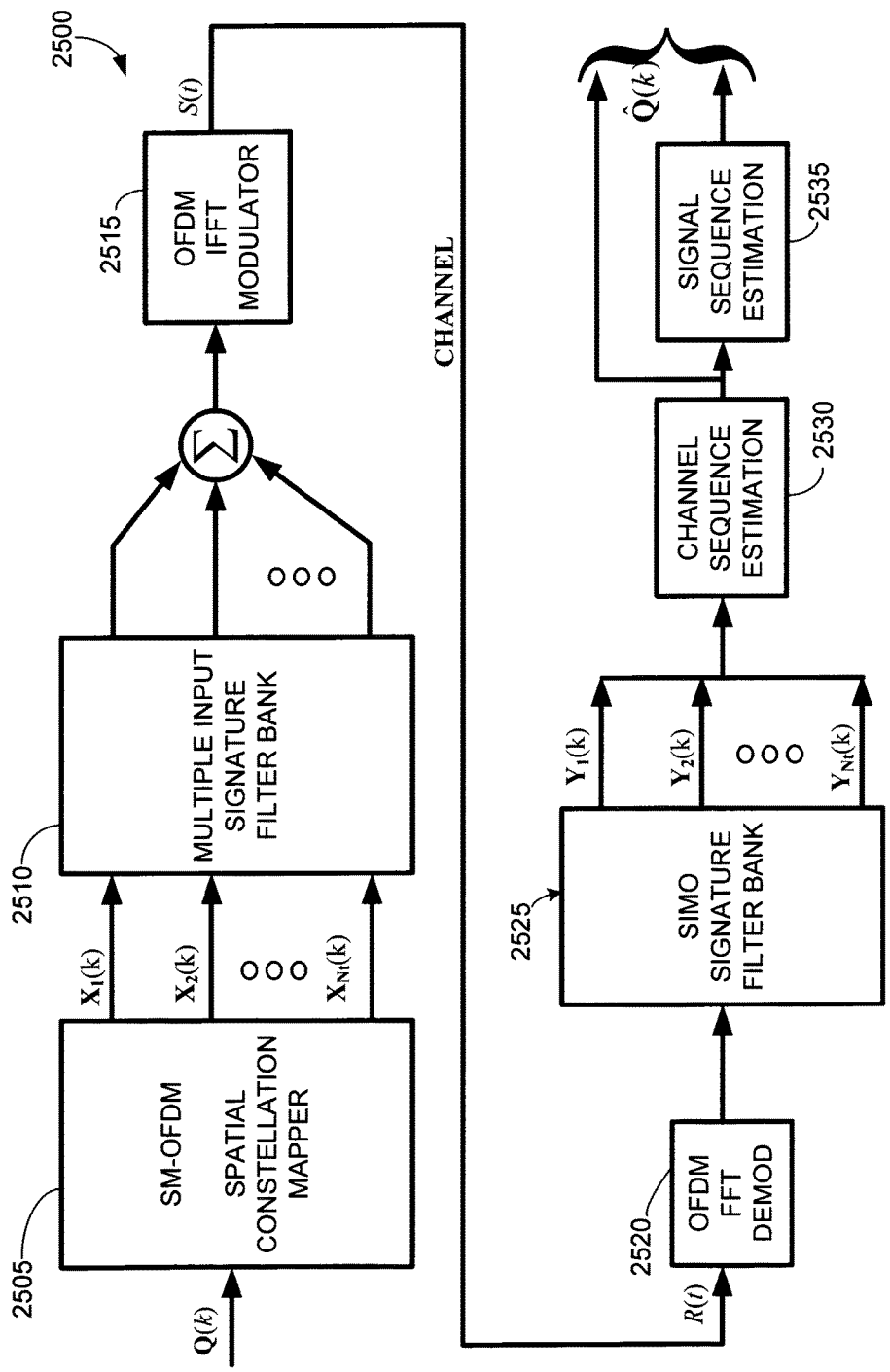
FIG. 25 is a block diagram of a embodiment of an SM-OFDM and MIMO-OFDM system that makes use of frequency domain spatial channel signature filter banks.

Referring now to FIG. 25, an embodiment of a system, a method and an apparatus 2500 is shown in block diagram form. Inbound to a SM-OFDM spatial constellation mapper 2505 is an OFDM symbol matrix, Q(k). In this context the parameter k is used to denote frequency domain data. The subcarriers can be viewed as being indexed by k (or k-1). The matrix Q(k) can be viewed as being similar to the matrix Γ, but adapted to an OFDM frame size. That is, suppose each OFDM frame has N number of subcarriers. In this example, assume all subcarriers are used to carry useful information bits, although it is understood that in other examples, certain subcarriers could be reserved to carry known timing/synchronization symbols. Also assume, in this example, that each subcarrier is moduallated with m data bits so as to carry a $2^m$-ary data symbol. Also, let $m_{spatial}=\log_2(N_t)=\log_2(N_r)$. With these parameters defined, then the matrix Q(k) can be viewed as a $(m+m_{spatial}) \times N$ matrix of binary bits. Similar to how $\Gamma$ is defined in SM and MIMO applications with the submatrices $\Gamma_1$ and $\Gamma_2$, Q(k) can be viewed as having a $Q_1(k)$ binary submatrix of size m×N stacked above a $Q_2(k)$ binary submatrix of size $m_{spatial} \times N$. When CICM is optionally also being applied in a given embodiment, the matrices Q(k), $Q_1(k)$, and $Q_2(k)$ can be loaded by sliding a window across the $\Gamma$ matrix so that a blocks of N columns of $\Gamma$ are mapped to each OFDM symbol.

Similar to how the bits in the $\Gamma_2$ matrix are used in FIG. 23 and FIG. 24 to select a sequence of spatial channels to be used to send each column of the $\Gamma_1$ matrix, the bits in the $Q_2(k)$ are used to select a sequence of spatial channels to be used to send each column of the $Q_1(k)$ matrix. However, in the OFDM embodiment of FIG. 25 each of the columns, numbered 1, . . . ,N of the $Q_1(k)$ matrix will be sent on a respective OFDM subcarrier, labeled 1, . . . ,N. Hence the operation performed by the SM-OFDM spatial constellation mapper 2505 can be viewed as transforming the matrix Q(k) to a set of spatial channel sequences, $X_1(k), \ldots, X_{Nt}(k)$. Again, here the k-parameter indicates that the X-vectors contain frequency domain data. In general, if there are N subcarriers, $N_t \le N$ is preferably chosen such that $N/N_t$ is an integer, i.e., $N_t$ divides N and in the extreme case, $N_t=N$, so that $m_{spatial}=\log_2(N)$. This is extreme case is now practical to implement since separate antennas are not needed to increase $N_t$. Therefore the example embodiment where $N_t=N$ becomes important and desirable.

To understand the function of the block 2505 to perform the mapping $Q(k) \to \{X_1(k), \ldots, X_{Nt}(k)\}$, consider all of the elements of the vectors $\{X_1(k), \ldots, X_{Nt}(k)\}$ to be initially set to zero. Note that the $k^{th}$ column of $Q_1(k)$ corresponds to a complex-valued signal constellation point to be transmitted onto the $k^{th}$ subcarrier and to be carried by the spatial transmit signature channel number given by the $k^{th}$ column of $Q_2(k)$. Hence similar to block 2310 and 2410, block 2505 will sequentially map each $k^{th}$ column of $Q_1(k)$ to a constellation point in the $k^{th}$ position of a selected channel vector, $X_{sp}(k)$, where the subscript sp$\in\{1,2,\ldots,N_t\}$ is equal to the binary value of the $k^{th}$ column of $Q_2(k)$. Since all of the elements of all of the vectors $\{X_1(k), \ldots, X_{Nt}(k)\}$ were initialized to zero, by the time each column of Q1(k) has been mapped to a complex number in the $k^{th}$ position of the Q2(k)-selected channel vector, $X_{sp}(k)$, the vectors $\{X_1(k),\ldots, X_{Nt}(k)\}$ will contain all zeros except for the frequency bins k to which a complex number corresponding to a signal constellation point have been inserted. Because each frequency bin k is mapped to one channel, it will never be the case that any one spatial channel sends more than one signal constellation point on any one subcarrier at a time. If the $\{X_1(k), \ldots, X_{Nt}(k)\}$ are viewed as row vectors all stacked into a matrix X(k), the matrix X(k) will be of size $N_t \times N$, and each $k^{th}$ column of X(k) will contain all zeros, except for the $sp^{th}$ row, which will contain a complex number. Here the spatial channel number, sp, corresponds to the binary value of the $k^{th}$ column of $Q_2(k)$ and the complex number corresponds to the signal constellation point determined by constellation mapping the $k^{th}$ column of $Q_1(k)$. Next the frequency domain set of spatial channel vectors are sent to a frequency domain filter bank 2510 where the equivalent of time-domain filtering (convolution) is implemented using point-wise multiplications in the frequency domain. If needed a cyclic prefix or guard interval can be used to ensure that the convolutional tails between OFDM symbols is maintained. The signature filter bank 2510 thereby applies a frequency domain spatial-channel signature value to each frequency bin in each transmit spatial channel. To keep the guard band short, the signature filters can IFFT back to zero padded impulse-response vectors in the time domain. The outputs of the frequency domain filter bank are then summed together in a summing junction and are then the sum is sent to an inverse FFT/OFDM modulator 2515. The time-domain output signal from this OFDM modulator is then converted to analog or otherwise coupled onto a physical channel for transmission. The physical channel can be wireless, wireline, or optical, and in general, can involve one or more antennas, although a preferred embodiment only uses one antenna at the transmitter and one antenna at the receiver to implement the equivalent of the matrix MIMO type channel, H.

In the embodiment shown in FIG. 25, the received signal R(t) is first sent to a single FFT module/OFDM demodulator 2520. The frequency domain version of the received signal, R(k) is then sent to a SIMO signature filter bank 2525 (similar to blocks 2330 and 2430) that is applied in the frequency domain to generate a plurality of frequency domain signals, $\{Y_1(k), \ldots, Y_{Nt}(k)\}$. This provides a set of frequency-domain vector signals output signals in accordance with y=Hx+w, i.e., equation (31). Because no spatial channel has more than one active antenna (signature filter) at any given particular time at any given particular frequency bin, normal SM type detection can be applied. For example, a channel estimator 2530 can perform maximum receive ratio combining (MRRC) as is known in the art to estimate a sequence of channels corresponding to the bits in the submatrix $Q_1(k)$. Other sequence estimation techniques could also be applied as discussed in connection with CICM and other embodiments herein. For example, if the number of columns of $\Gamma$ is five times N, then five OFDM symbols could be concatenated and decoded together. Whether joint spatial+signal sequence estimation is used, or whether the channel number sequence is estimated first and then used to help decode the signal symbols second, the end result is to estimate both the bits in both $Q_1(k)$, and $Q_2(k)$. Any variety of joint channel number and signal SISO decoding, hard channel number decoding followed by SISO decoding to recover the $Q_1(k)$ sequence, or any other known decoding scheme can be applied as discussed above in connection with FIG. 23. As described in the Mesleh reference, a vector $g(k)=H^H y(k)$ where this H the size $N_r \times N_t$ frequency response matrix of a given subchannel to account for all the cross couplings between transmit and receive spatial channels, and y(k) is one of the $\{Y_1(t), \ldots, Y_{Nt}(t)\}$ vectors. The g(k) vector or vectors similar to it can be used in various embodiments as a sufficient statistic/measure to be used to determine which antenna is transmitting at each subcarrier frequency using standard energy detection based algorithms. At each subcarrier, one antenna will be active and the rest quiet/dark as is common in all SM detection discussed herein.

Figure 26:
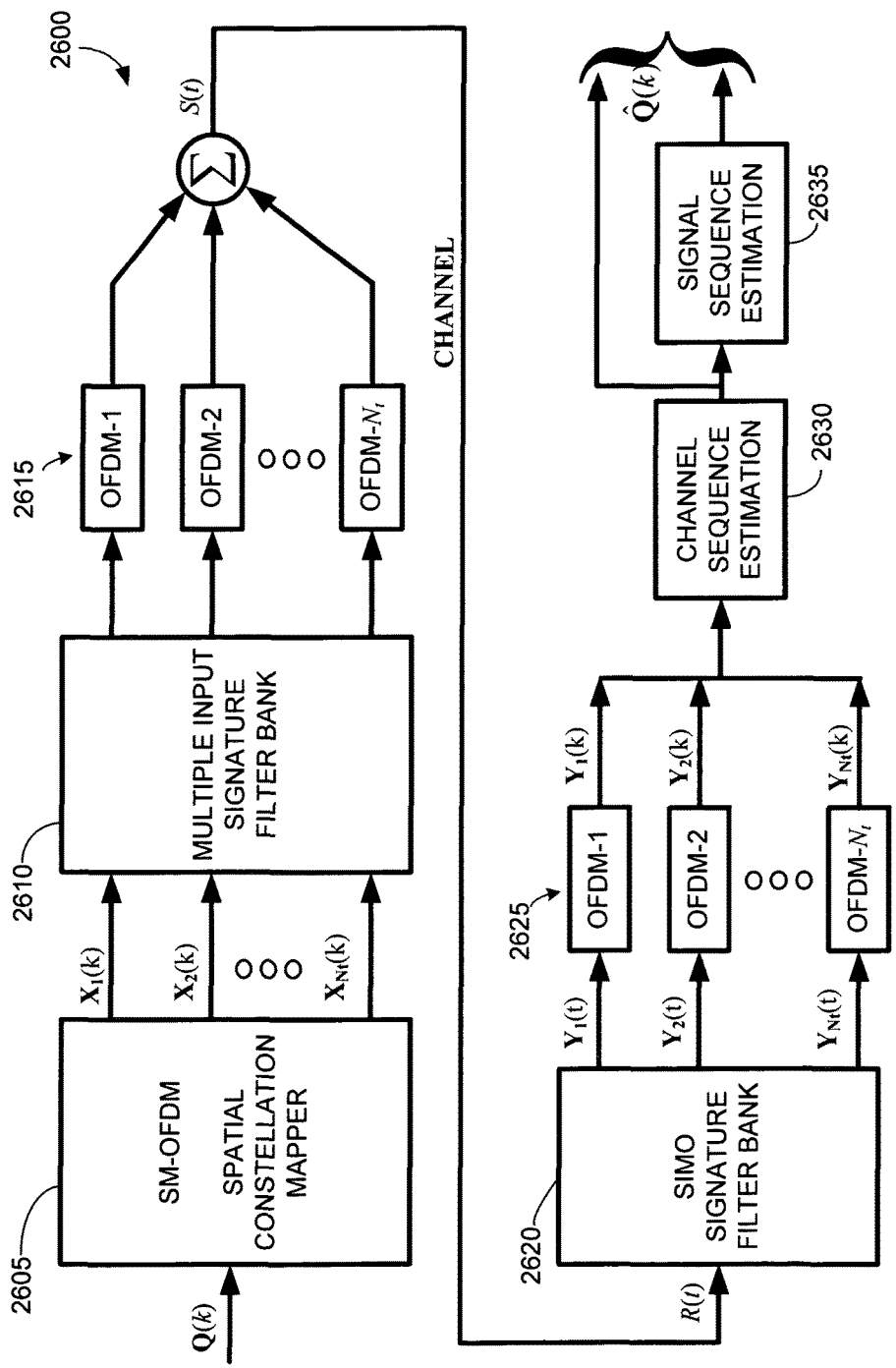
FIG. 26 is a block diagram of an alternative embodiment of an SM-OFDM and MIMO-OFDM system that makes use of a spatial channel signature filter banks.

In the alternative embodiment shown in FIG. 26, a SIMO signature filter bank 2620 (similar to blocks 2330 and 2430) is applied in the time domain to generate a plurality of time domain signals, $\{Y_1(t), \ldots, Y_{Nt}(t)\}$. This provides a set of time-domain vector signals output signals in accordance with y=Hx+w, i.e., equation (31). Each of these time domain signals is then processed by a set of $N_t$ an FFT/OFDM demodulators 2525 arranged in parallel to provide a set of frequency domain equivalents $\{Y_1(k), \ldots, Y_{Nr}(k)\}$. Note that FIG. 26 is close to known SM-OFDM, but requires more FFTs for OFDM demodulation than the more efficient frequency domain embodiment 2500 that was not possible with prior art SM-OFDM. FIG. 26 also uses a plurality of OFDM FFT based demodulators 2615 as opposed to the more efficient approach 2515. However FIG. 26 is closer to the prior art and illustrates where some of the complexity reductions were achieved as compared to FIG. 1 of the Mesleh reference. Another alternative embodiment would be to swap the order of blocks 2610 and 2615 and to thus implement the block 2610 in the time domain. This could be done in digital signal processing hardware or in an analog or discrete time filtering chip.

Also, while FIG. 25 and FIG. 26 were described in connection with SM-OFDM, the same structures support MIMO-OFDM as well. The difference now that the number of spatial channels can become relatively large, as high as $N_t=N$ with only one antenna at each of the transmitter and receiver, it makes sense to allow the spectral efficiency of the system to scale linearly with $N_t$ as opposed to $\log_2(N_t)$. The added cost would be successive interference cancellation or a similar detector as described in connection with FIGS. 21, 22 and 24 and as described more generally in the context of MIMO-modulation.

System Level and Alternative Embodiments

Figure 27:
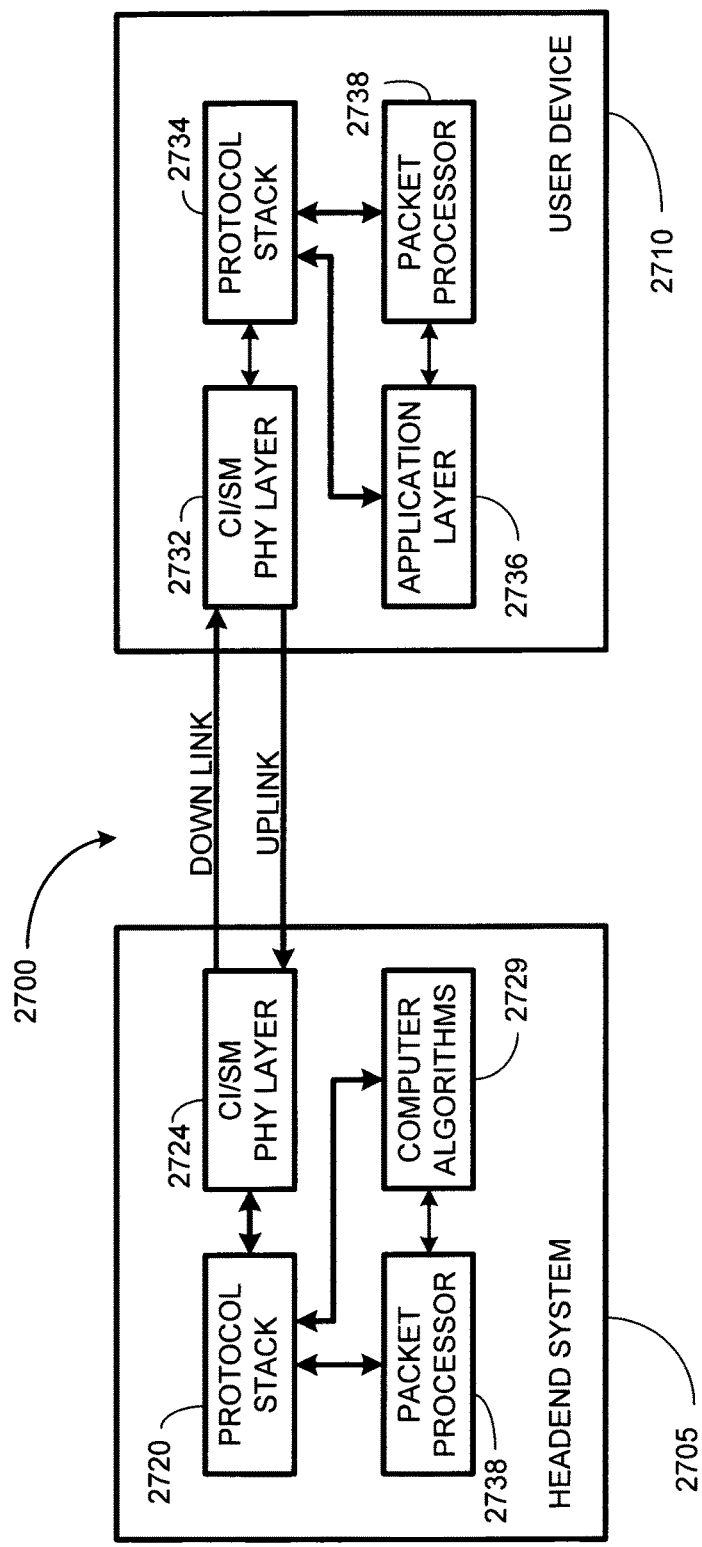
FIG. 27 is a block diagram of an exemplary communication system and method including two transmitters and two receivers that make use of the serial concatenation coding with constrained interleaving in order to communicate between communication endpoint stations.

FIG. 27 shows a higher level systems architecture 2700 into which any of the CI (constrained interleaving) and/or CICM and/or SM and/or MIMO techniques described herein may be used. A headend system 2705 transmits via a downlink channel to user device 2710. The user device 2710 transmits back to the headend system 2705 via an uplink channel using a physical layer that includes coding and modulaiton. The headend system comprises a protocol stack 2720 which includes a physical layer device 2724. The physical layer/coding layer devices 2725 2732 implement any combination of one or more of CTBC codes, CICM, SM and/or MIMO using constrained interleaving and any other coding and modulation techniques as described in this patent application. The headend system also may include a control and routing module to connect to external networks, databases, and the like. The headend system also contains a computer control module 2729 which comprises processing power coupled to memory. The computer control module 2729 preferably implements any maintenance functions, service provisioning and resource allocation, auto-configuration, software patch downloading and protocol version software downloads, billing, local databases, web page interfaces, upper layer protocol support, subscriber records, and the like.

The user terminal 2710 similarly includes a physical layer interface 2732, a protocol stack 2734 and an application layer module 2736 which may include user interface devices as well as application software. The user terminal 2710 also may optionally include a packet processor 2738 which can be connected to a local area network, for example. The user 2710 terminal may also act as an IP switching node or router in addition to user functions in some embodiments.

Another type of embodiment replaces the headend system 2705 with another user device 2710 in which case direct peer-to-peer communications is enabled. In many applications, though, the headend can act as an intermediary between two user devices to enable indirect peer-to-peer communications using the same headend-to/from-user device uplink/downlink architecture illustrated in FIG. 27. Also, a plurality of networked headends may be employed to the same effect, for example, in a cellular communication system (where the headends are implemented as cellular base stations). Likewise in OTN applications, switching and routing nodes in the backbone may be viewed as peer-to-peer, headend-to-headend connections. In high speed optical LAN applications, the headend may be viewed as a LAN controller and the user device can be a optical LAN connected device.

In a preferred embodiment as directly illustrated by FIG. 27, at least one of the uplink and the downlink channels is implemented using one or more or an combination of of the members of the family of encoding/modulation/demodulation and decoding schemes as described herein, such as CTBC codes, CICM, SM and/or MIMO. In some types of embodiments, the PHYS 2724, 2732 may also include echo cancellation, cross -talk cancellation, equalization, and other forms of signal conditioning or receiver pre -processing. Alternatively, the headend 2705 and the user station 2710 can be implemented as nodes in a network where the physical layer devices 2724, 2732 implement a backbone communication connection between nodes.

Another aspect of the present invention contemplated by FIG. 27 is the provision of services by a communication services provider. The communication service provider provides a communication service such as, for example, a cellular communications service to a set of subscribers, a wireless data service, or supplies a backbone optical communication service to support a network such as the Internet. The service provider implements FIG. 27 or any of its variants or equivalents described above. The service provider employs the PHYS 2724, 2732 in support of the service. In some cases the service also provides the user devices 2710 to the subscribers. This allows the service to be implemented more efficiently and economically that was available with prior art coding technologies.

Although the present invention has been described with reference to specific embodiments, other embodiments may occur to those skilled in the art without deviating from the intended scope. Figures showing block diagrams also identify corresponding methods as well as apparatus. All transmitted signals shown in the Figures can be applied to various types of systems, such as cable modem channels, digital subscriber line (DSL) channels, individual orthogonal frequency division multiplexed (OFDM) sub -channels, wireless channels, SM and MIMO channels, optical channels and the like. In general, more than two component codes can be concatenated together, and embodiments can be created that mix parallel and serial concatenation to form mixed parallel/serial concatenated codes. In such cases the constrained interleaving can be performed on any component-encoded or concatenated encoded bit stream to be interleaved within the mixed encoder structure to satisfy a constraint that is designed to jointly optimize or otherwise improve bit error rate performance by jointly increasing a measure of minimum distance and reducing the effect of one or more dominant error coefficients of the mixed encoded bit stream. The concepts presented herein can be extrapolated to these higher order cases by induction. This patent application contains various block diagrams and glow charts. It is to be understood that sub-portions of any of the block diagrams or flow charts can be used to extract apparatus, systems and methods that correspond to just the sub-portion of the block diagram or flow chart. Block diagrams in many cases can be indicative of all of methods, apparatus, and systems. Also, it is understood that an inner code in a concatenation can be replaced in many cases by a modulator such as a TCM, BICM, or CICM. That is, a serial concatenated code may be formed by an outer encoder followed by a constrained interleaver, followed by a signal mapper such as TCM, BICM, or CICM. Such embodiments of CTBC codes are contemplated herein.

Also FIG. 27 can expressly be mixed with any oth the other figures to construct communication systems and communication services. Also, sub-portions of any of the block diagrams or flow charts can be broken off and merged with other sub-portions of any other block diagrams or flow charts from one or more separate figures to arrive at other devices, apparatus, systems and methods. All such combinations are expressly contemplated herein, although it would take too much space to enumerate them all. Therefore the present disclosure is to be understood to include all such combinations of the material disclosed herein. Hence it is noted that all such embodiments and variations are contemplated by the present invention.

Also, it is to be noted that much of the description herein relates to computer, digital communications, and digital signal processing technology, and all of the block diagrams and flowcharts and related description herein can, in whole or in part, be implemented using processor technology. For example, apparatus and systems can comprise one or more processors coupled to one or more memories, and also coupled to other input/output devices such as channel interfaces, line interfaces, communication protocol stack upper layers, user interfaces, user input/output devices, switching fabrics, OTN backbone links, optical LAN interfaces, and the like. In such systems, instructions can be stored in the one or more memories to cause one or more functional units in one or more the processors to carry out actions or steps to implement any aspects of the block diagrams or flow charts herein. Also, special hardware can be hardwired, so that no instruction stream is needed to carry out certain actions such as highly repetitive/periodic processing. In such cases microsequencing logic can be built into dedicated control circuits to cause the hardware to loop through each frame of encoding, decoding, modulation, demodulation, and the like. The apparatus, systems and methods presented herein can be configured to perform computerized sequences of operations, however, the operations themselves are provided to solve problems that are necessarily rooted in computer and electronic communications technology in order to overcome specific problems that specifically arise in the realm of computer networks, local area networks, wide area networks, link layer communications, and physical layer communications. For example, errors naturally occur due noise, distortion, and other impairments physically introduced by a communication channel. The techniques developed herein provide solutions to recovering a message sequence at a receiver with error recovery and error avoidance in light of these physical technology-induced channel impairments.

Finally, it is recalled that U.S. Pat. No. 8,537,919 and U.S. Pat. No. 8,532,209, by the same inventors and dealing with constrained interleaving related technology, are incorporated herein by reference. In these incorporated-by-reference patents, CI-1 and CI-2 are presented. Likewise, a number of specific systems are presented therein, such as constrained turbo product codes (both the outer code and the inner codes are block codes) multiple concatenations, and the like. Hence it is to be understood that the present invention also contemplates modifying any specific embodiment (e.g., block diagram, flow chart, or written description portion) of these incorporated-by-reference patents by making any modification as disclosed in the instant patent application.

For example, any place a signal mapper is discussed in the incorporated-by-reference patents, CICM or a version of CICM-SM or CICM-MIMO would be used as the signal mapper. Any time BICM is mentioned in the incorporated-by-reference patents, CICM could be substituted to obtain an embodiment in accordance with a present invention. Likewise, any time CI -1 or CI-2 is mentioned in any disclosed embodiment in these incorporated-by-reference patents, a new embodiment in accordance with the present invention could be obtained by specifically reciting the new specific species SRCI, CI-3, or CI-4 of the more general genus of inventions, CI as disclosed in these incorporated-by-reference patents.

As a specific example how this would occur in practice, consider the steps involved in the construction of TPCs (turbo product codes) that are constructed in accordance with CI-1 which used a constrained interleaver design matrix with randomization along the rows and columns. Note that the CI-1 interleaver matrix ensures that every coded bit of a codeword of the OBC is fed into different codewords of the IBC (inner block code). In addition, the randomizations along all $L=k_i$ rows and then all np' columns guarantee that coded bits are placed with the highest possible level of randomness allowing any coded bit of any OBC to be placed anywhere in the interleaved sequence u subjected to the above constraint. In other words, TPC designed according to CI-1 uniformly randomizes positions subject to the constraint that no two coded bits of any codeword of the OBC are allowed to be fed into the same codeword of the IBC. With that observation and with the intention of feeding blocks of $k_i$ bits of interleaved bits into the IBC, the SRCI counterpart can be designed by considering a block structure in the interleaver and constraining that any two coded bits of a codeword of the OBC cannot be placed in the same block of $k_i$ bits of the interleaved sequence. Hence, in SR-CTPC, every coded bit $c_{jt}$ which is at position i=(jn+t) on c, where j=0,1, . . . , ($\rho$−1), t=0,1, . . . ,(n−1), an interleaved position $\pi$(i) can be found on u by using the following steps:

(a) for each q, 0≤q<p, the restricted zone is from X(p) to Y(p) (including X(q) and Y(q)) on u, where $X(q)=k_i \lfloor \pi(q)/k_i \rfloor$ and $Y(q)=X(q)+k_i-1$, and (b) randomly select a position among the remaining vacant positions on u as $\pi$(i). In order to treat all $\rho$ codewords in the same manner, every selected coded bit position p (0≤p<n) of all codewords can be placed on u, one coded bit position at a time starting from p=0 and moving up to p=(n−1).

As another example, consider FIG. 18 of U.S. Pat. No. 8,532,209. Using this figure, the present invention would include an embodiment that could be described as having all of blocks 1810, 1010A and 1820 specifically recited to have their interleavers implemented using a SRCI such as CI-3 and/or CI-4. While U.S. Pat. No. 8,532,209 described the CI genus, it only described the CI-2 and CI-2 species. Hence while inventions in U.S. Pat. No. 8,532,209 could be described to recite embodiments using the CI genus, the current patent application specifically contemplates all recitable inventions in U.S. Pat. No. 8,532,209, but with the specific new SRCI, CI-3 and CI-4 species. Also and alternatively, for example, in class of concatenation as shown in FIG. 18 of U.S. Pat. No. 8,532,209, the block 1820 and 1825 can be implemented using a CICM signal mapper that comprises a CICM permutation 1820 followed by a constellation mapper 1825 that acts as the inner code in a double concatenation. It is also noted that r2ρ2 in FIG. 18 of U.S.

Pat. No. 8,532,209 may be set to one. All such variations and embodiments are specifically contemplated by the present invention.

In can also be noted that in all of the optical and non-optical SM embodiments discussed herein, instead of jointly SISO decoding both the spatial constellation point (i.e., the channel number) and the signal constellation point, a two step process may be used instead. That is, a first detector/channel estimator can be used to identify one or a sequence of channel numbers through which the SM signal was transmitted in a given one or a sequence of symbol intervals, and a second detector/decoder can be used to estimate one or a sequence of signal constellation points. For example, the SISO decoder can be broken up into first and second SISO decoders (spatial constellation decoder followed by signal constellation decoder), or other types of arrangements can be used. For example, a hard decoder or a hard iterative decoder can be to estimate the sequence of spatial constellation points (sequence of channel numbers) and a SISO decoder can then be used to estimate the sequence of signal constellation points. Other types of arrangements that iterate between these two decoders can also be configured. Also, a channel pre-estimator portion could be used to narrow the search space and simplify the complexity of the SISO decoder. For example, if there are a total of 256 possible channels through which the SM signal can be transmitted each symbol interval, the channel pre-estimator could be configured to identify a sequence of the 16 or fewer most likely channels through which the SM signal was transmitted each symbol interval over a given frame interval. A reduced-complexity joint spatial-signal constellation SISO decoder could then be configured to use this channel pre-estimation information to narrow the search space when iterating to jointly find the sequence of spatial and signal constellation points that were transmitted during each symbol interval. To simplify further, for example, if out of the 16 channel estimates, only four are above a threshold during a given symbol interval, the joint SISO decoder could reduce its complexity further by only operating on the metrics that are above the threshold. All such variations are contemplated by the present invention.

It is therefore noted that any specific embodiment recited in any specifically drafted claim is what governs the claim scope of all recited claims in this application and any continuations, divisionals, or international filings derived herefrom. The disclosure provided herein is meant to explain how to construct all of these voluminous different types of embodiments and to explicitly show one of ordinary skill in the art how to readily construct them using standard levels of engineering creativity and engineering know-how as would be expected by one of ordinary skill in the art. The recited claims are provided to identify the scope of the claimed inventions.

What we claim is:

1. A communications apparatus, comprising:
   an outer encoder configured to transform a sequence of input bits to a sequence of outer encoded bits, wherein the sequence of outer-encoded bits is encoded in accordance with an outer code that is a member of the group consisting of a block code and a non- recursive convolutional code;
   a constrained interleaver that is configured to implement a permutation function to permute the order of the outer-encoded bits to produce a constrained-interleaved sequence of outer-encoded bits, wherein the permutation function implements a pseudo-random reordering of the outer-encoded bits subject to the at least one SRCI constraint;
   an inner encoder configured to transform the constrained-interleaved sequence of outer-encoded bits to a sequence of inner-encoded bits, wherein the sequence of inner-encoded bits is encoded in accordance with an inner code; and
   whereby the sequence of inner-encoded bits constitutes a serially-concatenated sequence of bits that incorporates coding from both the inner code and the outer code in accordance with a serially-concatenated code that achieves a target minimum distance of $d_t$;
   wherein the constrained interleaver implements at least one SRCI (single row constrained interleaver) constraint that prevents one or more low-distance error sequences from occurring in the serially-concatenated code;
   wherein the outer code has a minimum distance of $d_0$ and the inner code has a minimum distance of $d_i$;
   wherein the permutation function implemented by the constrained interleaver is configured to implement the at least one SRCI constraint in order to enforce $d_t > d_0 d_i$; and
   wherein the at least one SRCI constraint includes at least one first SRCI constraint that ensures that the permutation function does not place any respective index from the integer ring [0,K-1] into any position in a permuted integer ring $\pi$[ ,K-1] that corresponds to any identified respective restricted zone, where each identified respective restricted zone corresponds to a subset of one or more adjacent positions in $\pi$[0,K-1] that, if the respective index were to be placed into any one of the identified respective restricted zones, at least one error sequence of weight less than $d_t$ would become possible in the serially-concatenated code.

2. The communications apparatus of claim 1, wherein the SRCI constraints include at least one second SRCI constraint that ensures that the permutation function does not place any respective index from the integer ring [0,K-1] into any position in a permuted integer ring $\pi$[0,K-1] that corresponds to any second identified respective restricted zone, where each second identified respective restricted zone corresponds to a subset of one or more adjacent positions in the permuted integer ring $\pi$[0,K-1] that, if the respective index were to be placed into any one of the second respective restricted zones, at least one error sequence of weight less than $d_{t2}$ would become possible in the serially-concatenated code, where $d_{t2} > d_t$, and where the at least one error sequence of weight less than $d_{2t}$ is associated with a second category of error sequences different from a first category of error sequences that are restricted out by the first SRCI constraint.

3. The communications apparatus of claim 2, wherein the first category of error sequences is associated with error sequences that are avoided using at least one CI-3 constraint.

4. The communications apparatus of claim 2, wherein the first category of error sequences is associated with error sequences that are avoided using at least one CI-4 constraint.

5. The communications apparatus of claim 2, wherein the second category of error sequences is associated with error sequences that are avoided using at least one CI-3 .

6. The communications apparatus of claim 2, wherein the second category of error sequences is associated with error sequences that are avoided using at least one CI-4 constraint.

7. The communications apparatus of claim 2, wherein the SRCI constraints include at least one third SRCI constraint that corresponds to a vectorization constraint.

8. The communications apparatus of claim 7, wherein the constrained interleaver is further constrained to generate a deterministic and M-way vectorizable permutation.

9. The communications apparatus of claim 2, further comprising:
a signal mapper configured to map the sequence of inner-encoded bits to a transmission signal.

10. The communications apparatus of claim 9, wherein the signal mapper performs signal mapping in accordance with a CICM (constrained interleaved coded modulation) permutation function, $\Gamma$.

11. The communications apparatus of claim 10, wherein the signal mapper further performs constellation mapping in accordance with a RGC (reverse Gray coded) constellation mapping rule.

12. The communications apparatus of claim 11, wherein the recursive convolutional code is an accumulator; an accumulator followed by an SPC code.

13. The communications apparatus of claim 11, wherein the predetermined target minimum Hamming distance (MHD), given by MHD=$d_t > d_0 d_i$.

14. The communications apparatus of claim 11, wherein the predetermined target minimum Hamming distance (MHD), given by MHD=$d_t > d_0^2 d_i$.

15. The communications apparatus of claim 11, further comprising:
a signal mapper configured to map the sequence of inner-encoded bits to a transmission signal.

16. The communications apparatus of claim 15, wherein the signal mapper performs signal mapping in accordance with a CICM (constrained interleaved coded modulation) permutation function, $\Gamma$.

17. The communications apparatus of claim 16, wherein the signal mapper further performs constellation mapping in accordance with a RGC (reverse Gray coded) signal mapping rule.

18. The communications apparatus of claim 16, wherein the permutation function $\Gamma$ is selected to ensure that the transmission signal achieves a desired symbol Hamming distance and a desired MSED (minimum squared Euclidian distance).

19. The communications apparatus of claim 10, wherein the permutation function $\Gamma$ is selected to ensure that the transmission signal achieves a desired symbol Hamming distance and a desired MSED (minimum squared Euclidian distance).

20. The communications apparatus of claim 1, wherein the at least one first SRCI constraint corresponds to at least one CI-3 constraint.

21. The communications apparatus of claim 1, wherein the at least one first SRCI constraint corresponds to a CI-4 constraint.

22. The communications apparatus of claim 1, wherein the at least one second SRCI constraint corresponds to at least one CI-3 constraint.

23. The communications apparatus of claim 1, wherein the at least one second SRCI constraint corresponds to a CI-4 constraint.

24. The communications apparatus of claim 1, wherein the SRCI constraints include at least one second SRCI constraint that corresponds to a vectorization constraint.

25. The communications apparatus of claim 24, wherein the constrained interleaver is further constrained to generate a deterministic and M-way vectorizable permutation.

26. The communications apparatus of claim 1, further comprising:
a signal mapper configured to map the sequence of inner-encoded bits to a transmission signal.

27. The communications apparatus of claim 26, wherein the signal mapper performs signal mapping in accordance with a CICM (constrained interleaved coded modulation) permutation function, $\Gamma$.

28. The communications apparatus of claim 27, wherein the signal mapper further performs constellation mapping in accordance with a RGC (reverse Gray coded) constellation mapping rule.

29. The communications apparatus of claim 27, wherein the permutation function $\Gamma$ is selected to ensure that the transmission signal achieves a desired symbol Hamming distance and a desired MSED (minimum squared Euclidian distance).

30. A communications apparatus, comprising:
an outer encoder configured to transform a sequence of input bits to a sequence of outer encoded bits, wherein the sequence of outer-encoded bits is encoded in accordance an outer code that has n coded bits per codeword, a minimum Hamming distance of $d_0$ and is a member of the group consisting of a block code, a convolutional code transformed to a block code, and a non-recursive convolutional code; and
a SRCI (single row constrained interleaver) that is configured to implement a permutation function to permute the order of the outer-encoded bits to produce a constrained-interleaved sequence of outer-encoded bits;
an inner encoder configured to transform the constrained-interleaved sequence of outer-encoded bits to a sequence of inner-encoded bits, wherein the sequence of inner-encoded bits is encoded in accordance with an inner code which is a recursive convolutional code; and
whereby the sequence of inner-encoded bits constitutes a serially-concatenated sequence of bits that incorporates coding from both the inner code and the outer code in accordance with a serially-concatenated code that has achieves a target minimum distance of $d_t$;
wherein the outer code has a minimum distance of $d_0$ and the inner code has a minimum distance of $d_i$;
wherein the permutation function implemented by the SRCI is configured to interleave the bits of $\rho$=K/n codewords to provide an increased interleaver gain relative to constrained interleavers that use L>1 rows in an interleaver design matrix, and permutation function enforces one or more interleaver constraints that guarantee that no sequence of inner-encoded bits has a weight less than a predetermined target minimum Hamming distance (MHD), given by MHD=$d_t \geq d_0 d_i$.

* * * * *